(12) United States Patent
Maenishi et al.

(10) Patent No.: US 7,899,561 B2
(45) Date of Patent: Mar. 1, 2011

(54) OPERATING TIME REDUCING METHOD, OPERATING TIME REDUCING APPARATUS, PROGRAM AND COMPONENT MOUNTER

(75) Inventors: Yasuhiro Maenishi, Saga (JP); Chikashi Konishi, Fukuoka (JP); Akihito Yamasaki, Fukuoka (JP); Takeshi Kuribayashi, Saga (JP)

(73) Assignee: Panasonic Corporation, Osaka (JP)

( * ) Notice: Subject to any disclaimer, the term of this patent is extended or adjusted under 35 U.S.C. 154(b) by 931 days.

(21) Appl. No.: 11/792,833

(22) PCT Filed: Dec. 2, 2005

(86) PCT No.: PCT/JP2005/022210

§ 371 (c)(1), (2), (4) Date: Jun. 12, 2007

(87) PCT Pub. No.: WO2006/064680

PCT Pub. Date: Jun. 22, 2006

(65) Prior Publication Data

US 2008/0154392 A1     Jun. 26, 2008

(30) Foreign Application Priority Data

| Dec. 15, 2004 | (JP) | ............................. 2004-362953 |
| Feb. 7, 2005 | (JP) | ............................. 2005-031128 |
| Feb. 14, 2005 | (JP) | ............................. 2005-035472 |
| Mar. 1, 2005 | (JP) | ............................. 2005-056549 |
| Mar. 2, 2005 | (JP) | ............................. 2005-058113 |

(51) Int. Cl.
    *G05B 13/02* (2006.01)
    *G06F 19/00* (2006.01)

(52) U.S. Cl. ........................... 700/28; 700/60; 700/103; 700/121; 29/743; 29/832

(58) Field of Classification Search ................. 700/103, 700/114, 117, 121, 229, 230, 28; 716/9; 414/331.06, 401; 29/740, 741, 743, 832

See application file for complete search history.

(56) References Cited

U.S. PATENT DOCUMENTS 5,862,586 A * 1/1999 Kimura ........................ 29/832

(Continued)

FOREIGN PATENT DOCUMENTS

EP     0 727 924     8/1996

(Continued)

OTHER PUBLICATIONS

Partial English translation of Japanese Patent Application No. 2004-6605, which was cited in the IDS filed Oct. 9, 2008.

*Primary Examiner* — Albert Decady
*Assistant Examiner* — Douglas S Lee
(74) *Attorney, Agent, or Firm* — Wenderoth, Lind & Ponack, L.L.P.

(57) ABSTRACT

An operating time reducing method in which a processing procedure of a component mounting order determination method can be changed depending on the type of an operation loss that affects a component mounting time for mounting components onto the board is an operating time reducing method for a component mounter, wherein the method includes: an operation loss identifying step of identifying an operation loss to be resolved in the component mounter; a processing procedure selecting step of selecting, based on the identified operation loss, a processing procedure for reducing an operating time of the component mounter; and a processing procedure executing step of executing the selected processing procedure.

44 Claims, 116 Drawing Sheets

U.S. PATENT DOCUMENTS

| | | | |
|---|---|---|---|
| 6,002,650 A | 12/1999 | Kuribayashi et al. | |
| 6,650,953 B2 * | 11/2003 | Schaffer et al. | 700/103 |
| 6,729,018 B1 * | 5/2004 | Takano et al. | 29/743 |
| 6,971,161 B1 | 12/2005 | Maenishi et al. | |
| 6,996,440 B2 | 2/2006 | Maenishi et al. | |
| 7,142,939 B2 * | 11/2006 | Nonaka et al. | 700/121 |
| 7,395,129 B2 * | 7/2008 | Yamazaki et al. | 700/104 |
| 7,536,236 B2 * | 5/2009 | Yano et al. | 700/121 |
| 7,603,193 B2 * | 10/2009 | Maenishi et al. | 700/100 |
| 2002/0138673 A1 | 9/2002 | Schaffer et al. | 710/28 |
| 2004/0033128 A1 | 2/2004 | Kabeshita et al. | |
| 2004/0073322 A1 | 4/2004 | Maenishi et al. | |
| 2004/0153868 A1 * | 8/2004 | Nonaka et al. | 714/47 |
| 2004/0168310 A1 * | 9/2004 | Takano et al. | 29/832 |
| 2006/0047353 A1 | 3/2006 | Maenishi et al. | |
| 2006/0229758 A1 * | 10/2006 | Maenishi et al. | 700/121 |
| 2008/0005892 A1 * | 1/2008 | Chida et al. | 29/739 |

FOREIGN PATENT DOCUMENTS

| | | |
|---|---|---|
| JP | 4-299898 | 10/1992 |
| JP | 5-108122 | 4/1993 |
| JP | 5-298283 | 11/1993 |
| JP | 6-53690 | 2/1994 |
| JP | 6-177597 | 6/1994 |
| JP | 6-350297 | 12/1994 |
| JP | 7-176891 | 7/1995 |
| JP | 7-326885 | 12/1995 |
| JP | 8-222898 | 8/1996 |
| JP | 9-201749 | 8/1997 |
| JP | 9-260893 | 10/1997 |
| JP | 9-270595 | 10/1997 |
| JP | 10-162041 | 6/1998 |
| JP | 10-326999 | 12/1998 |
| JP | 11-330790 | 11/1999 |
| JP | 2001-5846 | 1/2001 |
| JP | 2001-144496 | 5/2001 |
| JP | 2001-269881 | 10/2001 |
| JP | 2002-50900 | 2/2002 |
| JP | 2002-252499 | 9/2002 |
| JP | 2003-031997 | 1/2003 |
| JP | 2003-037396 | 2/2003 |
| JP | 2003-258495 | 9/2003 |
| JP | 2004-6510 | 1/2004 |
| JP | 2004-6512 | 1/2004 |
| JP | 2004-6605 | 1/2004 |
| JP | 2004-6962 | 1/2004 |
| JP | 2004-87874 | 3/2004 |
| JP | 2004-186391 | 7/2004 |
| JP | 2005-123487 | 5/2005 |
| WO | 97/27522 | 7/1997 |
| WO | 01/24597 | 4/2001 |
| WO | 02/17699 | 2/2002 |

* cited by examiner

| t(ms) | Δxy | Δz | $h_j$ | Wmax(o→i) |
|---|---|---|---|---|
| 100 | ~15 | 0 | 1 | 1 |
| 120 | ~21 | — | 2 | 2 |
| 140 | ~22 | — | 3 | 3 |
| 160 | ~27 | 1 | 4 | 4 |
| 200 | ~34 | — | 5 | 5 |
| 250 | ~46 | — | 6 | 6 |
| 300 | ~60 | 2 | 7 | 7 |
| 500 | ~103 | ~6 | 8 | 8 |

FIG. 15

Tact table: $t_{ij}$

| i\j | 0 | 1 | 2 | 3 | 4 | 5 | 6 |
|---|---|---|---|---|---|---|---|
| 0 | 1 | 200 | 300 | 100 | 200 | 400 | 1 |
| 1 | 200 | 1 | 400 | 200 | 400 | 100 | 10000000 |
| 2 | 300 | 400 | 1 | 300 | 200 | 350 | 10000000 |
| 3 | 100 | 200 | 300 | 1 | 250 | 260 | 10000000 |
| 4 | 200 | 400 | 200 | 250 | 1 | 380 | 10000000 |
| 5 | 400 | 100 | 350 | 260 | 380 | 1 | 10000000 |
| 6 | 1 | 10000000 | 10000000 | 10000000 | 10000000 | 10000000 | 1 |

FIG. 18

Mounting order array: p[i]

| p[0] | p[1] | p[2] | p[3] | p[4] | p[5] | p[6] |
|------|------|------|------|------|------|------|
| 0    | 1    | 2    | 3    | 4    | 5    | 6    |

FIG. 21
(a)
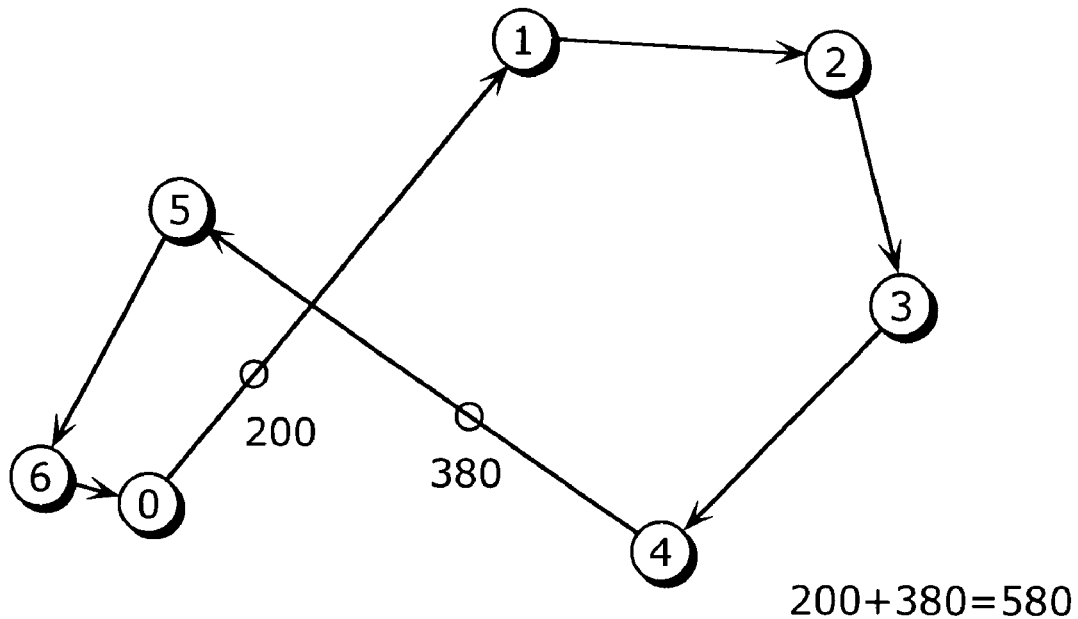
200+380=580
⇓
(b)
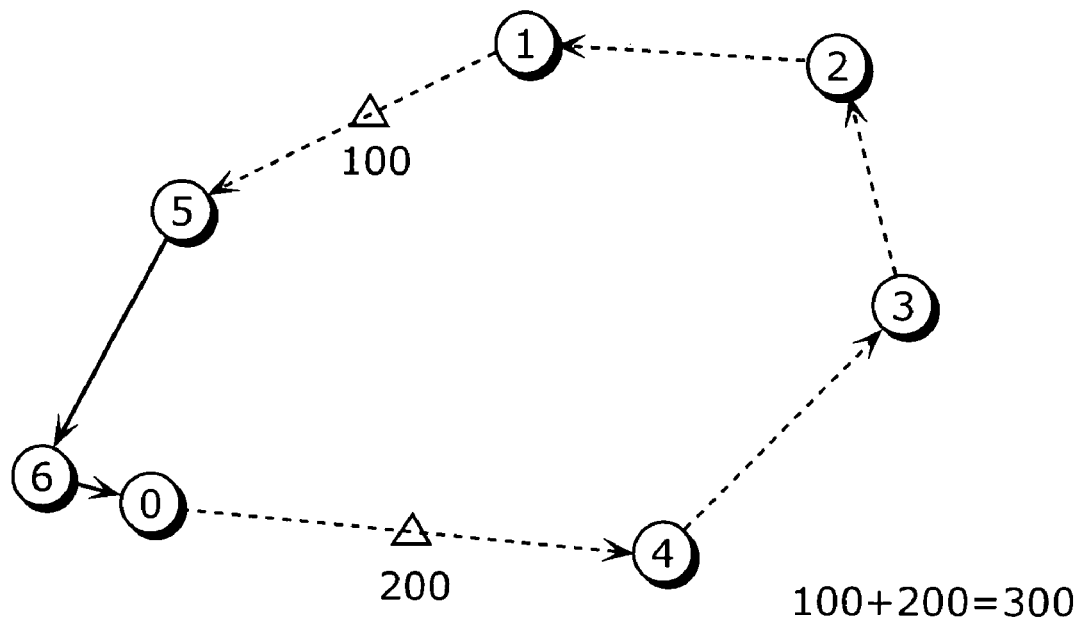
100+200=300

| p[0] | p[1] | p[2] | p[3] | p[4] | p[5] | p[6] |
|---|---|---|---|---|---|---|
| 6 | 5 | 1 | 3 | 2 | 4 | 0 |

(b)

| Data[0] | Data[1] | Data[2] | Data[3] | Data[4] | Data[5] | Data[6] |
|---|---|---|---|---|---|---|
| Board mark | Mounting point 1 | Mounting point 2 | Mounting point 3 | Mounting point 4 | Mounting point 5 | Dummy point |

(c)

| Data[1] | Data[2] | Data[3] | Data[4] | Data[5] |
|---|---|---|---|---|
| Mounting point 5 | Mounting point 1 | Mounting point 3 | Mounting point 2 | Mounting point 4 |

(d)

| Data[1] | Data[2] | Data[3] | Data[4] | Data[5] |
|---|---|---|---|---|
| Mounting point 4 | Mounting point 2 | Mounting point 3 | Mounting point 1 | Mounting point 5 |

FIG. 26

| Sample | Number of mounting points | Number of component types | Greedy algorithm (sec) | Algorithm of present application (sec) | Improvement ratio (%) | Processing time (sec) |
|---|---|---|---|---|---|---|
| A | 762 | 146 | 132.3 | 116.2 | 113.9 | <1 |
| B | 390 | 123 | 64.0 | 61.5 | 104.1 | <1 |
| C | 895 | 83 | 146.0 | 141.6 | 103.1 | <1 |
| D | 388 | 70 | 56.0 | 53.4 | 104.9 | <1 |
| E | 400 | 1 | 46.1 | 39.0 | 118.2 | <1 |
| F | 500 | 70 | 111.9 | 106.8 | 104.8 | <1 |
| G | 1008 | 97 | 194.7 | 178.7 | 109.0 | <1 |
| H | 650 | 26 | 100.1 | 94.0 | 106.5 | |

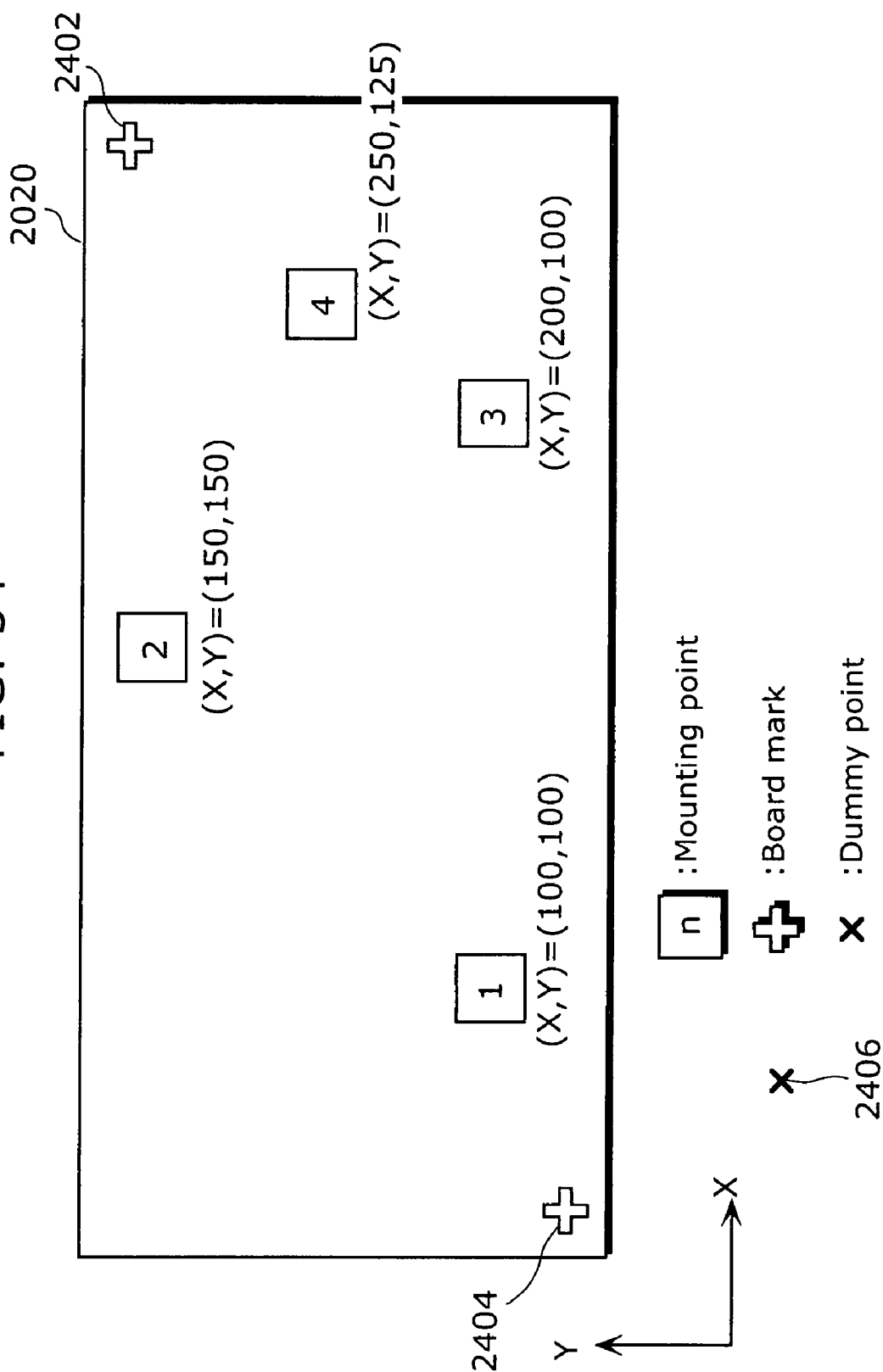

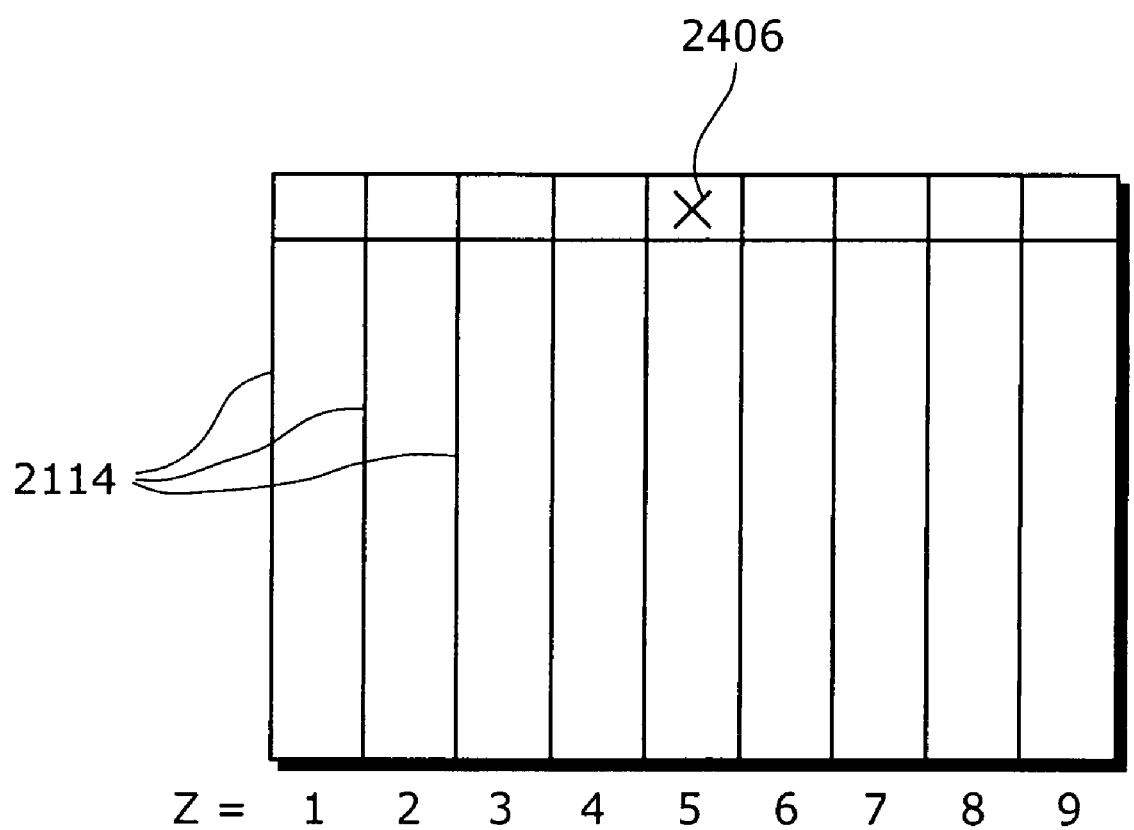

FIG. 37

| Mounting point | X | Y | Pickup head number | X' | Y' |
|---|---|---|---|---|---|
| 1 | 100 | 100 | 2 | 110 (=100+10) | 100 |
| 2 | 150 | 150 | 1 | 180 (=150+30) | 150 |
| 3 | 200 | 100 | 4 | 170 (=200−30) | 100 |
| 4 | 250 | 125 | 3 | 240 (=250−10) | 125 |

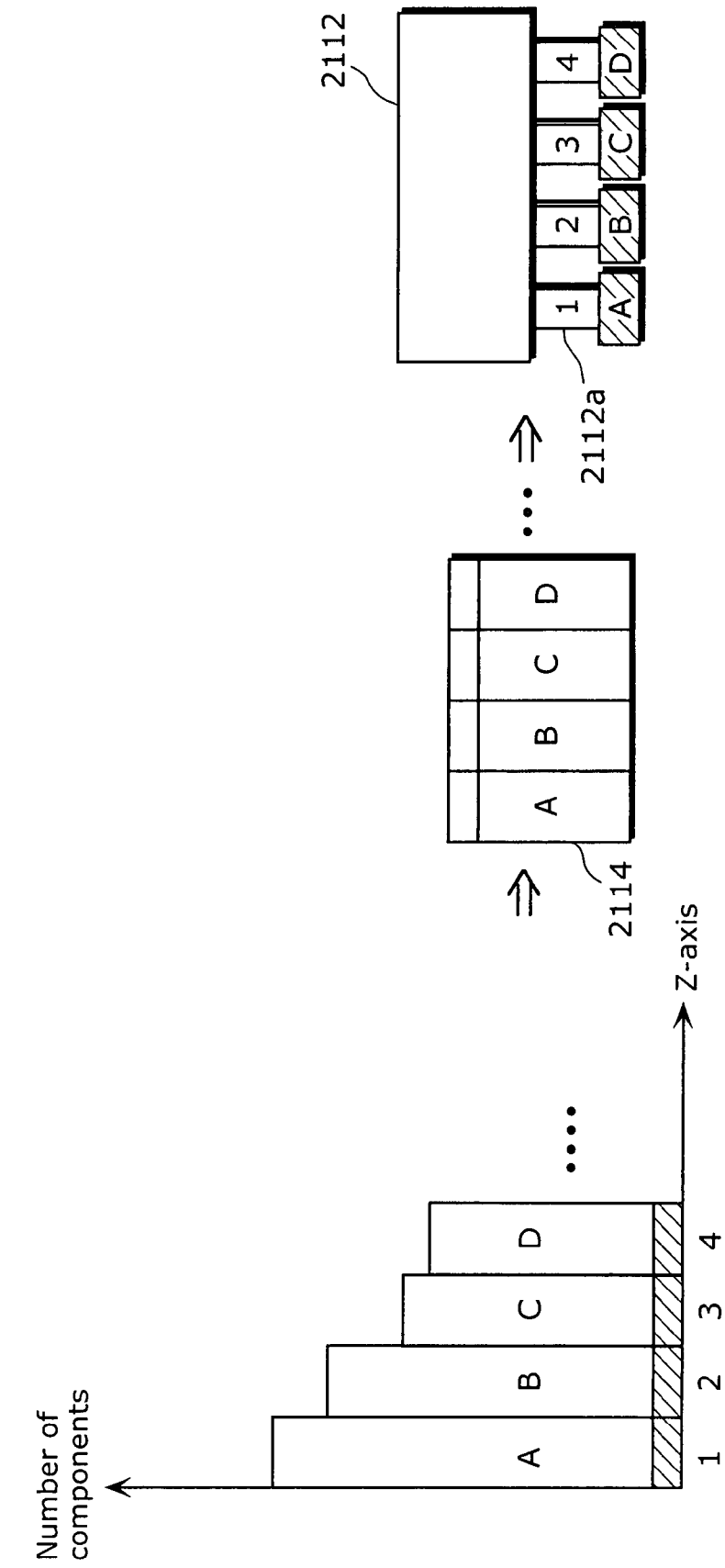

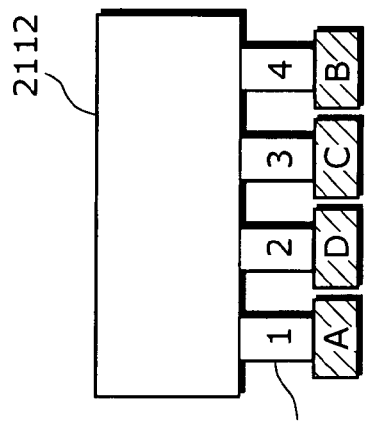
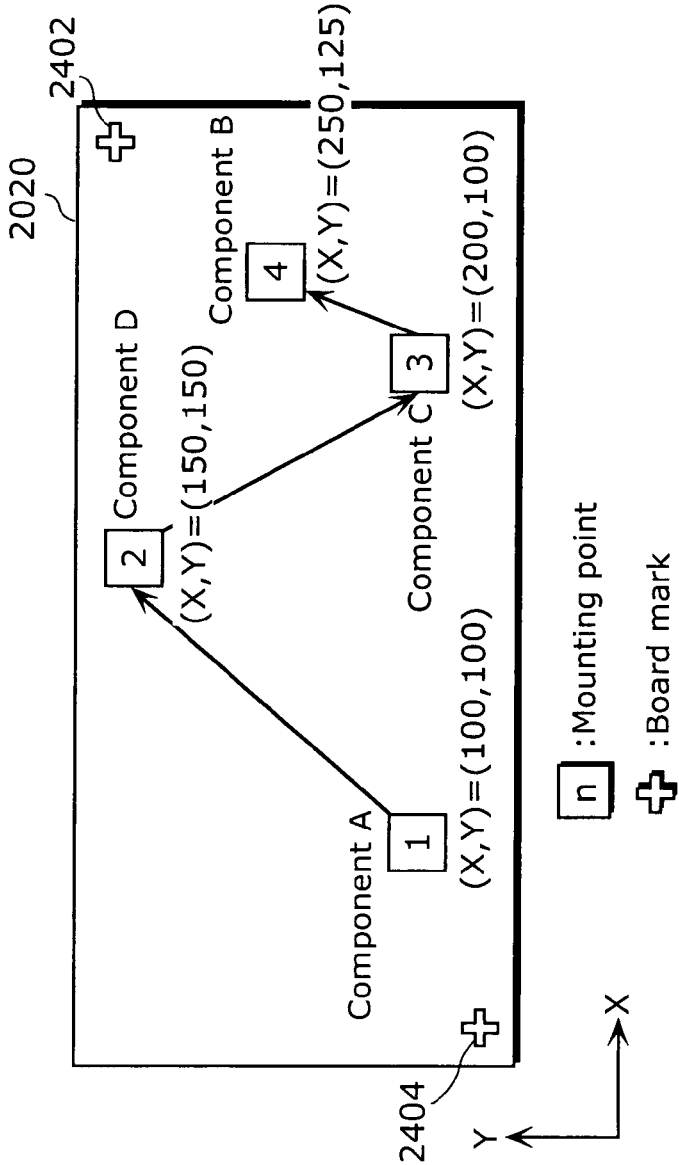

FIG. 44
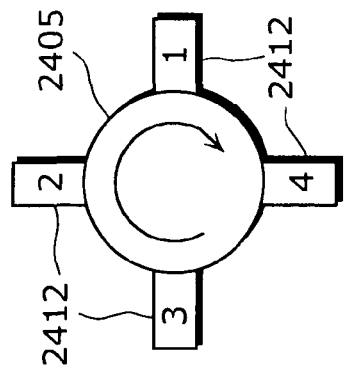
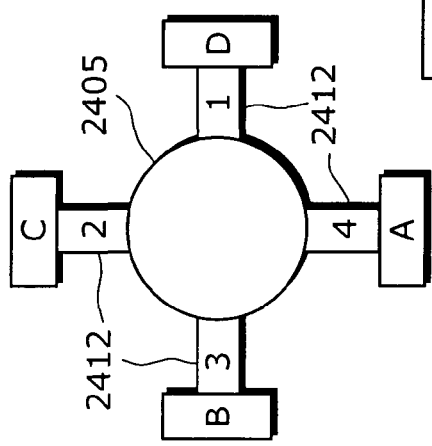
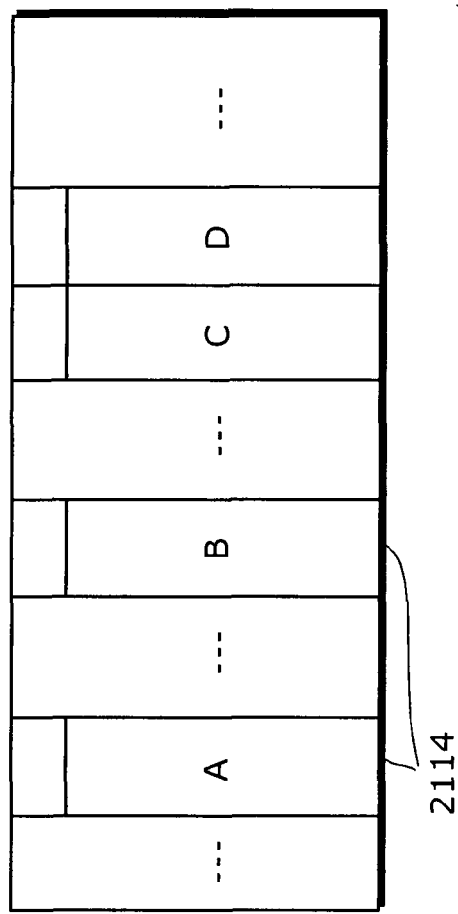
FIG. 44 Movement

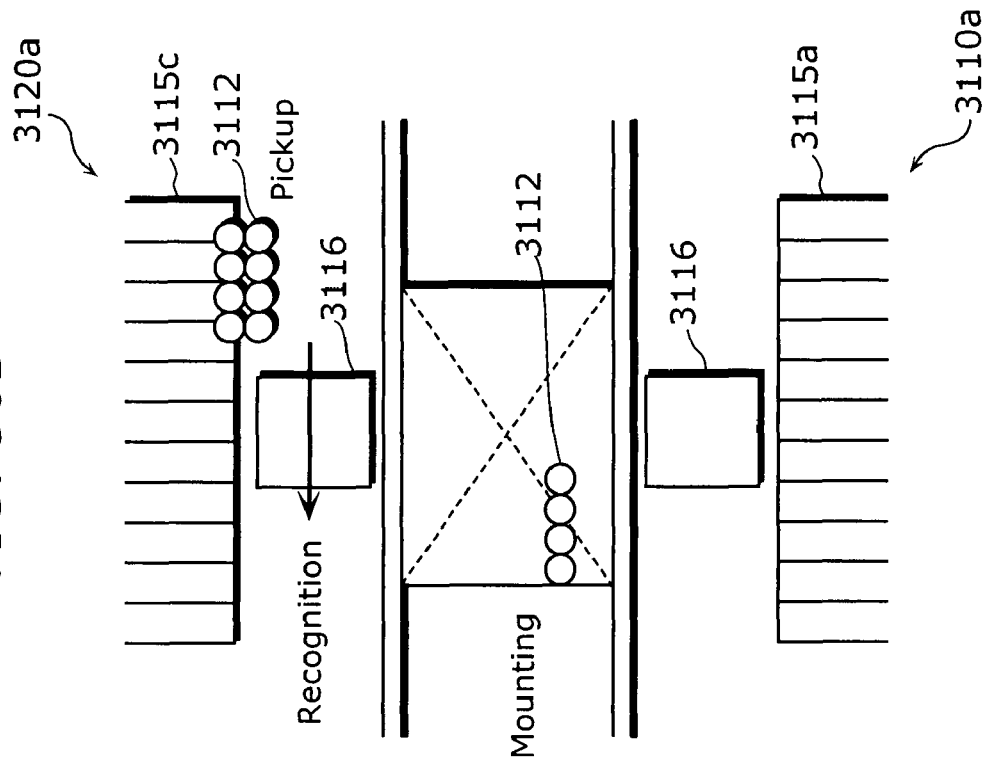
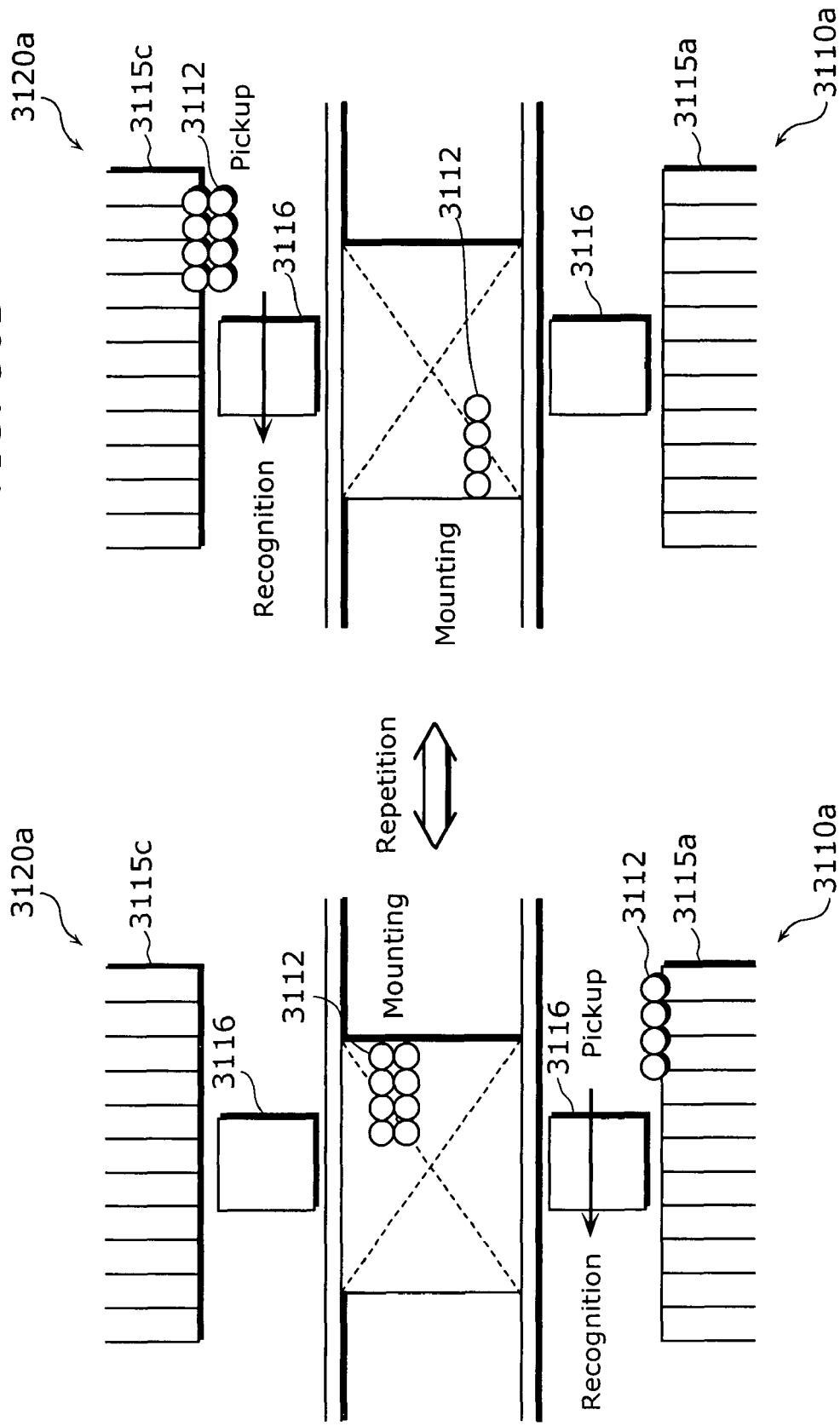

3307a

Mounting point pi=(Component type Ci, X-coordinate xi, Y-coordinate yi, Control data φi)

⬇ Mounting point data is list of mounting points pi $$\text{Mounting point data} = \begin{pmatrix} p1 \\ p2 \\ p3 \\ \cdot \\ \cdot \\ \cdot \\ pN \end{pmatrix} = \begin{pmatrix} c1, x1, y1, \phi 1 \\ c2, x2, y2, \phi 2 \\ c3, x3, y3, \phi 3 \\ \cdot \\ \cdot \\ \cdot \\ cN, xN, yN, \phi N \end{pmatrix}$$

FIG. 52

| Component name | (Component external appearance) | Component size (mm) | | | Two-dimensional recognition method | Pickup nozzle | Tact (sec) | XY speed |
|---|---|---|---|---|---|---|---|---|
| | | X | Y | L | | | | |
| 0603CR | | 0.6 | 0.3 | 0.25 | Reflection | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | Cylindrical chip | 0.11 | |
| 6TR | | 4.3 | 4.5 | 1.5 | | | | |
| 1TIP | | 2.0 | φ1.0 | - | | | | |
| 2TIP | | 3.6 | φ1.4 | - | | | | |
| 1CAP | | 3.8 | 1.9 | 1.6 | | S | | |
| 2CAP | | 4.7 | 2.6 | 2.1 | | | | |
| 3CAP | | 6.0 | 3.2 | 2.5 | | M | | |
| 4CAP | | 7.3 | 4.3 | 2.8 | | | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

| Unit id | Head information | Nozzle information | Cassette information | Tray information |
|---------|------------------|--------------------|-----------------------|------------------|
| 110a | 4-nozzle head | SX,SA,··· | 96 Pieces | 8 Sub-equipment |
| 120a | 8-nozzle head | None | 96 Pieces | None |
| 110b | 8-nozzle head | S,M,··· | 48 Pieces | None |

| Left sub-equipment | 3307d |
|---|---|
| Component type | Number of components |
| A | 40 |
| B | 20 |
| C | 20 |
| D | 5 |
| E | 15 |
| Total | 100 |

FIG. 61
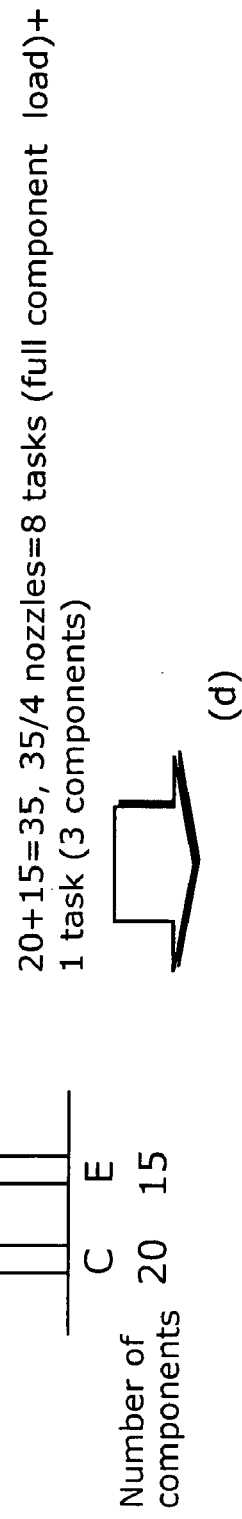
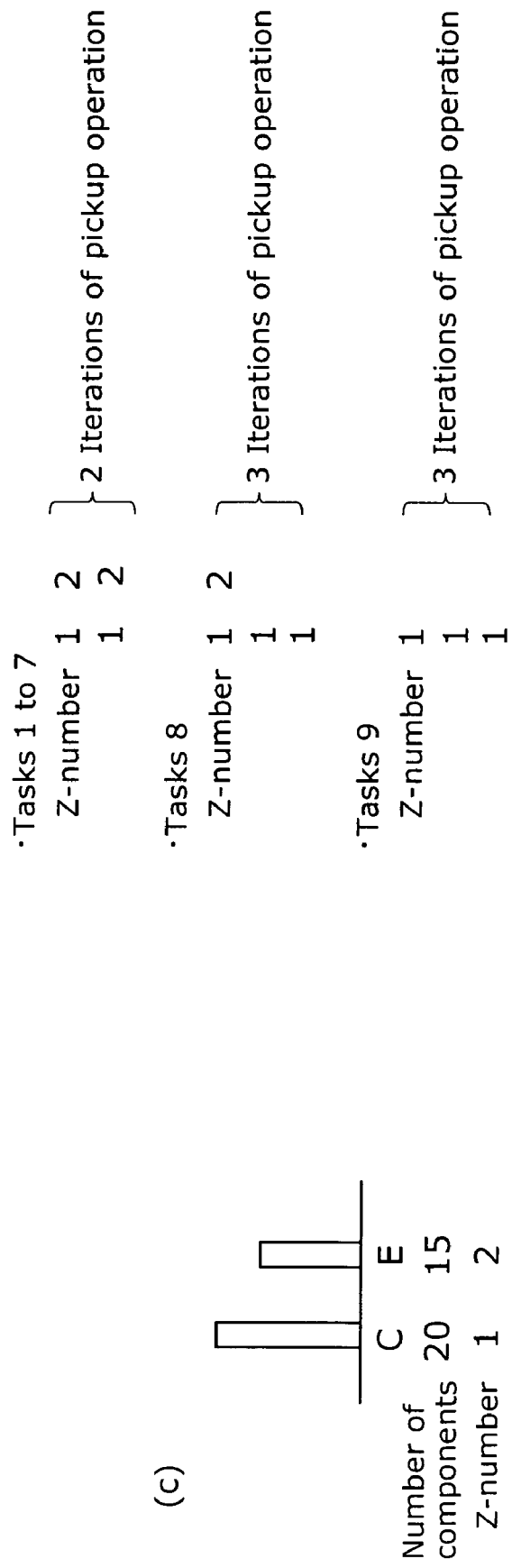

FIG. 62

| | Number of pickup iterations of front head | | Number of pickup iterations of rear head |
|---|---|---|---|
| Task 1 | 3 | → ← | 2 |
| Task 2 | 3 | → ← | 2 |
| Task 3 | 3 | → ← | 2 |
| Task 4 | 3 | → ← | 2 |
| Task 5 | 3 | → ← | 2 |
| Task 6 | 3 | → ← | 2 |
| Task 7 | 3 | → ← | 2 |
| Task 8 | 3 | → ← | 3 |
| Task 9 | 1 | → | 3 |

| Task number i | Pickup time ti | Mounting time ti | |
|---|---|---|---|
| 1 | $t_1$ | $m_1$ | 4307d |
| 2 | $t_2$ | $m_2$ | |
| 3 | $t_3$ | $m_3$ | |
| 4 | $t_4$ | $m_4$ | |

| A1 | | A2 | | | A3 | A4 | A5 | A6 |
|---|---|---|---|---|---|---|---|---|
| Component name | (Component external appearance) | Component size (mm) | | | Two-dimensional recognition method | Pickup nozzle | Tact (sec) | XY speed |
| | | X | Y | L | | | | |
| 0603CR | | 0.6 | 0.3 | 0.25 | Reflection | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | Cylindrical chip | 0.11 | |
| 6TR | | 4.3 | 4.5 | 1.5 | | | | |
| 1TIP | | 2.0 | φ1.0 | - | | | | |
| 2TIP | | 3.6 | φ1.4 | - | | | | |
| 1CAP | | 3.8 | 1.9 | 1.6 | | S | | |
| 2CAP | | 4.7 | 2.6 | 2.1 | | | | |
| 3CAP | | 6.0 | 3.2 | 2.5 | | | | |
| 4CAP | | 7.3 | 4.3 | 2.8 | | M | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

5307b

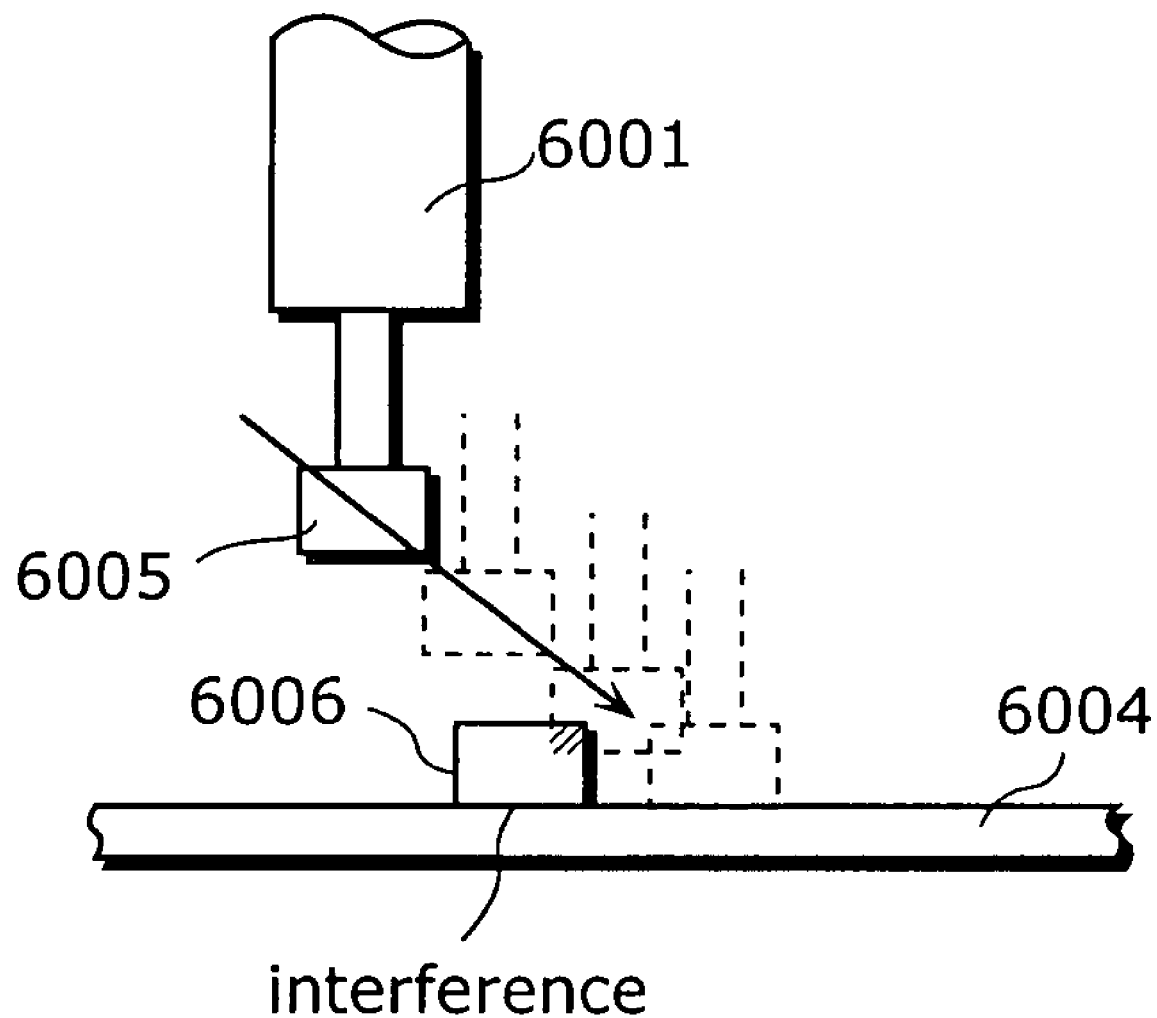

FIG. 105

| Mounting point No. | Mounting order (group number) |
|---|---|
| P003 | 1 |
| P008 | 1 |
| ⋮ | ⋮ |
| P048 | 1 |
| P001 | 2 |
| P006 | 2 |
| ⋮ | ⋮ |
| P041 | 2 |
| P005 | 3 |
| P024 | 3 |
| ⋮ | ⋮ |
| P044 | 3 |
| P002 | 4 |
| P004 | 4 |
| ⋮ | ⋮ |
| P0031 | 4 |

FIG. 107

| Mounting point No. | Mounting order (group number) | Task |
|---|---|---|
| P003 | 1 | T003 |
| P008 | 1 | T001 |
| P009 | 1 | T001 |
| P011 | 1 | T003 |
| P015 | 1 | T002 |
| P019 | 1 | T001 |
| P022 | 1 | T004 |
| P023 | 1 | T001 |
| P027 | 1 | T004 |
| ⋮ | ⋮ | ⋮ |
| P048 | 1 | T002 |
| P001 | 2 | T005 |
| P006 | 2 | T006 |
| P007 | 2 | T007 |
| P010 | 2 | T005 |
| ⋮ | ⋮ | ⋮ |

FIG. 110

| Mounting point No. | Mounting order (group number) | Task |
|---|---|---|
| P003 | 1 | T001 |
| P008 | 1 | T001 |
| P009 | 1 | T001 |
| P011 | 1 | T001 |
| P015 | 1 | T002 |
| P019 | 1 | T002 |
| P022 | 1 | T002 |
| P023 | 1 | T002 |
| P027 | 1 | T003 |
| ⋮ | ⋮ | ⋮ |
| P048 | 1 | T004 |
| P001 | 2 | T005 |
| P006 | 2 | T005 |
| P007 | 2 | T005 |
| P010 | 2 | T005 |
| ⋮ | ⋮ | ⋮ |

FIG. 114

| Mounting point No. | Component name (X,Y,θ) |
|---|---|
| P001 | SCAP(31, 62, 0) |
| P002 | 1005CR(26, 80, 90) |
| P003 | 4TR(124, 95, 90) |
| ⋮ | ⋮ |

| Component name | (Component external appearance) | Component size (mm) | | | Two-dimensional recognition method | Pickup nozzle | Tact (sec) | XY speed |
|---|---|---|---|---|---|---|---|---|
| | | X | Y | L | | | | |
| 0603CR | | 0.6 | 0.3 | 0.25 | Reflection | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | | | |
| 6TR | | 4.3 | 4.5 | 1.5 | | | | |
| 1TIP | | 2.0 | φ1.0 | - | | Cylindrical chip | 0.11 | |
| 2TIP | | 3.6 | φ1.4 | - | | | | |
| 1CAP | | 3.8 | 1.9 | 1.6 | | S | | |
| 2CAP | | 4.7 | 2.6 | 2.1 | | | | |
| 3CAP | | 6.0 | 3.2 | 2.5 | | M | | |
| 4CAP | | 7.3 | 4.3 | 2.8 | | | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

6242

OPERATING TIME REDUCING METHOD, OPERATING TIME REDUCING APPARATUS, PROGRAM AND COMPONENT MOUNTER

TECHNICAL FIELD

The present invention relates to an operating time reducing method for a component mounter that mounts components onto a board.

BACKGROUND ART

In component mounting onto a board performed by a component mounter, the mounting order for the components needs be determined before the component mounting. In a component mounting order determination method, the mounting order is determined with the aim of minimizing the time duration from the start of mounting of components until the completion of mounting of all components. However, in a round robin method in which all possible component mounting orders are generated and then the optimal component mounting order is acquired, the processing time necessary for determining the optimal component mounting order increases as the number of mounting points for the components increases, so that it is difficult to determine the optimal component mounting order within a practical time.

Thus, as a method for determining the optimal component mounting order within a practical time, a method employing a greedy algorithm has been proposed (see, for example, Patent Reference 1).

Patent Reference 1: Japanese Laid-Open Patent Publication No. 7-176891

SUMMARY OF THE INVENTION

Problems that Invention is to Solve

However, in the component mounting order determination method employing a greedy algorithm, a component mounting point having the minimum cost (for example, the distance between component mounting points) is selected sequentially, and the component mounting order is determined. Thus, whereas the movement distance between component mounting points is small at the beginning of component mounting, the movement distance between component mounting points increases when the component mounting approaches the end, and there is a problem in that disorder (useless operation) in the movement between mounting points occurs. Thus, there is a problem that optimal mounting order is not necessarily obtained.

Further, in order that optimal component mounting order is determined within a practical time, it is preferable that the processing procedure of the component mounting order determination method is changed depending on the type of the operation loss that affects the time for mounting components onto the board.

The present invention is conceived in order to solve the above-mentioned problem, and has as an object to provide a component mounting order determination method that permits determination of optimal component mounting order within a practical time.

Another object of the present invention is to provide an operating time reducing method in which the processing procedure of the component mounting order determination method is changed depending on the type of the operation loss that affects the time for mounting components onto the board.

Means to Solve the Problems

In order to achieve the above-mentioned object, the operating time reducing method according to the present invention is an operating time reducing method for a component mounter, the method including: an operation loss identifying step of identifying an operation loss to be resolved in the component mounter; a processing procedure selecting step of selecting, based on the identified operation loss, a processing procedure for reducing an operating time of the component mounter; and a processing procedure executing step of executing the selected processing procedure.

According to this configuration, a processing procedure of reducing the operating time of the component mounter is selected based on the operation loss. Thus, an operating time reducing method is provided in which a processing procedure of the component mounting order determination method can be changed depending on the type of the operation loss that affects the component mounting time onto the board. Accordingly, a component mounting order determination method is provided that permits determination of optimal component mounting order within a practical time.

Furthermore, in the processing procedure selecting step, when an operation loss caused by a component mounter provided with a rotary head which, while rotating about an axis, picks up components and mounts the components onto a board is identified in the operation loss identifying step, a processing procedure is selected, the selected processing procedure is a component mounting order determination method for a component mounter that mounts a plurality of components onto a board, a board mark provided on a board for board positioning or a point included in component mounting points where a component is mounted first is defined as a start point, for an arbitrary two points among a plurality of component mounting points and the start point, a distance between the two points or a time duration necessary from completion of mounting of a component on one of the two points until completion of mounting of a component on the other of the two points is defined as a cost for the two points, a point set up hypothetically as a last movement point is defined as a dummy point, and the component mounting order determination method includes: a component mounting point information acquiring step of acquiring position information concerning the plurality of component mounting points and the costs for two points among the plurality of component mounting points, the start point and the dummy point; a traveling path calculating step of calculating a traveling path that passes individual points so as to minimize a sum of the costs for two points among the start point, the dummy point and the plurality of component mounting points on the board; and a mounting order determining step of determining the component mounting order based of the traveling path. Furthermore, the dummy point is a hypothetical point where a cost relative to each component mounting point is greater than a cost for every two points among the plurality of component mounting points and the start point and where a cost relative to the start point is smaller than a cost for every two points among the plurality of component mounting points and the start point.

A dummy point is defined, and an optimal traveling path is calculated. This solves the problem of disorder (useless operation) in the movement between the mounting points which occurs near the end of component mounting, which can occur when the component mounting order is determined by a greedy algorithm. Thus, optimal mounting order is obtained. Further, in this method, an approximate solution to the exact solution can be obtained in a practical processing time. Here, when the dummy point is defined as described above, a traveling path is generated so that the dummy point is necessarily connected to the start point. Thus, a closed traveling path that starts at the start point can be generated. Here, component mounting order may be acquired by a greedy algorithm in advance. Then, in order to improve on the useless operation described above, the above-mentioned method may be applied to acquire the optimal component mounting order.

Furthermore, it is also possible that the processing procedure further includes a cost calculating step of calculating a cost for arbitrary two points among the start point, the dummy point, and the plurality of component mounting points on the board, and in the traveling path calculating step, by using the costs calculated in the cost calculating step, a traveling path that passes individual points so as to minimize a sum of the costs for two points among the start, the dummy point, and the plurality of component mounting points point on the board is calculated in accordance with a traveling salesman problem.

Since a traveling path is calculated in accordance with a traveling salesman problem, an approximate solution to the exact solution can be obtained in a practical processing time.

Furthermore, it is also possible that when an operation loss caused by a component mounter in which a mounting head for holding and transporting a plurality of components mounts the plurality of components onto a board is identified in the operation loss identifying step, a processing procedure is selected in the processing procedure selecting step, the selected processing procedure is a component mounting order determination method of determining a mounting order in the case where components are mounted onto a board by a component mounter provided with a mounting head that picks up and transports a plurality of components so as to mount the plurality of components onto the board, for arbitrary two points among a plurality of component mounting points and a dummy point which is a point set up hypothetically, a distance between the two points or a time duration necessary from completion of mounting of a component to one point of the two points until completion of mounting of a component to the other point is defined as a cost for the two points, the dummy point is defined as a point set up as a start point and an end point of component mounting, and the component mounting order determination method includes: a component mounting point information acquiring step of acquiring position information concerning the plurality of component mounting points and the costs for two points among the plurality of component mounting points and the dummy point; a traveling path calculating step of calculating a traveling path in which the dummy point serves as a starting point and an end point and which passes individual points so as to minimize a sum of the costs for two points among the plurality of component mounting points and the dummy point; and a mounting order determining step of determining the component mounting order based on the traveling path.

Since the dummy point is adopted as the start point and the end point of component mounting, an optimal traveling path can be calculated also for a so-called modular machine. This solves the problem of disorder (useless operation) in the movement between the mounting points which occurs near the end of component mounting, which can occur when the component mounting order is determined by a greedy algorithm. Thus, optimal mounting order is obtained. Further, in this method, an approximate solution to the exact solution can be obtained in a practical processing time.

Furthermore, it is also possible that the dummy point is provided in a component supply unit which supplies the component to the mounting head.

Since the dummy point is provided at the above-mentioned position, an optimal traveling path is obtained in which pickup operation for the components is taken into consideration.

Furthermore, it is also possible that the dummy point is provided at a center of a plurality of component supply openings in the component supply unit.

Since the cost is derived based on corrected position information, the cost is obtained based on accurate movement distance and transportation time of the mounting head. This provides an optimal traveling path.

Furthermore, it is also possible that when an operation loss caused by a component mounter in which a plurality of mounting heads each for holding and transporting a plurality of components mount alternately the components onto one board is identified in the operation loss identifying step, a processing procedure is selected in the processing procedure selecting step, the selected processing procedure is a component mounting order determination method of determining a mounting order in the case where a plurality of mounting heads alternately mount components onto one board, each mounting head is a head that picks up and transports a plurality of components so as to mount the plurality of components onto the board, a component group that is mounted in one iteration of a repeated series of operations composed of pickup, transportation and mounting of the components performed by each mounting head is defined as a task, and the component mounting order determination method includes: an assignment step of assigning components to be mounted onto the board to any one of the plurality of mounting heads so that the number of tasks assigned to each of the plurality of mounting heads becomes uniform; and a task generating step of generating each task for the components assigned to each head so that a time duration from completion of component mounting in the task of a mounting head until start of component mounting in the task of a next mounting head is minimized.

According to this configuration, when component mounting of the task of a particular mounting head is completed, component mounting by the next mounting head can be started immediately. Thus, a tact loss in the component mounting operation onto the board is minimized, so that production efficiency is improved.

Furthermore, it is also possible that in the task generating step, for each of the plurality of mounting heads, tasks are generated by dividing the assigned component group into tasks so that pickup and recognition of the components can be completed by the time mounting of components by other mounting heads is completed. More specifically, it is also possible that the task generating step includes: a step of calculating, for each of the plurality of mounting heads, a maximum number of component pickup iterations in which pickup and recognition of the components can be completed within a mounting time for mounting components performed by the other mounting heads, by comparing a pickup time and a recognition time with the mounting time which is a time duration from completion of recognition of components until completion of mounting performed by the other mounting heads, the pickup time being a time duration from completion of mounting of components until completion of pickup, the recognition time being a time duration from completion of pickup of the components until completion of recognition; and a step of generating tasks for each of the plurality of mounting heads, by dividing the assigned component group into tasks so that the number of component pickup iterations is smaller than or equal to the maximum number of pickup iterations.

Further, according to this configuration, tasks are obtained so that during the time that one mounting head mounts components, the other mounting head completes pickup and recognition operation for components. Thus, at the time that the one mounting head completes the mounting operation, the other mounting head can start mounting operation without delay. This improves production efficiency.

Furthermore, it is also possible that the mounting head includes a plurality of pickup nozzles arranged along a rotating circumference, and in the task generating step, the component group assigned to each mounting head is divided into tasks so that, in the same task order, the number of components included in each task assigned to each of the plurality of mounting heads is equal, and an order for the divided tasks is determined.

According to this configuration, in each task, the number of iterations of pickup becomes equal for each of the plurality of mounting heads. Thus, during the time that one mounting head mounts components, the other mounting head can pick up components. This improves mounting efficiency for the components.

Furthermore, it is also possible that when an operation loss caused by a case where, in a component mounter in which a mounting head for holding and transporting a plurality of components mounts the plurality of components onto a board, a board carrying-in time which is a time duration after the components have been mounted onto the board until a next board is carried in to a board stop position in the component mounter is greater than a predetermined threshold is identified in the operation loss identifying step, a processing procedure is selected in the processing procedure selecting step, the selected processing procedure is a method of reducing an operating time in the case where components are mounted onto a board by a component mounter provided with a mounting head that picks up and transports a plurality of components so as to mount the plurality of components onto the board, the method of reducing an operating time includes: a board carrying-in time calculating step of calculating the board carrying-in time which is the time duration after the components have been mounted onto the board until the next board is carried in to the board stop position in the component mounter; and a timing determining step of determining, in the case where one iteration of a repeated series of operations composed of pickup and mounting of the components performed by the mounting head is defined as a task, timing of pickup of components in a first task so that pickup of the components in a first task, for a board carried in, is started within the board carrying-in time.

According to this configuration, component pickup timing in the first task is determined so that component pickup of the first task is started before a board is carried into the component mounter. Thus, the mounting head can operate in parallel to the board carrying-in. This reduces the tact time necessary for mounting the components, and hence board production efficiency can be improved.

Furthermore, it is also possible that the component mounting order determination method further includes a task order determining step of determining task order so that a task having the greatest component pickup time is adopted as the first task and pickup of a component in the first task is started within the board carrying-in time.

Accordingly, the mounting waiting time after the completion of the component pickup in the first task until the start of component mounting can be reduced to the minimum or zero. This improves production efficiency for the board further.

Furthermore, it is also possible that in a component mounter in which a mounting head for holding and transporting a plurality of components mounts the plurality of components onto a board, and a component group to be mounted in one iteration of a repeated series of operations composed of pickup, transportation and mounting of the components performed by the mounting head is defined as a task, when an operation loss caused by a presence of a task in which the components have mutually different component transportation speed limits for the mounting head or by a presence of a task in which the components have mutually different component transportation acceleration limits for the mounting head is identified in the operation loss identifying step, a processing procedure is selected in the processing procedure selecting step, the selected processing procedure is a component mounting method of mounting a plurality of components onto a board by using a holding unit that holds and transports the plurality of components, and the component mounting method includes: a speed identifying step of identifying a transportation speed limit for a holding unit corresponding to each of the plurality of components; a determination step of determining, based on the transportation speed limits, a handling order for the plurality of components in the holding unit so that a time duration that a component having a lower transportation speed limit, among the plurality of components, is held by the holding unit is reduced; and a mounting step of mounting the plurality of components onto the board by handling the plurality of components with the holding unit in accordance with the handling order determined in the determination step, and moving the holding unit at a speed not exceeding the lowest transportation speed limit of the components held by the holding unit.

Accordingly, even in the case where the holding unit is moved at a speed not exceeding the lowest transportation speed limit of the components held by the holding unit, when the plurality of components are handled by the holding unit in accordance with the handling order determined in the determination step, the time duration that a component having a low transportation speed limit is held by the holding unit is reduced, so that the transportation speed of the head can be increased. This reduces the time necessary for component mounting, and hence improves throughput. Further, since the holding unit is moved at a speed not exceeding the lowest transportation speed limit of the components held by the holding unit, the components are prevented from deviating or departing from the holding unit, so that the components can be accurately mounted onto the board.

Furthermore, it is also possible that in the determination step, a holding order for the plurality of components in the holding unit is determined as the handling order so that components are held sequentially starting from a component having the highest transportation speed limit identified in the speed identifying step, and in the mounting step, the holding unit is made to hold the plurality of components in accordance with the handling order, and the held plurality of components is mounted onto the board.

For example, if the holding unit would hold first a component having the lowest transportation speed limit, after that, in order to hold other components, the holding unit would need to move at the lowest transportation speed limit. In contrast, as described above, when the plurality of components are hold by the holding unit in accordance with the holding order determined in the determination step, the components are held sequentially starting at a component having the highest transportation speed limit. Accordingly, after holding the first component, the holding unit can rapidly move and hold other components without restriction by the lowest transportation speed limit. This improves throughput.

Furthermore, it is also possible that in the determination step, a mounting order for the plurality of components in the holding unit is determined as the handling order so that components are mounted sequentially starting from a component having the lowest transportation speed limit identified in the speed identifying step, and in the mounting step, the holding unit is made to hold the plurality of components, and the held plurality of components are mounted onto the board in accordance with the mounting order.

For example, if the holding unit would mount last a component having the lowest transportation speed limit, even after the mounting of the first component, the holding unit would need to move at the lowest transportation speed limit until the last component is mounted. In contrast, as described above, when the plurality of components are mounted in accordance with the mounting order determined in the determination step, the components are mounted sequentially starting at a component having the lowest transportation speed limit. Accordingly, after mounting the first component, the holding unit can rapidly move and mount other components without restriction by the lowest transportation speed limit. This improves throughput.

Furthermore, it is also possible that in the speed specifying step, a transportation speed limit for each component is specified by referring to speed information that indicates transportation speed limits for the plurality of components.

For example, when a memory that stores the speed information is prepared, the transportation speed limit of each component can be identified simply and rapidly.

Furthermore, it is also possible that in the speed specifying step, a transportation speed limit for each component is specified by referring to size information that indicates sizes of the plurality of components, so that the transportation speed of the holding unit is restricted to be lower for a component having a larger size. Furthermore, it is also possible that in the speed specifying step, a transportation speed limit for each component is specified by referring to thickness information that indicates thicknesses of the plurality of components, so that the transportation speed of the holding unit is restricted to be lower for a component having greater thickness.

Accordingly, even when information that directly indicates the transportation speed limit for each component is not present, the transportation speed limit for each component is specified based on the size information or the thickness information. Thus, it is possible to expand the applicability of the present invention and improve convenience.

Furthermore, it is also possible that in the speed specifying step, a transportation speed limit for each component is specified by referring to weight information that indicates weights of the plurality of components, so that the transportation speed of the holding unit is restricted to be lower for a component having greater weight.

Accordingly, even when information that directly indicates the transportation speed limit for each component is not present, the transportation speed limit for each component is specified based on the weight information. Thus, it is possible to expand the applicability of the present invention and improve convenience.

Furthermore, it is also possible that, in a component mounter in which a mounting head for holding and transporting a plurality of components mounts the plurality of components onto a board, and a component group to be mounted in one iteration of a repeated series of operations composed of pickup, transportation and mounting of the components performed by the mounting head is defined as a task, when an operation loss caused by a presence of a task in which the components have mutually different component transportation speed limits for the mounting head or by a presence of a task in which the components have mutually different component transportation acceleration limits for the mounting head is identified in the operation loss identifying step, a processing procedure is selected in the processing procedure selecting step, the selected processing procedure is a component mounting method of mounting a plurality of components onto a board by using a holding unit that holds and transports the plurality of components, and the component mounting method includes: an acceleration identifying step of identifying a transportation acceleration limit for the holding unit, corresponding to each of the plurality of components; a determination step of determining a handling order for the plurality of components in the holding unit based on the transportation acceleration limits so that a time duration that a component having a lower transportation acceleration limit, among the plurality of components, is held by the holding unit is reduced; and a mounting step of mounting the plurality of components onto the board by handling the plurality of components with the holding unit in accordance with the handling order determined in the determination step, and moving the holding unit with an acceleration not exceeding the lowest transportation acceleration limit of the components held by the holding unit.

Accordingly, even in the case where the holding unit is moved with an acceleration not exceeding the lowest transportation acceleration limit of the components held by the holding unit, when the plurality of components are handled by the holding unit in accordance with the handling order determined in the determination step, the time duration that a component having a low transportation acceleration limit is held by the holding unit is reduced, so that the transportation acceleration of the head can be increased. This reduces the time necessary for component mounting, and hence improves throughput. Further, since the holding unit is moved with an acceleration not exceeding the lowest transportation acceleration limit of the components held by the holding unit, the components are prevented from deviating or departing from the holding unit, so that the components can accurately be mounted onto the board.

Furthermore, it is also possible that when an operation loss caused by an interference, which is a collision between components or between a component and a mounting head that can occur when a component mounter provided with a mounting head mounts a component on a board, is identified in the operation loss identifying step, a processing procedure is selected in the processing procedure selecting step, the selected processing procedure is a component mounting order determination method of determining mounting order in the case where components are mounted onto a board by a component mounter provided with a mounting head that picks up and transports a plurality of components so as to mount the plurality of components onto the board, and the component mounting order determination method includes: a mounting order determining step of determining a mounting order onto the board based on a restriction condition concerning a before-after relation in the mounting order for the components; and a task order determining step of dividing all components into tasks in a state where the mounting order determined in the mounting order determining step is maintained, and determining a mounting order for the divided tasks, in the case where a component group to be mounted in one iteration of a repeated series of operations composed of pickup, transportation and mounting of the components performed by the mounting head is defined as a task. In other words, the mounting order for the components onto the board is determined first, and tasks and task order are determined next.

Accordingly, in the mounting order determining step, the mounting order can be determined so that interference, which is collision between components or between a component and the mounting head that could occur when the components are mounted onto the board does not occur. Thus it is possible to avoid, for example, interference caused by arch motion operation of the mounting head.

Furthermore, it is preferable that in the mounting order determining step, for each component, it is judged whether another component or a part of another component mounted on the board is present within a range of a moving space of the mounting head in the case where the mounting head mounts the component onto the board by arch motion operation, and when it is judged as being present, the mounting order is determined so that the component being judged is mounted before the another component.

More specifically, in the mounting order determining step, a sequence of component groups may be generated as the mounting order by repeating a process in which, based on the judgment result, a group of components to be mounted first is specified as a first component group, and a group of components to be mounted next among the components excluding the first component group is specified as a second component group. Accordingly, as long as the components are mounted in accordance with the sequence of the component groups, interference caused by arch motion operation is avoided.

Here, it is preferable that in the mounting order determining step, a three-dimensional map that shows three-dimensional positions and shapes of the components mounted on the board is generated, and a group of components to be mounted first is specified as a first component group, in the generated three-dimensional map, based on the judgment result. Accordingly, the mounting order can be determined so that components already mounted at the time of being carried into the component mounter are taken into consideration.

Further, in the task order determining step, it is preferable that the tasks and the mounting order for the tasks are determined for each component group determined in the mounting order determining step. This is because the mounting order determined in the mounting order determining step is maintained. Alternatively, the mounting head may have n pickup nozzles that pick up components. Then, in the task order determining step, component groups obtained by dividing into n-component groups the components arranged in accordance with the mounting order determined in the mounting order determining step and the sequence of these component groups may be determined as the tasks and the mounting order for the tasks, respectively. Also in this method, tasks and task order can simply be determined in a state that the mounting order determined in the mounting order determining step is maintained.

Further, the component mounting order determination method may further include a pickup order determining step of determining a pickup order when the mounting head picks up the components, for each task determined in the task order determining step. For example, the mounting head may have n pickup nozzles that pick up components. Then, in the task order determining step, a group of n components at maximum obtained by extracting each component one by one according to the sequence of components arranged in the component mounter may be determined as a task. Further, in the pickup order determining step, as for components arranged successively in the sequence of components among the components making up the task, the pickup order may be determined so that the mounting head picks them up simultaneously. Alternatively, in the task order determining step, a group of n components at maximum obtained by extracting components from the sequence of components arranged in the component mounter sequentially, starting with components of which a larger number are to be mounted onto the board may be determined as a task. Then, in the pickup order determining step, the pickup order may be determined so that the mounting head picks up the components sequentially starting with the components of which a larger number are to be mounted onto the board.

Further, in the mounting order determining step, in the case where the mounting onto the board includes three-dimensional mounting in which a second component is mounted onto a first component, the mounting order may be determined so that the first component is mounted before the second component. The three-dimensional mounting is in common with the above-mentioned interference in the point that a restriction is present in the mounting order for the components. Thus, the present invention is applicable also to this case.

Here, in addition to implementation as an operating time reducing method provided with such characteristic steps, the present invention may be implemented as an operating time reducing apparatus having means made up of the characteristic steps included in the operating time reducing method or alternatively as a program that causes a computer to execute the characteristic steps included in the operating time reducing method. Then, it goes without saying that such program may be distributed via a recording medium such as a CD-ROM (Compact Disc-Read Only Memory) and a communication network such as the Internet.

Effects of the Invention

According to the present invention, the processing procedure of a component mounting order determination method can be changed depending on the type of an operation loss that affects the time for mounting components onto the board.

Further, optimal component mounting order can be determined within a practical time.

BRIEF DESCRIPTION OF DRAWINGS

FIG. 12 is a diagram showing an example of a conversion table.

FIG. 15 is a diagram showing an example of a tact table.

FIG. 18 is a diagram showing an example of a mounting point array p.

FIG. 21 is a diagram showing a traveling path before and after component mounting order is changed.

FIG. 24 is a diagram describing another generating method for a mounting point information array "Data".

FIG. 26 is a table showing experimental results of a conventional method and a method according to the present application.

FIG. 34 is a diagram showing an example of a board.

FIG. 35 is a diagram describing a dummy point.

FIG. 37 is a diagram describing a calculation method for an "x'-coordinate" and a "y'-coordinate".

FIG. 40 is a diagram describing a pickup pattern in a priority-to-pickup manner.

FIG. 41 is a diagram describing a pickup pattern in a priority-to-mounting manner.

FIG. 44 is a schematic diagram in the case where a component mounter provided with a rotary head shown in FIG. 42 is viewed from the above.

FIG. 50 is a diagram describing component mounting performed by a component mounter.

FIG. 52 is a diagram showing an example of a component library.

FIG. 53 is a diagram showing an example of mounting apparatus information.

FIG. 54 is a diagram showing an example of number-of-mounting-points information.

FIG. 61 is a diagram describing details of task generation processing for a rear head.

FIG. 62 is a diagram in which the number of iterations of pickup in each task is arranged in task order.

FIG. 88 is a diagram showing an example of a component library held in the above-mentioned component mounter.

FIG. 97 is a diagram describing interference caused by arch motion operation.

FIG. 105 is a diagram describing processing of determining groups.

FIG. 107 is a diagram describing processing of determining tasks and mounting order for the tasks.

FIG. 110 is a diagram describing another method of determining tasks and task order.

FIG. 114 is a diagram showing an example of mounting point data.

FIG. 115 is a diagram showing an example of component data.

FIG. 120 is a diagram showing an example of a screen displayed on a display unit.

FIG. 121 is a diagram showing an example of a screen displayed on a display unit.

FIG. 122 is a diagram showing an example of a screen displayed on a display unit.

NUMERICAL REFERENCES

Figure 1:
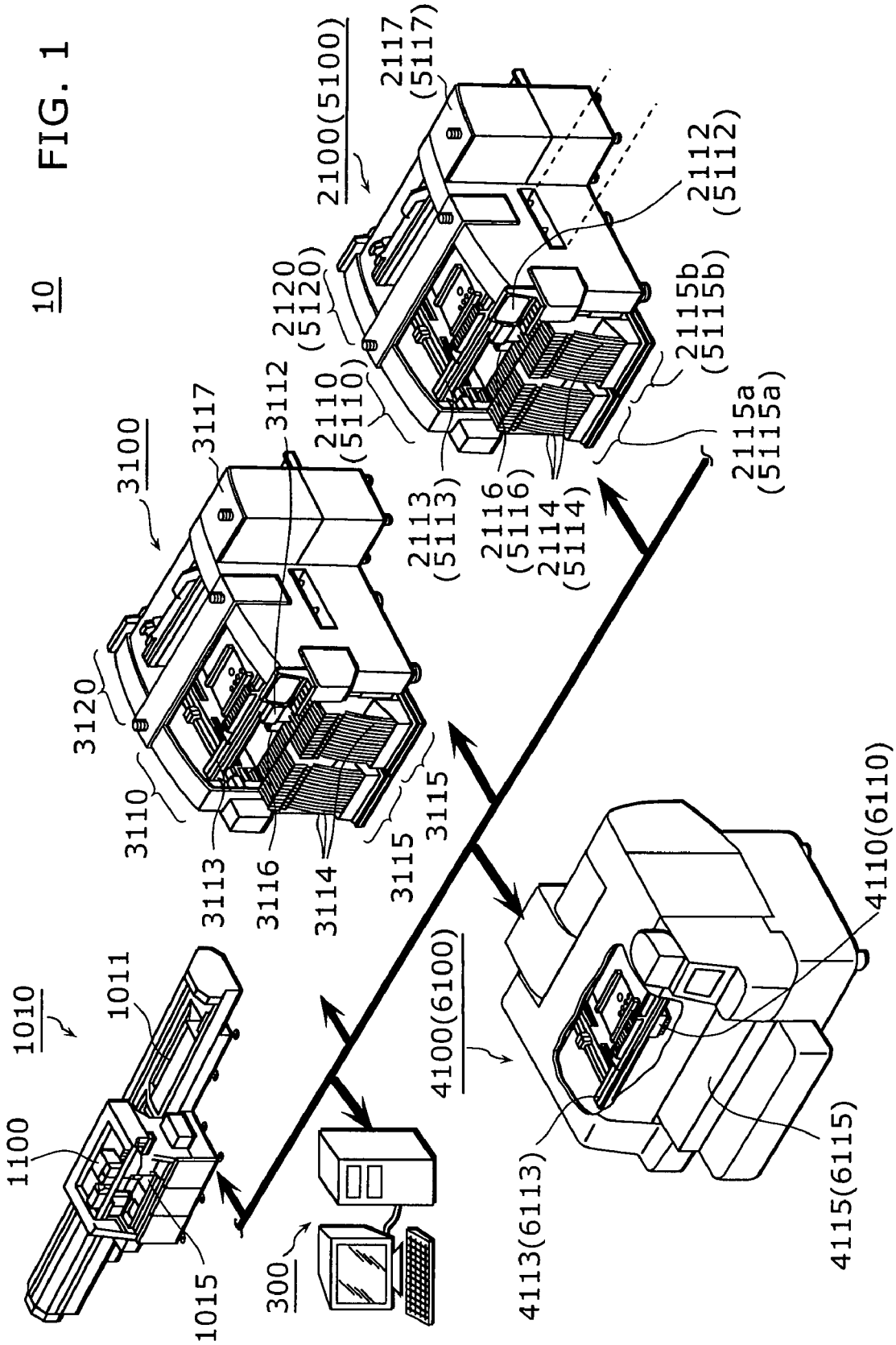
FIG. 1 is an external appearance view showing a configuration of a component mounting system according to an embodiment of the present invention.

300 Operating time reducing apparatus
301 Arithmetic control unit
305 Optimization method selection program storing unit
305a Operation loss identifying unit
305b Processing procedure selecting unit
308 Optimization program storing unit
308a First component mounting order determining unit
308b Second component mounting order determining unit
308c Third component mounting order determining unit
308d Fourth component mounting order determining unit
308e Fifth component mounting order determining unit
308f Sixth component mounting order determining unit
1010 Component mounter
1011 Component supply unit
1015 Table
1020 Board
1100 Rotary head 1101 Rotary base
1103 Mounting head
1105a Lens barrel
1105b Small view-field camera
1105c Large view-field camera
1105 Component recognition camera
1106 Components
1107b Half mirror
1107a Mirror
1110 Component tape
1111 Component cassette
1112 Adsorption opening
1113 Reel
1114 Tape feeder
1300 Component mounting order determining apparatus
1301 Arithmetic control unit
1302 Display unit
1303 Input unit
1304 Memory unit
1305 Component mounting order determination program storing unit
1306 Communication I/F unit
1307 Database unit
1307a Mounting point information array
1307b Conversion table
1402, 1404 Board mark
1406 Dummy point
3100, 3200 Component mounter
3110a, 3110b, 3120a, 3120b Sub-equipment
3112 Line gang pickup head
3112a, 3112b, 3403 Pickup nozzle
3113 Beam
3114 Component cassette
3115, 3115a to 3115d Component supply unit
3116 Component recognition camera
3117 Tray supply unit
3121 Rail
3300 Optimization apparatus
3301 Arithmetic control unit
3302 Display unit
3303 Input unit
3304 Memory unit
3305 Optimization program storing unit
3305c Mounting order optimizing unit
3306 Communication I/F unit
3307 Database unit
3307a Mounting point data
3307b Component library
3307c Mounting apparatus information
3307d, 3307f, 3307g Mounting mark information
3412 Adsorption opening
4100 Component mounter
4110 Mounting head
4113 XY robot
4114 Tape feeder
4115 Component supply unit
4115a to 4115c Component supply unit
4116 Component tape
4116a, 4116b Component supply position
4117 Supply reel
4118 Component supply position
4119 Nozzle station
4120a, 4120b Board
4121 Rail
4123 Component collecting apparatus
4300 Component mounting order determining apparatus
4301 Arithmetic control unit
4302 Display unit
4303 Input unit
4304 Memory unit
4305 Optimization program storing unit
4305a Task order foreword determining unit
4305b Component supply position determining unit
4305c Mounting order optimizing unit
4306 Communication I/F unit
4307 Database unit
4307a Mounting point data
4307b Component library
4307c Mounting apparatus information
4307d Task time information
5100 Component mounter
5110 Front sub-equipment
5112 Head
5112a Nozzle
5115a, 5115b Component supply unit
5120 Rear sub-equipment
5200 Component mounter
5300 Management apparatus
5307b Component library
6100 Component mounter
6110 Mounting head
6113 XY robot
6115 Component housing unit
6115a Component cassette
6121 Transportation unit
6122 Board
6123 Three-dimensional camera
6200 Mechanism unit
6210 Mounting control unit
6220 Input unit
6230 Output unit
6240 Storage unit
6241 Mounting point data
6242 Units data
6243 Mounting order data
6250 Mounting order determining unit
6251 Mounting order determining unit
6252 Task order determining unit
6253 Pickup order determining unit
6260 Communication I/F unit

DETAILED DESCRIPTION OF THE INVENTION

A component mounting system according to an embodiment of the present invention is described below with reference to the drawings.

FIG. 1 is an external appearance view showing a configuration of a component mounting system according to the present embodiment.

A component mounting system 10 is a system in which a mounting order for mounting components onto a board is determined and the components are mounted onto the board in accordance with the determined mounting order. The component mounting system 10 includes a component mounter 1010, a component mounter 3100, a component mounter 2100, a component mounter 5100, a component mounter 4100, a component mounter 6100, and an operating time reducing apparatus 300.

The component mounters 1010, 3100, 2100, 5100, 4100 and 6100 are apparatuses that mount components onto a board. Detailed configuration of each component mounter is described later.

Figure 2:
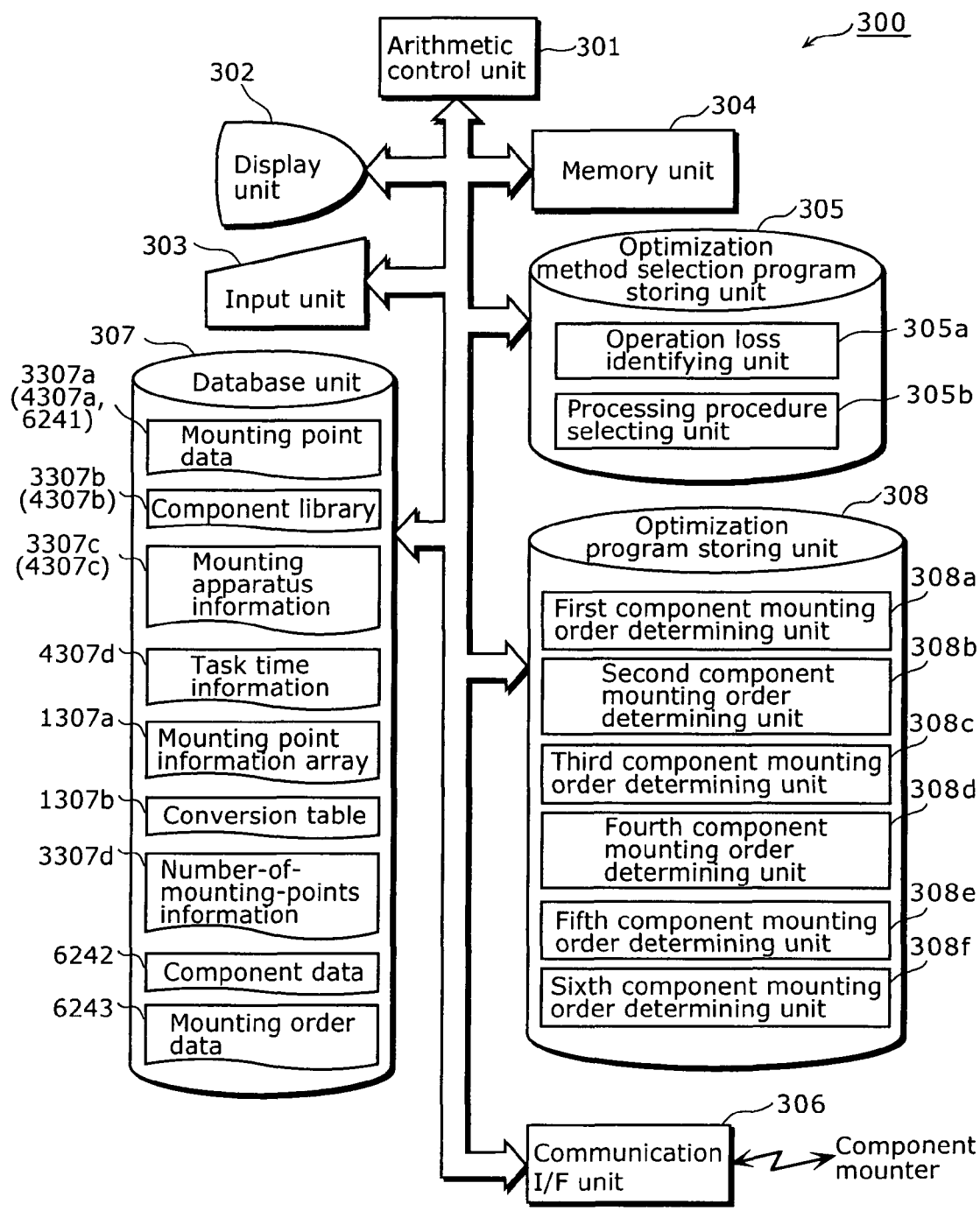
FIG. 2 is a functional block diagram showing a configuration of an operating time reducing apparatus.

FIG. 2 is a functional block diagram showing a configuration of an operating time reducing apparatus 300.

The operating time reducing apparatus 300 is a computer that reduces the operating time of the component mounters by reducing the component mounting time of the component mounters. The operating time reducing apparatus 300 includes an arithmetic control unit 301, a display unit 302, an input unit 303, a memory unit 304, an optimization method selection program storing unit 305, an optimization program storing unit 308, a database unit 307, and a communication I/F (interface) unit 306, and so on.

The operating time reducing apparatus 300 is implemented when a general-purpose computer such as a personal computer executes various programs stored in the optimization method selection program storing unit 305 and various programs stored in the optimization program storing unit 308.

The arithmetic control unit 301 is a CPU (Central Processing Unit), a numerical processor or the like. In response to an instruction from the component mounters connected via the communication I/F unit 306 or from a user, the arithmetic control unit 301 loads a program from the optimization method selection program storing unit 305 or the optimization program storing unit 308 onto the memory unit 304, and executes the loaded program so as to control the respective constituent units 302 to 308 in accordance with the execution result.

The display unit 302 is a CRT (Cathode-Ray Tube), an LCD (Liquid Crystal Display) or the like, while the input unit 303 is a keyboard, a mouse and the like. These units are used for interactive operation or the like between the operating time reducing apparatus 300 and an operator, under the control of the arithmetic control unit 301.

The communication I/F unit 306 is a LAN (Local Area Network) adapter or the like, and is used for communication and the like between the operating time reducing apparatus 300 and the component mounters. The memory unit 304 is a RAM (Random Access Memory) or the like that provides a working area for the arithmetic control unit 301.

The optimization method selection program storing unit 305 and the optimization program storing unit 308 are hard disks that store various programs for implementing the function of the operating time reducing apparatus 300. When a program stored in the optimization method selection program storing unit 305 is executed by the arithmetic control unit 301, the program serves as an operation loss identifying unit 305a and a processing procedure selecting unit 305b. Further, when a program stored in the optimization program storing unit 308 is executed by the arithmetic control unit 301, the program serves as a first component mounting order determining unit 308a, a second component mounting order determining unit 308b, a third component mounting order determining unit 308c, a fourth component mounting order determining unit 308d, a fifth component mounting order determining unit 308e and a sixth component mounting order determining unit 308f.

The operation loss identifying unit 305a is a processing unit that identifies an operation loss to be resolved in the component mounters. The processing procedure selecting unit 305b is a processing unit that, based on the operation loss identified by the operation loss identifying unit 305a, selects a program which is a processing procedure for reducing the operating time of the component mounters from the programs stored in the optimization program storing unit 308.

The processing executed by the first component mounting order determining unit 308a, the second component mounting order determining unit 308b, the third component mounting order determining unit 308c, the fourth component mounting order determining unit 308d, the fifth component mounting order determining unit 308e and the sixth component mounting order determining unit 308f is described later.

The database unit 307 is a hard disk that stores, for example: input data used for operating time reduction processing for the component mounters by the operating time reducing apparatus 300; and mounting point data generated in the operating time reduction processing.

The input data stored in the database unit 307 includes mounting point data 3307a (4307a, 6241), a component library 3307b (4307b), mounting apparatus information 3307c (4307c), task time information 4307d, a mounting point information array 1307a, a conversion table 1307b, number-of-mounting-points information 3307d, component data 6242 and mounting order data 6243. Details of such input data are described later.

Figure 3:
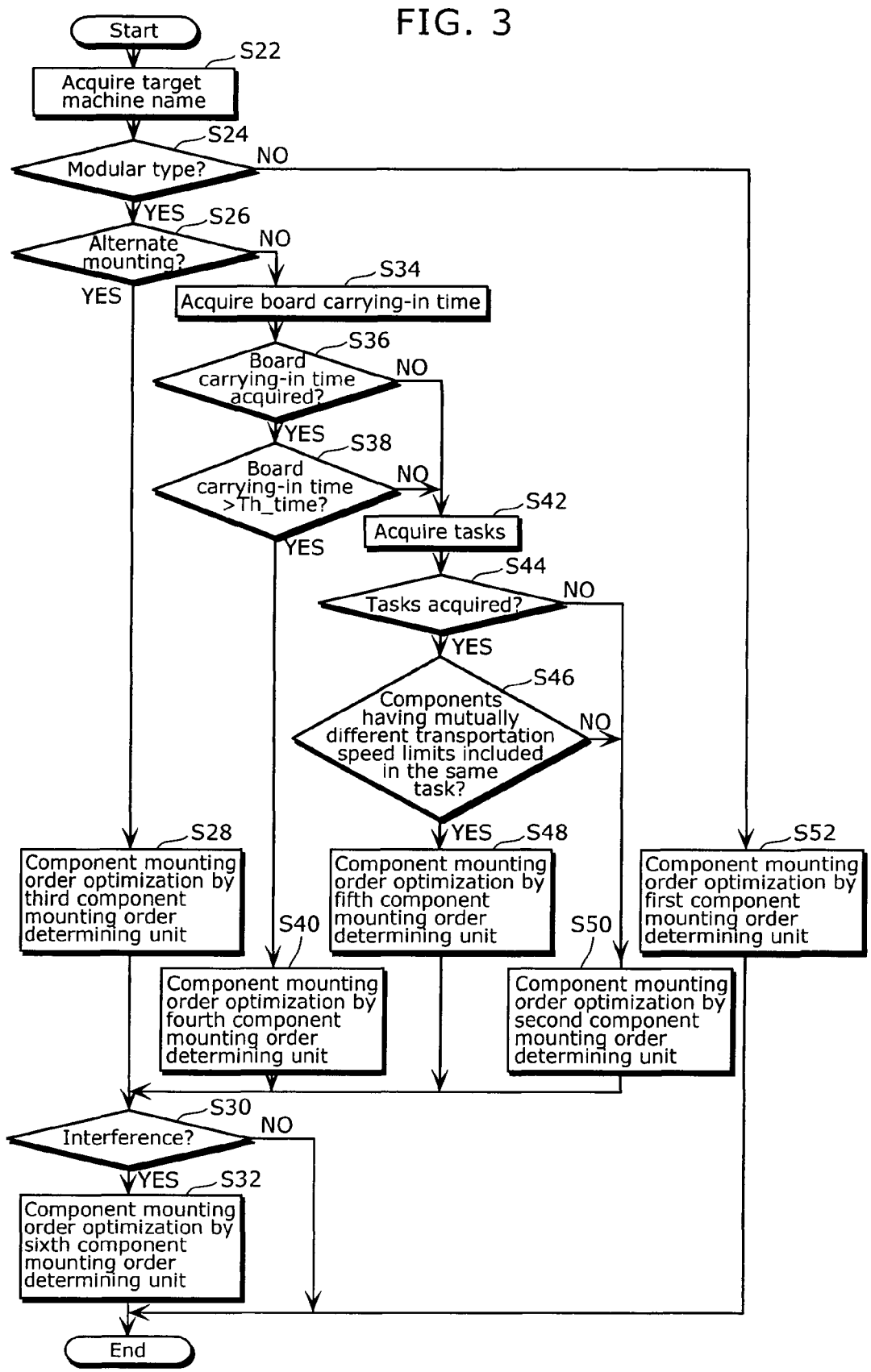
FIG. 3 is a flow chart of processing executed by an operating time reducing apparatus.

FIG. 3 is a flow chart of processing executed by the operating time reducing apparatus 300.

The operation loss identifying unit 305a acquires, via the communication I/F unit 306, the machine name of a component mounter from the component mounter in which a production loss or the like is generated (S22). Based on the acquired machine name, the operation loss identifying unit 305a judges whether or not the component mounter having the machine name is a so-called modular type component mounter (S24). Here, "modular type component mounter" refers to a component mounter of a type in which a mounting head that holds components moves and mounts the components onto a board.

When the component mounter is not of modular type (NO in S24), the component mounter is of a rotary type. Thus, the processing procedure selecting unit 305b selects from the optimization program storing unit 308 a program for implementing the first component mounting order determining unit 308a, and loads it to the memory unit 304. When the arithmetic control unit 301 executes the program, the first component mounting order determining unit 308a optimizes the component mounting order based on the traveling path that includes the component mounting points (S52). Then, the processing is completed. Here, "rotary type component mounter" refers to a component mounter provided with a rotary head that picks up components and mounts the components onto a board, while rotating about an axis. Here, the processing executed by the first component mounting order determining unit 308a is described later.

When the component mounter is of modular type (YES in S24), the operation loss identifying unit 305a judges whether or not the component mounter which is the target of operating time reduction is a so-called alternate mounting component mounter (S26). Here, "alternate mounting component mounter" refers to a component mounter in which a plurality of mounting heads performs coordinated operation so as to mount components onto one board.

When the component mounter is of modular type and of alternate mounting (YES in S26), the processing procedure selecting unit 305b selects from the optimization program storing unit 308 a program for implementing the third component mounting order determining unit 308c, and loads it to the memory unit 304. When the arithmetic control unit 301 executes the program, the third component mounting order determining unit 308c optimizes the component mounting order in accordance with an optimization method specific to a component mounter of modular type and of alternate mounting (S28). The processing executed by the third component mounting order determining unit 308c is described later.

Subsequently, the operation loss identifying unit 305a acquires, from the component mounter, information concerning whether or not interference, which is the collision between components or between a component and the mounting head, occurs when the component mounter, which is the target of operating time reduction, mounts the components onto the board. When interference occurs (YES in S30), the processing procedure selecting unit 305b selects from the optimization program storing unit 308 a program for implementing the sixth component mounting order determining unit 308f, and loads it to the memory unit 304. When the arithmetic control unit 301 executes the program, the sixth component mounting order determining unit 308f optimizes the component mounting order such as to resolve the interference (S32). Then, the processing is completed. The processing executed by the sixth component mounting order determining unit 308f is described later.

When interference does not occur (NO in S30), the processing is completed without performing the optimization processing for the component mounting order by the sixth component mounting order determining unit 308f.

When the component mounter is of modular type but not of alternate mounting (NO in S26), the operation loss identifying unit 305a transmits to the component mounter a command for acquiring the board carrying-in time (S34). Here, "board carrying-in time" refers to the time duration from after the completion of mounting components onto the board until the time that the next board is carried in to the board stop position in the component mounter.

When the board carrying-in time is acquired from the component mounter (YES in S36), the operation loss identifying unit 305a judges whether the acquired board carrying-in time is greater than a predetermined threshold Th_time (S38). When the value is greater than the predetermined threshold (YES in S38), the processing procedure selecting unit 305b selects from the optimization program storing unit 308 a program for implementing the fourth component mounting order determining unit 308d, and loads it to the memory unit 304. When the arithmetic control unit 301 executes the program, the fourth component mounting order determining unit 308d performs optimization processing (processing of reducing the operating time) on the component mounting order so as to minimize the loss time caused by the board carrying-in (S40). After that, processing subsequent to S30 is performed. The processing executed by the fourth component mounting order determining unit 308d is described later.

When the board carrying-in time is not successfully acquired (NO in S36) or alternatively when board carrying-in time ≦threshold Th_time (NO in S38), the operation loss identifying unit 305a transmits to the component mounter a command for acquiring tasks in the component mounter (S42). Here, "task" refers to a component group mounted in one iteration of a repeated series of operations composed of pickup, transportation and mounting of components performed by the mounting head.

When the tasks are acquired from the component mounter (YES in S44), the operation loss identifying unit 305a checks, for each task, whether or not components having mutually different transportation speed limits are included in the same task (S46). Here, "transportation speed limit" refers to the maximum speed of the mounting head when a component is picked-up.

When components having mutually different transportation speed limits are included in the same task (YES in S46), the processing procedure selecting unit 305b selects from the optimization program storing unit 308 a program for implementing the fifth component mounting order determining unit 308e, and loads it to the memory unit 304. When the arithmetic control unit 301 executes the program, the fifth component mounting order determining unit 308e performs optimization processing for the component mounting order so as to reduce the component mounting time with attention being given to the transportation speed limit (S48). Then, processing subsequent to S30 is performed. The processing executed by the fifth component mounting order determining unit 308e is described later.

When the task is not successfully acquired (NO in S44) or alternatively when all speed limits of the components within the same task are the same (NO in S46), the processing procedure selecting unit 305b selects from the optimization program storing unit 308 a program for implementing the second component mounting order determining unit 308b, and loads it to the memory unit 304. When the arithmetic control unit 301 executes the program, the second component mounting order determining unit 308b optimizes the component mounting order based on the traveling path that includes the component mounting points (S50). Then, processing subsequent to S30 is performed. The processing executed by the second component mounting order determining unit 308b is described later.

The processing executed by the first component mounting order determining unit 308a through the sixth component mounting order determining unit 308f are described below.

[First Component Mounting Order Determining Unit 308a]

The component mounter controlled by the first component mounting order determining unit 308a is a component mounter 1010 of rotary type shown in FIG. 1.

The component mounter 1010 is a mounting apparatus that mounts plural kinds of components at high speeds onto a printed circuit board that makes up an electronic apparatus. The component mounter 1010 includes: a rotary head 1100 that picks up, transports and mounts components; a component supply unit 1011 that supplies various kinds of components to the rotary head 1100; and an XY table 1015 that moves, in the horizontal plane directions, a printed circuit board placed thereon.

Figure 4:
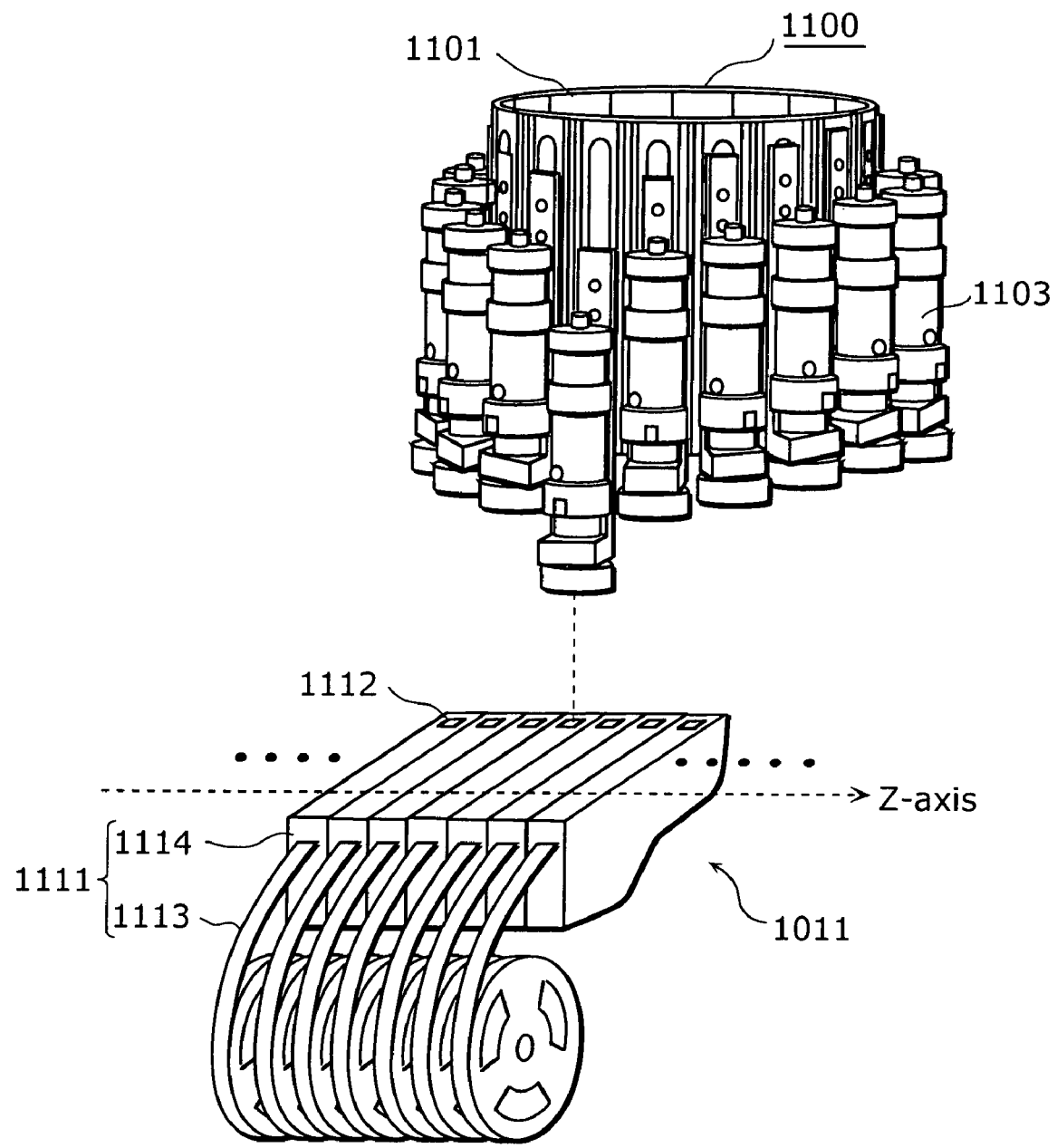
FIG. 4 is a schematic diagram showing positional relation between a component supply unit and a rotary head.

FIG. 4 is a schematic diagram showing the positional relation between a component supply unit and a rotary head.

As shown in the upper part in FIG. 4, the rotary head 1100 has mounting heads 1103 each serving as mounting means for mounting components onto a printed circuit board. Further, the mounting head 1103 has six pickup nozzles (not shown) which are attached, in a manner freely movable in the height directions, to a rotary base 1101 that rotates without moving in the height directions, and which can hold components by vacuum suction.

As shown in the lower part in FIG. 4, the component supply unit 1011 has component cassettes 1111 that are aligned horizontally in a row and that can provide components of the same type sequentially to the mounting head 1103. Then, the component supply unit 1011 has the function of moving and positioning the component supply unit 1011 relative to the rotary head 1100 in the Z-axis directions in FIG. 4 so as to select the component to be mounted.

Figure 5:
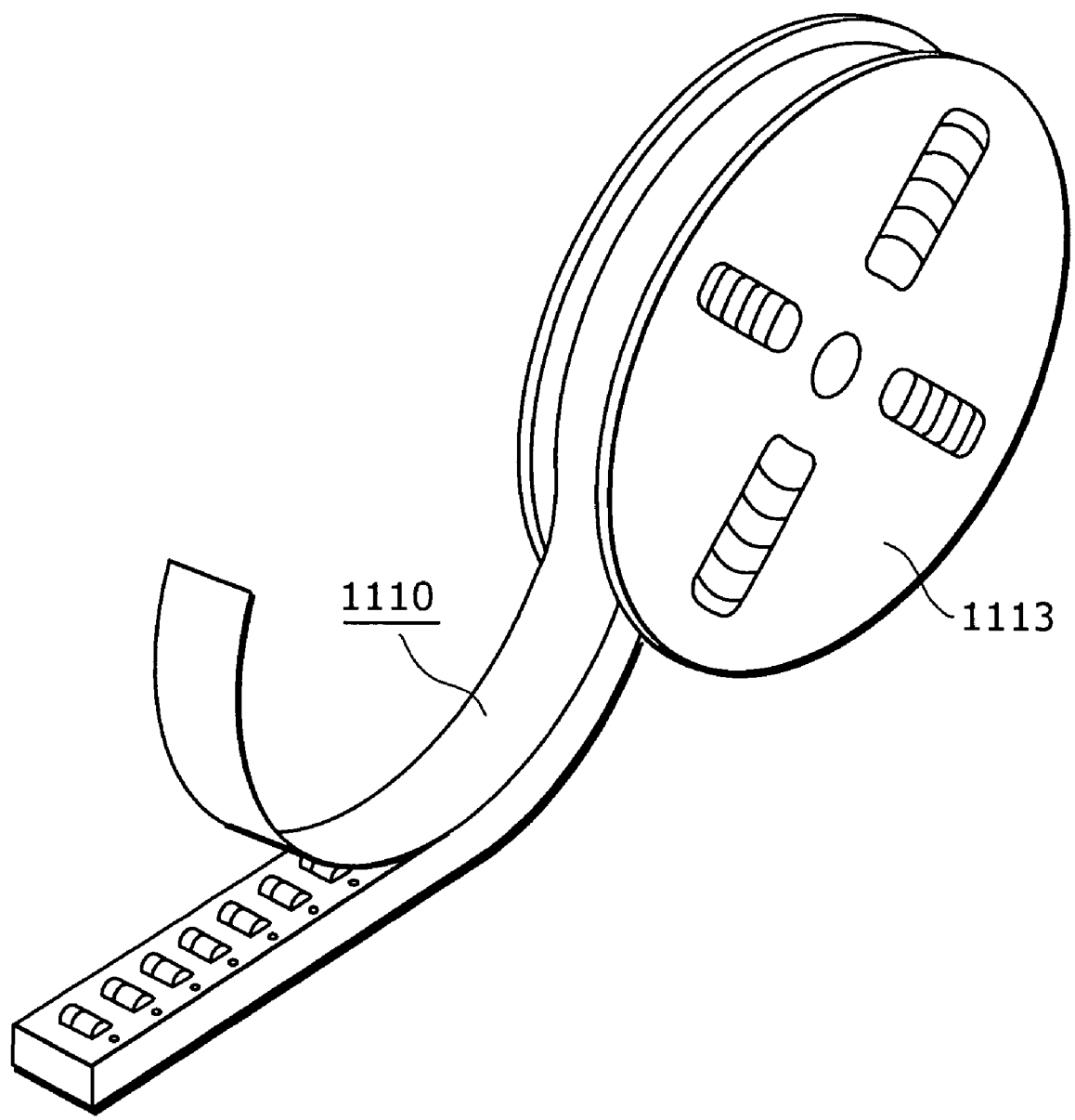
FIG. 5 is an external appearance view of a reel around which a component tape that holds components is wound.

As shown in FIG. 5, the component cassette 1111 includes: a reel 1113 around which a component tape 1110 that holds a large number of components of the same type is wound; and a tape feeder 1114 that sequentially supplies the components held on the component tape 1110. The component cassette 1111 can be attached to and detached from the component supply unit 1011. That is, the component cassette 1111 corresponds to a unit that provides one kind of component, while the component supply unit 1011 corresponds to a set of the component cassettes 1111 (this may also include an housing unit that holds the set).

Figure 6:
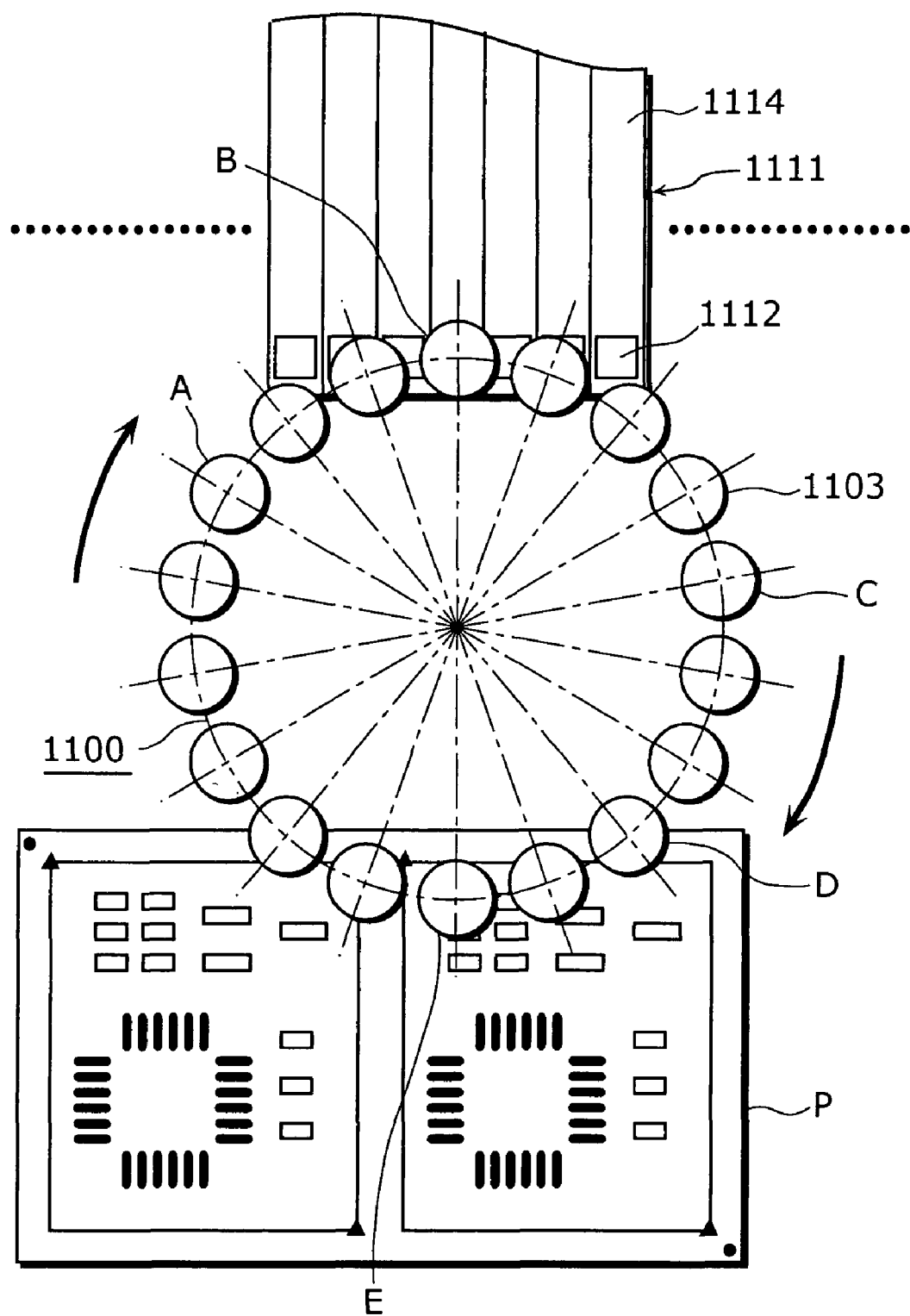
FIG. 6 is a diagram schematically showing positional relation among a rotary head, a board and a component supply unit.

FIG. 6 is a diagram schematically showing the positional relation among a rotary head, a board and a component supply unit.

As shown in the figure, the revolution axis of the rotary head 1100 does not move, while the mounting head 1103 provided around the revolution axis rotates intermittently about the revolution axis, so that work corresponding to each position is performed. Explained briefly, the mounting head 1103 located above a pickup opening 1112 (position B) provided in each component cassette 1111 picks up a component through the pickup opening 1112. Then, when located at the opposite position E, the mounting head 1103 mounts the picked-up component onto the printed circuit board P.

Here, the printed circuit board P onto which the components are to be mounted is placed on an XY table (not shown) that can move freely in the horizontal plane directions. The position at which the component is to be mounted is determined by moving the printed circuit board P.

Figure 7:
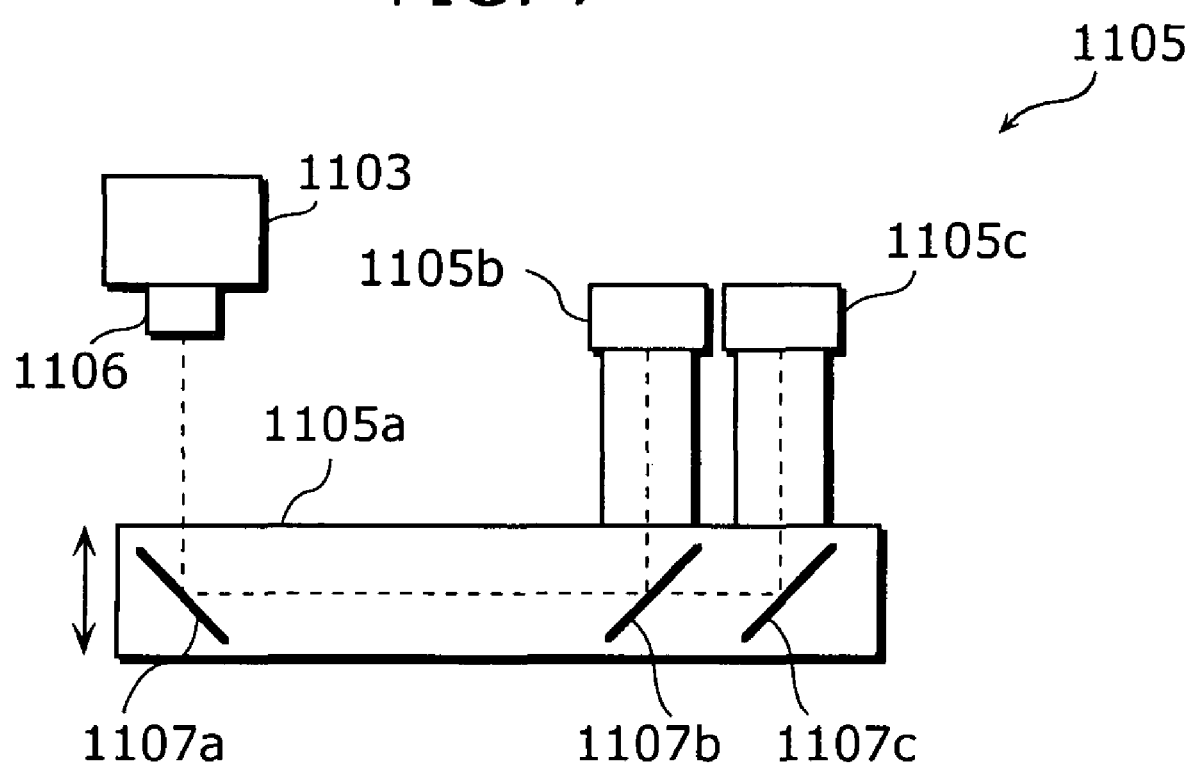
FIG. 7 is a diagram showing an example of a component recognition camera provided at position C in FIG. 6.

FIG. 7 is a diagram showing an example of a component recognition camera provided at position C in FIG. 6.

A component recognition camera 1105 is a camera for recognizing a component 1106 picked up by the mounting head 1103, and includes a lens barrel 1105*a*, a small view-field camera 1105*b* and a large view-field camera 1105*c*. Mirrors 1107*a* and 1107*c* and a half mirror 1107*b* are provided inside the lens barrel 1105*a*.

The small view-field camera 1105*b* is a camera having a view field size of 6 mm, and acquires an image of the component 1106 reflected by the mirror 1107*a* and the half mirror 1107*b*. The large view-field camera 1105*c* is a camera having a view field size of 28 mm, and acquires an image of the component 1106 reflected by the mirrors 1107*a* and 1107*c*.

Figure 8:
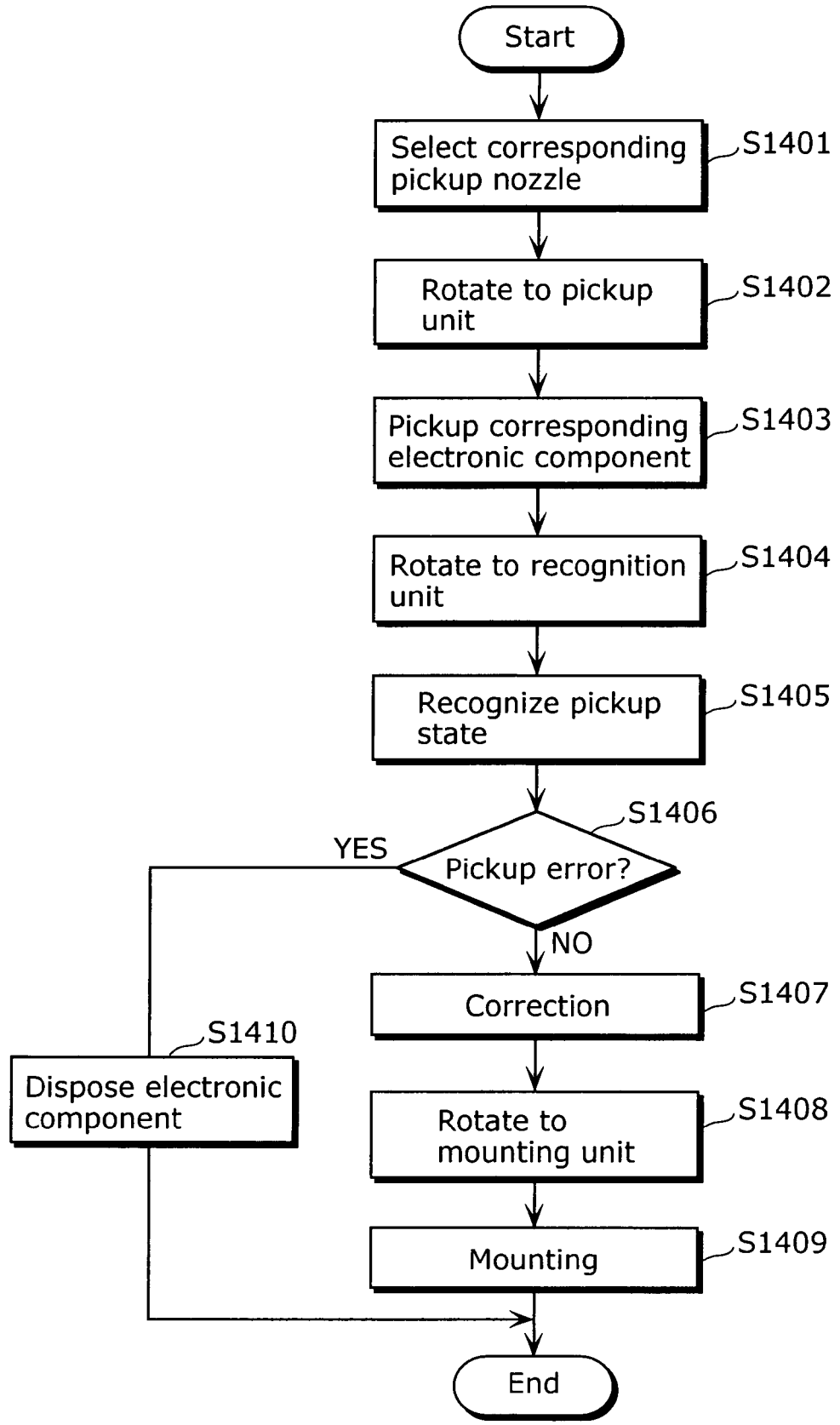
FIG. 8 is a flow chart showing operation of a mounting head in the case where attention is focused on one of mounting heads provided in a rotary head.

FIG. 8 is a flow chart showing operation of a mounting head 1103 in the case where attention is focused on one of the mounting heads 1103 provided in the rotary head 1100.

The mounting head 1103 located at a pickup nozzle selection position (position A in FIG. 6) selects a pickup nozzle suitable for the next component to be mounted (S1401). Then, the rotary base 1101 is rotated until the mounting head 1103 is located at the pickup unit (position B in FIG. 6) (S1402). At this position, the mounting head 1103 picks up and holds a component from the pickup opening 1112 of the component cassette 1111 by using the pickup nozzle (S1403).

Then, the rotary base 1101 is rotated until the mounting head 1103 is located at the component recognition camera 1105 (position C in FIG. 6) (S1404). Then, the small view-field camera 1105*b* or the large view-field camera 1105*c* provided at this position acquires an image of the component having been picked up and transported. Then, image processing is performed so that the pickup state of the component is recognized (S1405). In the recognition of the pickup state, the amount of two-dimensional deviation of the center of the component relative to the center of the pickup nozzle and the amount of rotational deviation of the component are detected. Further, judgment of component deficiency, pickup orientation error, recognition error (recognition processing is unsuccessful) and the like is performed. Then, when the pickup state is judged as having an error such as a component deficiency (YES in S1406), the picked-up component is discarded (S1410). On the other hand, when it is judged that there is no error (NO in S1406), the component is corrected in the θ-direction based on the above-mentioned amount of rotational deviation detected at position D shown in FIG. 6 (S1407). Here, as for the amount of two-dimensional deviation, the position of the printed circuit board is finely adjusted by the XY table 1015 so that correction is achieved. Then, the rotary base 1101 is rotated until the mounting head 1103 is located at the mounting unit (position E in FIG. 6) (S1408). Then, the mounting head 1103 is lowered in accordance with the height of the component to be mounted, and thereby pushes the component in and mounts it onto the printed circuit board P (S1409).

Figure 9A:
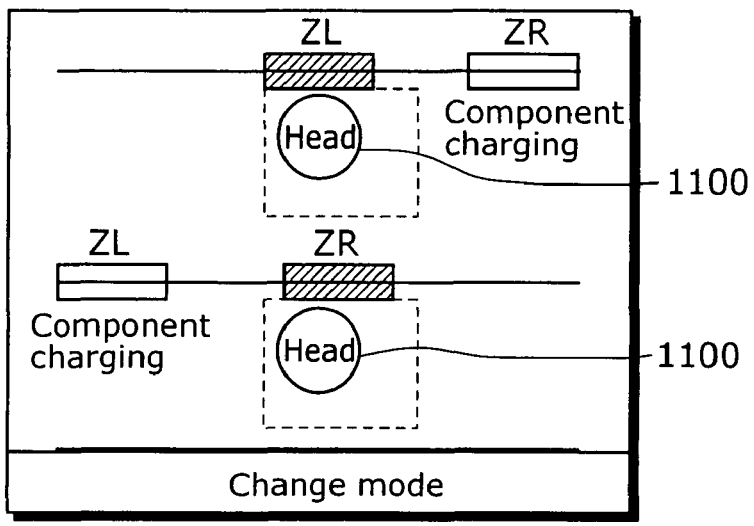
FIG. 9 is a diagram describing various modes of a component supply unit.
Figure 9B:
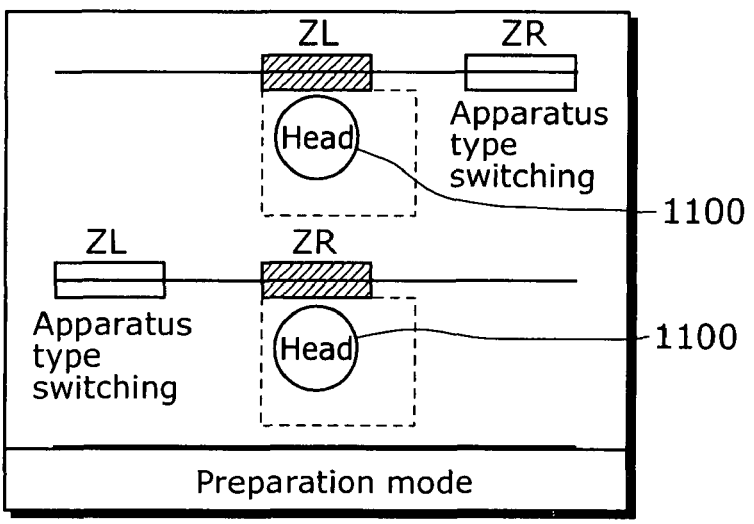
Figure 9C:
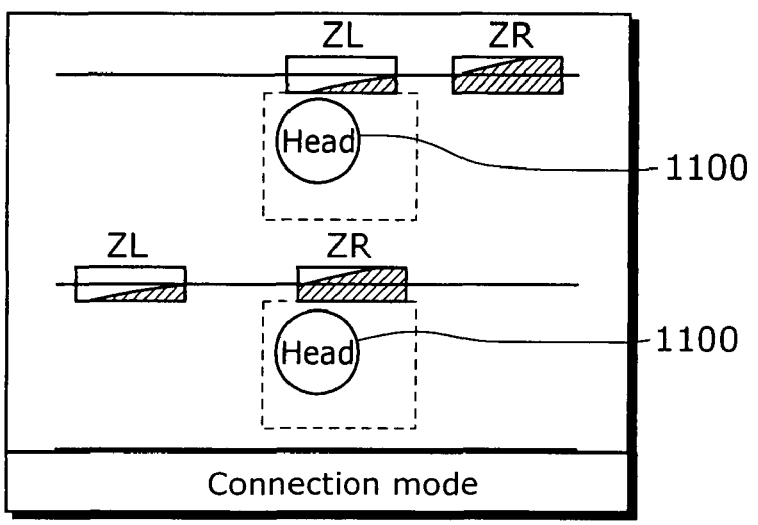

FIG. 9 is a diagram describing various modes of the component supply unit 1011. FIG. 9(*a*) is a diagram showing a change mode. As shown in the figure, the component supply unit 1011 has a left-side component supply unit ZL and a right-side component supply unit ZR. In the change mode, components of the same kind are set up in the left-side component supply unit ZL and the right-side component supply unit ZR. Then, for example, when components have run out during the production of a board by using the left-side component supply unit ZL, the right-side component supply unit ZR located at a waiting position is moved to the pickup position for the rotary head 1100, so that the board production is continued by using the right-side component supply unit ZR. Then, during this time, the left-side component supply unit ZL is replenished with the components of the kind that has run-out. In this manner, by having the same component make-up for the right-side component supply unit ZR and the left-side component supply unit ZL, long-term continuous operation of the component mounter 1010 becomes possible.

FIG. 9(*b*) is a diagram showing a preparation mode. In this mode, for example, during the production of a board by using the left-side component supply unit ZL, mounting components for the board to be produced next are set up in the right-side component supply unit ZR, so that switching of boards to be produced can be handled in advance. This mode is most suitable for the case where the type of board to be produced is switched frequently.

FIG. 9(*c*) is a diagram showing a connection mode. In this mode, for example, both the right-side component supply unit ZR and the left-side component supply unit ZL are used to produce a board. This mode is suitable in a case where a large number of component types are used in one board.

Figure 10:
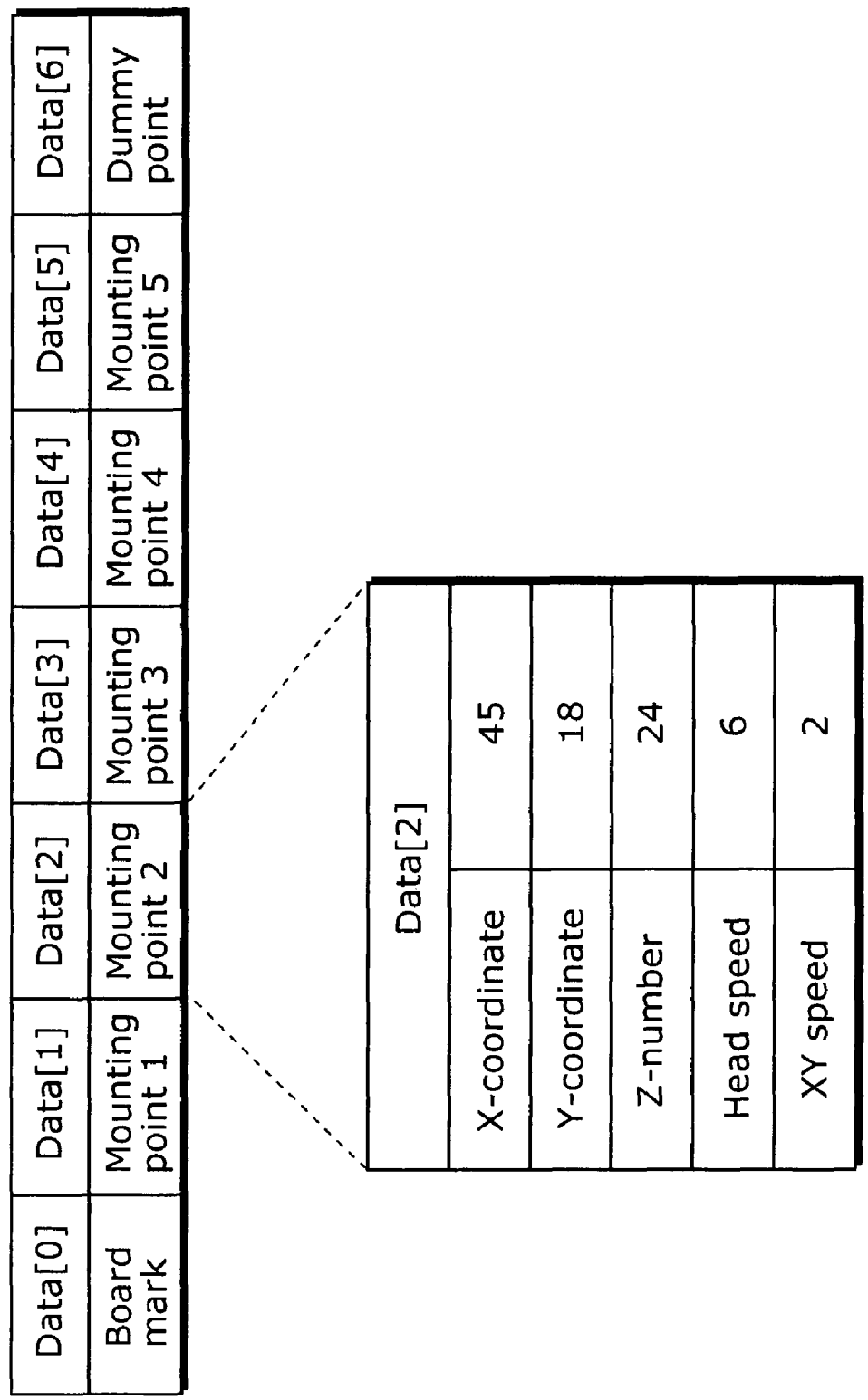
FIG. 10 is a diagram showing an example of a mounting point information array.

FIG. 10 is a diagram showing an example of the mounting point information array 1307*a*.

When the number of mounting points on the board 1020 is n, the mounting point information array 1307*a* is an array having N (=n+2) data elements.

Figure 11:
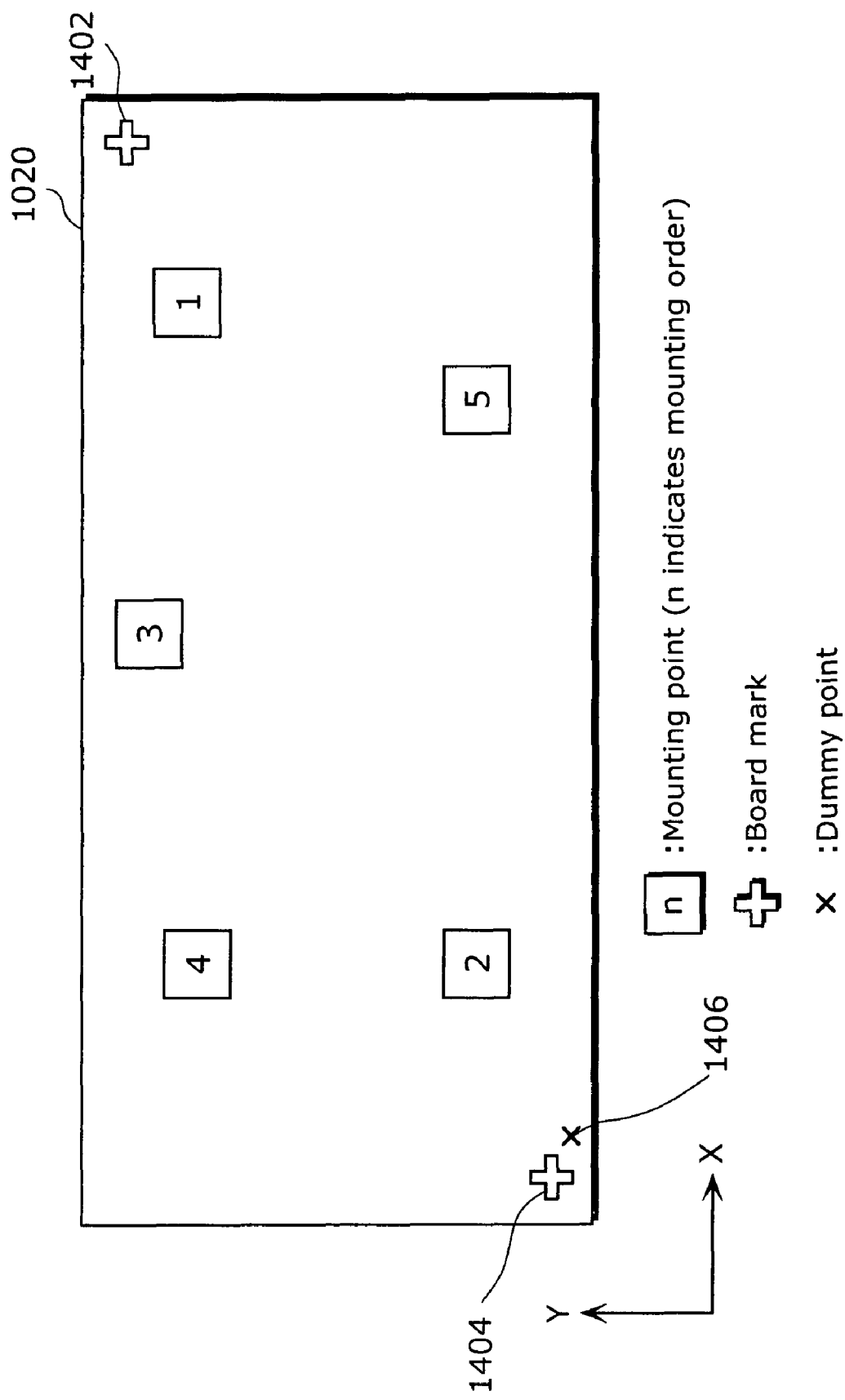
FIG. 11 is a diagram showing positional relation among the mounting points, board marks and a dummy point on a board.

Here, as shown in FIG. 11, it is assumed that two board marks 1402 and 1404 are formed on the board 1020 in advance while five mounting points (mounting point 1 through mounting point 5) are further provided on the board. The five mounting points are points where components are to be mounted by the component mounter 1010. An image of the board mark 1402 and the board mark 1404 is acquired by the board recognizing camera (not shown) provided in the rotary head 1100 for determining the positioning of the board 1020, and their positions are recognized. Here, it is assumed that the position of the board mark 1402 is recognized first while the position of the board mark 1404 is recognized next. In addition, a hypothetical point referred to as a dummy point 1406 is provided on the board 1020. The dummy point 1406 is provided near the board mark 1404 in the diagram. However, being a hypothetical point, the dummy point 1406 need not be provided on the board 1020 or alternatively may be located at the same position as the board mark 1404. Here, the board mark 1404 or alternatively the mounting point where the component is mounted first among the five mounting points is adopted as the start point of a closed circuit when the mounting order determination problem is modeled in the form of a closed circuit. The mounting order determination problem modeled in the form of a closed circuit is equivalent to a traveling salesman problem described later.

Referring to FIG. 10 again, each array element stores any one of information concerning the position and the like of a mounting point (referred to as "mounting point information", hereinafter), information concerning the position of the board mark, and information concerning the position of the dummy point. FIG. 10 shows the information stored in the second element Data[2] of the mounting point information array 1307a (Data). The element Data[2] stores the mounting point information of the mounting point 2, namely: the X-coordinate "45" and the Y-coordinate "18" that indicate the position of the mounting point 2 on the board 1020; the Z-axis position (Z-number) "24" in the component supply unit 1011 for the component cassette 1111 that holds the component to be mounted at the mounting point 2; the speed (head speed) "6" for the time after the mounting head 1103 picks up the component until the mounting of the component; and the transportation speed (XY speed level) "2" for the XY table.

The head speed is expressed in eight stages from level "1" to level "8". Level 1 indicates the highest head speed, while level 8 indicates the lowest head speed. That is, a heavy component or a large component cannot be mounted at a high head speed, and hence a lower head speed is adopted. Here, the head speed indicates the speed at which the rotary head 1100 rotates intermittently. Here, the rotary head 1100 rotates about the axis of rotation by a half turn between the time after picking up the component at position B in FIG. 6 (S1403 in FIG. 8) until mounting the component at position E in FIG. 6 (S1409 in FIG. 8). Thus, strictly speaking, the rotation speed of the rotary head 1100 is determined in accordance with the lowest head speed among the head speed values of the components picked up by the plurality of mounting heads 1103 located between position B and position E in FIG. 6. However, in this example, in order to simplify processing, it is assumed that the head speed is determined for each component without taking into consideration the head speed values of other components located between position B at which the rotary head 1100 picks up the component and position E at which the component is mounted.

The transportation speed of the XY table is expressed in eight stages from level "1" to level "8". Level 1 indicates the highest transportation speed of the XY table 1015, while level 8 indicates the lowest transportation speed of the XY table 1015. That is, in a case where the component to be mounted is a heavy component or a large component, if the transportation speed of the XY table 1015 were excessively high, the mounted component could be stripped off from the board 1020. Thus, in the case of such a component, the transportation speed of the XY table 1015 is set at a low transportation speed level.

Here, the information concerning the position of the board mark and the information concerning the position of the dummy point are assumed to also contain information similar to the mounting point information.

FIG. 12 is a diagram showing an example of a conversion table 1307b. The conversion table 1307b is a table for converting into time the head speed, the transportation speed of the XY table 1015, and the like. The first column indicates the time t (msec) after the conversion. The second column indicates the distance $\Delta xy$ between a mounting point i and a mounting point j. The third column indicates the Z-axis distance (absolute value of the difference of the Z-numbers) between the component cassette that holds the component to be mounted at the mounting point i and the component cassettes that holds the component to be mounted at the mounting point j. The fourth column indicates the head speed in the case where the mounting component j is to be mounted (that is, the level of the speed at which the rotary head 1100 rotates intermittently). The fifth column indicates the maximum value $W_{max(0 \to i)}$ among the values ranging from the transportation speed of the XY table 1015 for the first mounting point to the transportation speed of the XY table 1015 for the mounting point i. Here, the reason why the maximum value $W_{max(0 \to i)}$ of the transportation speed of the XY table 1015 is used as described here is that when a component having a low transportation speed of the XY table 1015 is once mounted onto the board 1020, if the XY table 1015 were moved at a transportation speed higher than that, a heavy component or a large component that is mounted onto the board 1020 could be stripped off from the board 1020 or alternatively positional deviation could arise. Therefore, when the transportation speed of the XY table 1015 is reduced once, the XY table 1015 should not be moved at a transportation speed higher than that.

For example, in the case where both the head speed and the XY speed level are 1 and the distance $\Delta xy$ from the mounting point to the mounting point j is 20, the time necessary for the movement is obtained to be 120 msec. Further, in the case where both the head speed and the XY speed level for the mounting point j are 3, the time necessary for the movement is obtained to be 140 msec.

Here, a value not listed in the conversion table 1307b can be obtained by performing linear interpolation or the like based on the already calculated values. For example, when the distance $\Delta xy$ exceeds 1103, the time $t_{xy}(\Delta xy)$ necessary for moving across the distance $\Delta xy$ is obtained by the following Formula (1).

$$t_{xy}(\Delta xy) = 500 + (\Delta xy - 103)/0.356 \quad (1)$$

Here, the other parameters are converted into time when similar interpolation formulas are obtained.

Figure 13:
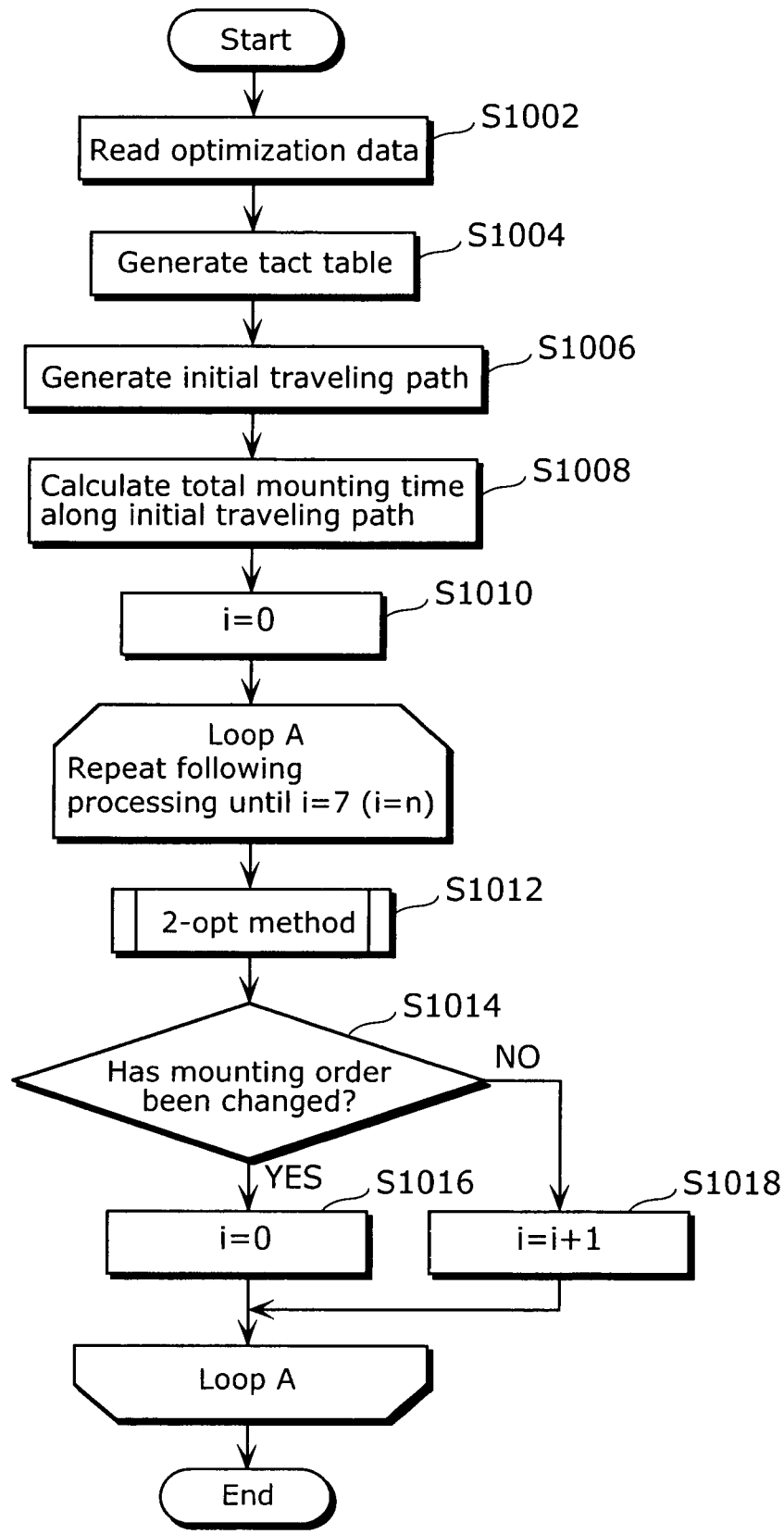
FIG. 13 is a flow chart of processing executed by a component mounting order determining apparatus.

FIG. 13 is a flow chart of processing executed by the first component mounting order determining unit 308a.

Figure 14:
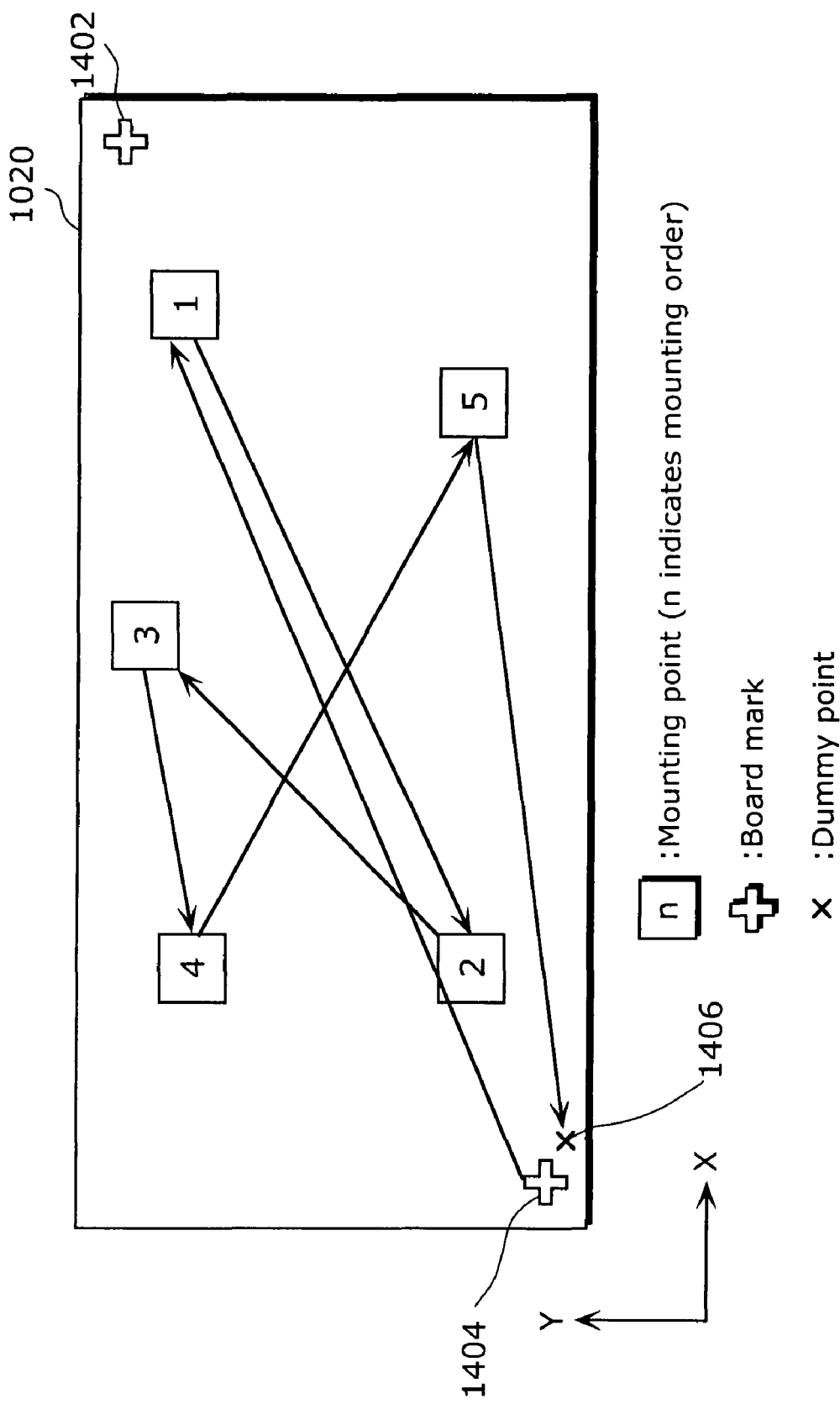
FIG. 14 is a diagram schematically showing mounting order for components.

The first component mounting order determining unit 308a reads the mounting point information array 1307a and the conversion table 1307b from the database unit 1307 (S1002). According to the mounting point information array 1307a shown in FIG. 10, mounting of the components is performed in the order indicated by arrows in FIG. 14.

Then, the first component mounting order determining unit 308a generates a tact table based on the mounting point information array 1307a and the conversion table 1307b that have been read out (S1004). The tact table is a table that lists the time necessary after the mounting of a component at a mounting point i until the mounting of a component at a mounting point j.

FIG. 15 is a diagram showing an example of a tact table. Here, the board mark 1404 is defined as a mounting point 0, while the dummy point 1406 is defined as a mounting point 6. The mounting time $t_{ij}$ necessary from the mounting point i to the mounting point j, which are respective values in the tact table, is obtained according to the following Formula (2).

$$t_{ij} = \max\{t_{xy}(\Delta xy), t_z(\Delta z), t_h(h_j), t_w(w_{max(0 \to i)})\} \quad (2)$$

Here, when the above-mentioned mounting point information i for the mounting point i is expressed as $(x_i, y_i, z_i, h_i, w_i)$ while the mounting point information j for the mounting point j is expressed as $(x_j, y_j, z_j, h_j, w_j)$, $$\Delta xy = \max\{|x_i - x_j|, |y_i - y_j|\}$$

xy: distance between the mounting points i and j on the table, $t_{xy}(\Delta xy)$: value obtained by converting $\Delta xy$ into time according to the conversion table 1307b, $\Delta z=|z_i-z_j|$: distance on the z axis between the component cassette that holds the component to be mounted at the mounting point i and the component cassette that holds the component to be mounted at the mounting point j, $t_z(\Delta z)$: value obtained by converting $\Delta z$ into time based on the conversion table 1307b (time necessary for supplying the component from the component supply unit 1011 to the mounting head 1103)

$h_j$: head speed level of the component j (level 1 (high) to level 8 (low))

$t_h(h_j)$: time necessary for the intermittent rotation of the rotary head when the processing transits from the mounting at the mounting point i to the mounting at the mounting point j, $w_{max(0 \to i)}$: maximum value among the values ranging from the transportation speed of the XY table 1015 for the first mounting point to the transportation speed of the XY table 1015 for the mounting point i (level 1 (high) to level 8 (low)), and $t_w(w_{max(0 \to i)})$: value obtained by converting $w_{max(0 \to i)}$ into time according to the conversion table 1307b.

Here, each mounting time corresponds to a "cost" in a traveling salesman problem described later. Further, in the calculation processing (S1004) for the tact table, $t_{ij}=t_{ji}$ is assumed so that $t_{ji}$ is not calculated. This reduces the processing time. Moreover, as for the "cost", aside from each mounting time, the movement distance between two mounting points may be defined as the cost.

Further, the mounting time from the dummy point to each mounting point (mounting point 1 through mounting point 5) is assumed to be a value (10000000 in this example) greater than the mounting time between any of arbitrary mounting points. Further, the mounting time between the board mark 1404 and the dummy point 1406 is assumed to be a value (1 in this example) smaller than the mounting time between any arbitrary mounting points. Note that these values are examples and are not restricted to such.

Figure 16:
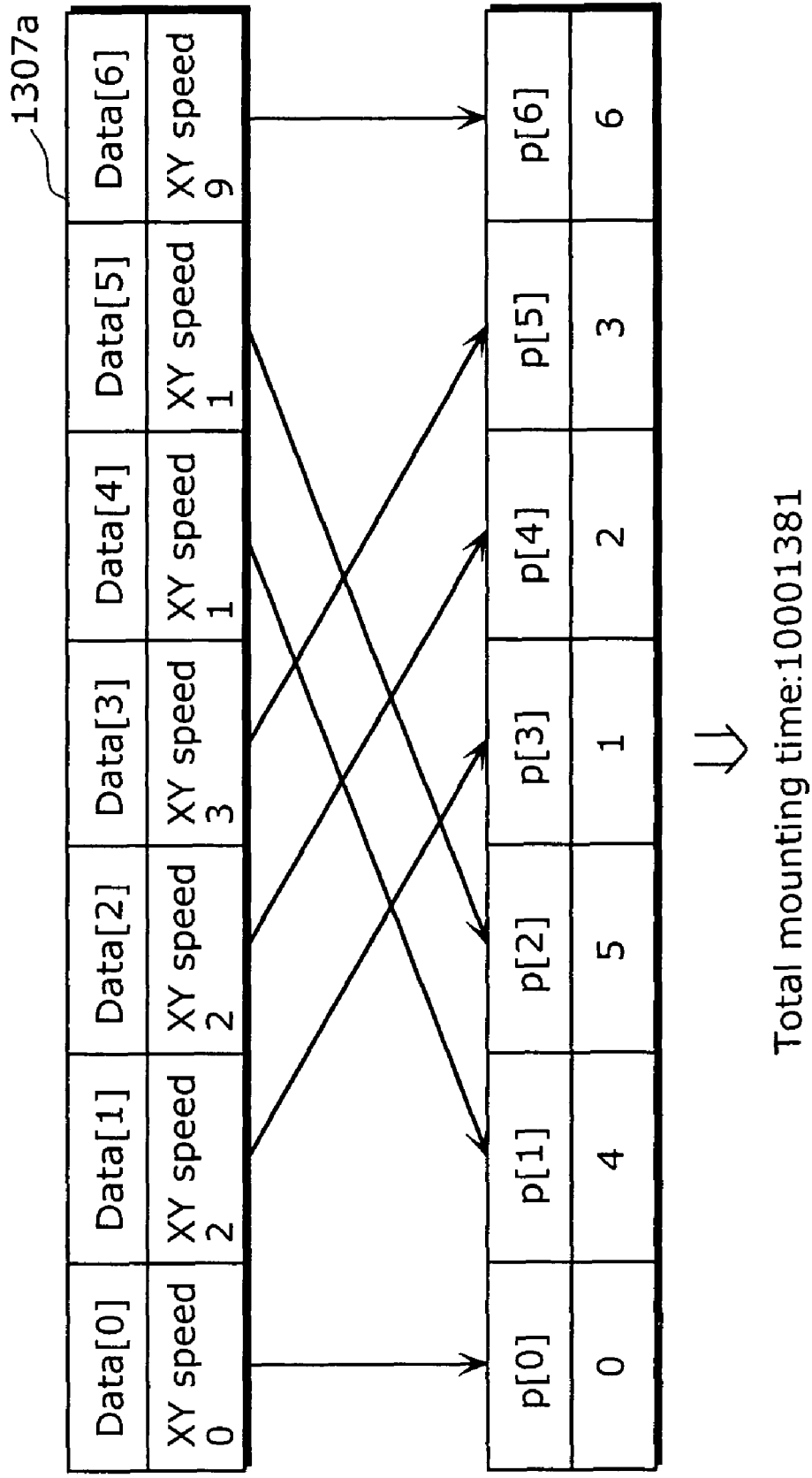
FIG. 16 is a diagram describing a generating method for an initial traveling path.
Figure 17:
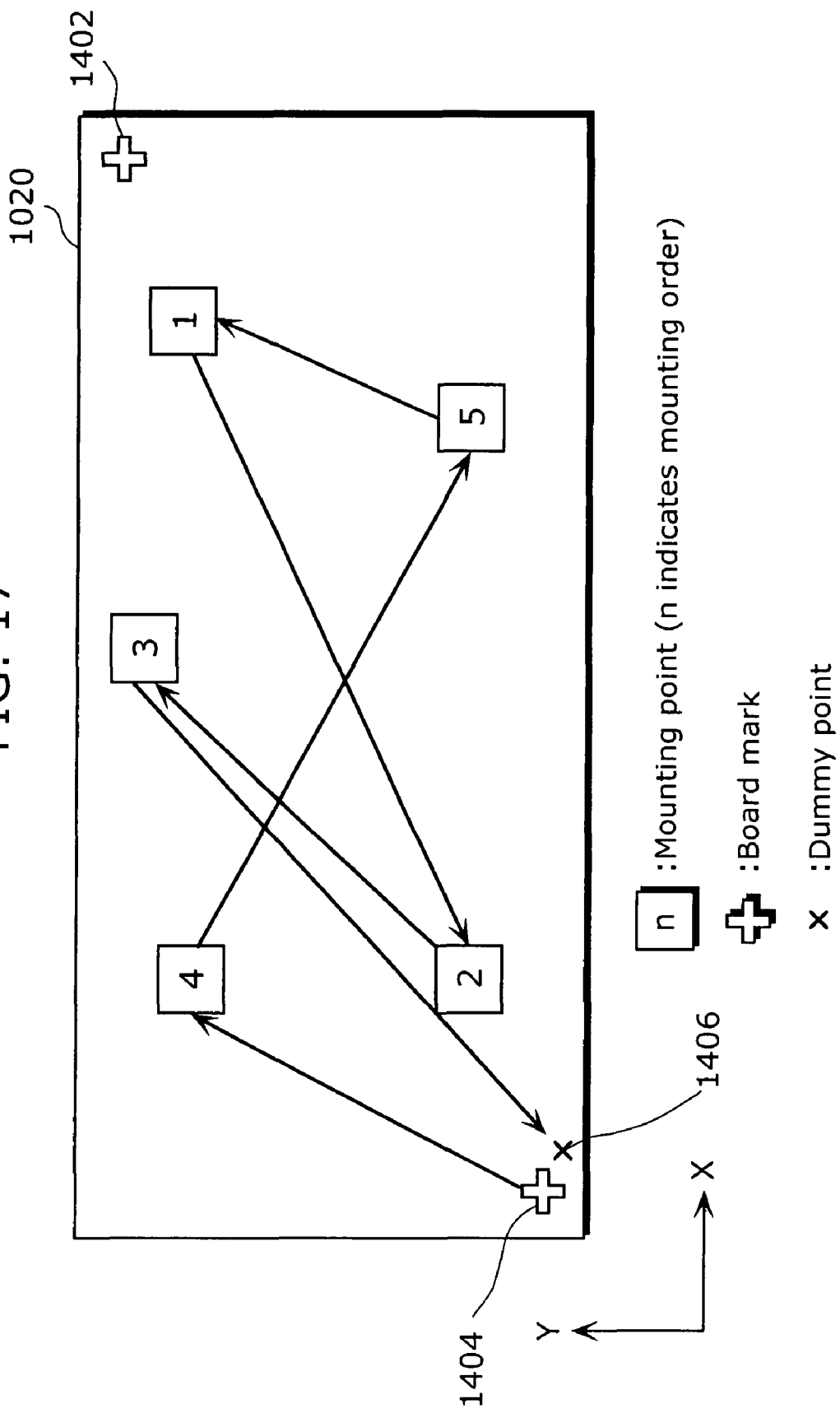
FIG. 17 is a diagram schematically showing mounting order for components.

Then, the first component mounting order determining unit 308a generates an initial traveling path based on the mounting point information array 1307a (S1006). FIG. 16 is a diagram describing a generating method for an initial traveling path. The initial traveling path is generated by rearranging the mounting point information array 1307a into descending order of the transportation speed values of the XY table (ascending order of the level values). Here, the XY speed level of the board mark 1404 (Data[0]) is assumed to be 0, while the XY speed level of the dummy mark 1406 (Data[6]) is assumed to be 9. As a result, the start point is set up at the board mark 1404, while the end point is set up at the dummy point 1406. Here, in order to speed up processing, in place of replacing the elements of the mounting point information array 1307a, a mounting order array p that stores element numbers of the mounting point information array 1307a is utilized. Here, p[i] indicates an element number of the mounting point information array 1307a for the mounting point where mounting is performed at the i+1th turn. That is, according to the mounting order array p in FIG. 16, components are mounted in the order of board mark 1404, mounting point 4, mounting point 5, mounting point 1, mounting point 2, mounting point 3 and dummy point 1406. FIG. 17 shows this mounting order. That is, a closed loop is generated in which mounting is performed in the above-mentioned order; starting at the board mark 1404 and ending at the dummy point 1406.

Then, the first component mounting order determining unit 308a acquires the total mounting time along the obtained initial traveling path (S1008). That is, the total mounting time T along the initial traveling path is obtained by the following Formula (3).

$$T=t_{04}+t_{45}+t_{51}+t_{12}+t_{23}+t_{36}+t_{60} \qquad (3)$$

Here, as an example, the total mounting time according to the tact table shown in FIG. 15 is acquired as follows.

$T$=200+380+400+400+300+10000000+1=10002081
(msec)

Then, in accordance with the processing described below (S1010 to S1018), the first component mounting order determining unit 308a acquires a traveling path that minimizes the total mounting time.

According to the above-mentioned description, the mounting order array p that indicates the initial traveling path obtained by the initial traveling path generation processing (S1006) is generated as shown in FIG. 16. However, to simplify later descriptions, the mounting order array p that indicates the initial traveling path obtained by the initial traveling path generation processing (S1006) is assumed to be generated as shown in FIG. 18. Further, for simplicity of description, it is assumed that the XY speed level of the mounting point 0 (board mark 1404) is 0, while all XY speed levels from the mounting point 1 to the mounting point 5 are 1, and the speed level of the mounting point 6 (dummy point 1406) is 9.

First, the first component mounting order determining unit 308a sets up the loop counter i to be 0 (S1010). Then, the first component mounting order determining unit 308a applies a 2-OPT method of a traveling salesman problem to the traveling path, and thereby tries to change the mounting order (S1012). Details of the 2-OPT method (S1012) are described later. When the mounting order has been changed by the 2-OPT method (YES in S1014), the loop counter i is reset to 0 (S1016). When the mounting order was not successfully changed (NO in S1014), the loop counter i is incremented by one (S1018). The processing described here (S1012 to S1018) is repeated until the value of the loop counter i reaches 7, that is, until i=N=n+2 is satisfied (loop A). The traveling path obtained at the time that the value of the loop counter reaches 7 is the traveling path that minimizes the total mounting time and that is obtained in accordance with the traveling salesman problem. That is, when the repeated processing of the loop A is performed 7 times (N times) successively and still the mounting order is not changed, the traveling path obtained at that time is concluded to be the optimal traveling path, so that the component mounting order is determined.

Figure 19:
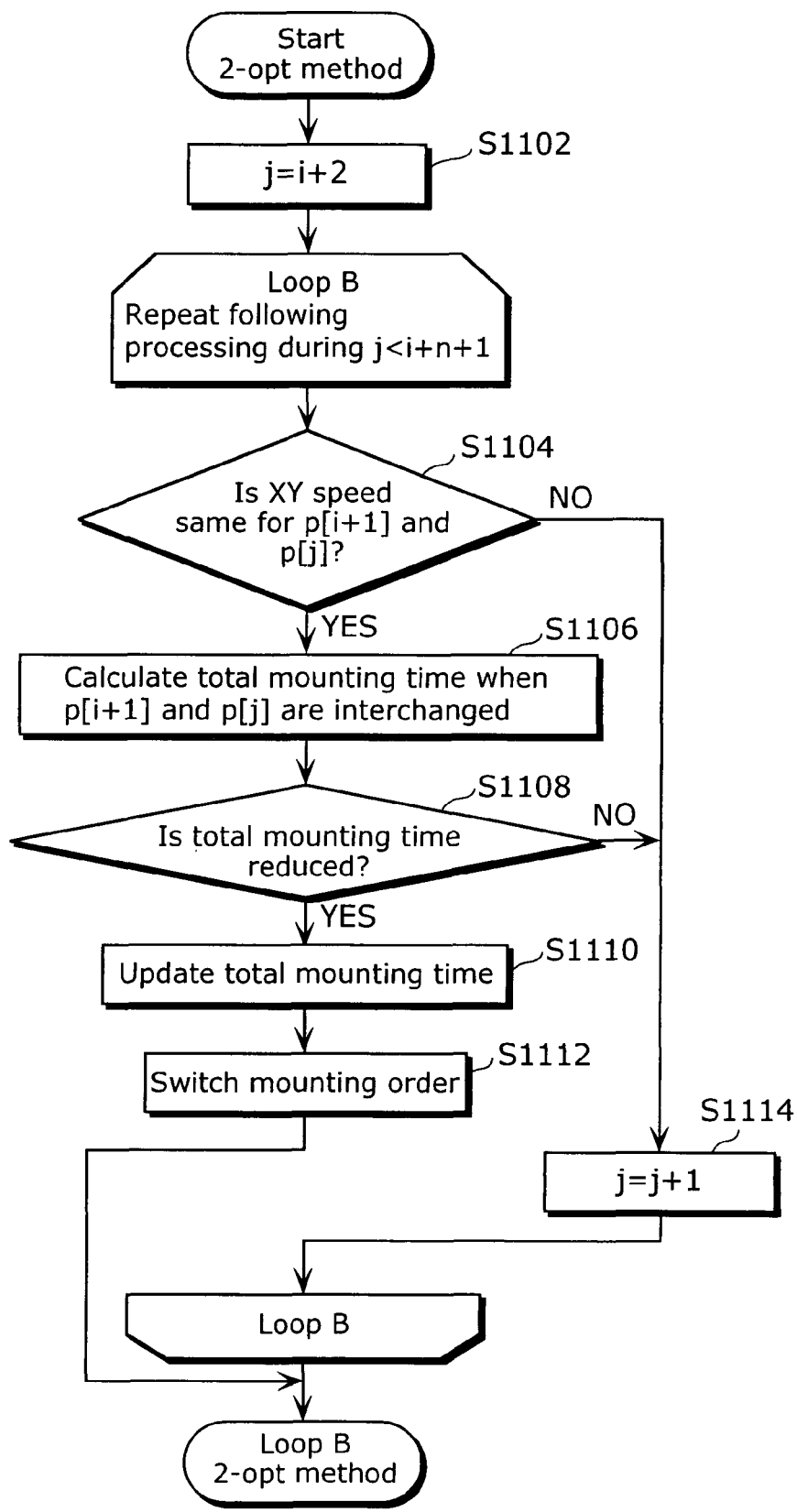
FIG. 19 is a flow chart showing detailed processing of a 2-OPT method.

The 2-OPT method (S1012) is described below in detail. FIG. 19 is a flow chart showing detailed processing of a 2-OPT method.

The first component mounting order determining unit 308a sets up the loop counter j to be i+2 (S1102). Here, when the value of the loop counter j exceeds 7, ((i+2) mod 7) is substituted into the loop counter j. Here, "x mod y" indicates the remainder in the case where x is divided by y.

Then, the first component mounting order determining unit 308a judges whether or not the XY speed values of the mounting point indicated by element p[i+1] of the mounting order array p (the mounting point indicated by element p[k] is referred to as the mounting point p[k], hereinafter) and the mounting point p[j] are the same (S1104).

When the XY speed-values are the same (YES in S1104), the total mounting time is calculated for a traveling path where the mounting point p[i+1] and the mounting point p[j] are interchanged (S1106).

The first component mounting order determining unit 308a judges whether or not the calculated total mounting time is smaller than the previous total mounting time (S1108).

For example, in the case where i=0 and j=2, when the total mounting time is calculated before and after the interchange of the mounting order for the mounting points p[1] and p[2], no change arises in the total mounting time. The reason is as follows. That is, when attention is focused on the mounting order of the portion that affects the change in the total mounting time, the mounting time between the two points p[0] and p[1] before the change of the mounting order is obtained to be $t_{01}$=200 (msec) according to the tact table. Further, the mounting time between the two points p[2] and p[3] is obtained to be $t_{23}$=300 (msec) according to the tact table. Thus, the mounting time from p[0] to p[3] is obtained to be 500 (msec). On the other hand, the mounting time from p[0] to p[2] after the change of the mounting order is obtained to be $t_{02}$=300 (msec) according to the tact table, while the mounting time from p[1] to p[3] is obtained to be $t_{13}$=200 (msec) according to the tact table. Thus, the mounting time from p[0] to p[3] is obtained to be 500 (msec), which is the same as that before the mounting order change. Accordingly, the total mounting time does not vary.

When the XY speed values of the mounting point p[i+1] and the mounting point p[j] are not the same with each other (NO in S1104), or alternatively when the total mounting time is not smaller than the previous one (NO in S1108), the value of the loop counter j is incremented by one (S1114). After that, during the time that the value of the loop counter j is smaller than i+n+1, processing subsequent to S1104 is repeated (loop B). Here, when j exceeds N, "j mod N" is adopted in place of j. When i+n+1 exceeds N, "i+n+1 mod N" is adopted in place of i+n+1. When the processing of loop B is completed, the 2-OPT method (S1012 in FIG. 13) is terminated.

When the total mounting time after the mounting point interchange is smaller than the total mounting time before the mounting point interchange (YES in S1108), the first component mounting order determining unit 308a updates the total mounting time with the total mounting time after the mounting point interchange (S1110). Further, the first component mounting order determining unit 308a replaces the elements of the mounting order array p, and thereby changes the mounting order (S1112). Here, as described later with reference to FIG. 21, the interchange of mounting points corresponds to interchange of the paths in the closed loop. When paths are interchanged, a closed loop is not formed until the orientation of the paths located between the interchanged paths is reversed. Thus, when the mounting order is changed, the processing of reversing the orientation of the paths is performed simultaneously. Then, the 2-OPT method (S1012 in FIG. 13) in the traveling salesman problem is completed.

Figure 20:
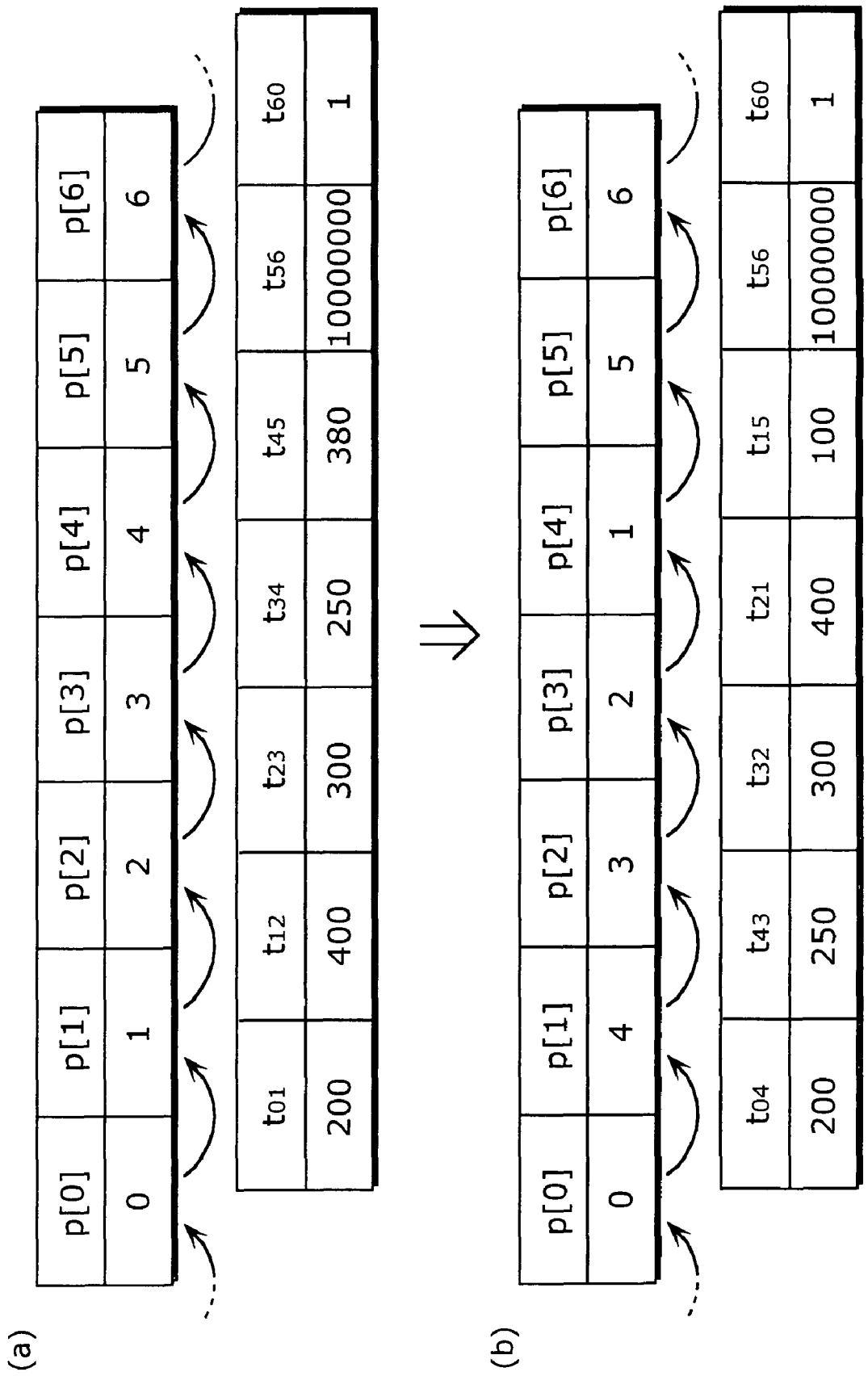
FIG. 20 is a diagram showing a mounting point array p before and after component mounting order is changed.

For example, in the case where i=0 and j=4, the mounting time for the respective mounting points before the interchange of the mounting point p[1] (mounting point 1, in this example) with the mounting point p[4] (mounting point 4, in this example) is as shown in the table in the lower part in FIG. 20(a). Further, the mounting time for the respective mounting points after the interchange of the mounting point 1 with the mounting point 4 is as shown in the table in the lower part in FIG. 20(b). That is, FIGS. 21(a) and 21(b) are diagrams respectively showing the traveling paths before and after the interchange of the mounting points. Here, the interchange of the mounting point 1 with the mounting point 4 corresponds to the interchange of the path from the mounting point 0 to the mounting point 1 with the path from the mounting point 4 to the mounting point 5.

When only the mounting time of the portion that affects the total mounting time is taken into consideration, the mounting time from the mounting point 0 to the mounting point 1 before the mounting point interchange is $t_{01}$=200 (msec) according to the tact table, while the mounting time from the mounting point 4 to the mounting point 5 is $t_{45}$=380 (msec) according to the tact table. Thus, the total mounting time is 580 (msec). On the other hand, the mounting time from the mounting point 0 to the mounting point 4 after the mounting point interchange is $t_{04}$=200 (msec) according to the tact table, while the mounting time from the mounting point 1 to the mounting point 5 is $t_{15}$=100 (msec) according to the tact table. Accordingly, the total mounting time is 300 (msec), which is smaller than the value before the mounting point interchange. Moreover, following the interchange of the mounting point p[1] with the mounting point p[4], the values of the elements p[2] and p[3] located between p[1] and p[4] are also interchanged as shown in FIG. 20(b). That is, the value of p[2] is changed from 2 to 3, while the value of p[3] is changed from 3 to 2. This is because, as shown in FIG. 21, when p[1] and p[4] are interchanged, orientation is reversed in the path from p[1] to p[2], the path from p[2] to p[3] and the path from p[3] to p[4] located therebetween. Here, even when the orientation of the path is reversed, in the above-mentioned calculation processing (S1004) for the tact table, the tact table is acquired assuming $t_{ij}=t_{ji}$. Thus, the portion where the orientation of the path is reversed does not affect the change in the total mounting time.

Here, the description in FIG. 21 is summarized as follows. FIG. 21(b) shows the case where even when the orientation of the path is reversed, no change arises in the mounting time for the mounting points making up that path. Further, the final purpose is to reduce the total mounting time for the closed loop. Thus, as long as this condition is satisfied, the mounting order may be changed from that shown in FIG. 21(a) to that shown in FIG. 21(b). Further, FIG. 21(b) shows that when a particular two mounting points are interchanged, the orientation of the path needs to be interchanged appropriately so that a closed loop is formed.

Figure 22A:
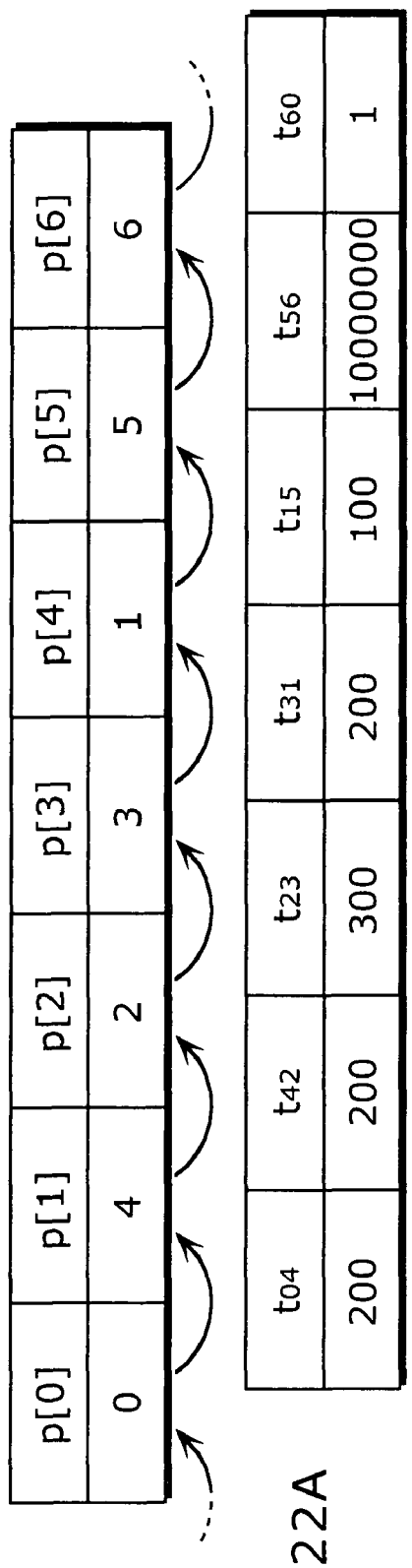
FIG. 22 is a diagram showing a processing result of mounting order determination processing performed by a component mounting order determining apparatus.
Figure 22B:
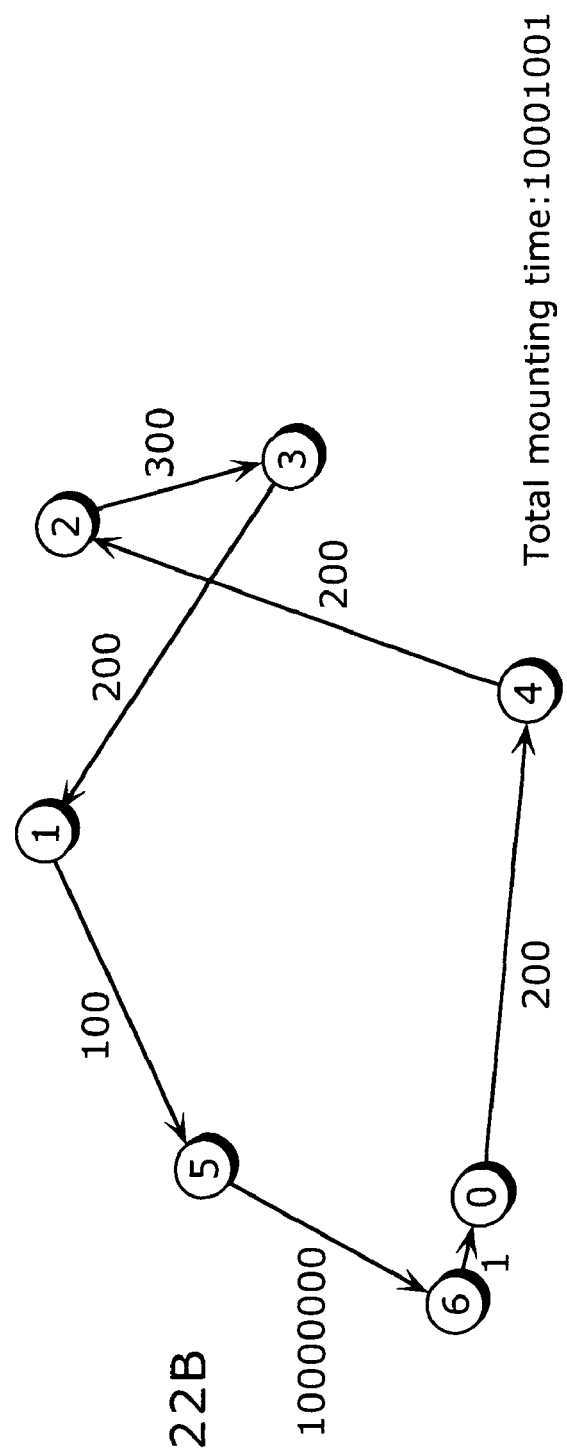

FIG. 22 is a diagram showing the processing result of the above-mentioned mounting order determination processing performed by the first component mounting order determining unit 308a. FIG. 22(a) is a diagram showing a mounting order array p and the mounting time for the mounting points. FIG. 22(b) is a diagram showing a traveling path for the mounting points on the actual board and the mounting time for the mounting points. According to the mounting order array p, a traveling path is generated in the order of mounting points 0, 4, 2, 3, 1, 5, 6 and 0, while the total mounting time is 10001001. Here, the total mounting time for the closed loop shown in FIG. 21(b) is calculated to be 10001251. Thus, the total mounting time for the closed loop shown in FIG. 22(b) is smaller.

Figure 23:
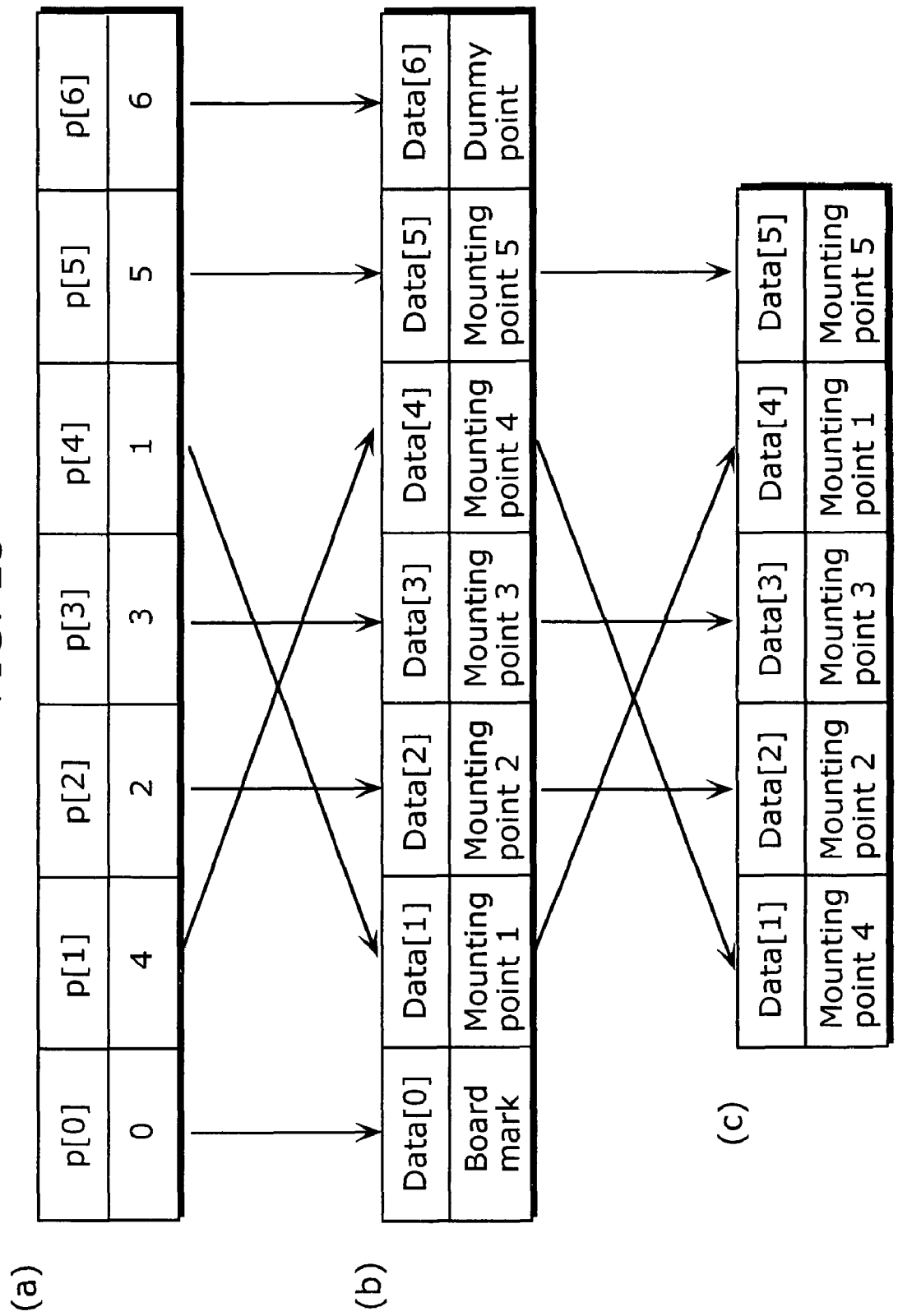
FIG. 23 is a diagram showing relation among a mounting order array p and a mounting point information array "Data" which are shown in FIG. 22(a) and mounting order.

FIG. 23 is a diagram showing the relation among a mounting order array p and a mounting point information array "Data" which are shown in FIG. 22(a) and mounting order. The value of each element of the mounting order array p shown in FIG. 23(a) is an index for the mounting point information array "Data" shown in FIG. 23(b). An arrow between the mounting order array p and the mounting point information array "Data" indicates an element of the mounting point information array "Data" indicated by each element of the mounting point array p. That is, the value 0 of p[0] is the index for an element of the mounting point information array "Data" for the mounting point where the mounting is performed first. Thus, Data[0] is indicated. Data[0] stores information concerning the position of the board mark 1404. Further, the value 4 of p[1] is the index for an element of the mounting point information array "Data" for the mounting point where the mounting is performed second. Thus, Data[4] is indicated. Data[4] stores mounting point information for the mounting point 4. When the mounting point information array "Data" is rearranged based on the values of the mounting order array p, except for the board mark 1404 and the dummy point 1406 from the traveling path obtained as described here, a mounting point information array "Data" is generated that indicates mounting in the order of mounting points 4, 2, 3, 1 and 5 as shown in FIG. 23(c).

Figure 25:
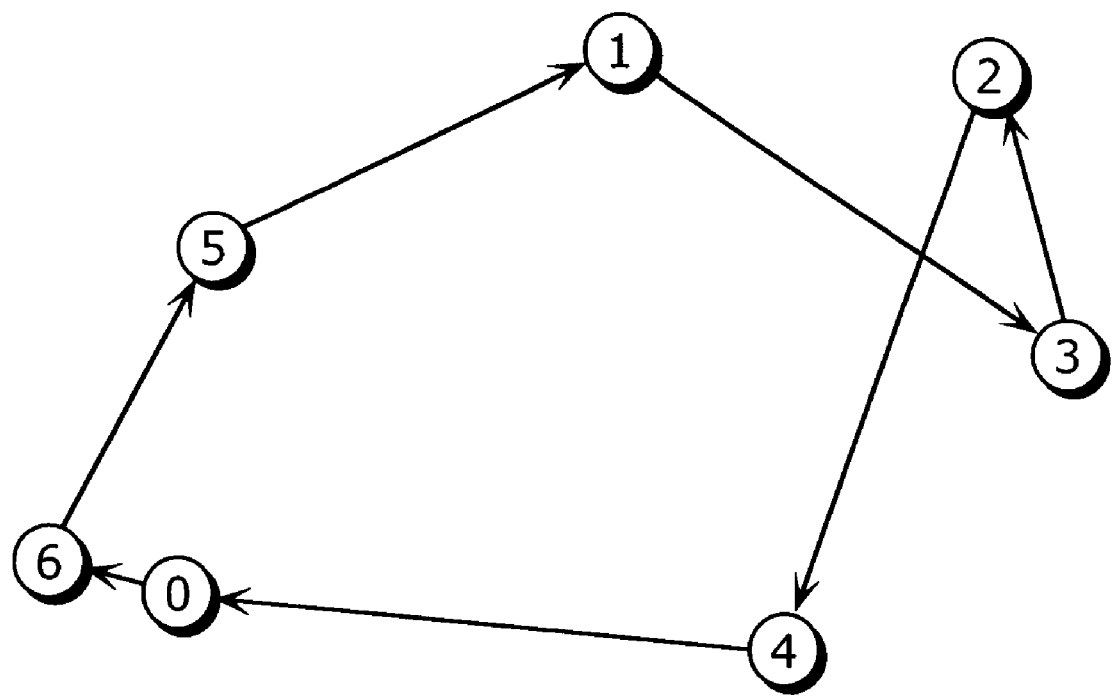
FIG. 25 is a diagram schematically showing an example of a traveling path.

FIG. 24 is a diagram describing another generating method for a mounting point information array "Data". The mounting point array p shown in FIG. 24(a) and the mounting point information array "Data" shown in FIG. 24(b) are assumed to be given. According to these, the start point of the traveling path is the dummy point. Thus, a traveling path shown in FIG. 25 is generated. Accordingly, in this case, a mounting point information array "Data" as shown in FIG. 24(c) is generated by a method similar to that in FIG. 23, and then the mounting order in the mounting point information array "Data" is changed. As a result, a traveling path shown in FIG. 22(c) is generated. By acquiring the mounting point information array "Data" in this manner, components are mounted starting at the mounting point close to the board mark 1404.

FIG. 26 is a table showing experimental results of a conventional method and a method according to the present application.

In this table, the first column indicates the sample number. The second column indicates the number of mounting points. The third column indicates the number of component types. The fourth column indicates the total mounting time in the case where the components are mounted in accordance with the mounting order obtained by a conventional method (greedy algorithm). The fifth column indicates the total mounting time in the case where the components are mounted in accordance with the mounting order obtained by using a traveling salesman problem which is the method of the present application. The sixth column indicates the percentage of the total mounting time shown in the fourth column relative to the total mounting time shown in the fifth column. The seventh column indicates the processing time necessary for acquiring the mounting order according to the method of the present application. Here, in both the conventional method and the method of the present application, the arrangement of the component cassettes on the Z-axis is the same, and hence the condition is the same with each other.

According to the improvement ratio shown in the sixth column, the value exceeds 100% for all samples, while improvement of 18.2% (sample E) is obtained at maximum. Further, the processing time necessary for acquiring the mounting order is less than 1 second for all samples.

As described above, according to the component mounting order determination processing performed by the first component mounting order determining unit 308a, optimal component mounting order can be determined within a practical time.

Although the component mounting order determination processing performed by the first component mounting order determining unit 308a has been described up to this point, this processing is not limited to that described above.

For example, in the determination method for the component mounting order shown in FIG. 13, the initial traveling path is acquired (S1006 in FIG. 13) by rearranging the mounting point information array 1307a into descending order of the transportation speed values of the XY table (ascending order of the level values). However, the initial traveling path may be acquired by the greedy algorithm. This speeds up the subsequent determination processing for the component mounting order performed in accordance with a traveling salesman problem.

Further, in the above-mentioned component mounting order determination processing, the dummy point 1406 is provided near the board mark 1404. However, the dummy point 1406 need not be provided near the board mark 1404. That is, the dummy point 1406 may be provided near a predetermined component mounting point where the component is mounted first.

Further, the dummy point 1406 may be at the same position as a predetermined component mounting point where the component is mounted first.

Further, it is possible to have a configuration in which, in place of switching and executing the component mounting order determination processing as in the operating time reducing apparatus 300 in FIG. 2, only the component mounting order determination processing performed by the first component mounting order determining unit 308a is exclusively executed.

Figure 27:
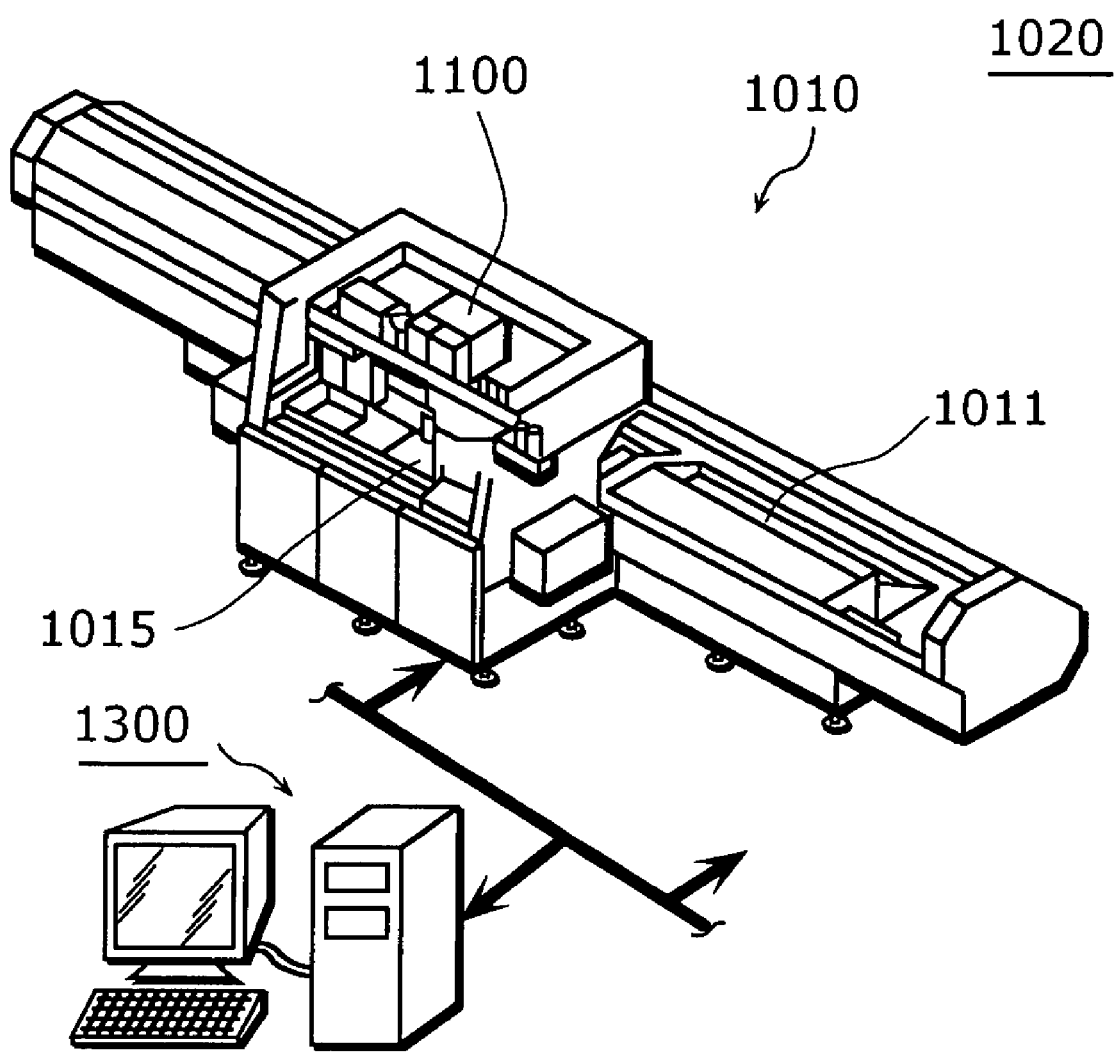
FIG. 27 is an external appearance view showing a component mounting system according to an embodiment of the present invention.

FIG. 27 is an external appearance view of a component mounting system having this configuration.

The component mounting system is a system that determines a mounting order for components onto a board and that mounts the components onto the board in accordance with the determined mounting order. The component mounting system includes a component mounter 1010 and a component mounting order determining apparatus 1300.

Figure 28:
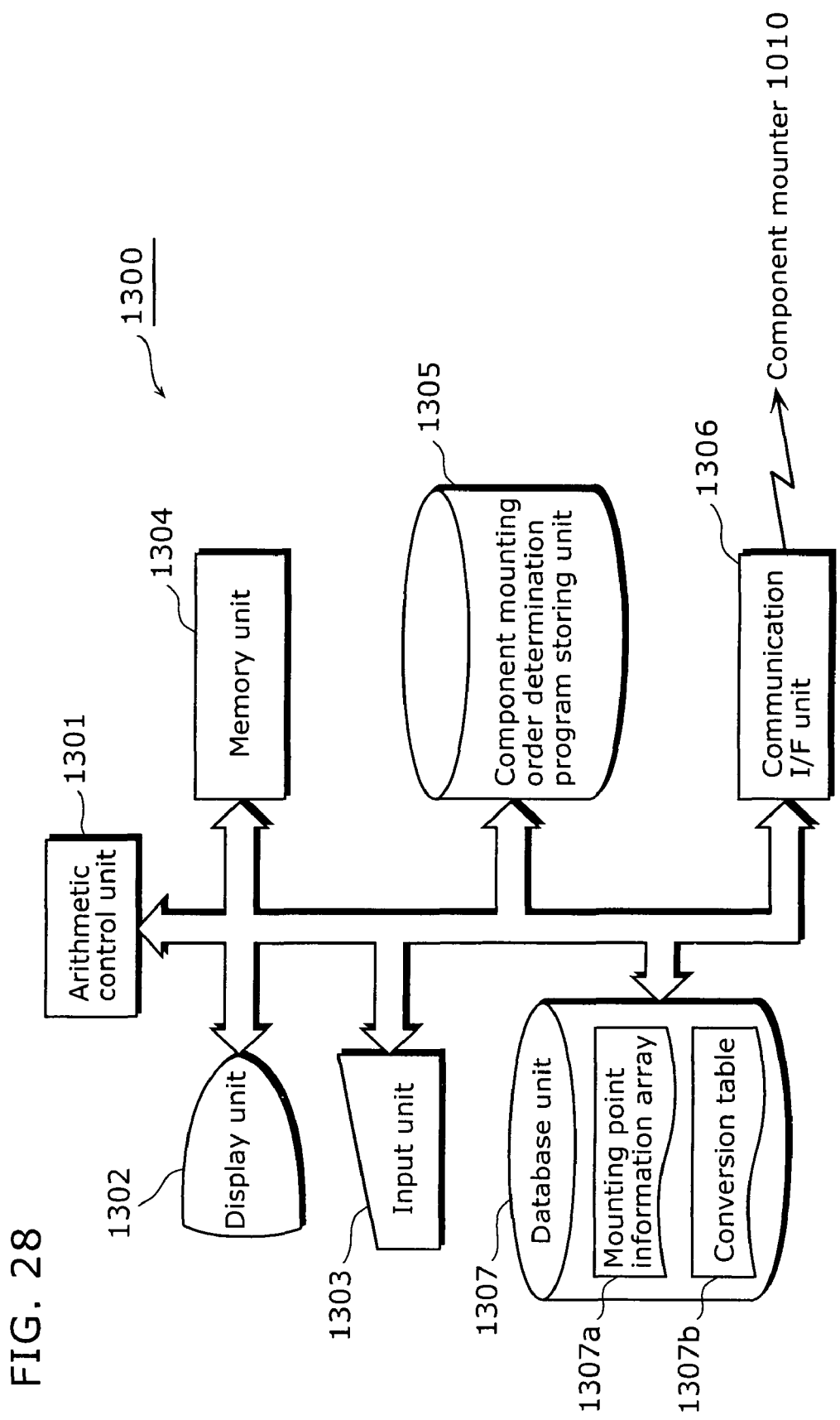
FIG. 28 is a functional block diagram showing a configuration of a component mounting order determining apparatus.

FIG. 28 is a functional block diagram showing a configuration of a component mounting order determining apparatus.

The component mounting order determining apparatus 1300 is a computer for determining mounting order for components onto a board, and includes an arithmetic control unit 1301, a display unit 1302, an input unit 1303, a memory unit 1304, a component mounting order determination program storing unit 1305, a communication I/F (interface) unit 1306 and a database unit 1307.

The component mounting order determining apparatus 1300 is implemented by a general-purpose computer system such as a personal computer that executes a component mounting order determination program. In a state not connected to the component mounter 1010, the component mounting order determining apparatus 1300 serves also as a stand-alone simulator (a tool for component mounting order determination).

The arithmetic control unit 1301 is a CPU (Central Processing Unit), a numerical processor and the like. In response to an instruction from the user or the like, the arithmetic control unit 1301 loads a necessary program from the component mounting order determination program storing unit 1305 to the memory unit 1304, and executes it. Then, in accordance with the execution result, the arithmetic control unit 1301 controls individual units 1302 to 1307.

The display unit 1302 is a CRT (Cathode-Ray Tube), an LCD (Liquid Crystal Display) or the like, while the input unit 1303 is a keyboard, a mouse and the like. These units are used for interactive operation or the like between the component mounting order determining apparatus 1300 and an operator, under the control of the arithmetic control unit 1301.

The communication I/F unit 1306 is a LAN (Local Area Network) adapter or the like, and is used for communication and the like between the component mounting order determining apparatus 1300 and the component mounter 1010. The memory unit 1304 is a RAM (Random Access Memory) or the like that provides a working area for the arithmetic control unit 1301.

The database unit 1307 is a hard disk that stores, for example: input data used for the component mounting order determination processing performed by the component mounting order determining apparatus 1300 (such as the mounting point information array 1307*a* and the conversion table 1307*b*); and the mounting order for components determined by the component mounting order determination processing.

The program stored in the component mounting order determination program storing unit 1305 is a program that serves as the above-mentioned first component mounting order determining unit 308*a* when executed by the arithmetic control unit 1301. Thus, when the program is executed by the arithmetic control unit 1301, processing similar to that of the above-mentioned first component mounting order determining unit 308*a* can be performed.

Here, the first component mounting order determining unit 308*a* has performed the optimization processing for the component mounting order in the case where the component mounter 1010 is of rotary type. However, the processing performed by the first component mounting order determining unit 308*a* is applicable also to a component mounter referred to as a radial component inserter.

Figure 29:
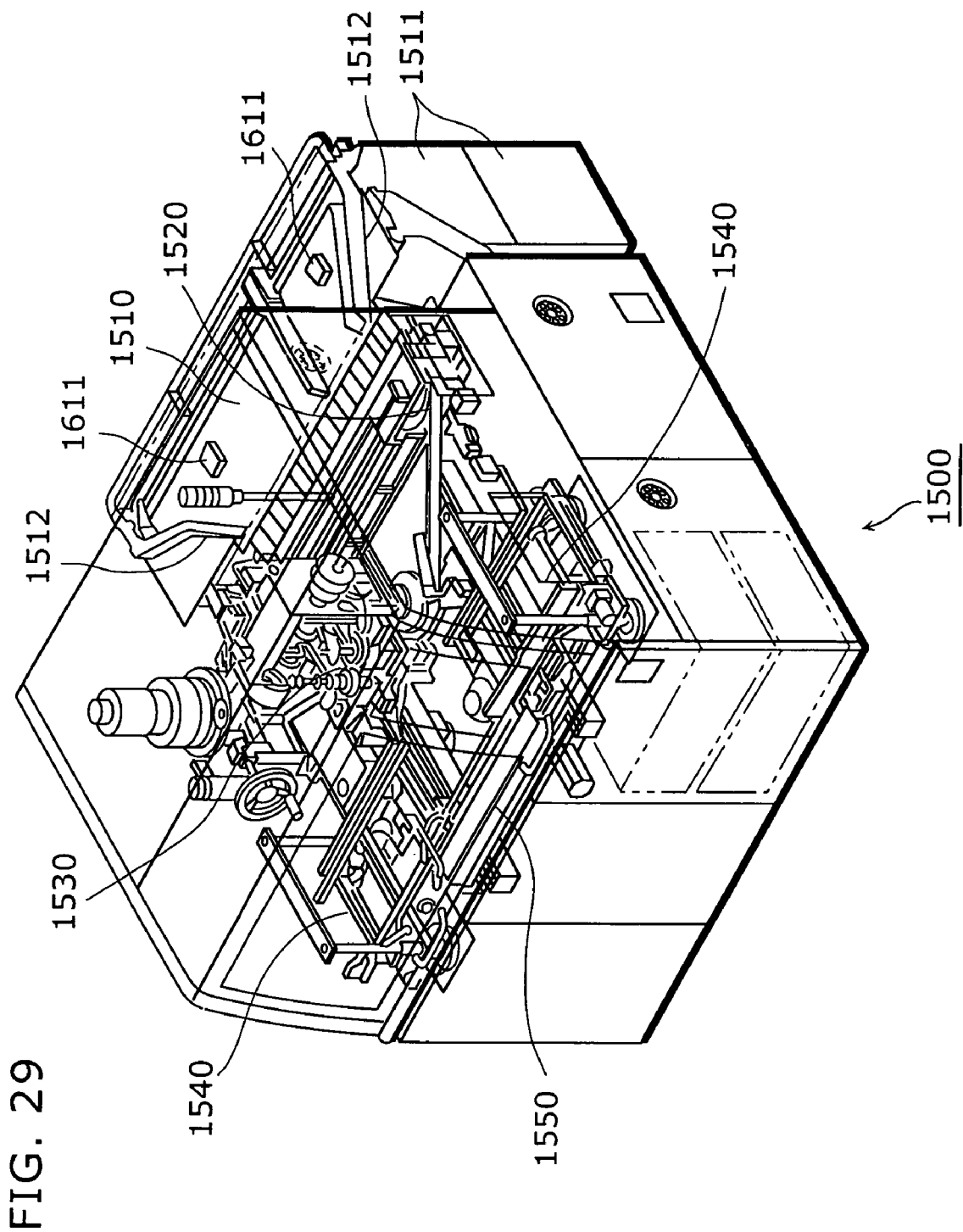
FIG. 29 is an external appearance view showing an exemplary configuration of a component mounter referred to as a radial component inserter.

FIG. 29 is an external appearance view showing an exemplary configuration of a component mounter referred to as a radial component inserter. The component mounter 1500 is a so-called radial component inserter in which the leads of a radial component are inserted into through holes in the board so that the radial component is mounted onto the board.

The component mounter 1500 includes a component supply unit 1510, a component transporting unit 1520, a head 1530, a transportation loader 1540, an XY table 1550 and two IC tag readers 1611.

Figure 30:
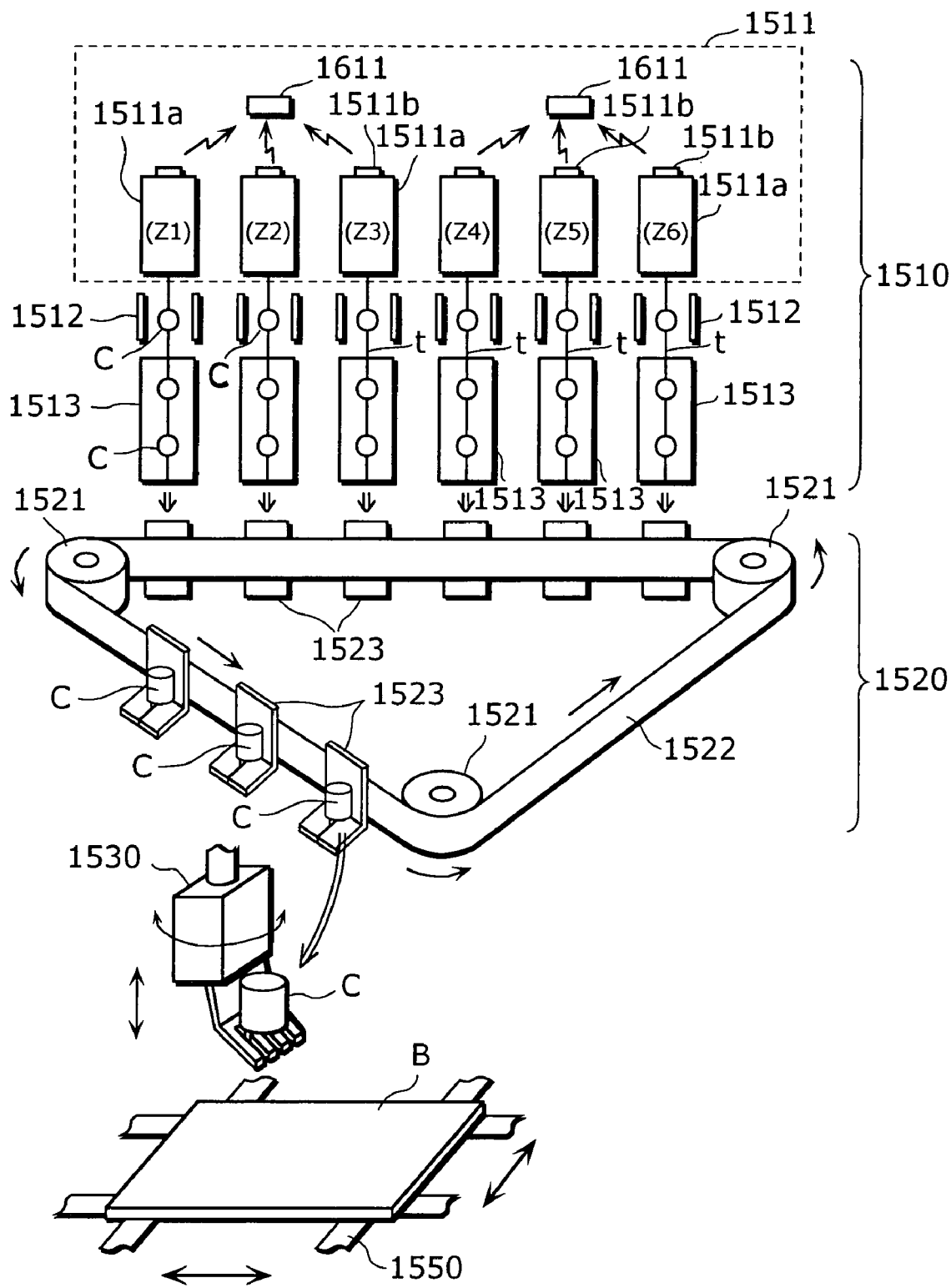
FIG. 30 is a diagram conceptually showing a major configuration of a component mounter.

FIG. 30 is a diagram conceptually showing the main configuration of a component mounter 1500.

The component supply unit 1510 stores a plurality of radial components and transfers the radial components to the component transporting unit 1520. The component supply unit 1510 includes a component housing unit 1511, a plurality of guides 1512 and a plurality of cassettes 1513.

The component housing unit 1511 houses a plurality of packs 1511*a* each serving as component supply means that packs a group of radial components C of the same kind. The group of radial components C of the same kind is arranged in one row and held on one pack. That is, the above-mentioned pack 1511*a* packs the tape (component tape) t that holds these radial components C in a folded state.

The guides 1512 guide into the cassette 1513 the component tape t extracted from the pack 1511*a* of the component housing unit 1511.

The cassette 1513 extracts the component tape t from the pack 1511*a* of the component housing unit 1511, and performs continuous feeding operation. Then, the cassette 1513 cuts the supplied component tape t on the tip side, and thereby separates the plurality of radial components C held on the component tape t so as to supply them to the component transporting unit 1520

The component transporting unit 1520 transports to the head 1530 the radial components C supplied from the cassette 1513. The component transporting unit 1520 includes three pulleys 1521, a conveyor belt 1522, a plurality of chuck holding units 1523, and a drive mechanism (not shown) that rotates the pulleys 1521.

The conveyor belt 1522 is formed, for example, from synthetic resin in an annular shape, and wound approximately in a triangular shape by the three pulleys 1521. The conveyor belt 1522 goes round by the rotation of the pulleys 1521.

The plurality of chuck holding units 1523 are attached to the conveyor belt 1522 at approximately regular intervals with each other, and hold (grip) the radial components C.

In this component transporting unit 1520, the radial components C supplied from the cassette 1513 are held by the chuck holding units 1523 of the conveyor belt 1522, and then the radial components C are sequentially transported from the cassette 1513 to the head 1530.

As shown in FIG. 29, the transportation loader 1540 carries in a board B to the XY table 1550 and then transports the board B onto which components have been mounted, to the outside of the component mounter 1500.

The XY table 1550 moves the board B in the two-dimensional directions along the mounting surface.

The head 1530 acquires and holds the radial components C transported by the component transporting unit 1520, and then mounts the radial components C onto the board B placed on the XY table 1550.

The two IC tag readers 1611 are arranged in the component housing unit 1511, and reads later-described component information from the IC tag 1511*b* attached to each pack 1511*a*. Further, a signal outputted from each IC tag 1511*b* is acquired by the two IC tag readers 1611 arranged at mutually different positions. Thus, the position of each IC tag 1511*b* is identified based on the acquired signal. That is, since each IC tag 1511*b* is attached to each pack 1511*a*, the position (Z-number "Z1, Z2, . . . ") of each pack 1511*a* is identified.

Further, the processing performed by the first component mounting order determining unit 308*a* is applicable also to a component mounter referred to as a jumper inserting machine that inserts a jumper component onto a board or an axial inserter that inserts an axial component.

[Second Component Mounting Order Determining Unit 308*b*]

The component mounter controlled by the second component mounting order determining unit 308*b* is a component mounter 2100 of modular type shown in FIG. 1.

Figure 31:
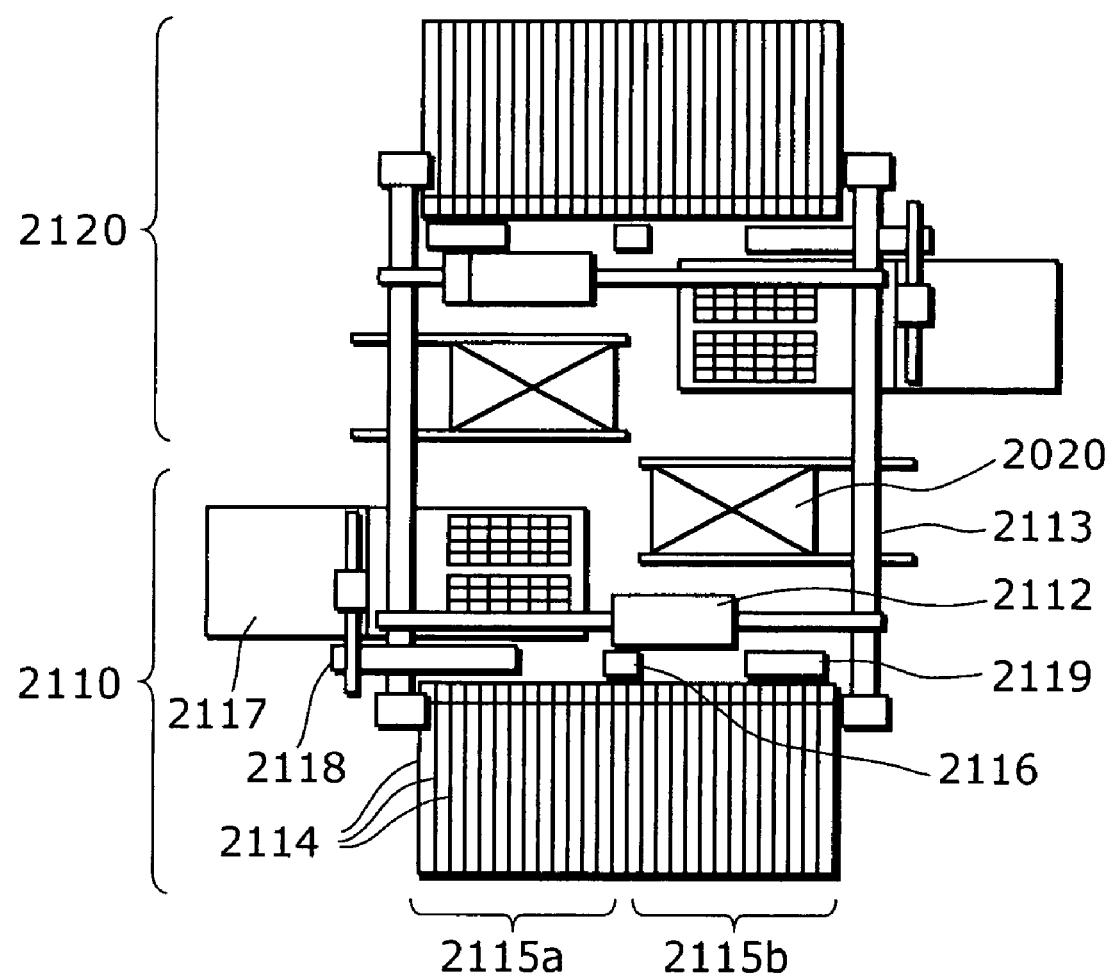
FIG. 31 is a plan view showing a major configuration of a component mounter according to the present invention.

FIG. 31 is a plan view showing the main configuration of a component mounter 2100 according to the present invention.

A shuttle conveyor 2118 is a transportation table (a component transportation conveyer) for conveying a component extracted from a tray supply unit 2117, to a predetermined position where the component can be picked up by a head 2112. A nozzle station 2119 is a table on which changeable nozzles corresponding to various component sizes are placed.

Two component supply units 2115*a* and 2115*b* that make up a sub-equipment 2110 (or 2120) are arranged respectively in the right and left of a component recognition camera 2116. Thus, after picking up components at the component supply unit 2115*a* or 2115*b*, the head 2112 passes the component recognition camera 2116 and then moves to the mounting points of the board 2020 so as to repeat the operation of mounting all picked-up components sequentially. "Mounting point" refers to a coordinate point on the board 2020 where a component should be mounted, and there are cases where components of the same component type can be mounted at mutually different mounting points. The total number of components (mounting points) arranged on each component tape corresponding to the same component type is equal to the number of components of that component type (the total number of components to be mounted).

Here, one iteration (pickup, transportation and mounting) of the repeated series of operations composed of pickup, transportation and mounting of the components performed by the head 2112, or alternatively a component group to be mounted by this one iteration of operations is referred to as a "task". For example, when a ten-nozzle head is employed, the maximum number of components mounted in one task is 10. Here, the "pickup" described here includes the entire pickup operation from the time that the head 2112 begins to pick up the components until the time that the head 2112 transports them. For example, in addition to the case where ten components are picked up in one iteration of pickup (one iteration of a lowering and raising operation of the head 2112), the case where ten components are picked up by multiple iterations of pickup is included in the definition.

Figure 32:
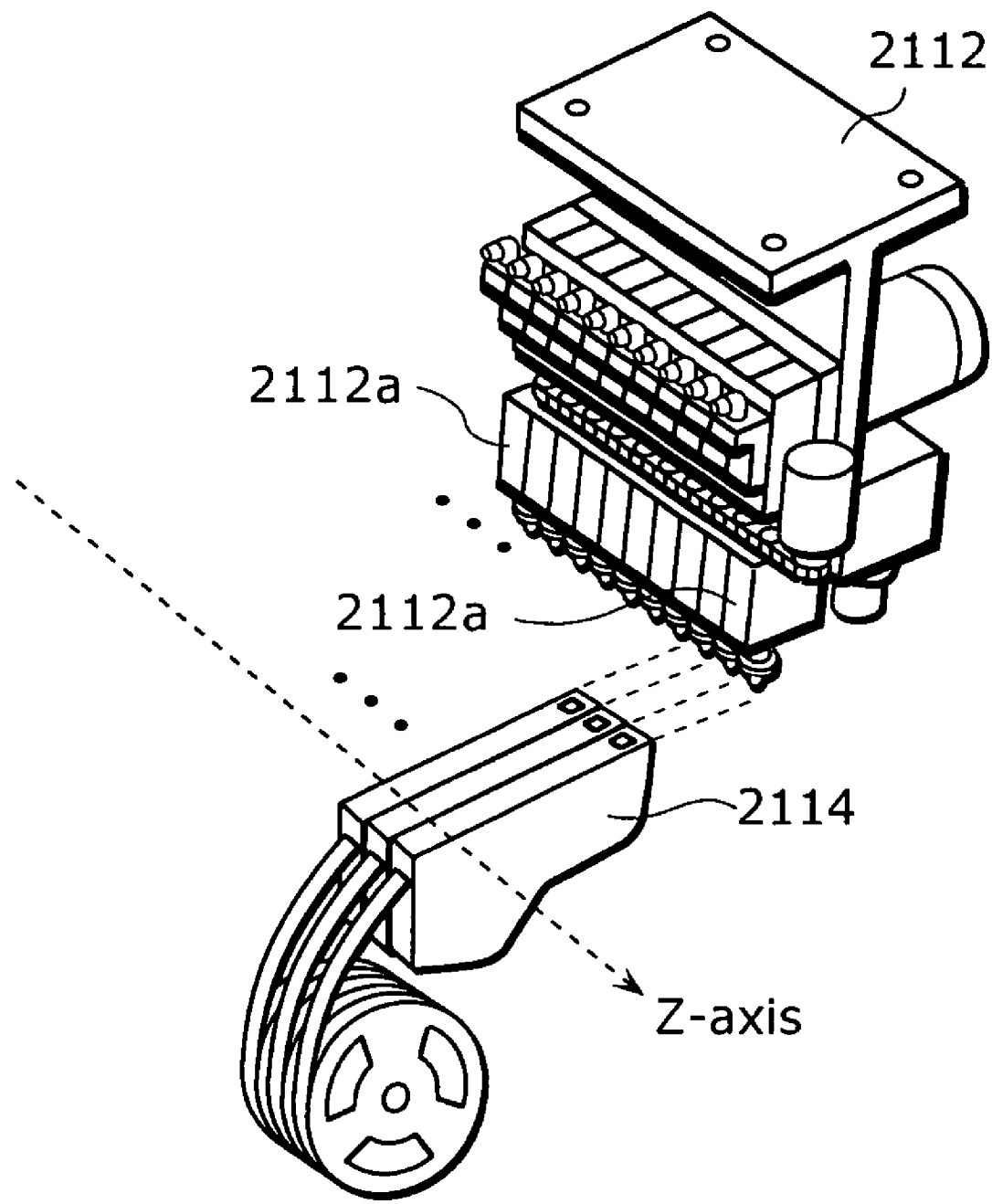
FIG. 32 is a schematic diagram showing positional relation between a head and a component cassette.

FIG. 32 is a schematic diagram showing positional relation between a head 2112 and a component cassette 2114. The head 2112 is an operation head of a type referred to as a "gang pickup method", to which a maximum of ten pickup nozzles 2112a can be attached. At that time, components can be picked up simultaneously (in one iteration of a lowering and raising operation) from each of a maximum of ten component cassettes 2114.

Here, in a component cassette 2114 referred to as a "single cassette", one component tape is loaded, while in a component cassette 2114 referred to as a "double cassette", two component tapes are loaded. Further, the setting position of a component cassette 2114 (or a component tape) in the component supply unit 2115a or 2115b is referred to as the "value on the Z-axis" or the "position (Z-number) on the Z-axis". As the Z-numbers, consecutive numbers are used in which the leftmost end of the component supply unit 2115a is assigned to "Z1". The "Z-axis" indicates a coordinate axis that identifies the arrangement position (setting position) of a component cassette 2114 set up in each component mounter (sub-equipment, in the case where sub-equipment is included).

The component mounting order determination processing executed by the second component mounting order determining unit 308b is described below. The component mounting order determination processing executed by the second component mounting order determining unit 308b is almost the same as the component mounting order determination processing executed by the first component mounting order determining unit 308a. However, a formula different from the above-mentioned Formula (2) is used for acquiring the mounting time $t_{ij}$ from the mounting point to the mounting point j on the board.

That is, the mounting time $t_{ij}$ is acquired by the following Formula (4).

$$t_{ij} = t_{xy}(\Delta x'y') \quad (4)$$

$\Delta x'y' = \max\{|x'_i - x'_j|, |y'_i - y'_j|\}$: distance between the corrected mounting point i and the corrected mounting point j on the board 2020, and $t_{xy}(\Delta x'y')$: value obtained by converting $\Delta x'y'$ into time according to the conversion table 1307b.

Here, the "corrected mounting point i" refers to a point where the head center 2502 is located when the component is mounted at the mounting point i, as described later. It is the same for the "corrected mounting point j".

Figure 33B:
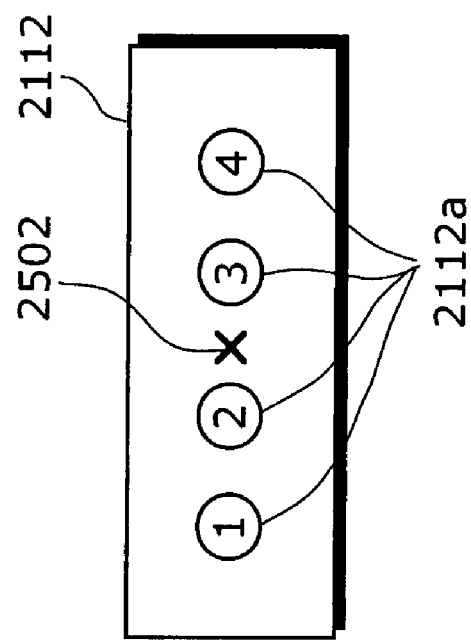
FIG. 33 is an external appearance view of a head.
Figure 33A:
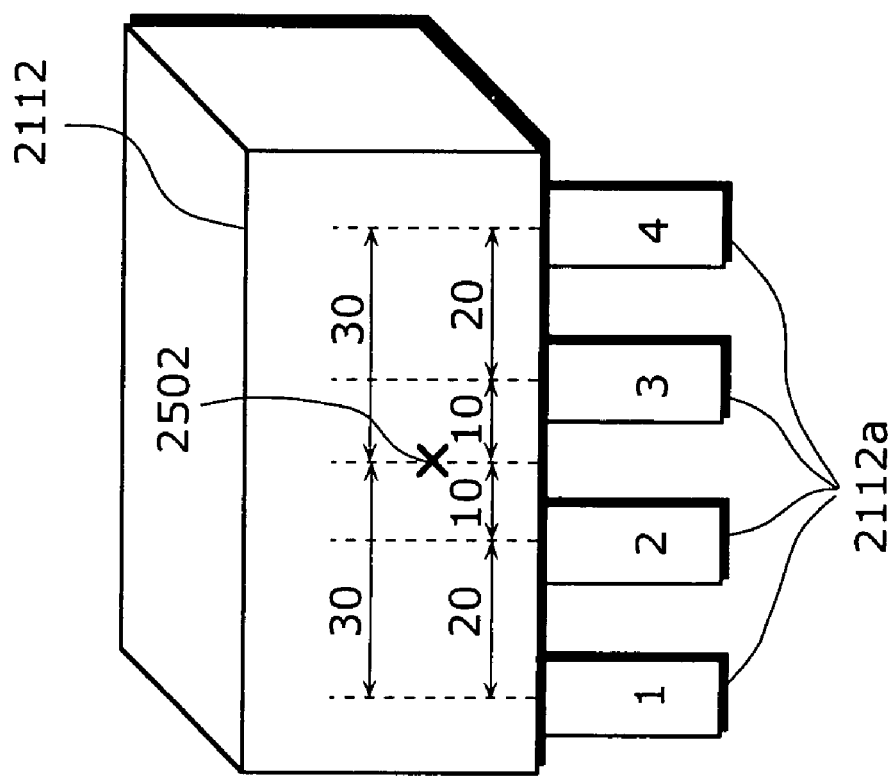

FIG. 33(a) is a diagram of a head 2112 viewed from the side. FIG. 33(b) is a diagram of the head 2112 viewed from the bottom. In order to simplify the following description, the number of pickup nozzles 2112a is assumed to be four. Nozzle numbers 1 to 4 are assigned to the pickup nozzles 2112a. Further, the center of the four pickup nozzles 2112a is located at the head center 2502. As shown in FIG. 33(a), the first pickup nozzle 2112a is offset to the left from the head center 2502 by 30 in the x-coordinate. Similarly, the second pickup nozzle 2112a is offset to the left from the head center 2502 by 10 in the x-coordinate. Further, the third and the fourth pickup nozzle 2112a are offset from the head center 2502 to the right by 10 and 30, respectively, in the x-coordinate.

FIG. 34 is a diagram showing an example of a board 2020. It is assumed that two board marks 2402 and 2404 are formed on the board 2020 in advance while four mounting points (mounting point 1 through mounting point 4) are further provided on the board. The four mounting points are points where components are to be mounted by the component mounter 2010. An image of the board mark 2402 and the board mark 2404 is acquired by the board recognizing camera (not shown) provided in the head 2112 for the purpose of positioning of the board 2020, so that their positions are recognized. Here, it is assumed that the position of the board mark 2402 is recognized first while the position of the board mark 2404 is recognized next. Here, the coordinates of the four mounting points are as shown in the figure. For example, the coordinates of the mounting point 1 are (x,y)=(100,100).

In addition, a hypothetical point referred to as a dummy point 2406 is provided outside the board 2020. Specifically, as shown in FIG. 35, the dummy point 2406 is provided at the component supply opening of the component cassette located in the center of a plurality of component cassettes 2114 in the component supply unit 2115a or 2115b. For example, when nine component cassettes 2114 are employed (Z-axis values are 1 to 9), the dummy point 2406 is provided at the component supply opening of the component cassette 2114 having a Z-axis value of 5.

Here, in the processing performed by the second component mounting order determining unit 308b, the dummy point 2406 is adopted as the start point and the end point when the component mounting order determination problem is modeled in the form of a closed circuit, which is an intermediate point on the closed circuit. Here, the mounting order determination problem modeled in the form of a closed circuit is equivalent to a traveling salesman problem.

Figure 36:
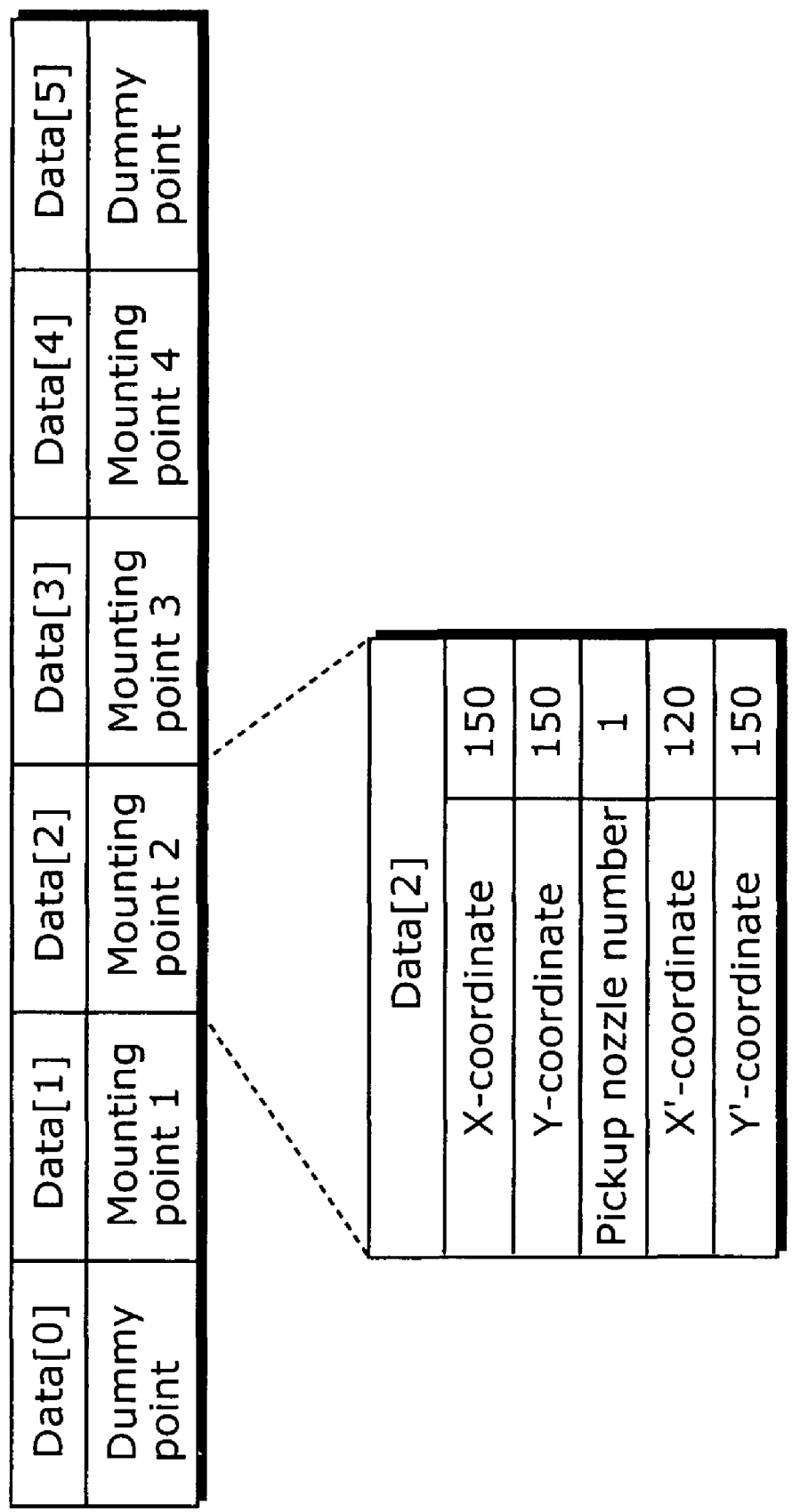
FIG. 36 is a diagram showing an example of a mounting point information array.

FIG. 36 is a diagram showing an example of a mounting point information array 1307a. In this processing, in contrast to the mounting point information array 1307a shown in FIG. 10, both the start point and the end point in the mounting point information array 1307a are assigned to the dummy point. Further, the mounting point information is different from that shown in FIG. 10. That is, the mounting point information includes: an "x-coordinate" and a "y-coordinate" which are the coordinates of a mounting point; a "pickup nozzle number" which is the number of the pickup nozzle 2112a that picks up the component to be mounted at the mounting point; and an "x'-coordinate" and a "y'-coordinate" obtained by correcting the "x-coordinate" and the "y-coordinate" based on the position of the pickup nozzle 2112a.

FIG. 37 is a diagram describing a calculation method for an "x'-coordinate" and a "y'-coordinate". As shown in the figure, the components to be mounted at the mounting points 1, 2, 3 and 4 are picked up by the pickup nozzles 2112a having the nozzle numbers 2, 1, 4 and 3. As shown in FIG. 33, the pickup nozzle 2112a having the nozzle number 1 is offset to the left from the head center 2502 by 30. Thus, although the coordinates of the mounting point 2 are (x,y)=(150,150), the coordinates (x',y') of the head center 2502 at the time of mounting at the mounting point 2 is (180(=150+30),150). As such, the "x'-coordinate" and the "y'-coordinate" indicate the coordinates of the head center 2502 at the time of component mounting.

Figure 38:
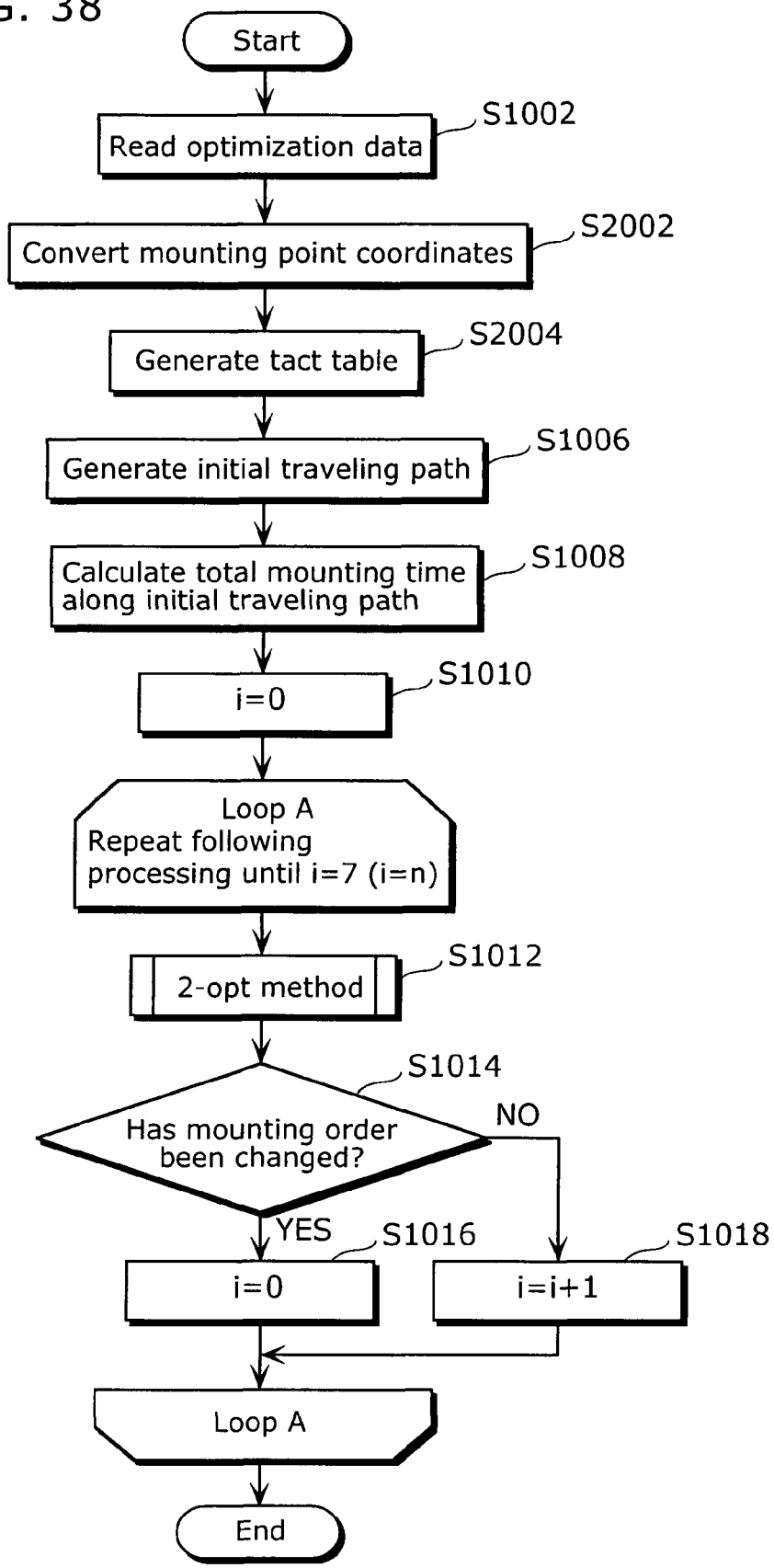
FIG. 38 is a flow chart of processing executed by a second component mounting order determining unit.

FIG. 38 is a flow chart of processing executed by the second component mounting order determining unit 308b.

The optimization data reading processing (S1002) is similar to the processing executed by the first component mounting order determining unit 308a. The second component mounting order determining unit 308b converts the read-out mounting point coordinates of the mounting point information array 1307a into an x'-coordinate and a y'-coordinate as described above (S2002).

Based on the obtained x'-coordinate and y'-coordinate of the mounting point and the coordinate of the dummy point, the second component mounting order determining unit 308b generates a tact table as shown in FIG. 15 (S2004). The subsequent processing (S1006 to S1018) is similar to the processing executed by the first component mounting order determining unit 308a. Thus, detailed description is not repeated here.

When the above-mentioned processing is performed, optimal component mounting order in a component mounter of modular type can be determined. This reduces operating time in the component mounter.

Here, in the above-mentioned method, as shown in FIG. 37, the types of the components held by the pickup nozzles 2112a have been fixed in advance. In the following example, two kinds of component type patterns for the components held by the pickup nozzles 2112a are prepared, and then a component type pattern is adopted that has the smaller mounting time for the components.

Figure 39:
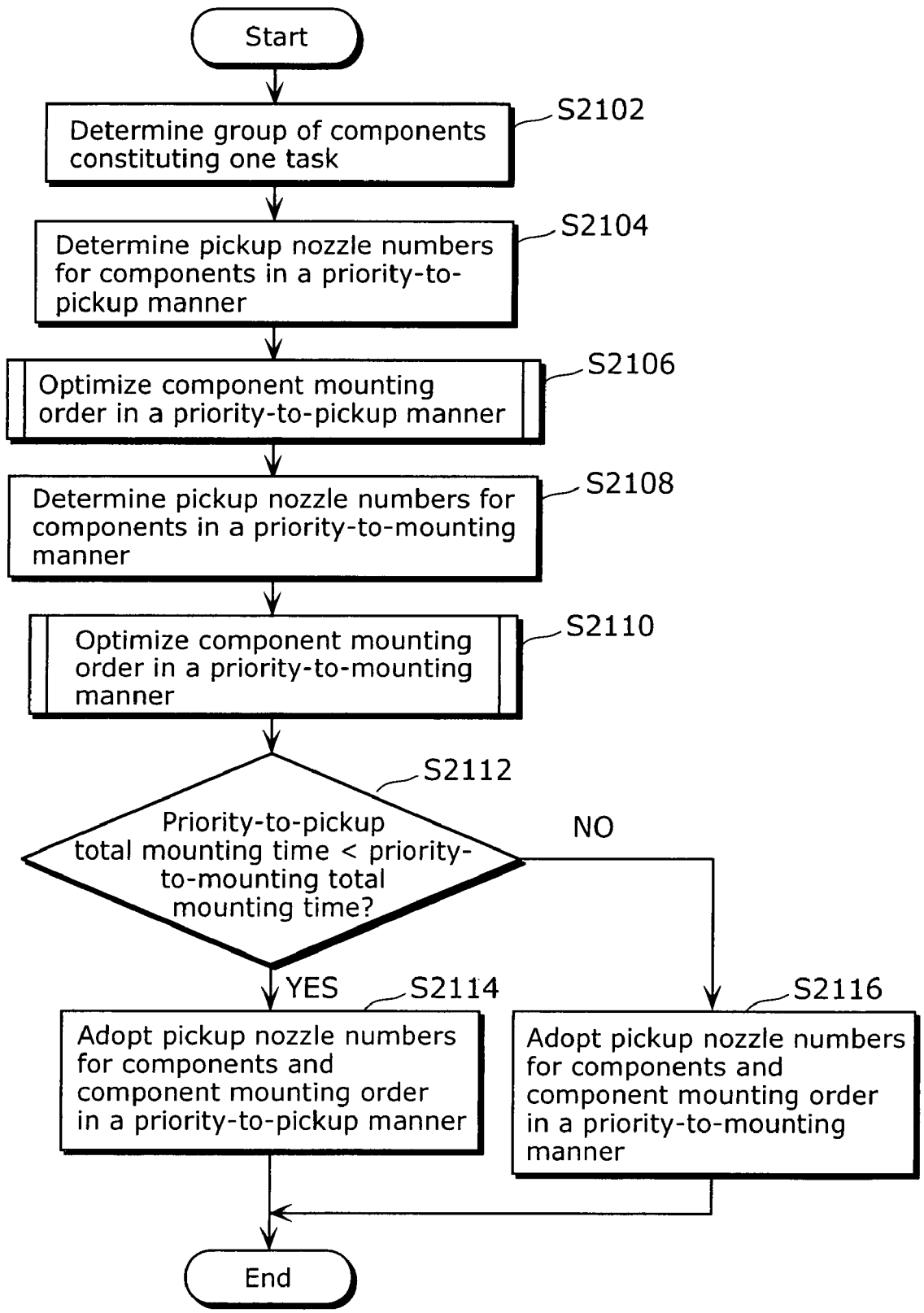
FIG. 39 is a flow chart of processing executed by a second component mounting order determining unit.

FIG. 39 is a flow chart of processing executed by the second component mounting order determining unit 308b.

The second component mounting order determining unit 308b determines a component group that makes up one task (S2102). The determination method for the component group may be a method of selecting a component one by one starting with a component of which the number to be mounted is greatest. For example, in the case of a number histogram shown in FIG. 40(a), component A through component D having the greater to-be-mounted numbers are adopted as a component group contained in one task.

Then, the second component mounting order determining unit 308b determines pickup nozzle numbers for the components in a priority-to-pickup manner (S2104). That is, the nozzle numbers are determined such as to minimize the component pickup time. For example, as shown in FIG. 40(b), the component cassettes 2114 are arranged in the order of components A, B, C and D. In this case, as shown in FIG. 40(c), the time for the component pickup is minimized when the component A is picked up by the pickup nozzle 2112a having the nozzle number 1, the component B is picked up by the pickup nozzle 2112a having the nozzle number 2, the component C is picked up by the pickup nozzle 2112a having the nozzle number 3, and the component D is picked up by the pickup nozzle 2112a having the nozzle number 4.

Then, based on the component pickup pattern in a priority-to-pickup manner obtained by the processing of S2104 as shown in FIG. 40(c), the second component mounting order determining unit 308b performs optimization processing for the component mounting order (S2106). The optimization processing (S2106) is similar to the processing shown in FIG. 38, and hence description is not repeated.

Then, the second component mounting order determining unit 308b determines pickup nozzle numbers for the components in a priority-to-mounting manner (S2108). That is, the nozzle numbers for component pickup are determined such as to minimize the component mounting time onto the board 2020. In this example, the pickup nozzle numbers for the components are determined so that a pickup nozzle 2112a having a smaller nozzle number picks up a component having a smaller x-coordinate of the mounting point. According to this determination method, the corrected x-coordinate (x'-coordinate) moves toward the center of the board 2020. This reduces the movement distance at the time of mounting by the head 2112.

For example, in the case where mounting points are arranged as shown in FIG. 41(a), as shown in FIG. 41(b) the component A is picked up by the pickup nozzle 2112a having the nozzle number 1, the component D is picked up by the pickup nozzle 2112a having the nozzle number 2, the component C is picked up by the pickup nozzle 2112a having the nozzle number 3, and the component B is picked up by the pickup nozzle 2112a having the nozzle number 4.

Then, based on the component pickup pattern in a priority-to-mounting manner obtained by the processing of S2108 as shown in FIG. 41(b), the second component mounting order determining unit 308b performs optimization processing for the component mounting order (S2110). The optimization processing (S2110) is similar to the processing shown in FIG. 38, and hence description is not repeated.

The second component mounting order determining unit 308b compares the total mounting time in the component mounting order determined in a priority-to-pickup manner (referred to as a "priority-to-pickup total mounting time", hereinafter) with the total mounting time in the component mounting order determined in a priority-to-mounting manner (referred to as a "priority-to-mounting total mounting time", hereinafter) (S2112).

When the priority-to-pickup total mounting time is smaller than the priority-to-mounting total mounting time (YES in S2112), the second component mounting order determining unit 308b adopts the component pickup pattern and the component mounting order determined in a priority-to-pickup manner (S2114). On the other hand, when the priority-to-mounting total mounting time is smaller than or equal to the priority-to-pickup total mounting time (NO in S2112), the second component mounting order determining unit 308b adopts the component pickup pattern and the component mounting order determined in a priority-to-mounting manner (S2116).

According to the above-mentioned processing, an optimal component type for the component to be held by each pickup nozzle 2112a can be determined.

Here, the processing executed by the second component mounting order determining unit 308b is applicable also to a component mounter of modular type in which a rotary head moves and mounts components onto a board.

Two kinds of such rotary heads are described below.

Figure 42:
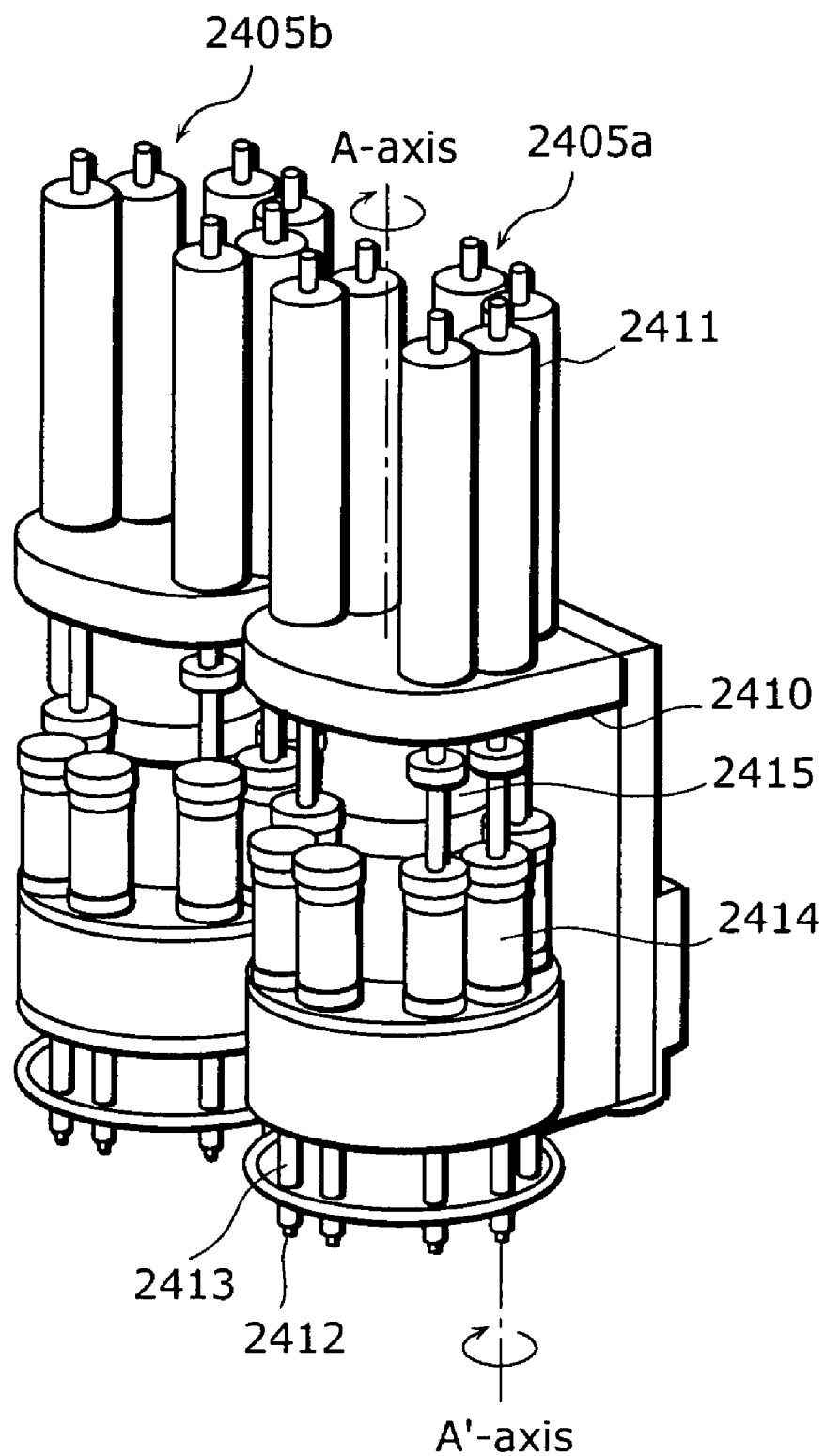
FIG. 42 is a perspective view of a rotary head.

FIG. 42 is a perspective view of a rotary head.

The rotary head 2405 has a first head unit 2405a and a second head unit 2405b which are installed in parallel and have the same function. Since these head units are units having approximately the same function, the structure of the first head unit 2405a is solely described below.

The first head unit 2405a includes: a fixing base 2410; a plurality (six in FIG. 42) of nozzle raising and lowering motors 2411 arranged on the fixing base 2410; a plurality of pickup nozzles 2412 that pick up components by suction and hold them; a pickup unit 2413 that holds the pickup nozzles 2412 in an attachable and detachable manner; a plurality of cam tubes 2414; and a θ-motor 2415 that causes the pickup nozzles 2412 to rotate about an A-axis or an A'-axis.

In the first head unit 2405a having the above-mentioned structure, by virtue of revolving operation of the θ-motor 2415, the plurality of pickup nozzles 2412 rotate about the A-axis in a state that their relative positions are maintained. Then, the pickup nozzle 2412 having moved to the immediate under of the nozzle raising and lowering motor 2411 moves downward by virtue of a pressing force from the nozzle raising and lowering motor 2411 located in the immediate over. Further, when the angle of the component picked up by the pickup nozzle 2412 is to be corrected, the pickup nozzle 2412 is rotated about the A'-axis by virtue of revolving operation of the θ-motor 2415.

Figure 43:
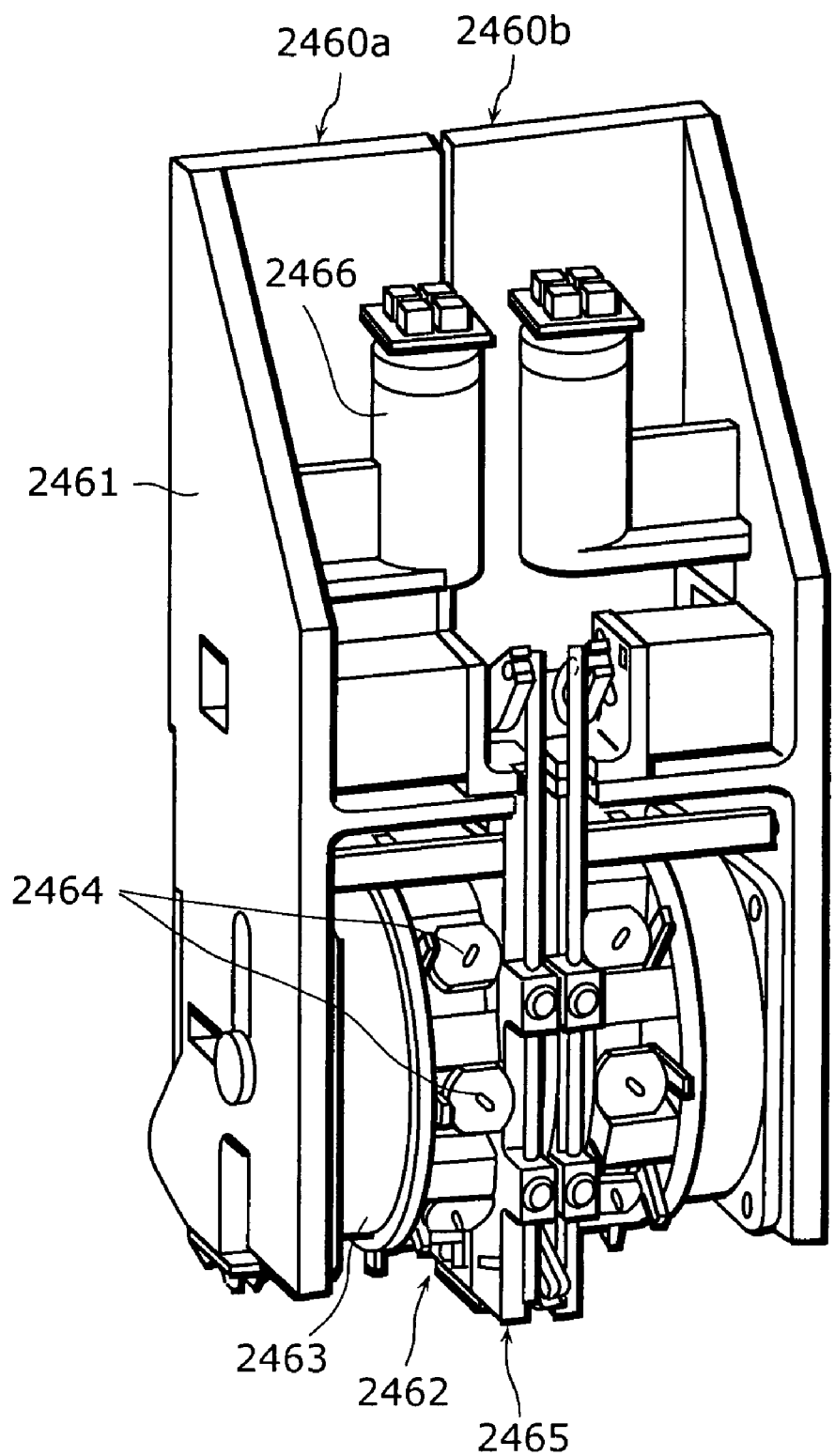
FIG. 43 is a perspective view of a rotary head.

Here, the above-mentioned description has been given for the case that the rotary head has a structure that plural sets of pickup nozzles are provided and that the pickup nozzles of each set in the same direction are rotated. However, the structure may be so that the pickup nozzles of each set in mutually different directions are rotated. That is, as shown in FIG. 43, the rotary head may has a first head unit 2460a and a second head unit 2460b which are installed in parallel and have the same function. Then, each of the first head unit 2460a and the second head unit 2460b may include: a unit outer frame 2461; a sub head 2462 attached to the unit outer frame 2461 in a manner that allows it to revolve; a sub head rotary motor 2463 that drives the rotation of the sub head 2462; pickup nozzles 2464 that pick up components and holding them; a depression mechanism 2465 that lowers the pickup nozzle 2464 located at the lower end position of the sub head 2462; and an image pickup unit 2466.

Here, as in the case of the rotary head shown in FIG. 43, when an image pickup unit 2466 (component recognition camera) is provided between the pickup and the mounting of the component, component recognition is completed between the pickup and the mounting of the component. Thus, in such a case, the operation of component recognition is performed after the pickup nozzle picks up the component by the time the component is moved to the mounting position. This provides a feature that the recognition time of the component can be disregarded so that the mounting time and the pickup time can be regarded as the same.

Optimization processing for component mounting order performed by using such a rotary head is described below.

FIG. 44 is a schematic diagram in the case where a component mounter provided with a rotary head 2405 shown in FIG. 42 is viewed from the above.

Here, for simplicity of description, one head unit is employed solely, while four pickup nozzles 2412 are provided. The rotary head 2405 picks up components with rotating clockwise when viewed from the above. The task picked up by the rotary head 2405 is made up of components A, B, C and D. The component cassettes 2114 are arranged in the component supply unit 2115a as shown in the figure. In this example, in the case where the rotary head 2405 picks up the components with moving from right to left in the figure, the time for the pickup operation is minimized when the component D is picked up by the first pickup nozzle 2412, the component C is picked up by the second pickup nozzle 2412, the component B is picked up by the third pickup nozzle 2412, and the component A is picked up by the fourth pickup nozzle 2412.

Figure 45:
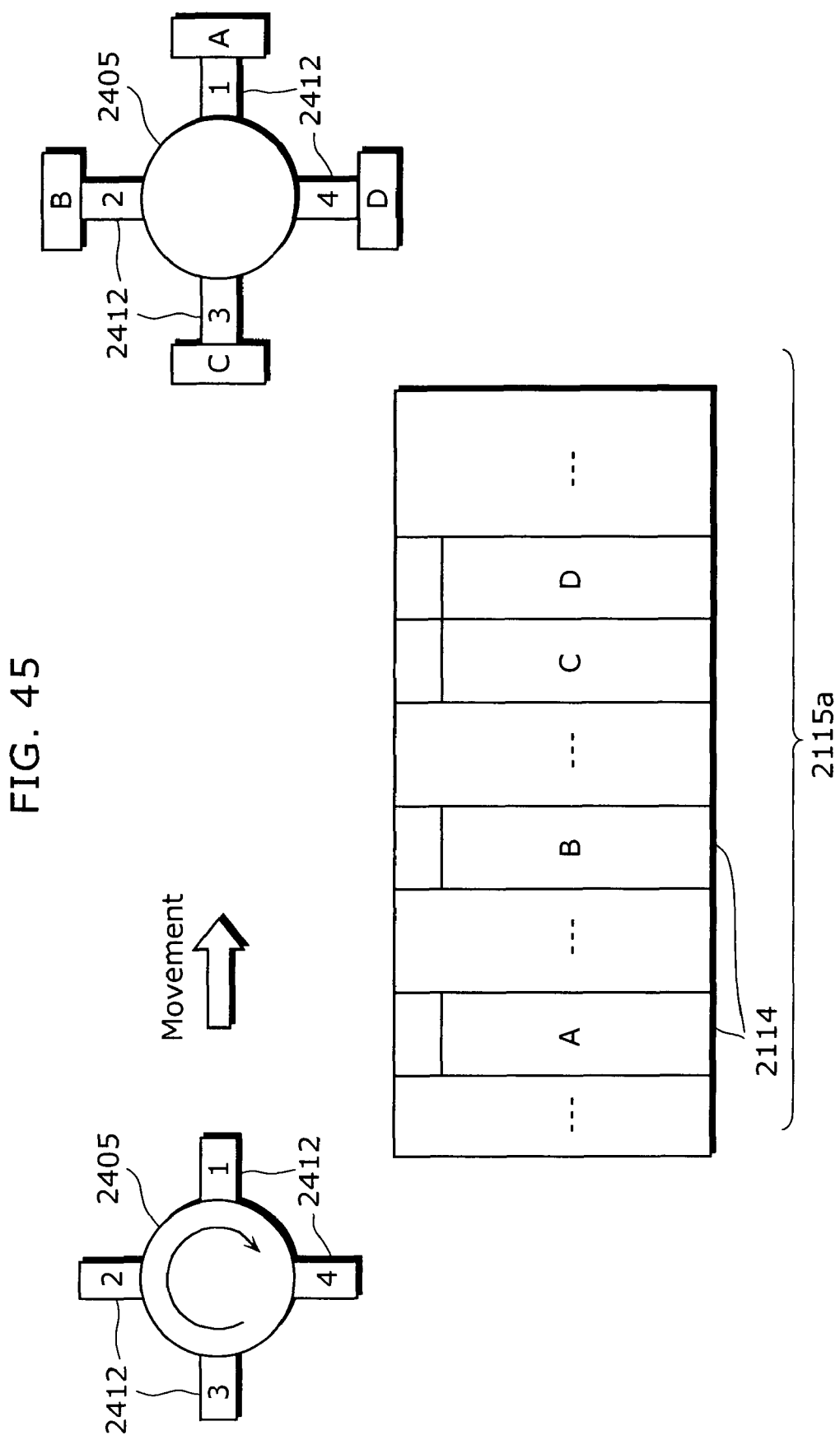
FIG. 45 is a diagram describing a pickup pattern in a priority-to-pickup manner.

On the other hand, in the case where the rotary head 2405 picks up the components with moving from left to right as shown in FIG. 45, the time for the pickup operation is minimized when the component A is picked up by the first pickup nozzle 2412, the component B is picked up by the second pickup nozzle 2412, the component C is picked up by the third pickup nozzle 2412, and the component D is picked up by the fourth pickup nozzle 2412.

When the processing subsequent to S2004 shown in FIG. 38 is performed in accordance with the pickup pattern for the components obtained as described above, optimal component mounting order can be determined for a component mounter of modular type provided with a rotary head. This reduces operating time in the component mounter.

Further, similarly to the case in FIG. 39, two kinds of component type patterns for the components held by the pickup nozzles 2112a may be prepared, and then a component type pattern may be adopted that has the smaller mounting time for the components.

Figure 46B:
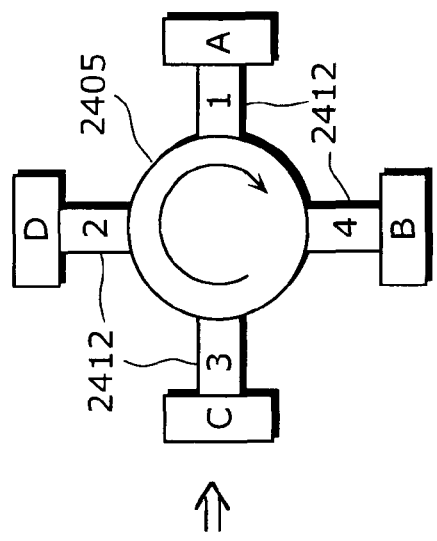
FIG. 46 is a diagram describing a pickup pattern in a priority-to-mounting manner.
Figure 46A:
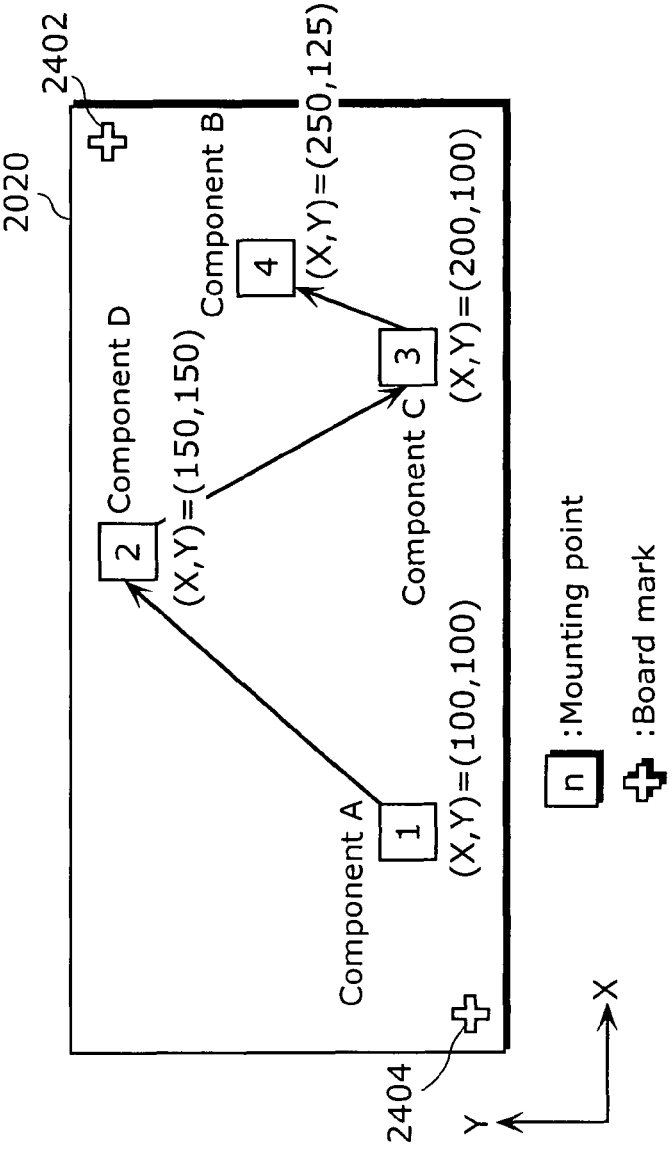

Here, the component pickup pattern in a priority-to-pickup manner is any one of the pickup patterns shown in FIGS. 44 and 45. Further, in the case where mounting points are arranged as shown in FIG. 46(a), based on the x-coordinates of the mounting points as shown in FIG. 46(b), the component pickup pattern in a priority-to-mounting manner is determined so that the component A is picked up by the first pickup nozzle 2412, the component D is picked up by the second pickup nozzle 2412, the component C is picked up by the third pickup nozzle 2412, and the component B picked up by the fourth pickup nozzle 2412 (S2108).

When processing similar to that shown in FIG. 39 is performed based on the component pickup pattern in a priority-to-pickup manner and the mounting pattern in a priority-to-mounting manner which have been determined as described above, an optimal component type for the component to be held by each pickup nozzle 2112a can be determined.

Here, in place of the configuration that the component mounting order determination processing is switched and executed as in the operating time reducing apparatus 300 in FIG. 2, the component mounting order determining apparatus may be used in place of the operating time reducing apparatus 300 such as to execute exclusively the component mounting order determination processing performed by the second component mounting order determining unit 308b. The component mounting order determining apparatus is similar to that described with reference to FIG. 28.

[Third Component Mounting Order Determining Unit 308c]

As a component mounter that mounts components such as electronic components onto a printed circuit board according to the conventional art, a component mounter is known in which a plurality of mounting heads alternately mount components onto one board.

In order to control such a component mounter, various component mounting methods have been proposed (see, for example, Japanese Laid-Open Patent Publication No. 2004-186391) In the technique disclosed in Japanese Laid-Open Patent Publication No. 2004-186391, components are mounted by two mounting heads. At that time, the components are allocated so that the number of mounting points for the components to be mounted onto the board is the same in each of the two mounting heads.

However, when the number of components assigned to each mounting head is merely equalized as in the technique described in Japanese Laid-Open Patent Publication No. 2004-186391, a tact loss cannot be resolved in the operation that the individual mounting heads alternately mount the components onto the board. That is, a problem arises that a time loss from the completion of component mounting operation onto the board performed by a particular mounting head until the start of component mounting operation onto the board performed by the next mounting head cannot be reduced.

For example, if pickup and recognition of the components by a particular mounting head were not completed at the time of completion of component mounting performed by the other mounting head, mounting operation for the components onto the board is suspended until the operation is completed. This suspended time causes a tact loss.

Further, in some cases depending on the component mounter, individual mounting heads can have mutually different numbers of pickup nozzles for the components. In such cases, if the number of mounting points for the components to be mounted were set up the same for each mounting head, the number of tasks could be different for each mounting head. Here, the task indicates a component group to be mounted in one iteration of a repeated series of operations composed of pickup, transportation and mounting of the components performed by the mounting head.

For example, in a component mounter in which two mounting heads alternately mount components, it is assumed that the number of nozzles of one mounting head is eight while the number of nozzles of the other mounting head is four. Further, the number of mounting points for the components is 240. In this case, when the number of mounting points for the components to be mounted by each mounting head is calculated according to the method described in Japanese Laid-Open Patent Publication No. 2004-186391 mentioned above, a value of 120 is obtained as the number of mounting points for the components which is obtained by dividing the total number 240 of mounting points for the components by the number 2 of mounting heads.

Accordingly, the number of tasks of one mounting head becomes 15 tasks (=120 points/8 nozzles), while the number of tasks of the other mounting head becomes 30 tasks (=120 points/4 nozzles). Thus, difference arises in the number of tasks.

Accordingly, in the first 15 tasks, one mounting head and the other mounting head alternately mount the components. At that time point, although one mounting head has completed the mounting of all components at 120 points, the other mounting head has mounted the components merely at 60 points (=4 nozzles×15 tasks). Thus, in the remaining 15 tasks, one mounting head stops, while the other mounting head solely operates and mounts the components. This reduces production efficiency.

As such, in the case where the number of provided pickup nozzles is different for each mounting head, when the mounting order for the components is determined in accordance with the method described in Japanese Laid-Open Patent Publication No. 2004-186391 mentioned above, a problem of reduction in the production efficiency arises.

Here, even when the number of pickup nozzles is the same for each other, the above-mentioned unbalance in the number of tasks can arise in the case where interference occurs between the components to be picked up caused by difference in the component size so that the components cannot physically be picked up in a number equal to the number of pickup nozzles.

Accordingly, for a component mounter in which a plurality of mounting heads alternately mount components onto one board, an object of the third component mounting order determining unit $308c$ is to determine optimal component mounting order in which a tact loss in the component mounting operation onto the board is minimized, so that production efficiency is improved.

Further, for a component mounter in which a plurality of mounting heads alternately mount components onto one board, another object is to provide a method of determining optimal component mounting order and thereby improving production efficiency even when the number of provided nozzles is different for each mounting head.

The component mounter controlled by the third component mounting order determining unit $308c$ is the component mounter 3100 shown in FIG. 1.

The component mounter 3100 includes: two component supply units 3115 each composed of an array of component cassettes 3114 each accommodating a component tape; a line gang pickup head 3112 having a plurality of pickup nozzles (referred to simply as "nozzles", in some cases hereinafter) capable of picking up electronic components from the component cassettes 3114 and mounting them onto a board 3020; a beam 3113 to which the line gang pickup head 3112 is attached; a component recognition camera 3116 that inspects in a two-dimensional or three-dimensional manner the pickup state of components picked up by the line gang pickup head 3112; and a tray supply unit 3117 that supplies a tray component. Here, the tray supply unit 3117 and the like are not provided in some cases depending on the sub-equipment.

Here, the "component tape" indicates a tape (carrier tape) on which a plurality of components of the same component type are arranged. This tape is supplied in a state wound around a reel (supply reel) or the like, and is used mainly for supplying components having a comparatively small size and referred to as chip components, to a component mounter.

Specifically, the component mounter 3100 is a mounter that has both the function of a component mounter referred to as a high-speed mounter and the function of a component mounter referred to as a multifunctional mounter. The high-speed mounter generally indicates an apparatus that mounts electronic components of 10 mm square or smaller at a speed of 0.1 second each or the like and that is characterized by high productivity. The multifunctional mounter indicates an apparatus that mounts large-size electronic components of 10 mm square or larger, irregularly shaped components such as switches and connectors, and IC components such as a QFP (Quad Flat Package) and a BGA (Ball Grid Array).

That is, the component mounter 3100 is designed to be capable of mounting almost all types of electronic components (the range of components to be mounted extends from a 0.4 mm×0.2 mm chip resistor to a 200 mm connector). Thus, when a necessary number of the component mounters 3100 are merely arranged, a mounting line can be constructed.

Figure 47:
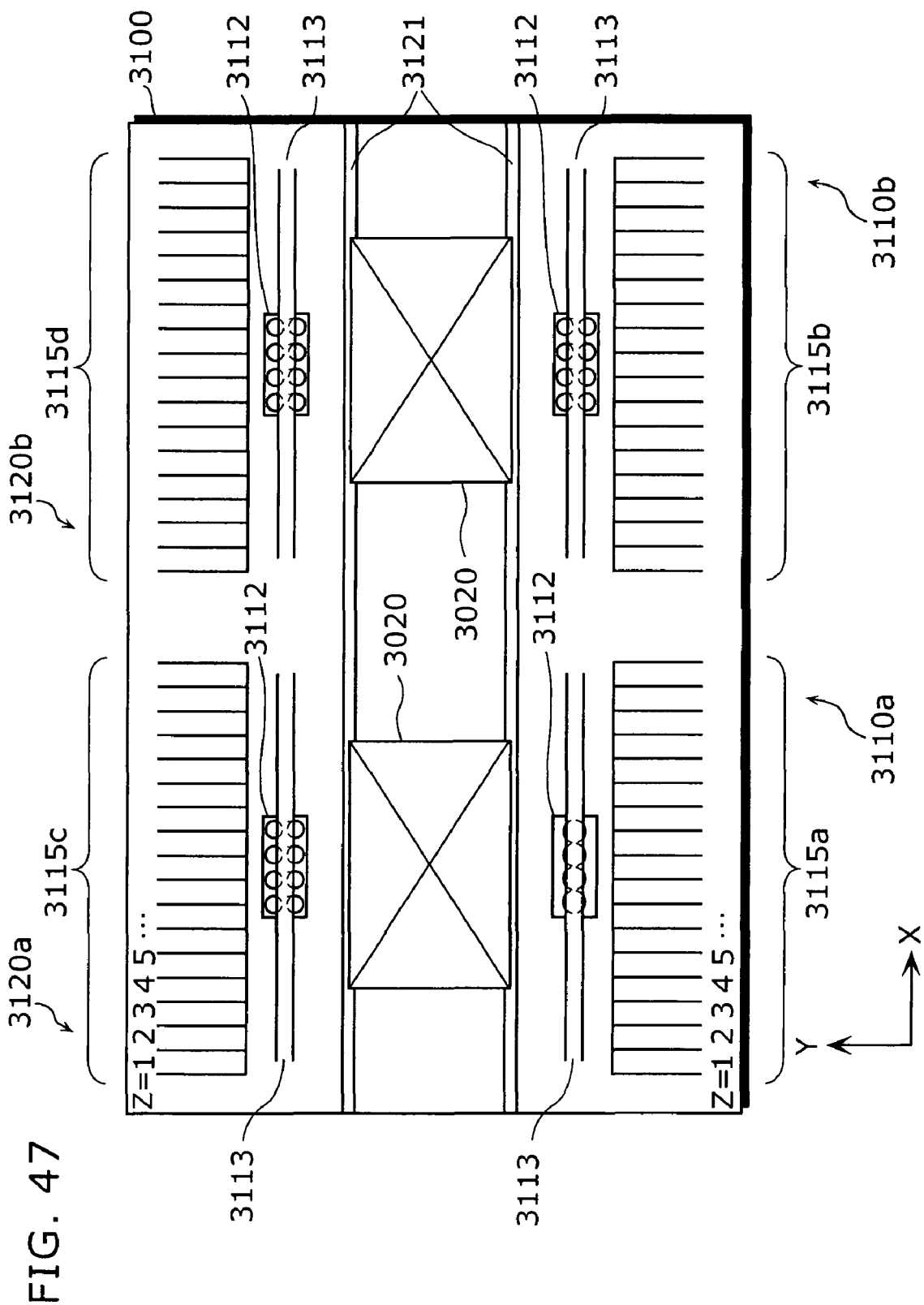
FIG. 47 is a plan view showing a major configuration of inside of a component mounter.

FIG. 47 is a plan view showing a major configuration of inside of a component mounter 3100 according to the present invention.

The component mounter 3100 includes in the inside: sub-equipment arranged in the board transportation direction (X-axis direction); and sub-equipment arranged in the forward and backward directions (Y-axis direction) of the component mounter 3100. In total, the component mounter 3100 includes four sub-equipment 3110a, 3110b, 3120a and 3120b. The sub-equipment (3110a/3110b and 3120a/3120b) arranged in the X-axis direction are mutually independent, and hence can simultaneously perform mutually different mounting work. Further, the sub-equipment (3110a/3120b and 3120b/3120a) are also mutually independently, and hence can simultaneously perform mutually different mounting work. On the other hand, the sub-equipment (3110a/3120a and 3110b/3120b) facing with each other in the forward and backward directions (Y-axis direction) cooperate with each other so as to perform mounting work on one board.

As for each sub-equipment 3110a, 3110b, 3120a and 3120b, each sub-equipment 3110a, 3110b, 3120a and 3120b is provided with a beam 3113, a line gang pickup head 3112 and component supply units 3115a to 3115d. Further, in the component mounter 3100, a pair of rails 3121 for board 3020 transportation is provided between the sub-equipment arranged in the forward and backward directions.

Here, the component recognition camera 3116, the tray supply unit 3117 and the like are not essential parts of the present invention. Thus, description is omitted in the figure.

The beam 3113 is a rigid body extending in the X-axis direction, and can move on a railway (not shown) provided in the Y-axis direction (perpendicular to the transportation direction for the board 3020), with maintaining the state of being parallel to the X-axis direction. Further, the beam 3113 allows the line gang pickup head 3112 attached to the beam 3113 to move along the beam 3113, that is, in the X-axis direction. Thus, by virtue of the movement of itself in the Y-axis direction and the X-axis directional movement of the line gang pickup head 3112 that moves in the Y-axis direction in association with the above-mentioned movement, the line gang pickup head 3112 can move freely in the XY plane. Further, a plurality of motors such as motors (not shown) for driving these are provided in the beam 3113. Electric power to these motors and the like is supplied via the beam 3113.

Figure 48:
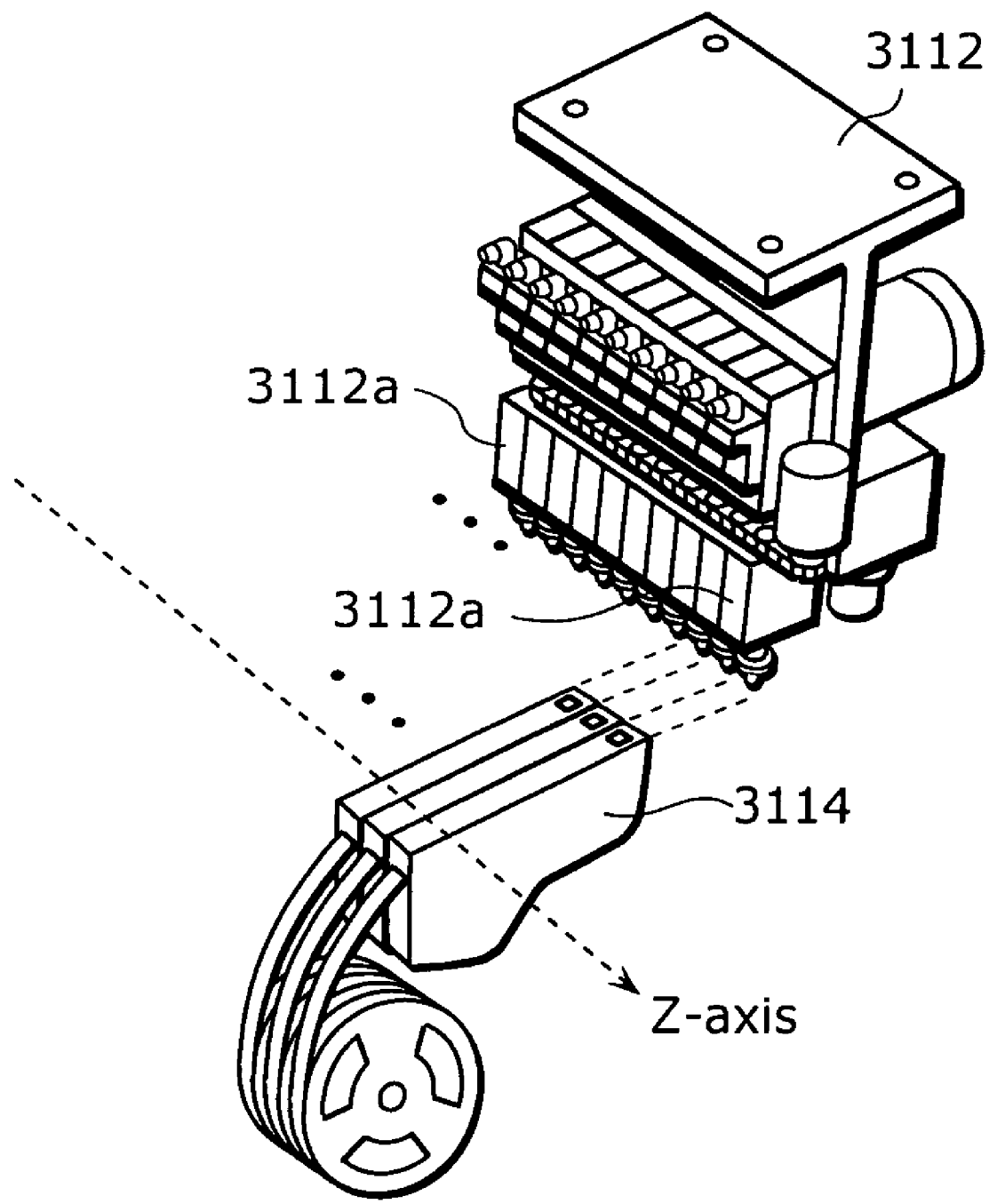
FIG. 48 is a schematic diagram showing positional relation between a line gang pickup head and a component cassette.

FIG. 48 is a schematic diagram showing positional relation between a line gang pickup head 3112 and a component cassette 3114.

The line gang pickup head 3112 can be equipped with a plurality of pickup nozzles 3112a to 3112b, and can pick up electronic components of a number equal to the number of pickup nozzles at maximum in an ideal case, from the individual component cassettes 3114 simultaneously (by in one iteration of a lowering and raising operation).

The line gang pickup head 3112 can move along the beam 3113. This movement is driven by a motor (not shown). Further, the lowering and raising operation at the time of picking up and holding the electronic components and mounting the held electronic components onto the board 3020 is also driven by a motor.

Figure 49:
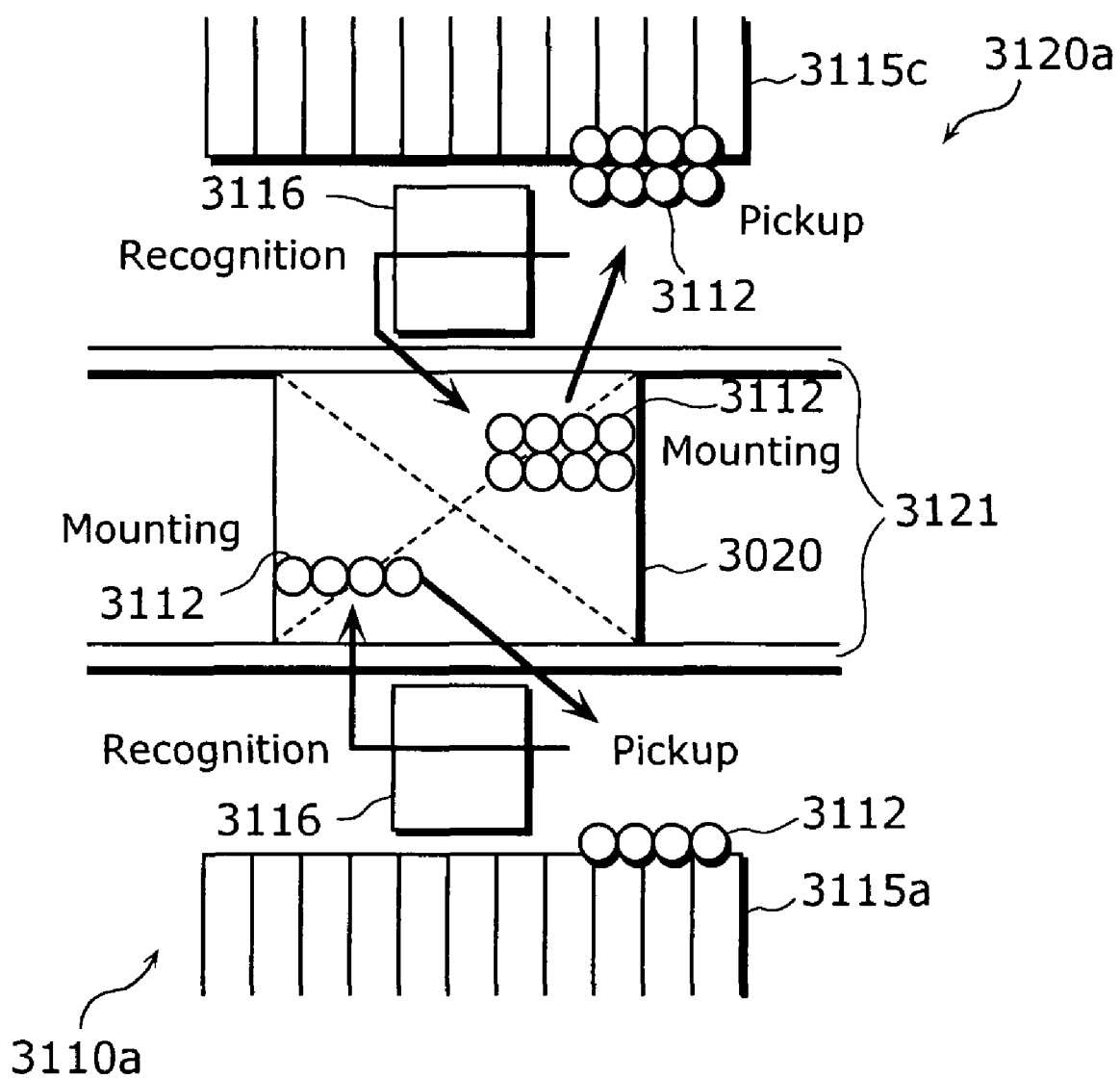
FIG. 49 is a diagram describing component mounting performed by a component mounter.

FIGS. 49 and 50 is a diagram describing component mounting performed by a component mounter 3100. Here, in FIGS. 49 and 50, the only the left sub-equipment are illustrated. However, the right sub-equipment operate similarly so as to mount the components. Thus, they are omitted in FIGS. 49 and 50.

As shown in FIG. 49, the line gang pickup head 3112 of the sub-equipment 3120a alternately repeats three kinds of operation composed of "pickup" of the components from the component supply unit 3115c, "recognition" of the picked-up components by using the component recognition camera 3116, and "mounting" of the recognized components onto the board 3020, and thereby mounts the components onto the board 3020.

Here, the line gang pickup head 3112 of the sub-equipment 3110a similarly repeats alternately the three kinds of operation composed of "pickup", "recognition" and "mounting", and thereby mounts the components onto the board 3020.

Here, at the time that the two line gang pickup heads 3112 simultaneously perform "mounting" of the components, in order that collision is avoided between the line gang pickup heads 3112, the two line gang pickup heads 3112 mounts the components onto the board 3020 in the form of coordinated operation. Specifically, as shown in FIG. 50(a), when the line gang pickup head 3112 of the sub-equipment 3120a performs "mounting" operation, the line gang pickup head 3112 of the sub-equipment 3110a performs "pickup" operation and "recognition" operation. In contrast, as shown in FIG. 50(b), when the line gang pickup head 3112 of the sub-equipment 3110a performs "mounting" operation, the line gang pickup head 3112 of the sub-equipment 3120a performs "pickup" operation and "recognition" operation. As such, when the two line gang pickup heads 3112 perform "mounting" operation alternately, collision can be avoided between the line gang pickup heads 3112. Here, in an ideal case, during the time that "mounting" operation is performed by one line gang pickup head 3112, if "pickup" operation and "recognition" operation by the other line gang pickup head 3112 are completed, the "mounting" operation to be performed by the other line gang pickup head 3112 can be started without delay at the time that the "mounting" operation by one of the line gang pickup heads 3112 has been completed. This improves production efficiency.

FIGS. 51 to 54 are diagrams respectively showing examples of the mounting point data 3307a, the component library 3307b, the mounting apparatus information 3307c and the number-of-mounting-points information 3307d.

Figure 51:
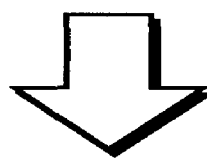
FIG. 51 is a diagram showing an example of mounting point data.

The mounting point data 3307a is a group of the information that indicates the mounting points for all components to be mounted. As shown in FIG. 51, one mounting point pi includes a component type ci, an X-coordinate xi, a Y-coordinate yi and control data $\phi i$. Here, the "component type" corresponds to the component name in the component library 3307b shown in FIG. 52. The "X-coordinate" and the "Y-coordinate" are the coordinates of the mounting point (coordinates that indicate a particular position on the board). The "control data" is restriction information concerning the mounting of the component (such as the type of a pickup nozzle the can be used and the highest transportation speed of the line gang pickup head 3112). Here, NC data to be obtained finally is a sequence of mounting points that minimizes the line tact.

The component library 3307b is a library generated by collecting information specific to each of all component types that can be processed by the component mounter 3100. As shown in FIG. 52, the component library 3307b contains for each component type: a component size; a tact (the tact specific to the component type under a particular condition); and other restriction information (such as the type of a pickup nozzle that can be used, the recognition method used by the component recognition camera 3116, and the maximum speed ratio of the line gang pickup head 3112). Here, in the figure, external appearances of components of various component types are also shown for convenience.

The mounting apparatus information 3307c is information that indicates the apparatuses configuration, the above-mentioned restriction, and the like for all individual sub-equipment that make up the production line. As shown in FIG. 53, the mounting apparatus information 3307c includes: head information concerning the type of the line gang pickup head 3112, that is, for example, concerning the number of pickup nozzles provided in the line gang pickup head 3112; nozzle information, for example, concerning the type of the pickup nozzles that can be attached to the line gang pickup head 3112; cassette information, for example, concerning the maximum number of component cassettes 3114; and tray information, for example, concerning the number of trays held in the tray supply unit 3117.

The number-of-mounting-points information 3307d is provided for each of the sub-equipment (3110a/3120a and 3110b/3120b) facing in the forward and backward directions (in the X-axis direction) in the component mounter 3100 shown in FIG. 47. In the following description, the sub-equipment 3110a and 3120a are referred to as the "left sub-equipment", while the sub-equipment 3110b and 3120b are referred to as the "right sub-equipment".

The number-of-mounting-points information 3307d is provided for each of the left sub-equipment and the right sub-equipment. As shown in FIG. 54, the number-of-mounting-points information 3307d is information in which correspondence is established between each component type of the mounting point to be mounted onto the board and its number (the number of mounting points for the component). For example, as shown in the figure, the component types to be mounted by the left sub-equipment are five kinds of A, B, C, D and E, while the numbers of mounting points for the components are 40, 20, 20, 5 and 15, respectively.

Figure 55:
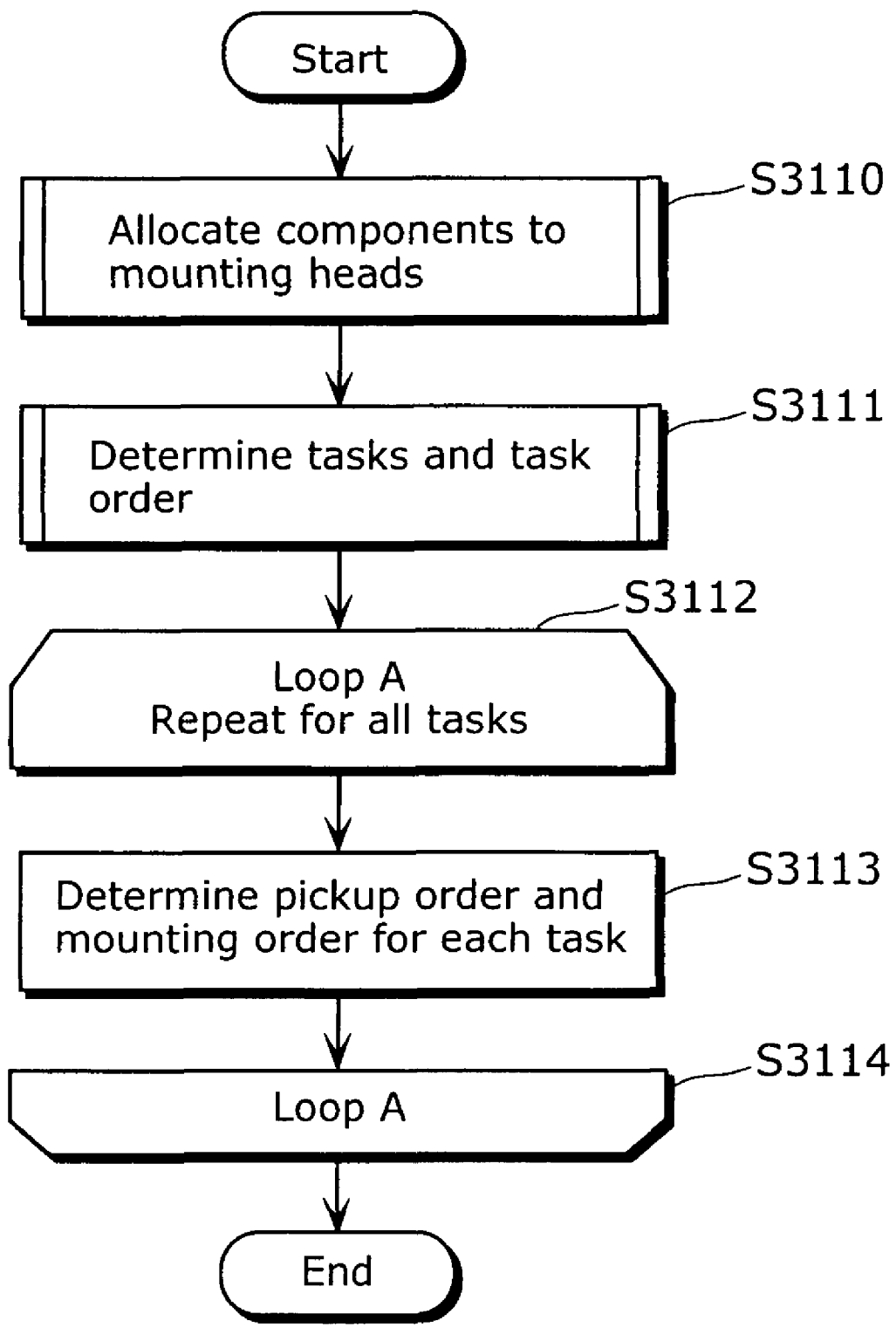
FIG. 55 is a flow chart of processing of determining component mounting order performed by an optimization apparatus.

The operation of the third component mounting order determining unit 308c is described below. FIG. 55 is a flow chart showing processing of determining component mounting order performed by the third component mounting order determining unit 308c. In the following description, a determination method for component mounting order is describe for the case of the left sub-equipment of the component mounter 3100. However, when similar processing is performed for the right sub-equipment of the component mounter 3100, component mounting order is determined.

The third component mounting order determining unit 308c allocates the components to be mounted onto one board 3020 to either the line gang pickup head 3112 (referred to as the "front head", hereinafter) of the sub-equipment 3120a or the line gang pickup head 3112 (referred to as the "rear head", hereinafter) of the sub-equipment 3110a (S3110). That is, the mounting order determining unit 3305c determines whether the to-be-mounted components should be mounted by the front head or by the rear head. Details of the allocation processing (S3110) is described later.

Then, the third component mounting order determining unit 308c determines tasks and task order in a state that the allocation result of the component allocation processing (S3110) is maintained (S3111). Details of the task determination processing (S3111) is described later.

Finally, for each determined task, the third component mounting order determining unit 308c determines pickup order for the components within the task (S3112 to S3114). As for the determination method for the pickup order for the components in a task, various techniques have been proposed already. Further, the method is not an essential part of the present application. Thus, description is not repeated here.

Figure 56:
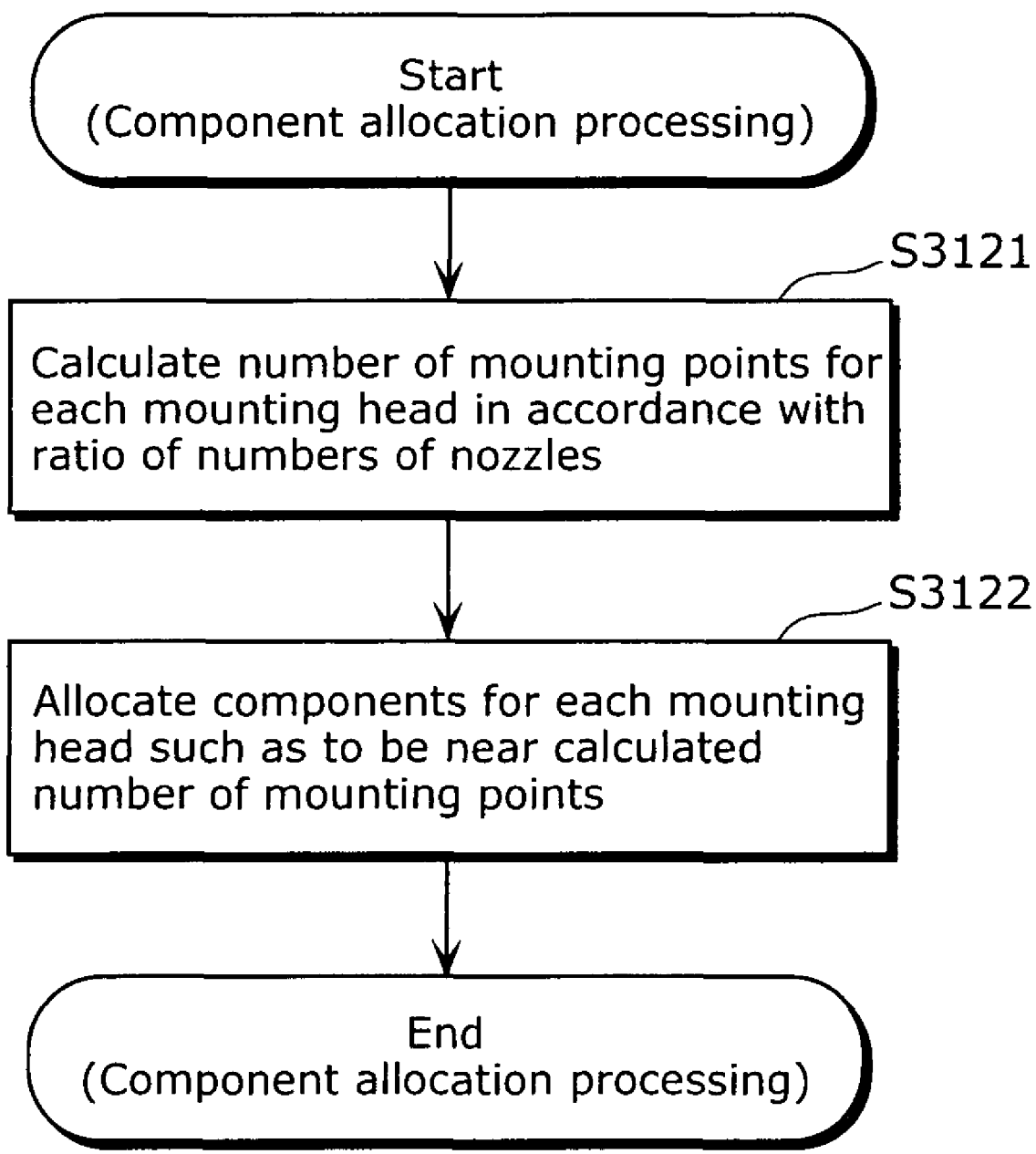
FIG. 56 is a detailed flow chart of component allocation processing.

First, the component allocation processing (S3110 in FIG. 55) is described below with reference to a practical example. FIG. 56 is a detailed flow chart of the component allocation processing (S3110 in FIG. 55). In this example, as shown in FIG. 53, it is assumed that the number of pickup nozzles of the front head is eight while the number of pickup nozzles of the rear head is four. Further, the component types of the components to be mounted and their numbers of mounting points are as shown in the number-of-mounting-points information 3307d in FIG. 54.

Figure 57:
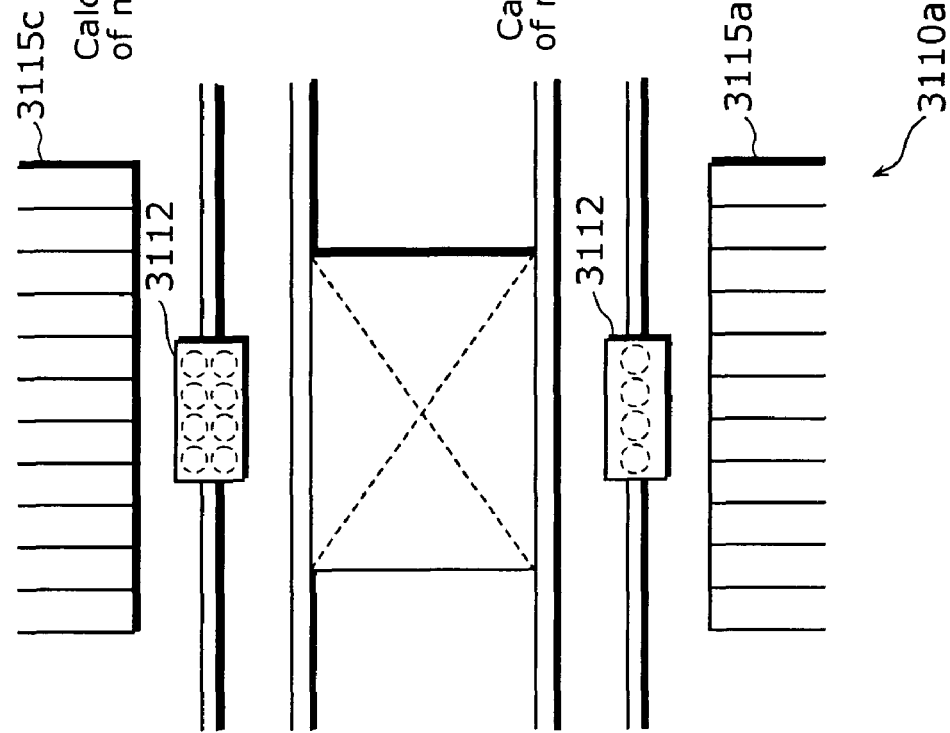
FIG. 57 is a diagram describing component allocation processing.

First, in accordance with the ratio of the total number of mounting points per board 3020 relative to the number of pickup nozzles, the third component mounting order determining unit 308c calculates the numbers of mounting points for the components to be mounted by the front head and the rear head (S3121). For example, as shown in FIG. 57, when the total number 100 of mounting points per board 3020 is disturbed in a ratio of 8 to 4, the number of mounting points for the components to be mounted by the front head is obtained to be 66.66, while the number of mounting points for the components to be mounted by the rear head is obtained to be 33.33. These numbers of mounting points for the components are ideal numbers of mounting points for the components.

Then, the third component mounting order determining unit 308c allocates the components to either the front head or the rear head for each component type so that the number of mounting points for the components is close to the number of components calculated in the number-of-mounting-points calculation processing (S3121)(S3122).

Figure 58:
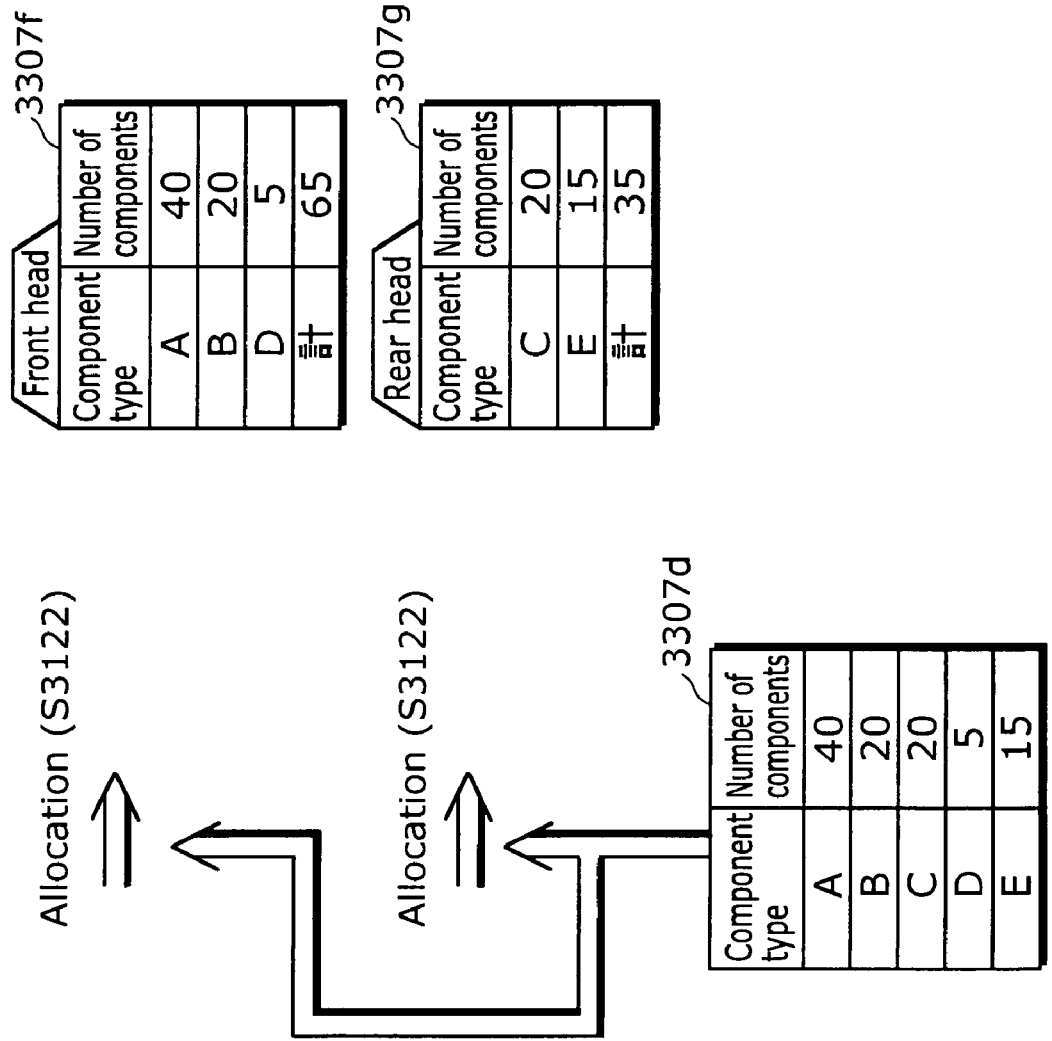
FIG. 58 is a diagram describing component allocation processing.

For example, as shown in FIG. 58, the component types A to E shown in the number-of-mounting-points information 3307d are allocated so that the number of mounting points for the components of the front head is close to 66.66 while the number of mounting points for the components of the rear head is close to 33.33. That is, as shown in the number-of-mounting-points information 3307f, when the component types to be mounted by the front head are adopted as three types of A, B and D, the total value becomes 65 which is close to 66.66. Further, as shown in the number-of-mounting-points information 3307g, when the component types to be mounted by the rear head are adopted as two types of C and E, the total value becomes 35 which is close to 33.33.

Figure 59:
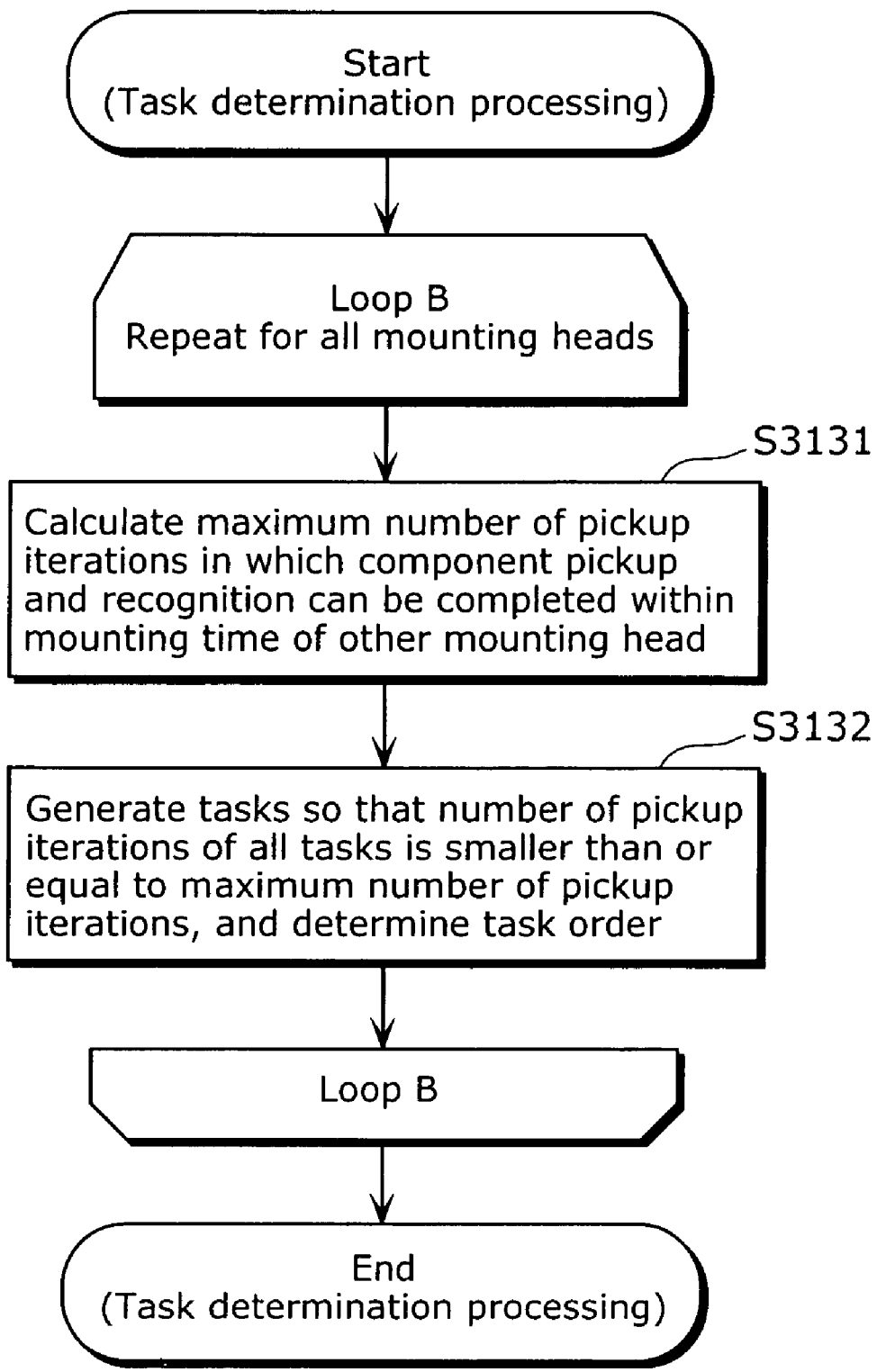
FIG. 59 is a detailed flow chart of task determination processing.

Next, the task determination processing (S3111 in FIG. 55) is described below with reference to a practical example. FIG. 59 is a detailed flow chart of the task determination processing (S3111 in FIG. 55). First, the third component mounting order determining unit 308c calculates the maximum number of iterations of pickup so that "pickup" and "recognition" of components by the line gang pickup head 3112 of interest can be completed within the time of "mounting" performed by the line gang pickup heads 3112 other than the line gang pickup head 3112 of interest (S3131).

That is, when the maximum number of iterations of pickup of the front head is to be acquired, the maximum number of iterations of pickup is calculated within the range that the following Formula (5) is satisfied.

$$\text{mounting time in rear head} \geq \text{pickup time in front head} + \text{recognition time in front head} \quad (5)$$

Here, when it is assumed that the mounting time per component in the rear head is 0.2 second, the component pickup time per iteration in the front head is 0.2 second, the recognition time for the component picked up by the front head is 0.2 second, and the maximum number of iterations of pickup in the front head is denoted by nf, Formula (5) can be rewritten into the following Formula (6).

$$0.2 \times 4 \geq 0.2 \times nf + 0.2 \quad (6)$$

When the value of the greatest nf that satisfies Formula (2) is calculated, nf=3 is obtained. Thus, the maximum number of iterations of pickup in the front head is obtained to be 3.

Similarly, when the maximum number of iterations of pickup in the rear head is to be acquired, the following Formula (7) need be satisfied.

$$\text{mounting time in front head} \geq \text{pickup time in rear head} + \text{recognition time in rear head} \quad (7)$$

Here, when it is assumed that the mounting time per component in the front head is 0.2 second, the component pickup time per iteration in the rear head is 0.2 second, the recognition time for the component picked up by the rear head is 0.2 second, and the maximum number of iterations of pickup in the rear head is denoted by nr, Formula (7) can be rewritten into the following Formula (8).

$$0.2 \times 8 \geq 0.2 \times nr + 0.2 \quad (8)$$

When the value of the greatest nr that satisfies Formula (2) is calculated, nr=7 is obtained. Thus, the maximum number of iterations of pickup in the rear head is obtained to be 7.

That is, component pickup by the front head per task may be performed in three iterations or less, while component pickup by the rear head per task may be performed in seven iterations or less.

Then, the third component mounting order determining unit 308c generates tasks so that the number of iterations of pickup in all tasks of the line gang pickup head 3112 of interest is smaller than or equal to the maximum number of iterations of pickup, and then determines task order (S3132). The third component mounting order determining unit 308c executes the maximum-number-of-iterations-of-pickup calculation processing (S3131) and the task generation processing (S3132) for all line gang pickup heads 3112 (loop B), and thereby determines the tasks for the individual line gang pickup heads 3112.

Figure 60:
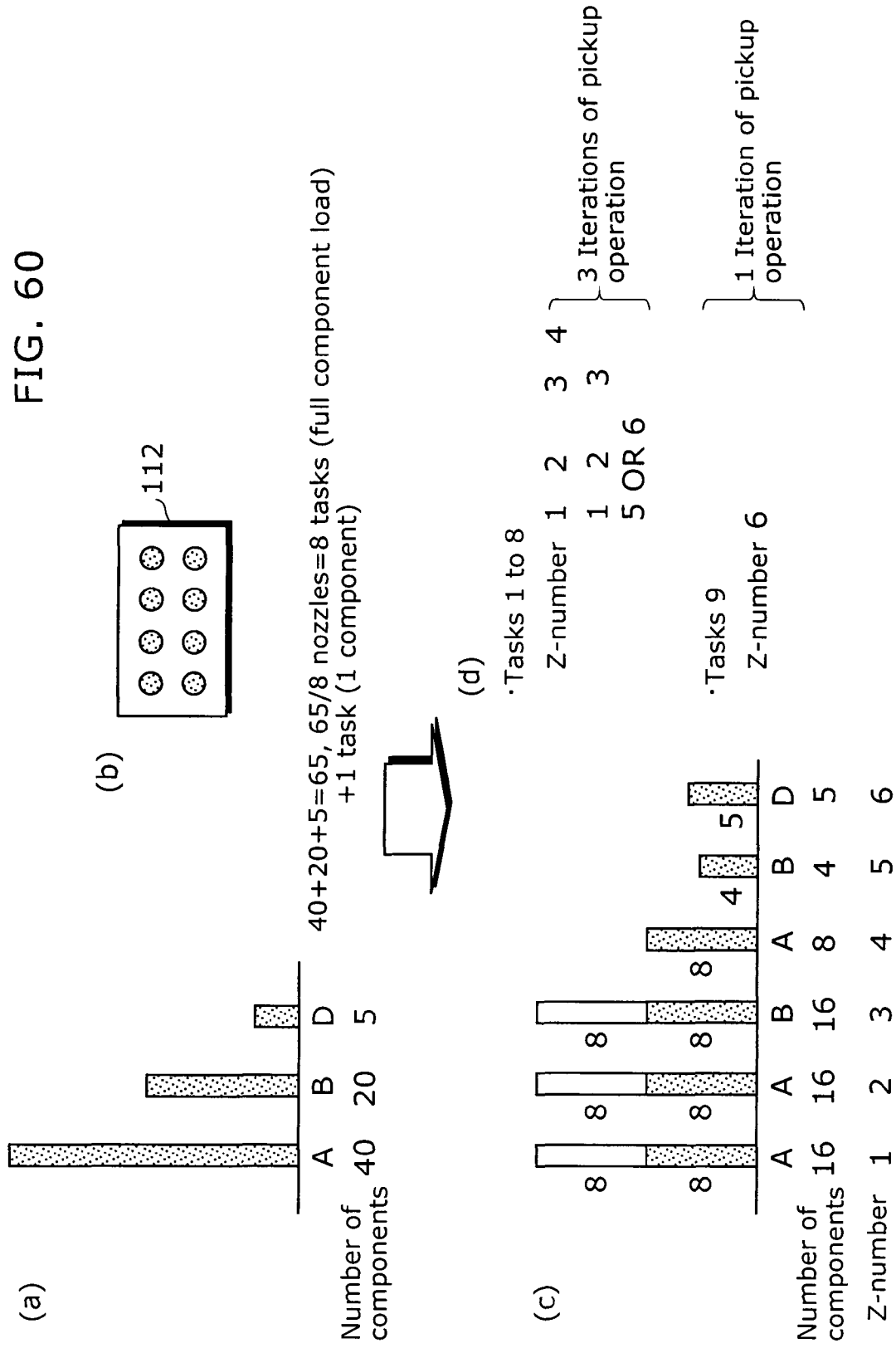
FIG. 60 is a diagram describing details of task generation processing for a front head.

FIG. 60 is a diagram describing details of the task generation processing (S3132 in FIG. 59) for the front head. As shown in FIG. 60(a), the types of components assigned to the front head are three kinds of A, B and D, while the numbers of components (the numbers of mounting points) are 40, 20 and 5, respectively. As shown in FIG. 60(b), when the total number 65 of these components is divided by the number 8 of pickup nozzles of the front head, 8 with a remainder of 1 is obtained. That is, when component mounting is to be performed in a state that components are fully loaded to the eight pickup nozzles of the front head, the mounting onto the board 3020 may be performed in a state that components are fully picked up and loaded in eight tasks while one component is picked up in the remaining one task.

Here, in each of the nine tasks in total, in order that pickup of the components is reliably be achieved in three iterations or less, which is the maximum number of iterations of pickup of the front head, processing referred to as "component division" is performed. The "component division" is processing in which a component group (one component tape) belonging to one component type is divided into a plurality of component tapes, and then a plurality of component tapes of the same kind are arranged in the component supply unit 3115c, so that a plurality of components of the same component type are allowed to be picked up at once.

FIG. 60(c) shows a sequence of components in the component supply unit 3115c obtained as a result of component division. The sequence position of a component is identified by a number referred to as a Z-number. Here, when each component type is grouped into eight components each so that component division is performed so that the maximum number of iterations of pickup is 3 or less, a sequence of components shown in FIG. 60(c) is determined.

When tasks and task order are to be acquired based on this arrangement, tasks and task order are obtained as shown in FIG. 60(d). That is, in the pickup order for the first eight tasks (task 1 through task 8), components (components A, A, B and A) having Z-numbers of 1, 2, 3 and 4 may be picked up in the first pickup operation. Then, components (components A, A and B) having Z-numbers of 1, 2 and 3 may be picked up in the second pickup operation. Then, a component (component B) having a Z-number of 5 or a component (component D) having a Z-number of 6 may be picked up in the third pickup operation. According to this method, components are fully picked up and loaded to the pickup nozzles of the front head by three iterations of pickup.

Further, in the last one task (task 9), the component D arranged at the remaining Z-number 6 is picked up. As such, when component division, tasks and task order are acquired as described above, it is ensured that all components are picked up by three iterations of pickup which is the maximum number of iterations of pickup.

FIG. 61 is a diagram describing details of the task generation processing (S3132 in FIG. 59) for the rear head. The task generating method is similar to that for the front head shown in FIG. 60. As shown in FIG. 61(a), the types of components assigned to the rear head are two kinds of C and E, while the numbers of components (the numbers of mounting points) are 20 and 15, respectively. As shown in FIG. 61(b), when the total number 35 of these components is divided by the number 4 of pickup nozzles of the rear head, 8 with a remainder of 3 is obtained. That is, when component mounting is to be performed in a state that components are fully loaded to the four pickup nozzles of the rear head, the mounting onto the board 3020 may be performed in a state that components are fully picked up and loaded in eight tasks while three components are picked up in the remaining one task.

Here, in each of the nine tasks in total, the components may be picked up in seven iterations or less, which is the maximum number of iterations of pickup of the rear head. However, since the rear head has merely four pickup nozzles, even when components are picked up one by one, the components can necessarily be picked up within four iterations. Thus, processing referred to as "component division" shown in FIG. 60(c) need not be performed.

As a result, a sequence for the component supply unit 3115a is determined as shown in FIG. 61(c). Further, tasks and task order are obtained as shown in FIG. 61(d). That is, as the component pickup order for the first seven tasks (task 1 to task 7), when components (components C and E) having Z-numbers of 1 and 2 are picked up in the first and the second iterations of pickup, components are fully picked up and loaded to the pickup nozzles of the rear head by two iterations of pickup.

Further, as the component pickup order for the next one task (task 8), when components (components C and E) having Z-numbers of 1 and 2 are picked up in the first iteration of pickup and when a component (component C) having a Z-number of 1 is picked up in the second and the third iterations of pickup, components are fully picked up and loaded to the pickup nozzles of the rear head by three iterations of pickup.

Further, as the component pickup order of the last one task (task 9), when a component (component C) having a Z-number of 1 is picked up in the first through the third iterations of pickup, the remaining three components are fully picked up and loaded to the pickup nozzles of the rear head by three iterations of pickup.

As such, when tasks and task order are acquired as described above, it is ensured that all components are picked up by seven iterations or less of pickup, which is the maximum number of iterations of pickup.

The numbers of iterations of pickup of the individual tasks for the front head and the rear head obtained as described above are shown in FIG. 62 in the form of a time series. As such, in all tasks, the components can be picked up by iterations of pickup of a number smaller than or equal to the maximum number of iterations of pickup. That is, at the time that the "mounting" operation by one of the line gang pickup heads 3112 has been completed, the "mounting" operation to be performed by the other line gang pickup head 3112 can be started without delay. This improves production efficiency.

As described above, according to the processing performed by the third component mounting order determining unit 308c, the number of mounting points for the components are allocated based on the ratio between the numbers of pickup nozzles of the line gang pickup heads. Thus, the number of tasks can be almost equal for the front head and for the rear head. This avoids the situation that one mounting head solely mounts components while the other mounting head stops. That is, the two mounting heads can mount components onto one board in a cooperated manner. This improves production efficiency.

Further, according to this configuration, tasks are obtained so that during the time that one mounting head mounts components, the other mounting head completes pickup and recognition operation for components. Thus, at the time that the one line gang pickup head 3112 completes the "mounting" operation, the other line gang pickup head 3112 can start "mounting" operation without delay. This improves production efficiency.

The component mounting order determination method performed by the third component mounting order determining unit 308c has been described above. However, the present invention is not limited to this method or the like.

For example, in the above-mentioned example, the components to be picked up by the pickup nozzles provided in each line gang pickup head 3112 have been assumed to be small components having a small size. Thus, tasks have been generated on condition that the number of components to be picked up by the line gang pickup head 3112 is equal to the number of pickup nozzles. However, in practice, components of various sizes are included. Thus, when large components are included, in some cases, interference between the components can cause a situation that components of a number equal to the number of pickup nozzles provided in the line gang pickup head 3112 cannot be picked up. In such cases, the above-mentioned processing may be performed based on the number of components that can actually be picked up by the line gang pickup head 3112, so that the tasks may be generated.

Further, in the above-mentioned example, component mounting order have been determined for the case of the line gang pickup head 3112 provided with pickup nozzles aligned in line as shown in FIG. 48. However, the shape of the mounting head is not limited to this. For example, a rotary head may be used in place of the line gang pickup head 3112.

Figure 63:
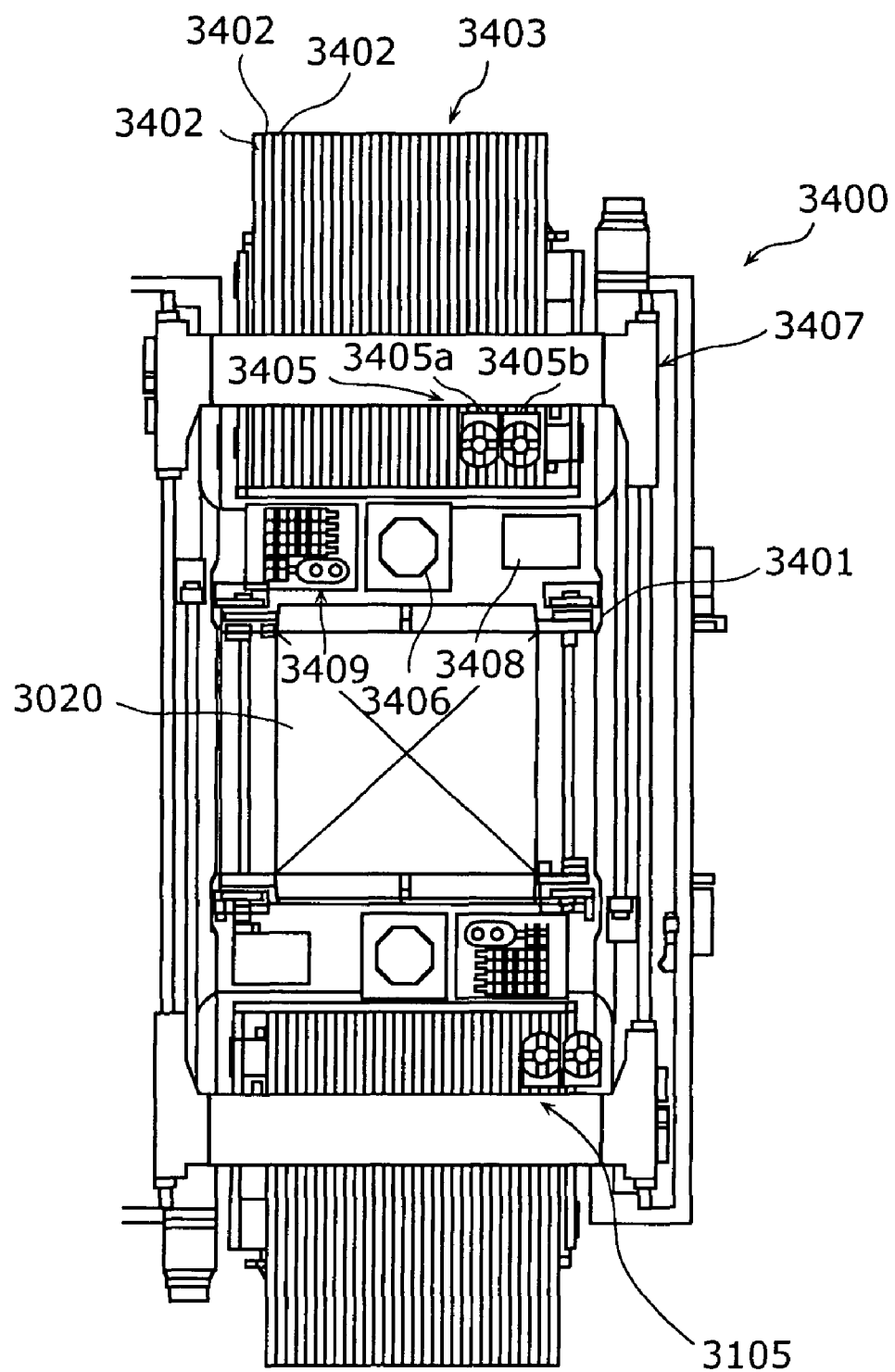
FIG. 63 is a top view of a component mounter provided with a rotary head.

FIG. 63 is a top view of a component mounter provided with a rotary head.

The component mounter provided with a rotary head includes: a base 3400; a transportation path 3401 that is arranged in the center part of the base 3400 and that transports and positions the board 3020; a component supply unit 3403 in which a plurality of tape feeders 3402 are installed in an aligned manner and which supplies plural kinds of components; a rotary head 3405 that extracts components from the component supply unit 3403 and transfers and loads them onto the board 3020; a recognizing camera 3406 that recognizes, from the below, the components picked up by the rotary head 3405; an XY robot 3407 that moves the rotary head 3405 in the XY directions; a discarding tray 3408 to which components are discarded; and a nozzle station 3409 that holds changeable pickup nozzles for the rotary head 3405.

Figure 64:
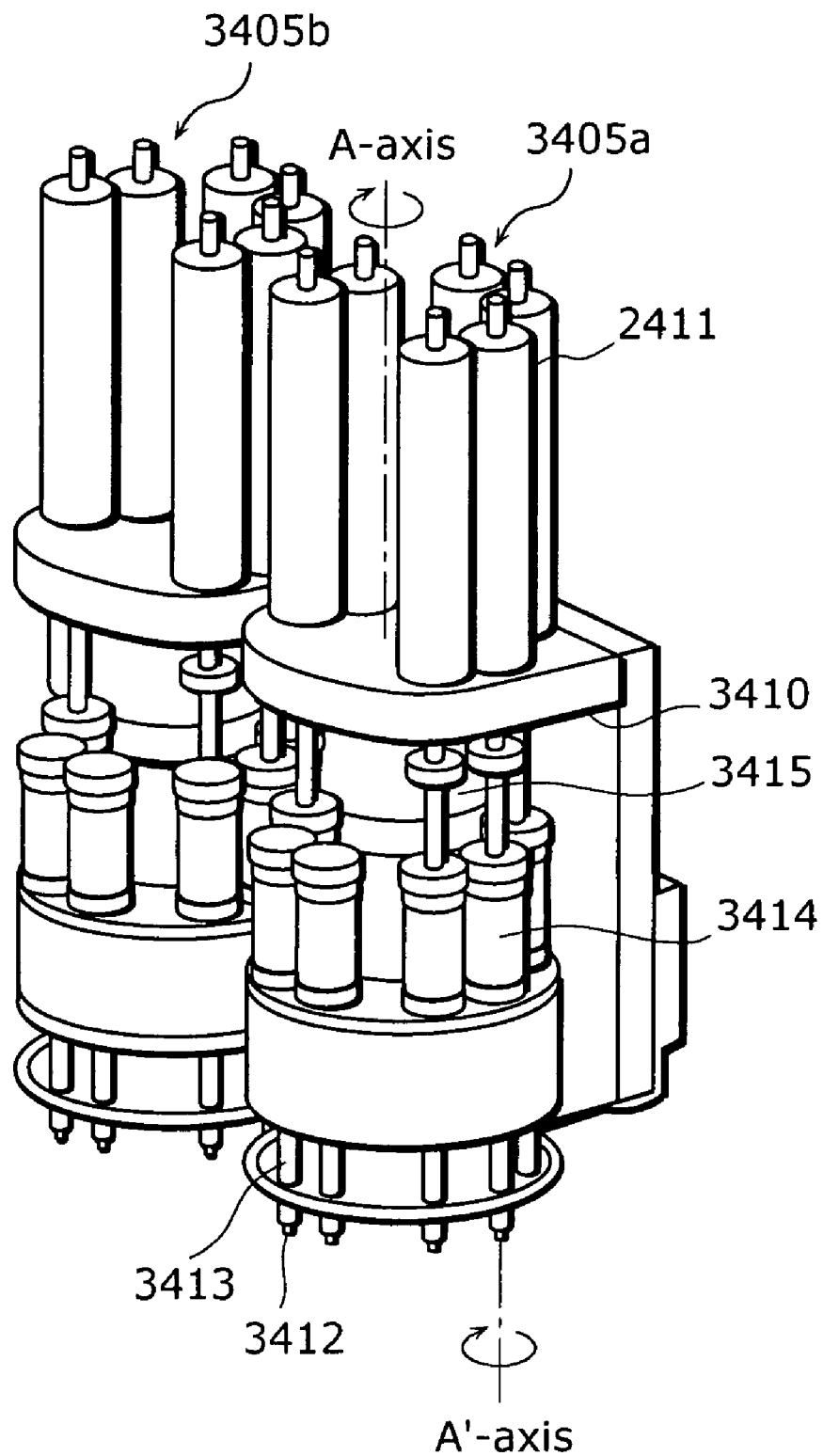
FIG. 64 is a perspective view of a rotary head.

FIG. 64 is a perspective view of a rotary head 3405.

The rotary head 3405 has a first head unit 3405a and a second head unit 3405b which are installed in parallel and have the same function. Since these head units are units having approximately the same function, the structure of the first head unit 3405a is solely described below.

The first head unit 3405a includes: a fixing base 3410; a plurality (six in FIG. 64) of nozzle raising and lowering motors 3411 arranged on the fixing base 3410; a plurality of pickup nozzles 3412 that pick up components by suction and hold them; a pickup unit 3413 that holds the pickup nozzles 3412 in an attachable and detachable manner; a plurality of cam tubes 3414; and a θ-motor 3415 that causes the pickup nozzles 3412 to rotate about an A-axis or an A'-axis.

In the first head unit 3405a having the above-mentioned structure, by virtue of revolving operation of the O-motor 3415, the plurality of pickup nozzles 3412 rotate about the A-axis in a state that their relative positions are maintained. Then, the pickup nozzle 3412 having moved to the immediate under of the nozzle raising and lowering motor 3411 moves downward by virtue of a pressing force from the nozzle raising and lowering motor 3411 located in the immediate over. Further, when the angle of the component picked up by the pickup nozzle 3412 is to be corrected, the pickup nozzle 3412 is rotated about the A'-axis by virtue of revolving operation of the θ-motor 3415.

Figure 65:
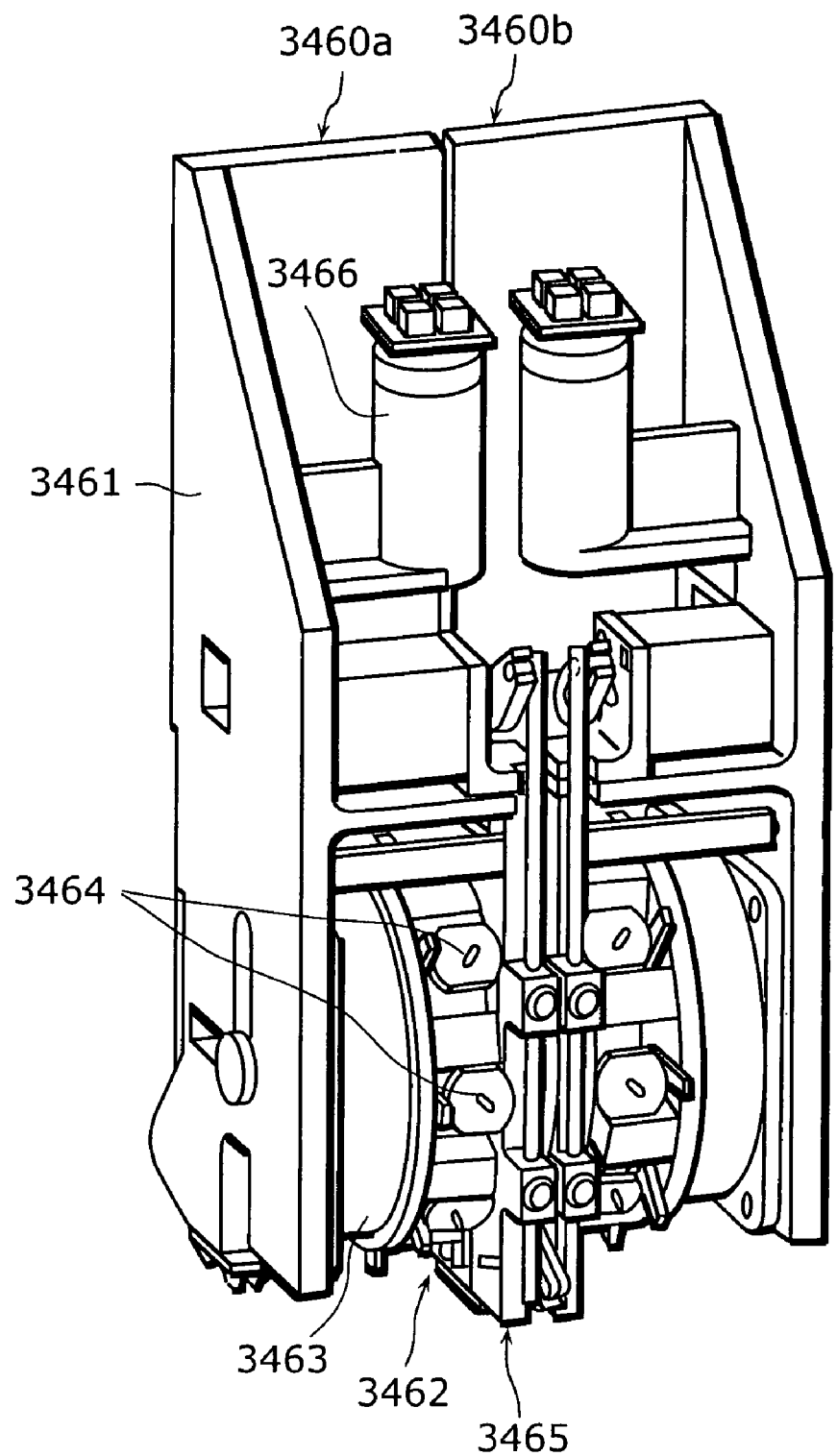
FIG. 65 is a perspective view of another rotary head.

Here, the above-mentioned description has been given for the case that the rotary head has a structure that plural sets of pickup nozzles are provided and that the pickup nozzles of each set in the same direction are rotated. However, the structure may be so that the pickup nozzles of each set in mutually different directions are rotated. That is, as shown in FIG. 65, the rotary head may has a first head unit 3460a and a second head unit 3460b which are installed in parallel and have the same function. Then, each of the first head unit 3460a and the second head unit 3460b may include: a unit outer frame 3461; a sub head 3462 attached to the unit outer frame 3461 in a manner that allows it to revolve; a sub head rotary motor 3463 that drives the rotation of the sub head 3462; pickup nozzles 3464 that pick up components and holding them; a depression mechanism 3465 that lowers the pickup nozzle 3464 located at the lower end position of the sub head 3462; and an image pickup unit 3466.

Here, as in the case of the rotary head shown in FIG. 65, when an image pickup unit 3466 (component recognition camera) is provided between the pickup and the mounting of the component, component recognition is completed between the pickup and the mounting of the component. Thus, in such a case, the operation of component recognition is performed after the pickup nozzle picks up the component by the time that that the component is moved to the mounting position. This provides a feature that the component the recognition time can be disregarded so that the mounting time and the pickup time can be regarded as mutually the same.

Accordingly, in the task determination processing (S3111 in FIG. 55), in place of the approach that tasks are acquired so that during the time that one mounting head mounts components, the other mounting head completes pickup and recognition operation for components, it is preferable that the number of components to be picked up in a particular time interval is made equal for the rear head and for the front head. Here, the number of pickup nozzles is assumed to be equal for the rear head and for the front head.

Figure 66:
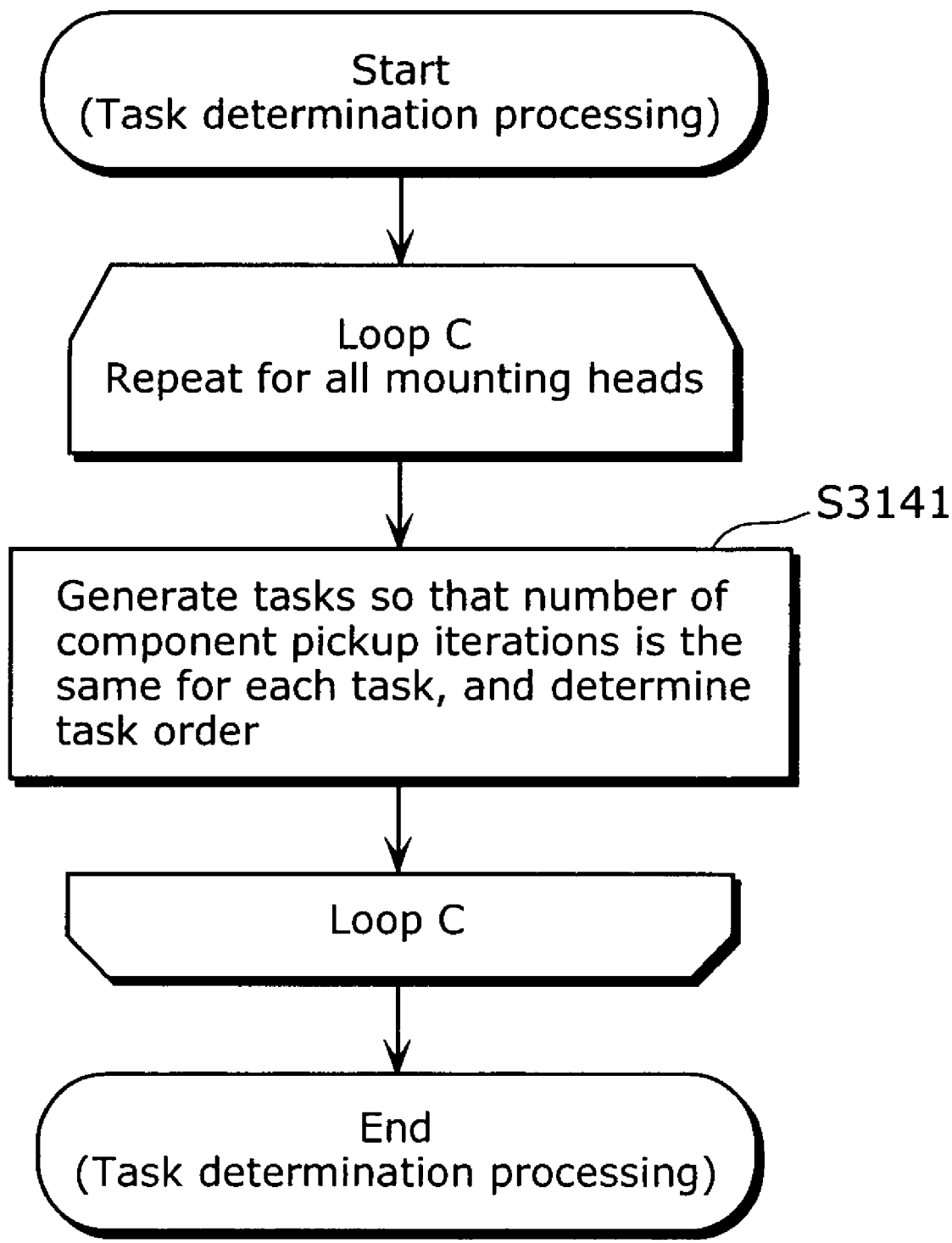
FIG. 66 is a flow chart describing details of task determination processing in a rotary head.

FIG. 66 is a flow chart describing details of task determination processing (S3111 in FIG. 55) in a rotary head.

The third component mounting order determining unit 308c determines tasks and task order so that the number of iterations of the component pickup in each task is equal to the number of iterations of the component pickup of the other head (S3141). This processing is performed for all mounting heads.

Figure 67:
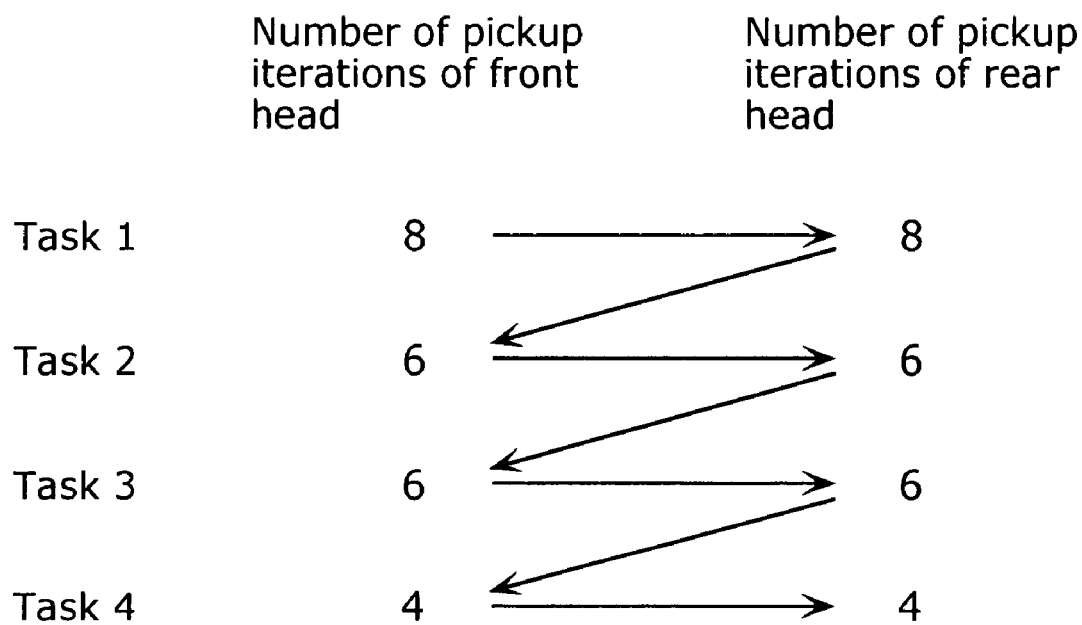
FIG. 67 is a diagram showing an example of task order obtained in accordance with task determination processing shown in FIG. 66.

FIG. 67 is a diagram showing an example of task order obtained in accordance with task determination processing shown in FIG. 66. As such, in each task, the number of iterations of pickup is equal for the front head and for the rear head. Thus, during the time that one mounting head mounts components, the other mounting head can pick up components. This improves mounting efficiency for the components.

Figure 68:
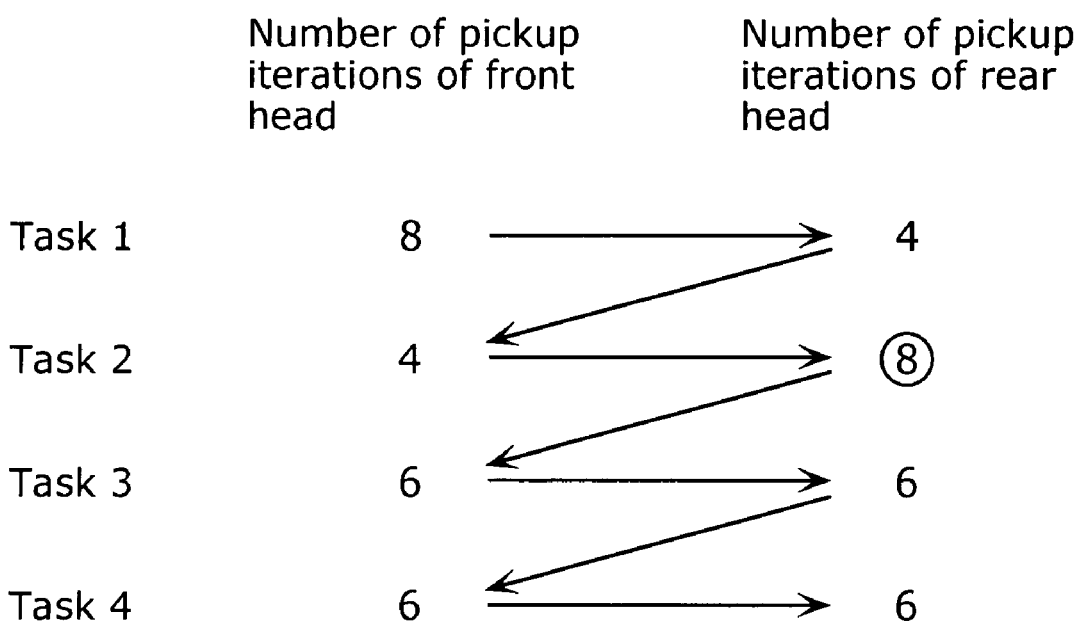
FIG. 68 is a diagram showing an example of unpreferable task order.

Here, FIG. 68 is a diagram showing an example of an undesirable task order. For example, in the task 2, the front head picks up four components, and then mounts them. However, at the time of the mounting of four components performed by the front head, the rear head need pick up eight components, and hence has a problem that the necessary time duration is longer than that of the component mounting by the front head. However, when the number of tasks is made to be the same as much as possible in each task as described above, such a problem is avoided.

This feature is obtained even in the case of the line gang pickup head 3112 provided with a component recognition camera. That is, the "recognition time in the front head" in the above-mentioned Formula (1) and the "recognition time in the rear head" in Formula (3) can be disregarded.

Here, even in the case of a rotary head, when the component recognition camera is not installed, component recognition need be performed in a state that the rotary head is moved to a position where the component recognition camera is installed in the component mounter, during the time between the pickup and the mounting of components. However, even in this case, tasks and task order are determined according to a method similar to that shown in FIG. 66 so that the number of iterations of the component pickup in each task is equal to the number of iterations of the component pickup of the other head.

Further, the above-mentioned example has been described for the case that the number of pickup nozzles is different for each of the two line gang pickup heads 3112. However, the present invention is not limited to the case that the number of pickup nozzles is different, and the number of pickup nozzles may be the same.

Further, in place of the configuration that the component mounting order determination processing is switched and executed as in the operating time reducing apparatus 300 in FIG. 2, the component mounting order determination processing performed by the third component mounting order determining unit 308c may exclusively be executed.

Figure 69:
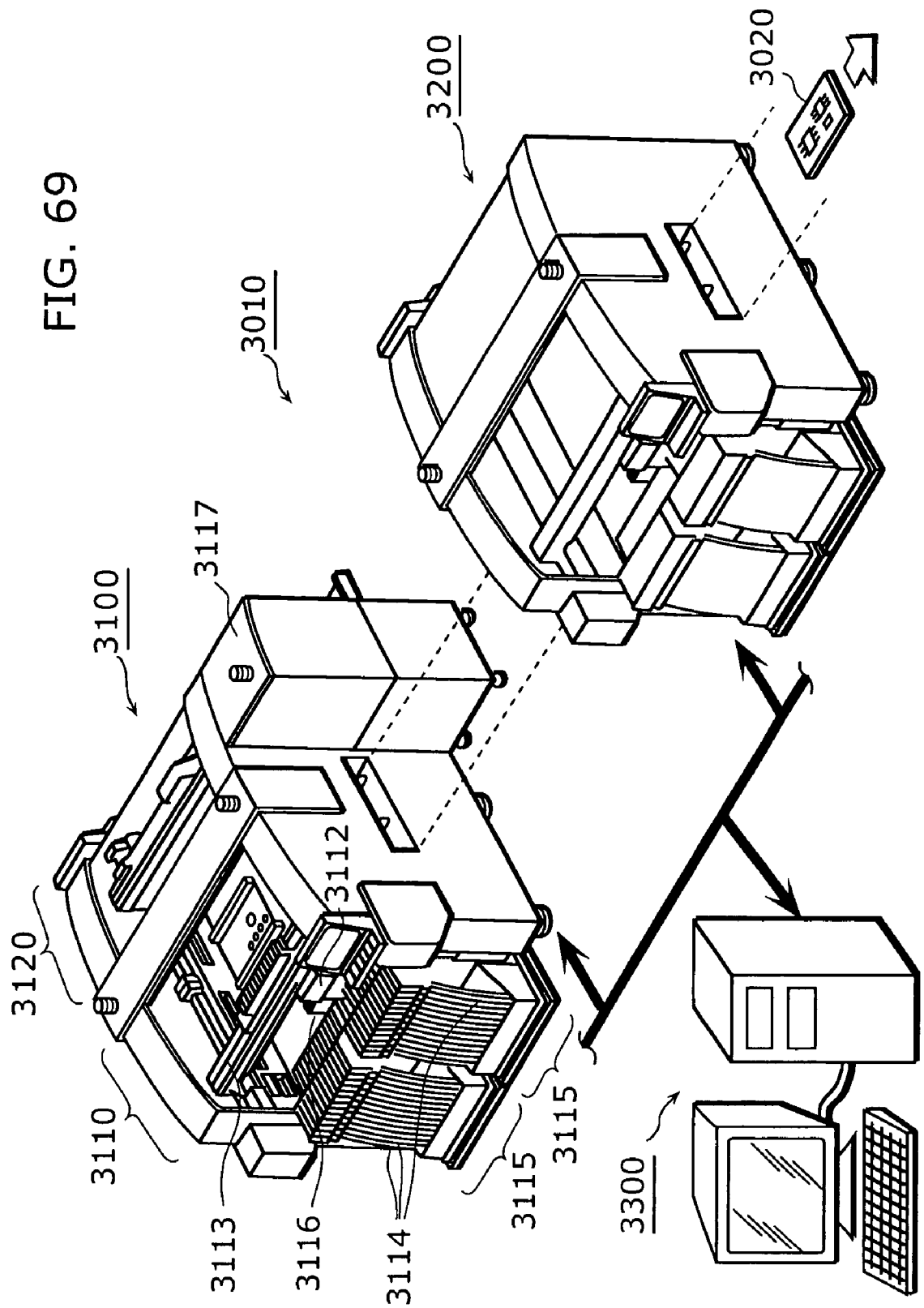
FIG. 69 is an external appearance view showing a configuration of an entire mounting line according to an embodiment of the present invention.

FIG. 69 is an external appearance view showing an overall configuration of a mounting line 3010 having this configuration.

The mounting line 3010 is a production line in which electronic components are mounted during the time that the board 3020 is transported from the upstream toward the downstream. The mounting line 3010 includes: a component mounter 3100; and a mounting order determining apparatus 3300 that, at the start of production or the like, determines mounting conditions such as the number of beams to be used and mounting order for electronic components based on various databases, and then downloads the obtained NC (Numeric Control) data to the component mounter 3100 so as to set up and control it.

Figure 70:
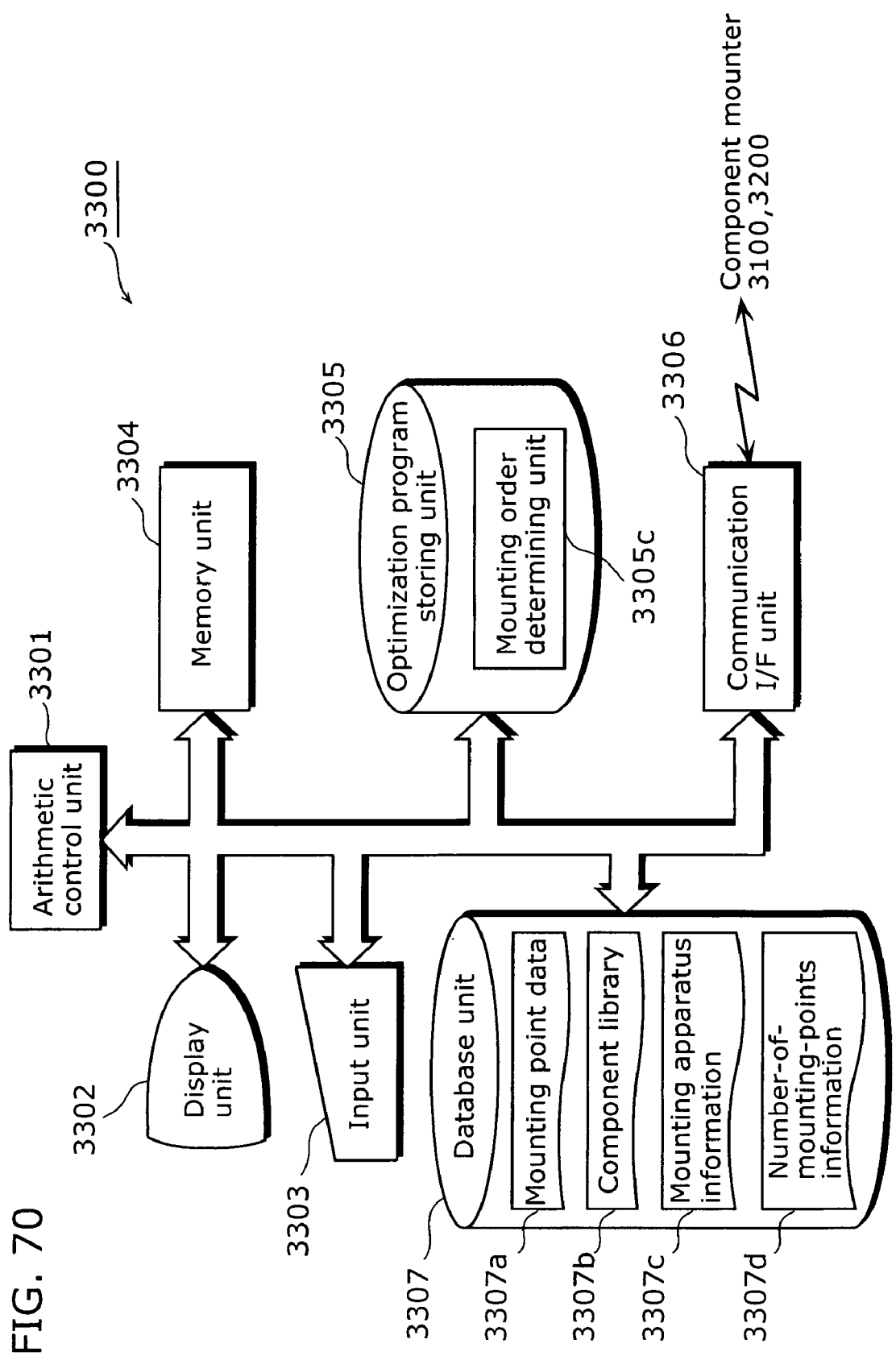
FIG. 70 is a block diagram showing an exemplary configuration of a mounting order determining apparatus according to an embodiment of the present invention.

FIG. 70 is a block diagram showing an exemplary configuration of a mounting order determining apparatus 3300 according to an embodiment of the present invention, that is, the mounting order determining apparatus 3300 shown in FIG. 69. This mounting order determining apparatus 3300 is a computer apparatus that determines the components to be mounted by each sub-equipment and the mounting order for the components in each sub-equipment for all components provided from a CAD apparatus for component mounting or the like so that the line tact in component mounting of the target board (the greatest tact among the tact values of the individual sub-equipment making up the line) is minimized under various restrictions caused by the specifications or the like of individual apparatuses making up the production line, and thereby generates optimal NC data. The mounting order determining apparatus 3300 includes an arithmetic control unit 3301, a display unit 3302, an input unit 3303, a memory unit 3304, an optimization program storing unit 3305, a communication I/F (interface) unit 3306 and a database unit 3307.

The mounting order determining apparatus 3300 is implemented by a general-purpose computer system such as a personal computer that executes an optimization program according to the present invention. In a state not connected to the component mounter 3100, the mounting order determining apparatus 3300 serves also as a stand-alone simulator (a tool for component mounting order determination). Here, mounting order determining apparatus 3300 may be installed inside the component mounter.

The arithmetic control unit 3301 is a CPU (Central Processing Unit), a numerical processor, or the like. In accordance with an instruction from the operator or the like, the arithmetic control unit 3301 loads a necessary program from the optimization program storing unit 3305 to the memory unit 3304 and executes it so as to control the individual units 3302 to 3307 in accordance with the execution result.

The display unit 3302 is a CRT (Cathode-Ray Tube), an LCD (Liquid Crystal Display) or the like, while the input unit 3303 is a keyboard, a mouse and the like. These units are used for interactive operation or the like between the mounting order determining apparatus 3300 and an operator under the control of the arithmetic control unit 3301.

The communication I/F unit 3306 is a LAN (Local Area Network) adapter or the like, and is used for communication and the like between the mounting order determining apparatus 3300 and the component mounter 3100. The memory unit 3304 is a RAM (Random Access Memory) or the like that provides a working area for the arithmetic control unit 3301.

The database unit 3307 is a hard disk or the like that stores, for example: input data (such as the mounting point data 3307a, the component library 3307b, the mounting apparatus information 3307c and the number-of-mounting-points information 3307d) used for the mounting order determination processing performed by the mounting order determining apparatus 3300; and mounting point data generated by the mounting order determination processing.

The optimization program storing unit 3305 is a hard disk that stores various optimization programs that implement the function of this mounting order determining apparatus 3300. The optimization program is a program that determines a mounting order for the components, and is constructed from the mounting order determining unit 3305c and the like in terms of the function (in the form of a processing unit that expresses the function when executed by the arithmetic control unit 3301).

Based on various kinds of data stored in the database unit 3307, the mounting order determining unit 3305c acquires mounting order for the components so that the mounting time for the components onto the board 3020 is minimized. That is, the mounting order determining unit 3305c executes processing similar to that of the third component mounting order determining unit 308c.

[Fourth Component Mounting Order Determining Unit 308d]

In the conventional art, methods of determining component mounting order for mounting components in a short mounting time have been proposed (see, for example, Japanese Laid-Open Patent Publication No. 2003-37396).

Further, in recent years, with progress of size reduction in mounting boards and the like, component mounters have been prepared in which two small boards are carried simultaneously into a component mounter, and then after components are mounted onto one board, components are mounted onto the other component.

Figure 71:
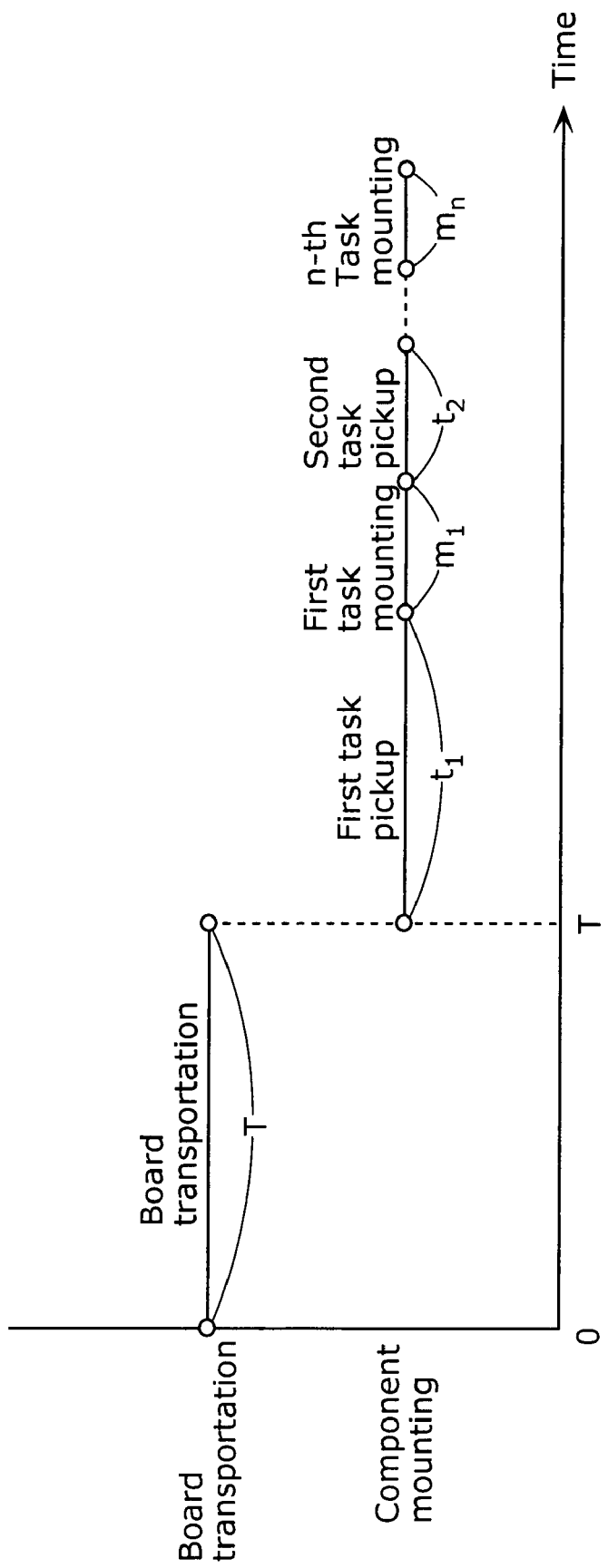
FIG. 71 is a diagram schematically showing conventional time course of board transportation and component mounting.

However, in the conventional component mounter, after the board had been carried into the component mounter and stopped, component mounting has been started. FIG. 71 is a diagram schematically showing conventional time course of board transportation and component mounting. In the conventional component mounter, after the time (referred to as a "board carrying-in time", hereinafter) T necessary for board carrying-in has been elapsed, a mounting head sequentially performs pickup and mounting operation of the components in each task. Thus, component mounting cannot be started until carrying in of the board is completed. This has caused a problem of reduction in the production efficiency. Here, the task indicates a component group to be mounted in one iteration of a repeated series of operation composed of pickup and mounting of the components performed by the mounting head, or alternatively the one iteration of series operation.

Further, in the invention described in Japanese Laid-Open Patent Publication No. 2003-37396, component mounting order is determined with the assumption that only one board is carried in. Thus, if the invention described in Japanese Laid-Open Patent Publication No. 2003-37396 were applied to a component mounter of a type that two boards are carried in simultaneously, an optional sequence of components in a component supply unit could not necessarily be obtained. This would cause the problem of an increase in the tact time in component mounting onto the board.

Figure 72:
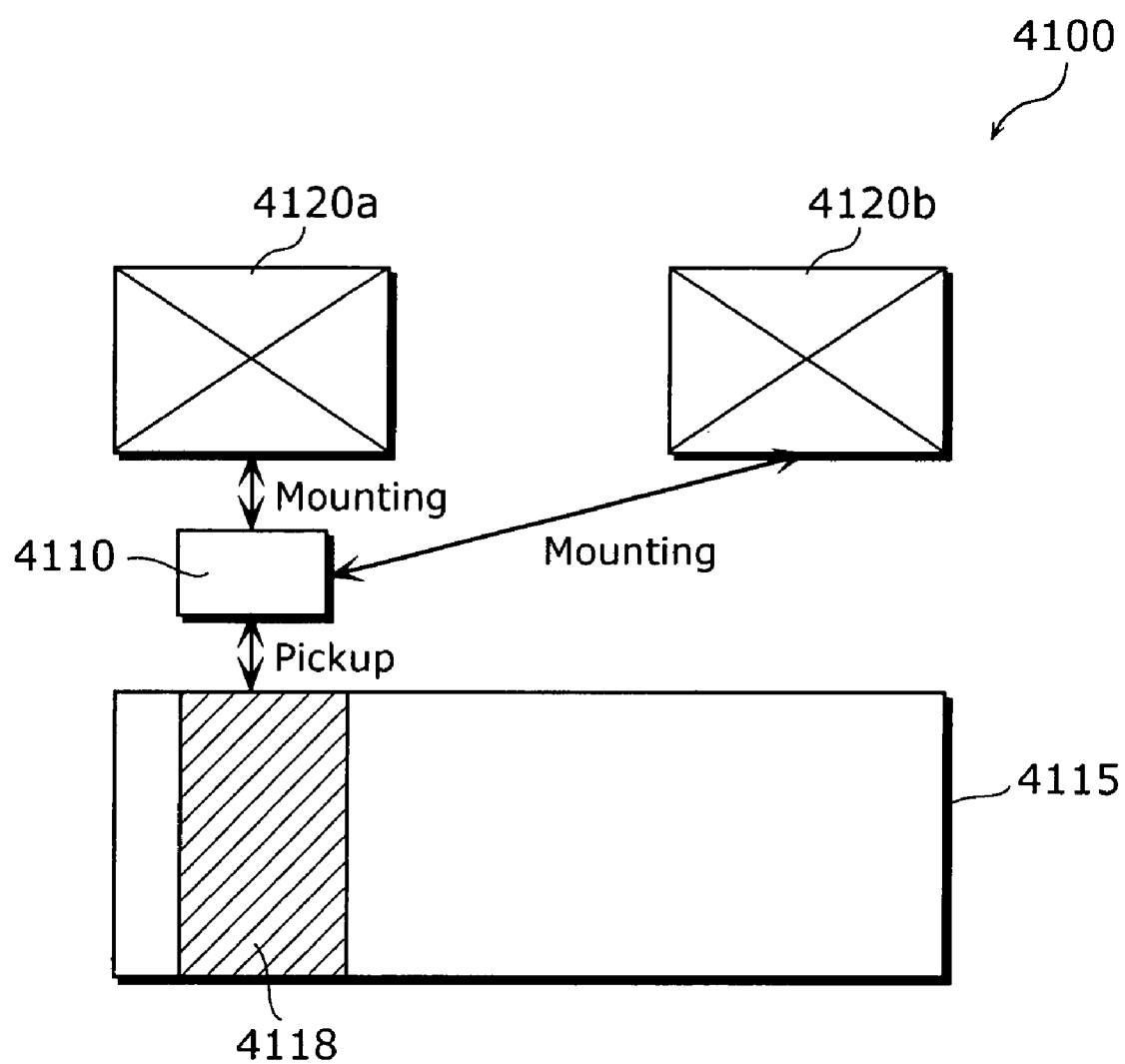
FIG. 72 is a diagram describing a problem in a conventional determination method for component mounting order.

FIG. 72 is a diagram describing the above-mentioned problems. FIG. 72 schematically shows an internal upper surface of a component mounter. In the component mounter 4100, two boards 4120a and 4120b are carried in, while one mounting head 4110 picks up components from the component supply unit 4115 and mounts the components onto the boards 4120a and 4120b. Here, components of the same types are mounted onto the boards 4120a and 4120b. Thus, for example, the components to be mounted onto the boards 4120a and 4120b are arranged on a part (referred to as the "component supply position", hereinafter) 4118 of the component supply unit 4115. However, the mounting head 4110 operates so that after all components onto the board 4120a have been mounted, all components onto the board 4120b are mounted.

Accordingly, in the repetition of a series of operation composed of pickup and mounting of the components by the mounting head 4110 in the component mounting onto the board 4120a, when the component supply position 4118 is determined so that the movement distance of the mounting head 4110 is reduced, the movement distance of the mounting head 4110 at the time of component mounting onto the board 4120a becomes small. Thus, the tact time at the time of component mounting onto the board 4120a becomes small. However, since the distance between the board 4120b and the component supply position 4118 is large, the movement distance at the time of mounting the components onto the board 4120b becomes large. Thus, the tact time at the time of component mounting onto the board 4120b becomes large. Accordingly, the tact time of component mounting onto the two boards 4120a and 4120b becomes large in total. This causes a problem of reduction in the production efficiency.

Accordingly, an object of the fourth component mounting order determining unit 308d is to provide a component mounting order determination method in which production efficiency is improved.

The component mounter controlled by the fourth component mounting order determining unit 308d is the component mounter 4100 shown in FIG. 1.

In FIG. 1, a part of the component mounter 4100 is cut out so that its inside is shown. The component mounter 4100 is an apparatus that can be incorporated into a mounting line and that mounts electronic components onto a board received from the upstream and then transfers to the downstream a circuit board which is the mounting board onto which the electronic components have been mounted. The component mounter 4100 includes: a mounting head 4110 that picks up and transports electronic components and then mounts the electronic components onto the board; an XY robot 4113 that moves the mounting head 4110 in the horizontal plane directions; and a component supply unit 4115 that supplies the components to the mounting head 4110. Here, in the figure, the component supply unit 4115 is shown in a state of being covered.

Specifically, the component mounter 4100 is a mounter that can mount onto a board various kinds of electronic components ranging from micro components to connectors, and is a mounter that can mount large-size electronic components of 10 mm square or larger, irregularly shaped components such as switches and connectors, and IC components such as a QFP (Quad Flat Package) and a BGA (Ball Grid Array).

Figure 73:
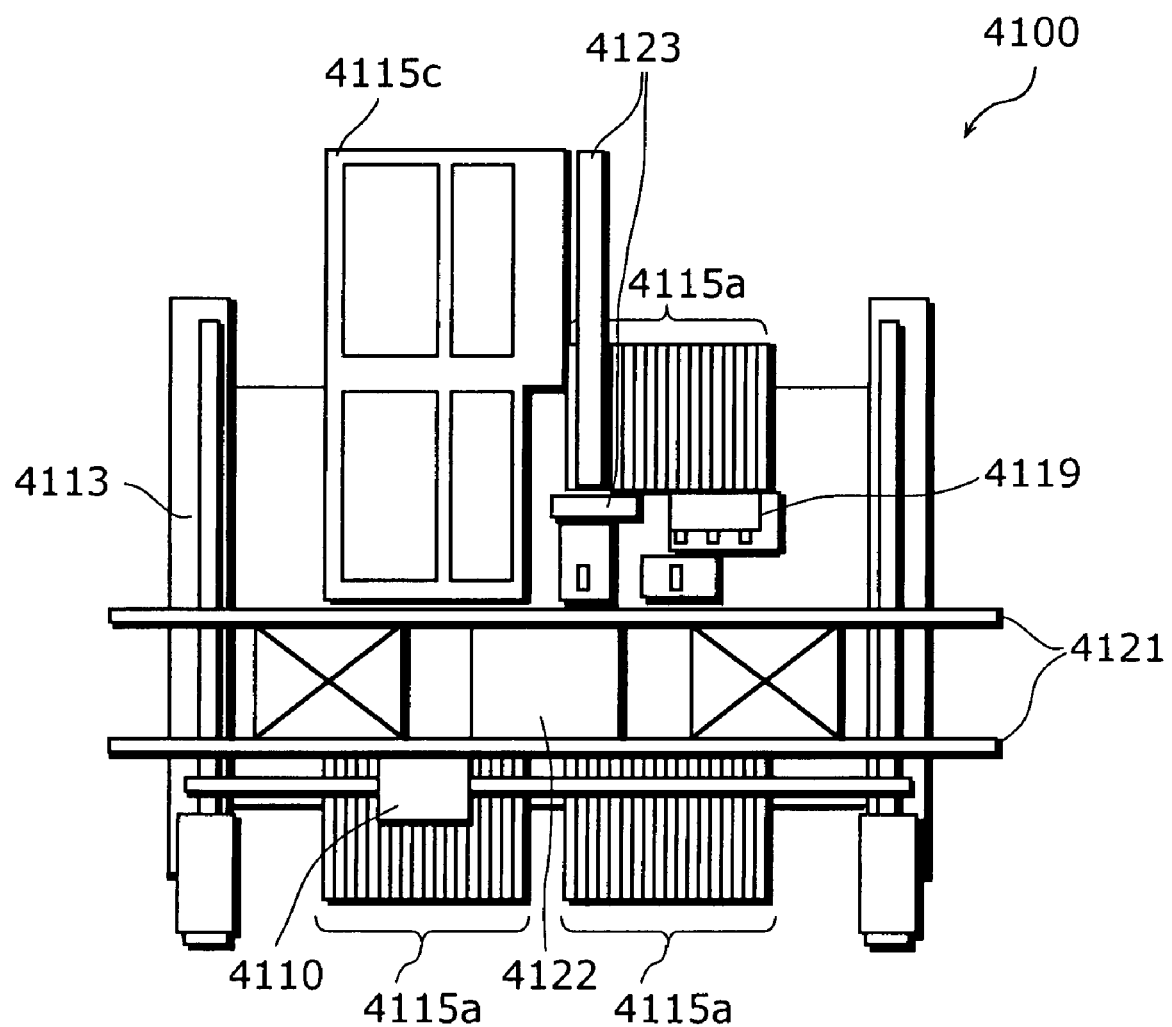
FIG. 73 is a plan view showing a major configuration of inside of a component mounter.

FIG. 73 is a plan view showing a major configuration of inside of a component mounter 4100 according to the present invention.

The component mounter 4100 further includes: a nozzle station 4119 on which changeable nozzles are placed that are attached to the mounting head 4110 in an exchangeable manner so that components of various sizes may be handled; rails 4121 that make up a railway for transporting two boards 4120a and 4120b; a mounting table (not shown) onto which the transported boards 4120a and 4120b are placed and electronic components are mounted thereon; and a component collecting apparatus 4123 that collects a component when the electronic component having been picked up and held has a fault.

Further, the component supply units 4115 are provided in the front and rear parts of the component mounter 4100, and include: component supply units 4115a and 4115b that supply electronic components held in the form of a tape, and a component supply unit 4115c that supplies electronic components held on a plate in which the components are partitioned depending on the size.

Figure 74:
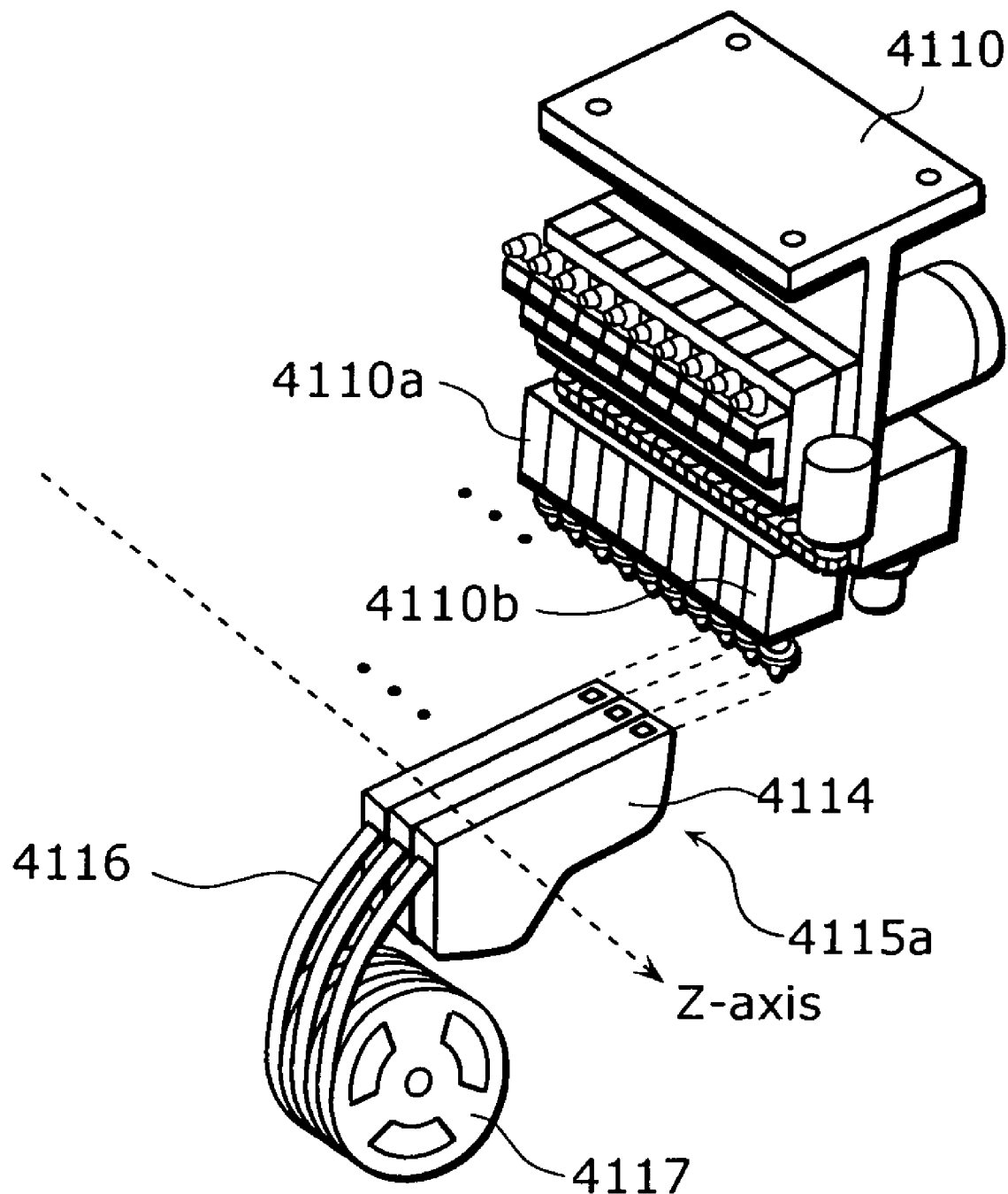
FIG. 74 is a schematic diagram showing positional relation between a mounting head and a component supply unit.

FIG. 74 is a schematic diagram showing the positional relation between the mounting head 4110 and the component supply unit 4115a.

The mounting head 4110 is provided with a plurality of pickup nozzles 4110a to 4110h. The mounting head 4110 moves to the above of the component supply unit 4115a. Then, after each pickup nozzle is lowered and picks up an electronic component, the entire mounting head 4110 moves so as to transport the electronic components to the mounting position above the board 4120a or 4120b. Then, the pickup nozzles of the mounting head 4110 are lowered so as to mount the electronic components onto the board 4120a or 4120b.

On the other hand, the component supply unit 4115a shown in the figure includes: a component tape 4116 that holds a plurality of electronic components of the same component type arranged on a carrier tape; a supply reel 4117 that holds the component tape 4116 in a state wound around; and a tape feeder 4114 that feeds the component tape 4116 from the supply reel 4117 when necessary and that extracts the electronic components from the component tape 4116. A plurality of these members is arranged in the Z-axis direction.

The relation between the mounting head 4110 and the component supply unit 4115b is similar to the relation between the mounting head 4110 and the component supply unit 4115a described above. Thus, detailed description is not repeated here.

Figures 75, 76:
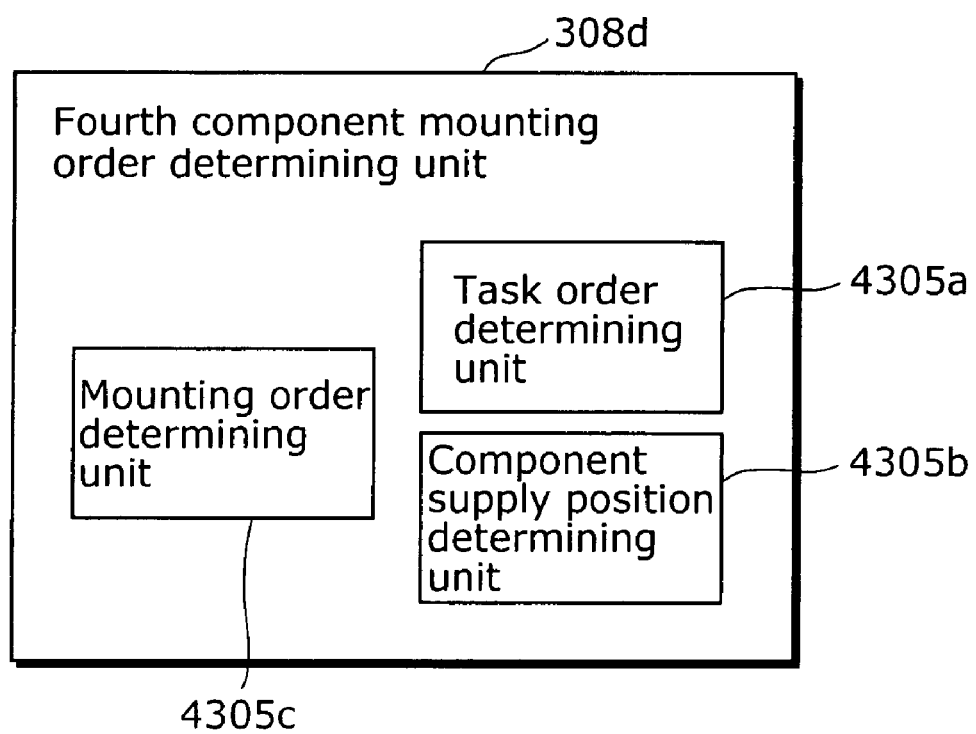
FIG. 75 is a diagram showing an example of task time information.
FIG. 76 is a block diagram showing a configuration of a fourth component mounting order determining unit 308d.

FIG. 75 is a diagram showing an example of task time information 4307d.

The task time information 4307d is information that indicates the pickup time and the mounting time for the components for each task and that contains a task number i, a pickup time ti and a mounting time mi. The task number i is a unique number imparted to each task for identifying the task. The pickup time ti indicates the time necessary for picking up the components included in the task of task number i. The mounting time mi indicates the time necessary for mounting onto the board the components included in the task of task number i.

FIG. 76 is a block diagram showing a configuration of a fourth component mounting order determining unit 308d.

The fourth component mounting order determining unit 308d includes a task order determining unit 4305a, a component supply position determining unit 4305b and a mounting order determining unit 4305c.

Figure 77:
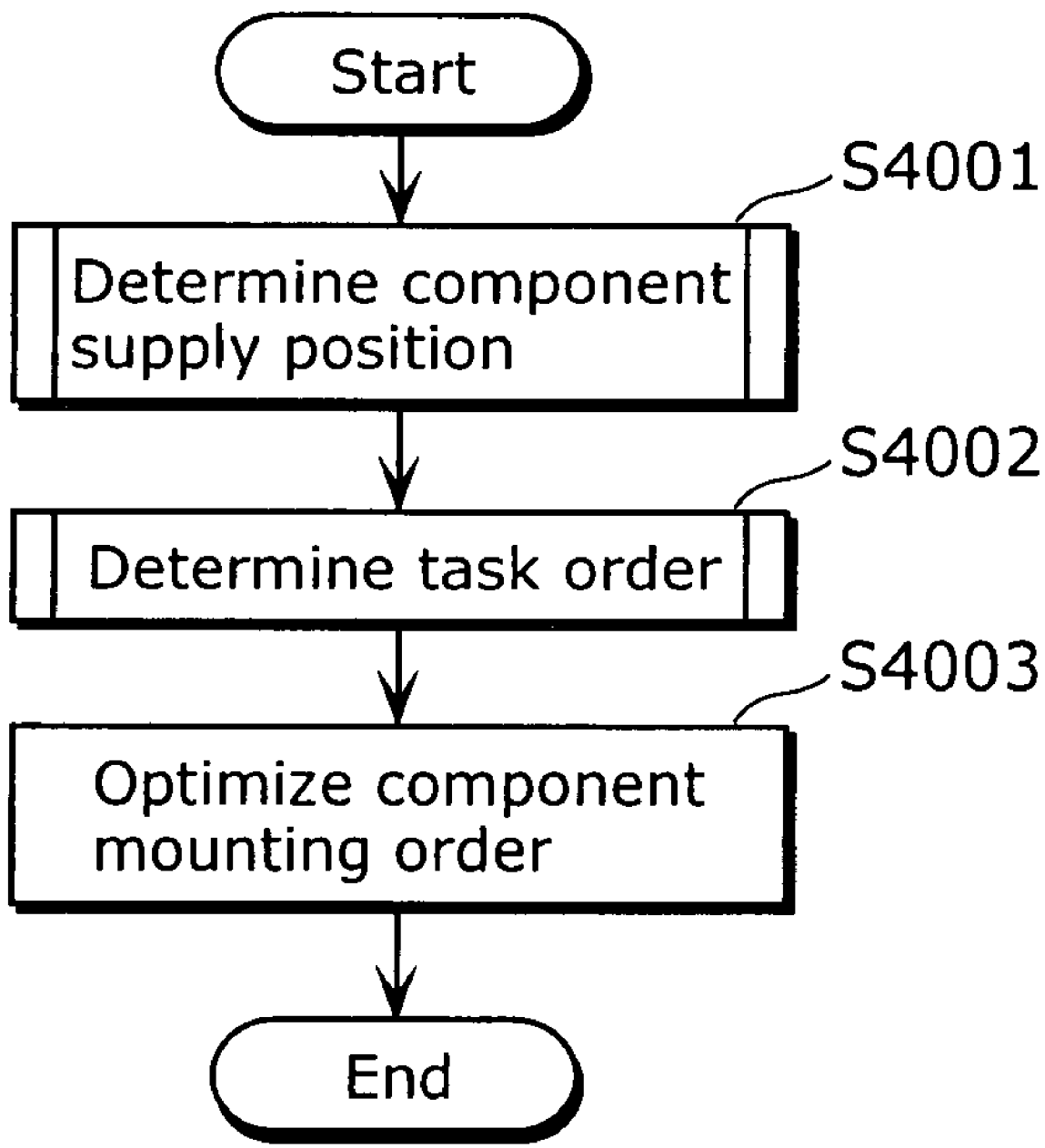
FIG. 77 is a flow chart of processing of determining component mounting order performed by a component mounting order determining apparatus.

FIG. 77 is a flow chart of processing of determining component mounting order performed by the fourth component mounting order determining unit 308d.

The component supply position determining unit 4305b determines the component supply position in the component supply unit 4115 for the components to be mounted onto the board 4120a and the board 4120b (S4001). Details of the component supply position determination processing (S4001) are described later.

Then, the task order determining unit 4305a determines the task order at the time of mounting the components onto the boards 4120a and 4120b (S4002). Details of the task order determination processing (S4002) are also described later.

Finally, based on the task order and the component supply position having been obtained, the mounting order determining unit 4305c optimizes the mounting order for the components so that the tact time is minimized, and determines the mounting order (S4003). As for the component mounting order optimization processing (S4003), various techniques have been proposed already. Further, this processing is not an essential part of the present application. Thus, description is not repeated here.

Figure 78:
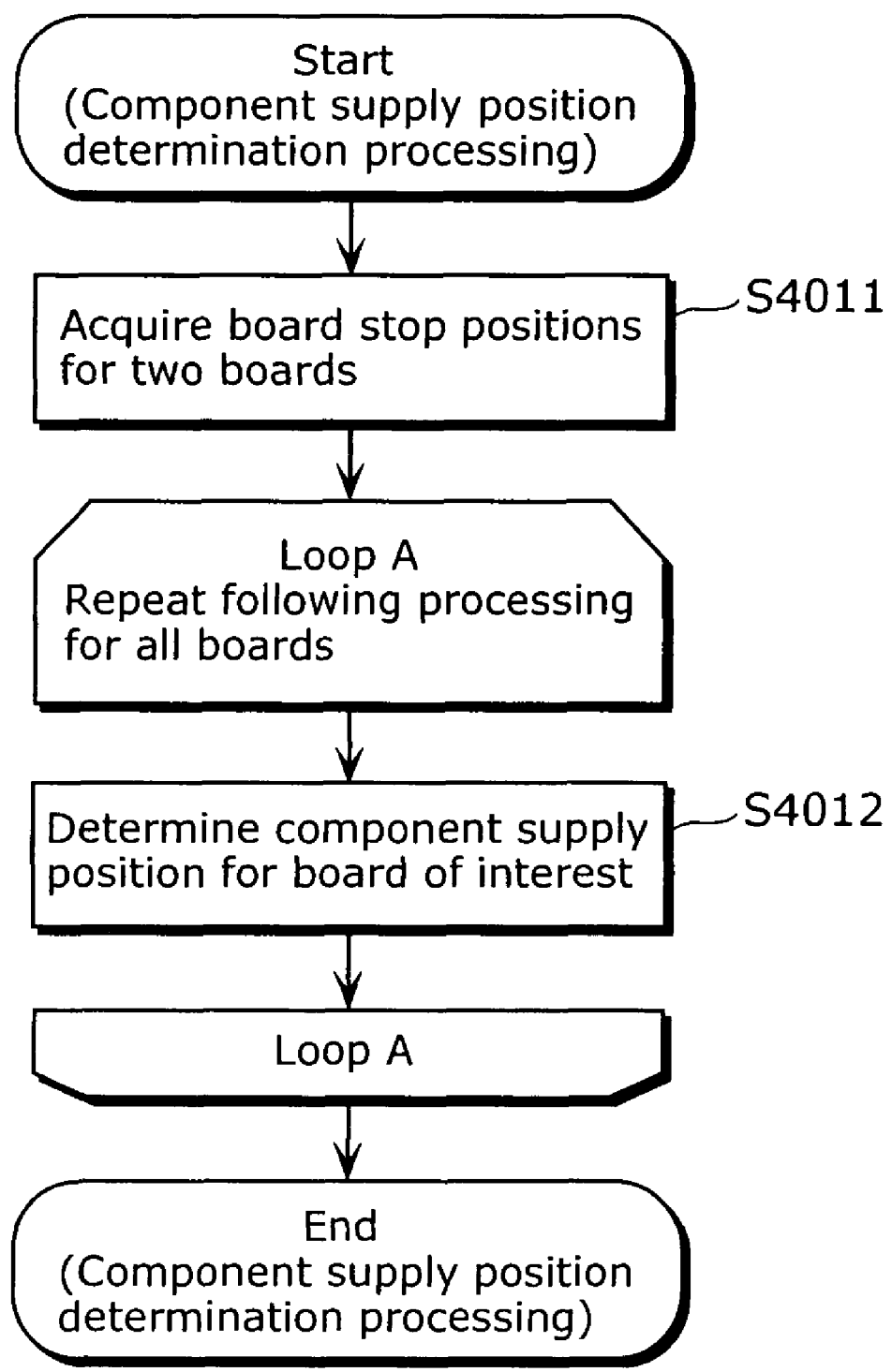
FIG. 78 is a detailed flow chart of component supply position determination processing performed by a component supply position determining unit.

FIG. 78 is a detailed flow chart of the component supply position determination processing (S4001 in FIG. 77) performed by the component supply position determining unit 4305b.

The component supply position determining unit 4305b acquires the stop positions of the two boards 4120a and 4120b in the component mounter 4100 (S4011).

Then, for a board of interest among the boards 4120a and 4120b, the component supply position determining unit 4305b determines the component supply position in the component supply unit 4115 for the components to be mounted onto the board (S4012). As for the determination method for the component supply position, for example, it is determined so that the movement distance necessary for the pickup of the components is minimized when the components are mounted onto the board of interest. The component supply position determining unit 4305b determines the component supply position for all boards 4120a and 4120b (loop A).

Figure 79:
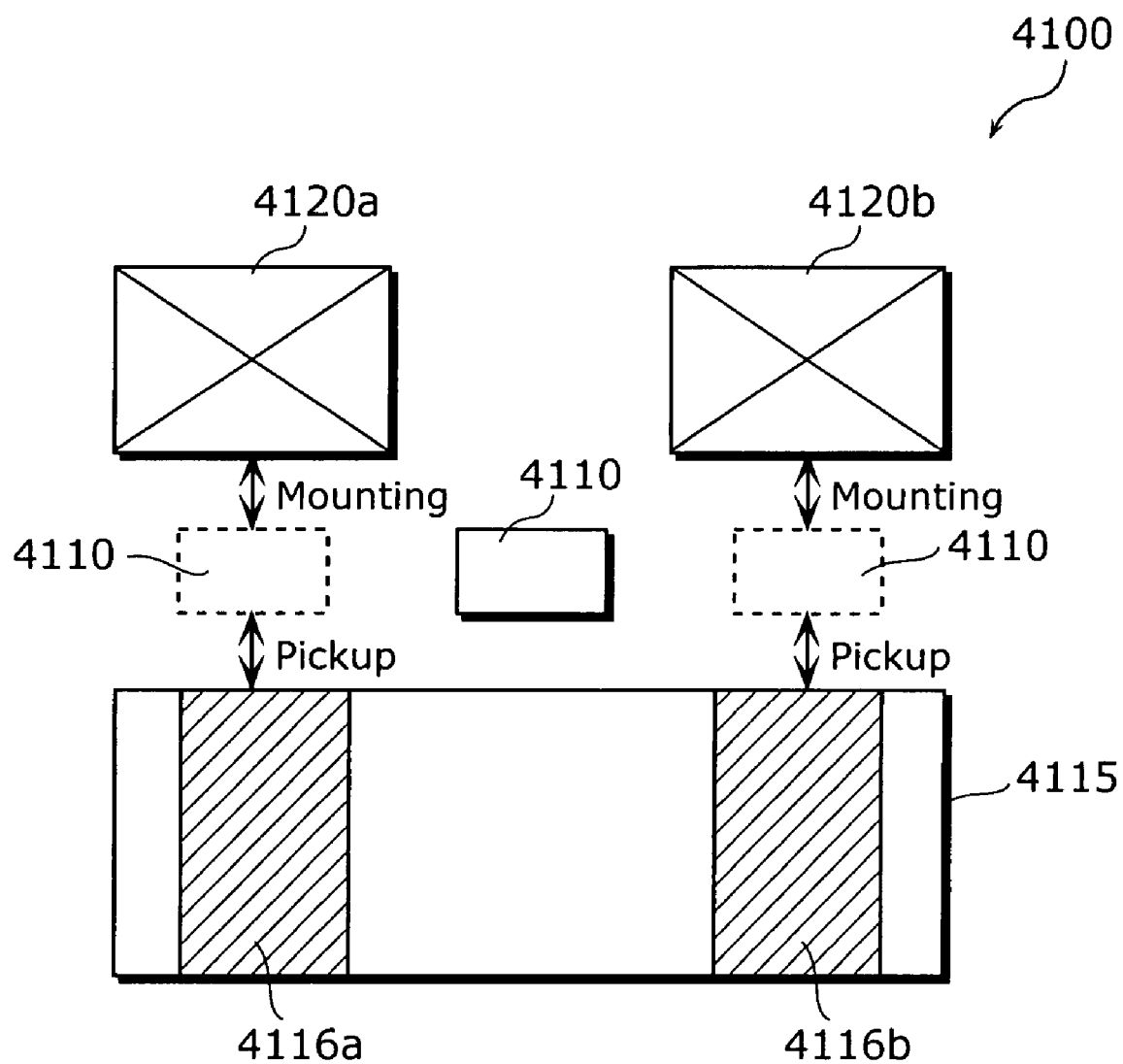
FIG. 79 is a diagram schematically showing component supply positions determined in accordance with a flow chart shown in FIG. 78.

FIG. 79 is a diagram schematically showing component supply positions determined in accordance with a flow chart shown in FIG. 78. FIG. 79 schematically shows an internal upper surface of a component mounter 4100.

As shown in FIG. 79, components are arranged at the component supply position 4116a and the component supply position 4116b of the component supply unit 4115 that correspond to the board 4120a and the board 4120b, respectively. That is, two sets of components of the same types are prepared and arranged at the component supply position 4116a and the component supply position 4116b.

Figure 80:
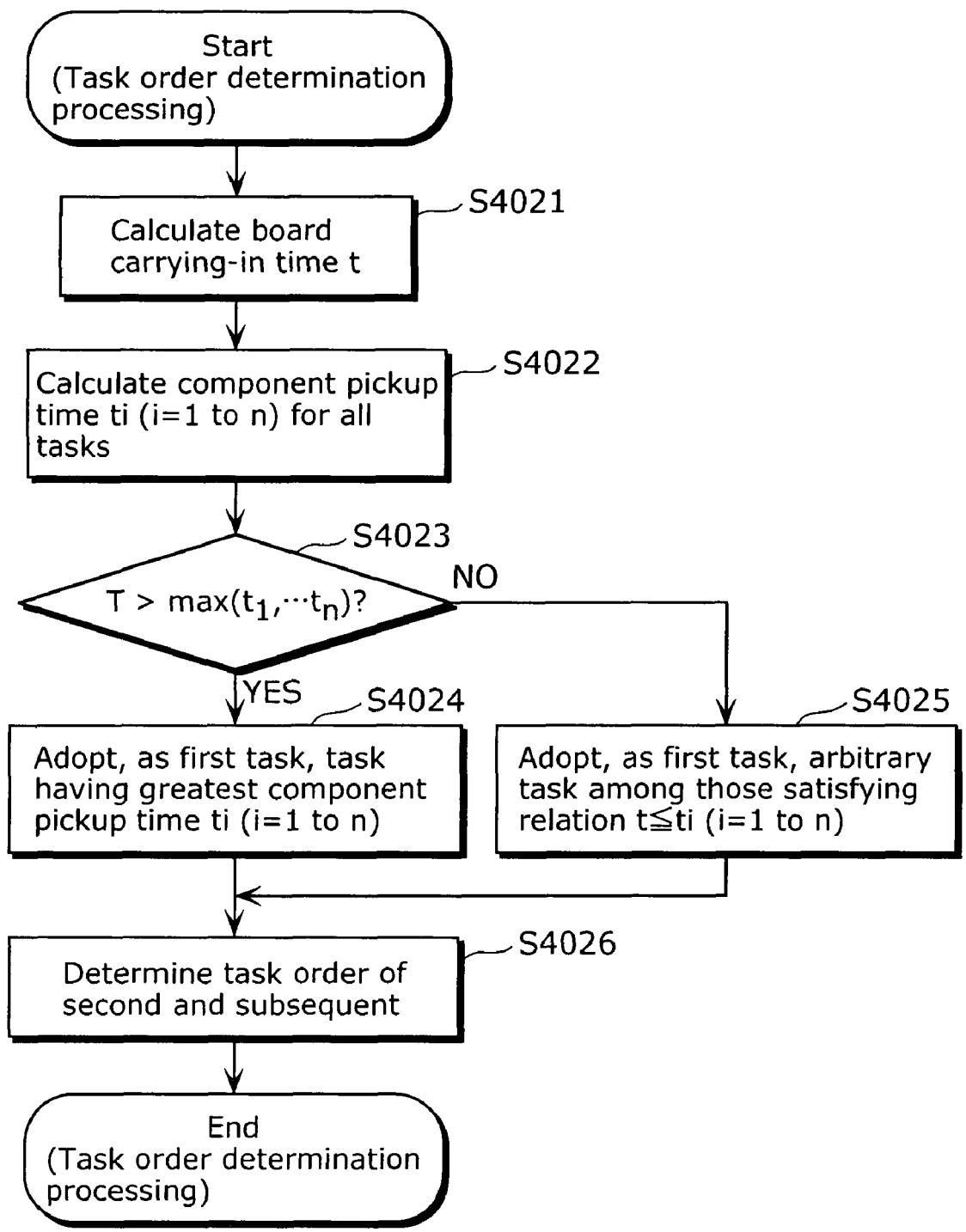
FIG. 80 is a detailed flow chart of task order determination processing (S4002 in FIG. 77) executed by a task order determining unit.

FIG. 80 is a detailed flow chart of task order determination processing (S4002 in FIG. 77) executed by a task order determining unit 4305a.

The task order determining unit 4305a calculates the time duration (that is, the board carrying-in time T) necessary from the completion of component mounting onto boards in the component mounter 4100 until two boards 4120a and 4120b onto which mounting are to be performed next are carried into the component mounter 4100 and stop (S4021). Here, this calculation processing (S4021) performed by the task order determining unit 4305a corresponds to the board carrying-in time calculating unit in the claim.

Then, for all of the n tasks, the task order determining unit 4305a calculates the pickup time ti (i=1 to n) of the components (S4022). The pickup time ti of the components is obtained by performing a simulation based on the sequence of the components arranged at the component supply position 4116a and the component supply position 4116b. The obtained pickup time ti of the components is stored into the task time information 4307d.

The task order determining unit 4305a compares the maximum of the component pickup time values ti of all tasks with the board carrying-in time T (S4023). When the board carrying-in time T is greater than the maximum of the component pickup time values ti (YES in S4023), a task having the greatest component pickup time ti is adopted as the first task, and then the component pickup of the first task is started within the board carrying-in time T (S4024).

When the board carrying-in time T is smaller than or equal to the maximum of the component pickup time values ti (NO in S4023), the task order determining unit 4305a adopts as the first task an arbitrary task among the tasks having a component pickup time ti greater than or equal to the board carrying-in time T. Then, the component pickup of the first task is started within the board carrying-in time T (S4025).

After the first task has been determined (S4024, S4025), the task order determining unit 4305a determines task order of second and subsequent (S4026).

Figure 81:
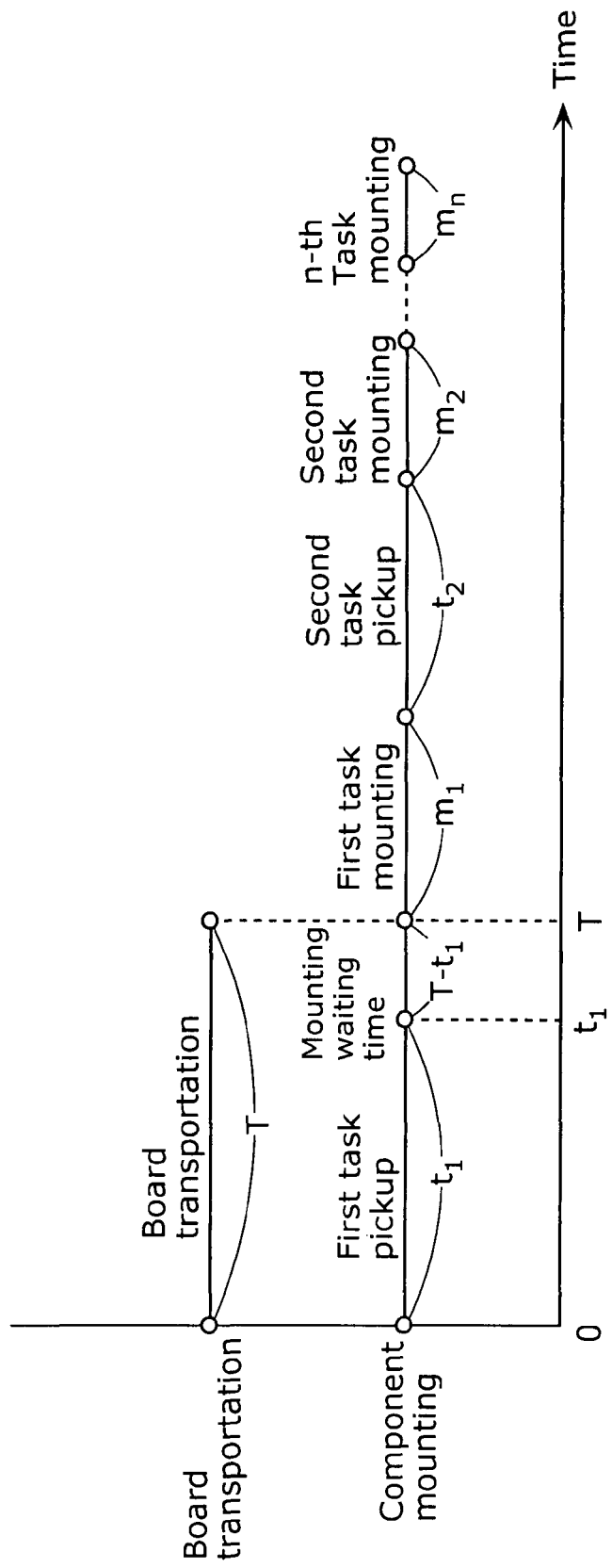
FIG. 81 is a diagram schematically showing time course of board transportation and component mounting in accordance with task order determined in the case where a board carrying-in time T is greater than the maximum of component pickup time values ti (YES in S4023 in FIG. 5).

FIG. 81 is a diagram schematically showing time course of board transportation and component mounting in accordance with task order determined in the case where the board carrying-in time T is greater than the maximum of component pickup time values ti (YES in S4023 in FIG. 80).

As shown in the figure, component pickup of the first task is started at the same time as carrying in of the boards. Thus, at the time point that the board carrying-in time T has been elapsed, component pickup of the first task is completed. Accordingly, mounting of the first task can be started at the same time as the completion of board carrying-in. Further, in this example, although no task has a component pickup time ti exceeding the board transportation time T, a task having the greatest component pickup time is selected as the first task. Thus, the mounting waiting time (T−t1) after the completion of the component pickup in the first task until the start of component mounting can be minimized. Accordingly, component mounting can be started at the same time as the board carrying-in, and hence the tact time in component mounting onto the boards can be minimized. This improves production efficiency for the board.

Figure 82:
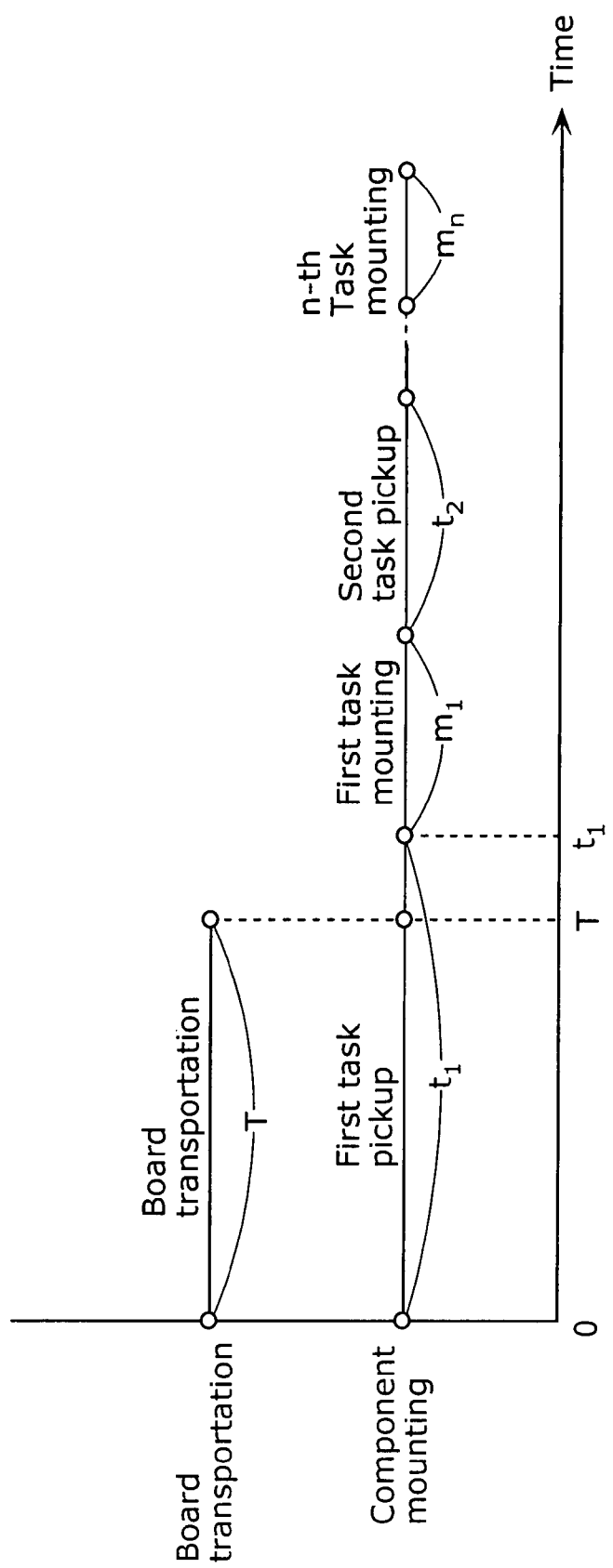
FIG. 82 is a diagram schematically showing time course of board transportation and component mounting in accordance with task order determined in the case where a board carrying-in time T is smaller than or equal to the maximum of component pickup time values ti (NO in S4023 in FIG. 80).

FIG. 82 is a diagram schematically showing time course of board transportation and component mounting in accordance with task order determined in the case where the board carrying-in time T is smaller than or equal to the maximum of component pickup time values ti (NO in S4023 in FIG. 80).

Similarly to FIG. 81, component pickup of the first task is started at the same time as the carrying in of the boards. However, in the task sequence shown here, the first task is selected, not so that pickup of the task is started immediately after the board carrying-in time T has been elapsed, but so that the mounting waiting time shown in FIG. 81 is zero. As such, components of the first task are picked up at the same time as the carrying in of the boards, and further the mounting waiting time does not arise. Thus, the tact time in component mounting onto the board can be minimized. This improves production efficiency for the board.

As described above, according to the processing executed by the fourth component mounting order determining unit 308d, components to be mounted are prepared for each board onto which mounting is to be performed, and further arranges at the component supply position in the component supply unit. Thus, even when the components prepared for one board have run out, component mounting can be continued by using the components prepared for the other board. Further, during that the time, the operator can refill the components. Thus, even when the components have run out during the mounting, the component mounter need not be stopped. This improves production efficiency for the boards.

Further, the component supply position of the components prepared for each board is determined so that the movement distance necessary for pickup of the components is minimized. Thus, the movement distance of the mounting head in a series of operation composed of pickup and mounting by the mounting head in component mounting operation for each board is reduced, so that production efficiency for the board is improved.

Further, component pickup of the first task is started before the boards are carried into the component counter. Thus, the mounting head can operate in parallel to the board carrying-in. This improves production efficiency for the boards.

In particular, when the board carrying-in time is greater than the maximum of the component pickup time values, a task having the greatest component pickup time is adopted as the first task. According to this approach, the mounting waiting time after the completion of the component pickup in the first task until the start of component mounting can be minimized. Further, when the board carrying-in time is smaller than or equal to the maximum of the component pickup time values, a task having a component pickup time greater than or equal to the board carrying-in time is adopted as the first task. According to this approach, the above-mentioned mounting waiting time can become zero. This improves production efficiency for the boards further.

The processing performed by the fourth component mounting order determining unit 308d has been described above. However, the present invention is not limited to the above-mentioned processing.

For example, in the determination processing (S4012 in FIG. 78) for the component supply position, the component supply position has been determined so that the movement distance necessary for pickup of the components is minimized. However, the present invention is not limited to this. For example, the component supply position may be determined so that the time necessary for pickup of the components is minimized.

Further, the start of carrying in of the boards and the start of component pickup of the first task need not be simultaneous. This is because change work for the pickup nozzles could arise before the component pickup of the first task.

Here, the processing by the fourth component mounting order determining unit 308d has been described for the case that the carrying in of the board is performed simultaneously for the two boards. However, the present invention is not limited to this. The present invention is obviously applicable also to a case that the board is carried in one by one.

Further, in place of the configuration that the component mounting order determination processing is switched and executed as in the operating time reducing apparatus 300 in FIG. 2, the component mounting order determination processing performed by the fourth component mounting order determining unit 308d may exclusively be executed.

Figure 83:
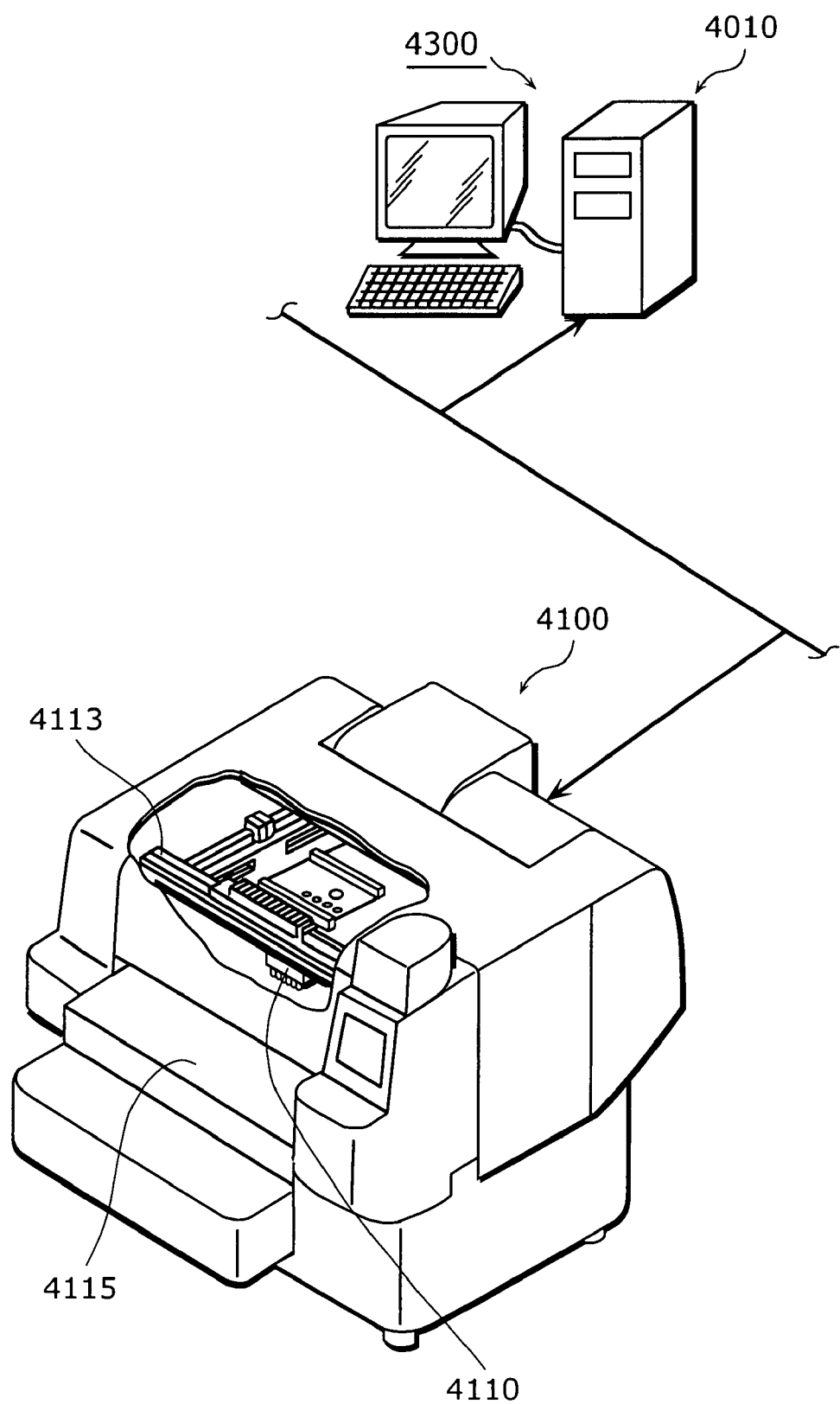
FIG. 83 is an external appearance view showing a configuration of a component mounting system according to an embodiment of the present invention.

FIG. 83 is an external appearance view of such a configuration of a component mounting system. The component mounting system 4010 is a system for mounting components onto a board, and includes a component mounter 4100 and a component mounting order determining apparatus 4300.

Figure 84:
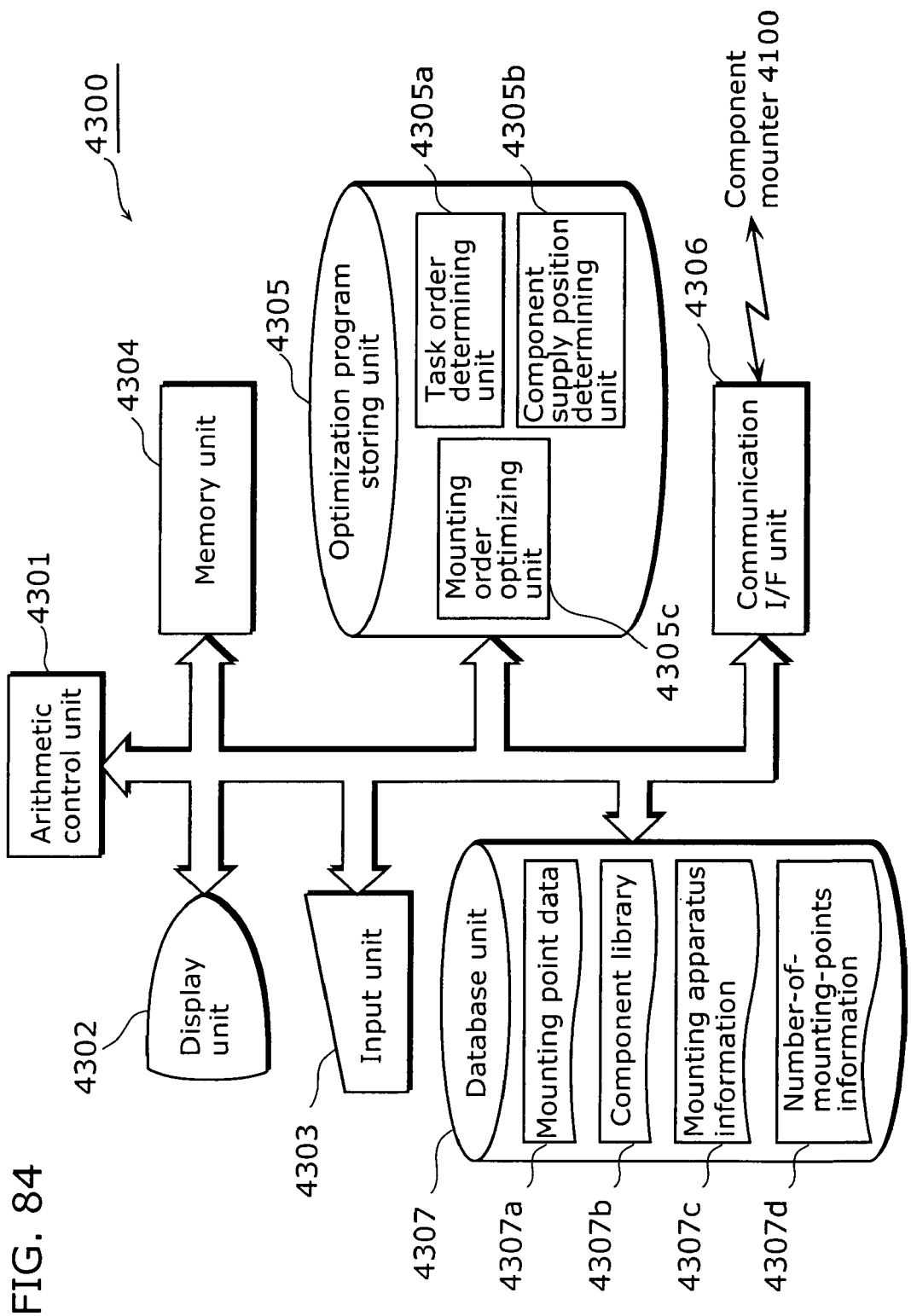
FIG. 84 is a block diagram showing a configuration of a component mounting order determining apparatus shown in FIG. 83.

FIG. 84 is a block diagram showing a configuration of a component mounting order determining apparatus 4300 shown in FIG. 83. The component mounting order determining apparatus 4300 is a computer apparatus that determines a mounting order for the components to be mounted by the component mounter 4100 for all components provided from a CAD apparatus (not shown) for component mounting or the like so that the tact time in component mounting of the target board is minimized under various restrictions caused by the specifications or the like of individual apparatuses making up the production line, and thereby generates optimal NC data. The component mounting order determining apparatus 4300 includes an arithmetic control unit 4301, a display unit 4302, an input unit 4303, a memory unit 4304, an optimization program storing unit 4305, a communication I/F (interface) unit 4306 and a database unit 4307.

The component mounting order determining apparatus 4300 is implemented by a general-purpose computer system such as a personal computer that executes a component mounting order determination program according to the present invention. In a state not connected to the component mounter 4100, the component mounting order determining apparatus 4300 serves also as a stand-alone simulator (a tool for component mounting order optimization).

The arithmetic control unit 4301 is a CPU (Central Processing Unit), a numerical processor and the like. In response to an instruction from the operator or the like, the arithmetic control unit 4301 loads a necessary program from the optimization program storing unit 4305 to the memory unit 4304, and executes it. Then, in accordance with the execution result, the arithmetic control unit 4301 controls individual units 4302 to 4307.

The display unit 4302 is a CRT (Cathode-Ray Tube), an LCD (Liquid Crystal Display) or the like, while the input unit 4303 is a keyboard, a mouse and the like. These units are used for interactive operation or the like between the component mounting order determining apparatus 4300 and an operator under the control of the arithmetic control unit 4301.

The communication I/F unit 4306 is a LAN (Local Area Network) adapter or the like, and is used for communication and the like between the component mounting order determining apparatus 4300 and the component mounter 4100. The memory unit 4304 is a RAM (Random Access Memory) or the like that provides a working area for the arithmetic control unit 4301.

The database unit 4307 is a hard disk or the like that stores, for example: input data (such as the mounting point data 4307a, the component library 4307b, the mounting apparatus information 4307c and the task time information 4307d) used for the component mounting order determination processing performed by the component mounting order determining apparatus 4300; and mounting point data generated by the optimization.

The optimization program storing unit 4305 is a hard disk that stores various optimization programs that implement the function of the component mounting order determining apparatus 4300. The optimization program is constructed from a task order determining unit 4305a, a component supply position determining unit 4305b and a mounting order determining unit 4305c in terms of the function (in the form of a processing unit that expresses the function when executed by the arithmetic control unit 4301). The processing executed by these units is as described above.

[Fifth Component Mounting Order Determining Unit 308e]

In the conventional art, component mounting methods have been proposed in which a plurality of components are picked up by a head (a transfer body), and then the plurality of components are mounted onto a board (see, for example, Japanese Laid-Open Patent Publication No. 2003-31997).

In the component mounting method of Japanese Laid-Open Patent Publication No. 2003-31997 described above, in order that a plurality of components is mounted at high density, the plurality of components are mounted sequentially starting at the smallest one. That is, the plurality of components to be mounted onto one board are arrange sequentially in the ascending order of the height, and then divided into three component groups made up of a small component group, a medium component group, and a large component group. Then, after the components belonging to the small component group are mounted onto the board, the components belonging to the medium component group are mounted onto the board. Then, finally, the components belonging to the large component group is mounted onto the board. Further, when the plurality of components belonging to any one of the component groups are to be mounted, the head picks up components of a number that can be picked up among the plurality of components, then transports them, and then mounts these components onto the board. The head repeats a series of such operation composed of pickup, transportation and mounting of a plurality of components, and thereby mounts all components belonging to the component group. At that time, after picking up and transporting a plurality of components, the head mounts the plurality of picked-up components onto the board sequentially starting with one having the lowest height.

However, the component mounting method of Japanese Laid-Open Patent Publication No. 2003-31997 described above has the problem of an increase in the time necessary for component mounting.

In general, in order that occurrence of deviation or the like is avoided in a component picked up by the head, the transportation speed of the head is restricted depending on the size or the weight of the component picked up. That is, the head is allowed to move faster when the component picked up is smaller (lighter), while the head need move slower when the component is larger (heavier). In the component mounting method of Japanese Laid-Open Patent Publication No. 2003-31997 described above, the components are mounted sequentially starting with the smallest one. Thus, the head continues to pick up a larger component for a long time. Accordingly, the transportation speed of the head is maintained at a lower speed, and hence causes an increase in the time necessary for component mounting. This reduces processing performance (throughput) of mounting the components onto the board per unit time.

Accordingly, the fifth component mounting order determining unit 308e has been devised in view of this problem. Its object is to provide a component mounting method that reduces the time necessary for component mounting and thereby improves throughput.

The component mounter controlled by the fifth component mounting order determining unit 308e is the component mounter 5100 shown in FIG. 1.

The component mounter 5100 includes two sub-equipment (a front sub-equipment 5110 and a rear sub-equipment 5120) that perform component mounting simultaneously and independently. Each sub-equipment 5110 (5120) is an orthogonal robotic mounting stage and includes component supply units 5115a and 5115b, a line gang pickup head 5112 serving as holding unit, an XY robot 5113, a component recognition camera 5116 and a tray supply unit 5117. Each of the component supply units 5115a and 5115b is composed of an array of component cassettes 5114 of a number of 48 at maximum, each holding a component tape. The line gang pickup head 5112 is referred to as a ten-nozzle head or simply as a head, and has ten pickup nozzles (referred to simply as "nozzles", in some cases hereinafter) that can pick up ten components at maximum from the above-mentioned component cassette 5114 and mount them onto the board 5020. This line gang pickup head 5112 is constructed as a holding unit that holds and transports a plurality of components. In the following description, the line gang pickup head 5112 is referred to simply as the head 5112. The XY robot 5113 moves the head 5112. The component recognition camera 5116 is used for inspecting in a two-dimensional or three-dimensional manner the pickup state of the components picked up by the head 5112. The tray supply unit 5117 supplies tray components. Each sub-equipment executes component mounting onto each assigned board 5020 independently of the other sub-equipment (in parallel).

In practice, the "component tape" indicates a tape (carrier tape) on which a plurality of components of the same component type are arranged. This tape is supplied in a state wound around a reel (supply reel) or the like, and is used mainly for supplying components having a comparatively small size and referred to as chip components, to a component mounter. Here, the component supplied on a component tape is referred to as a taping component.

Specifically, the component mounter 5100 is a mounter that has both the function of a component mounter referred to as a high-speed mounter and the function of a component mounter referred to as a multifunctional mounter. The high-speed mounter generally indicates an apparatus that mounts electronic components of 10 mm square or smaller at a speed of 0.1 second each or the like and that is characterized by high productivity. The multifunctional mounter indicates an apparatus that mounts large-size electronic components of 10 mm square or larger, irregularly shaped components such as switches and connectors, and IC components such as a QFP (Quad Flat Package) and a BGA (Ball Grid Array).

That is, the component mounter 5100 is designed to be capable of mounting almost all types of electronic components (the range of components to be mounted extends from a 0.4 mm×0.2 mm chip resistor to a 200 mm connector). Thus, when a necessary number of the component mounters 5100 are merely arranged, a production line can be constructed.

Figure 85:
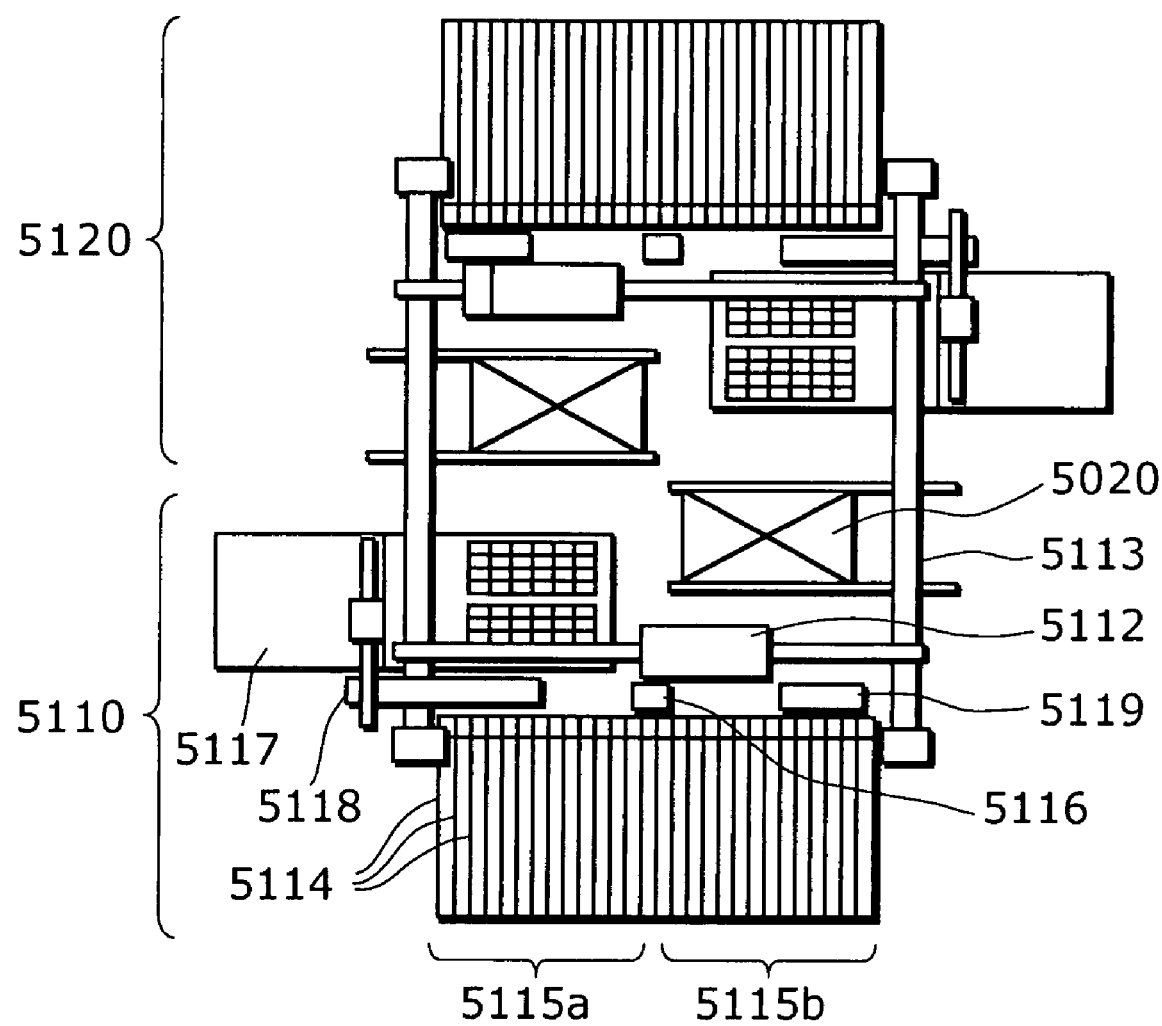
FIG. 85 is a plan view showing a major configuration of a component mounter.

FIG. 85 is a plan view showing a major configuration of a component mounter 5100 according to the present invention.

A shuttle conveyor 5118 is a transportation table (a component transportation conveyer) for conveying a component extracted from a tray supply unit 5117, to a predetermined position where a head 5112 can pick up it. A nozzle station 5119 is a table on which changeable nozzles corresponding to various component sizes are placed.

two component supply units 5115a and 5115b that make up a sub-equipment 5110 (or 5120) are arranged respectively in the right and left of a component recognition camera 5116. Thus, after picking up components at the component supply unit 5115a or 5115b, the head 5112 passes the component recognition camera 5116 and then moves to the mounting points of the board 5020 so as to repeat the operation of mounting all picked-up components sequentially. The "mounting point" indicates a coordinate point on the board 5020 where a component should be mounted. Components of the same component type can be mounted at mutually different mounting points, in some cases. The total number of components (mounting points) arranged on each component tape corresponding to the same component type is equal to the number of components of that component type (the total number of components to be mounted).

Here, one iteration (pickup, transportation and mounting) of the repeated series of operations composed of pickup, transportation and mounting of the components performed by the head 5112, or alternatively a component group to be mounted by this one iteration of operations is referred to as a "task". For example, when a ten-nozzle head is employed, the maximum number of components mounted in one task is 10. Here, the "pickup" described here includes the entire pickup operation from the time that the head 5112 begins to pick up the components until the time that the head 5112 transports them. For example, in addition to the case that ten components are picked up in one iteration of pickup (one iteration of a lowering and raising operation of the head 5112), a case that ten components are picked up by multiple iterations of pickup is included in the definition.

Figure 86:
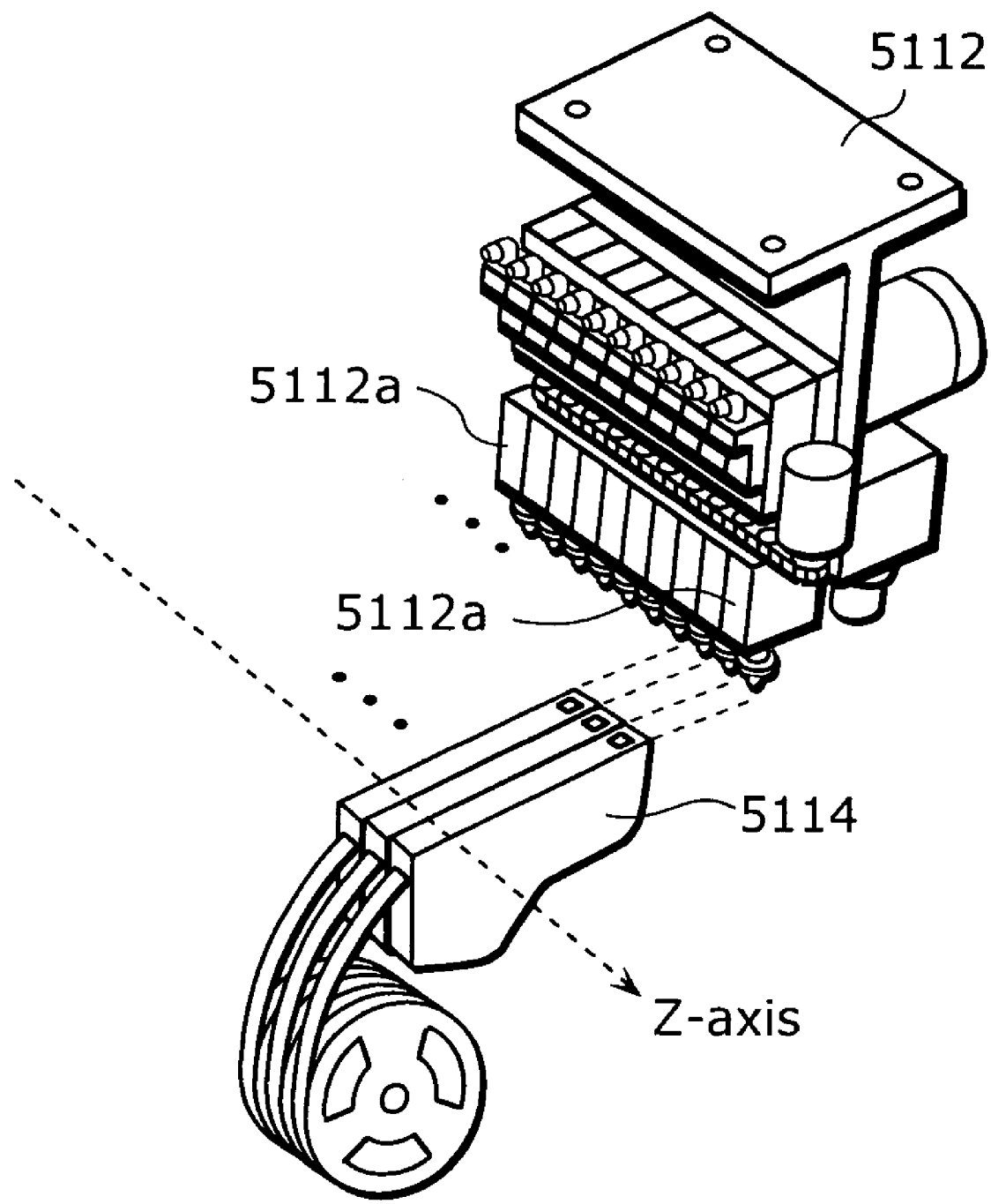
FIG. 86 is a schematic diagram showing positional relation between a head and a component cassette in the above-mentioned component mounter.
Figure 87A:
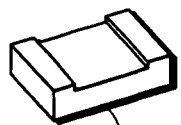
FIG. 87 is an external appearance view showing external appearances of components (electronic components) to be mounted by the above-mentioned component mounter.
Figure 87B:
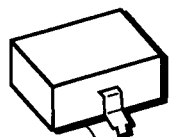
Figure 87C:
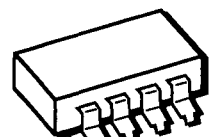
Figure 87D:

FIG. 86 is a schematic diagram showing positional relation between a head 5112 and a component cassette 5114. The head 5112 is an operation head of a type referred to as a "gang pickup method", to which ten pickup nozzles 5112*a* can be attached at maximum. At that time, components can be picked up simultaneously (in one iteration of a lowering and raising operation) from ten individual component cassettes 5114 at maximum.

Here, in a component cassette 5114 referred to as a "single cassette", one component tape is loaded, while in a component cassette 5114 referred to as a "double cassette", two component tapes are loaded. Further, the setting position of a component cassette 5114 (or a component tape) in the component supply unit 5115*a* or 5115*b* is referred to as the "value on the Z-axis" or the "position (Z-number) on the Z-axis". As the Z-numbers, consecutive numbers are used in which the leftmost end of the component supply unit 5115*a* is assigned to "Z1". The "Z-axis" indicates a coordinate axis that identifies the arrangement position (setting position) of a component cassette 5114 set up in each component mounter (sub-equipment, in the case where sub-equipment is included).

FIG. 87 is an external appearance view showing external appearances of components (electronic components) to be mounted.

Various kinds of chip type electronic components 5423*a* to 5423*d* as shown in FIG. 87(*a*) to 87(*d*) are held on the component tape in a state that a plurality of them are arranged successively at fixed intervals. Such a component tape is supplied to the user in a taping form in which the tape provided with a predetermined number of them is wound around a supply reel.

The features of operation of the component mounter 5100 are summarized as follows.

(1) Nozzle Change

When a nozzle necessary for the next mounting operation is present in the head 5112, the head 5112 moves to the nozzle station 5119 and performs nozzle change. The types of nozzles are, for example, types S, M and L each corresponding to a component size that can be picked up.

(2) Component Pickup

The head 5112 moves toward the component supply units 5115*a* and 5115*b* and picks up electronic components. When ten components cannot be picked up simultaneously at once, plural iterations of lowering and raising operation for pickup are performed with moving the pickup position. Thus, ten components at maximum can be picked up.

(3) Recognition Scan

The head 5112 moves on the component recognition camera 5116 at a fixed speed, so that images of all electronic components picked up by the head 5112 are acquired, so that pickup positions of the components are detected accurately.

(4) Component Mounting

The electronic components are sequentially mounted onto the board 5020.

When the above-mentioned operation (1) to (4) is repeated, all electronic components are mounted onto the board 5020. The above-mentioned operation (2) to (4) is basic operation in mounting of the components by the component mounter 5100, and hence corresponds to a "task". That is, ten electronic components at maximum can be mounted onto a board by one task.

FIG. 88 is a diagram showing an example of a component library 5307*b* held in the component mounter 5100.

The component library 5307*b* is stored in the memory of the component mounter 5100, and is a library generated by collecting information specific to each of all component types that can be processed by the component mounter 5100.

The component library 5307*b* includes, for example, for each component: a name field A1 that indicates the name (component name) of the component; a size field A2 that indicates the size of the component; a recognition method field A3 that indicates a recognition method for the component to be performed by the component recognition camera 5116; a nozzle field A4 that indicates the type of a nozzle that can be used for the component; a tact field A5 that indicates the tact specific to the component under a fixed condition; and a speed field A6 that indicates the maximum speed ratio for the head 5112 that picks up the component. Here, the component library 5307*b* may additionally include information concerning the color of the component, the shape of the component or the like.

For example, in the name field A1, a component name "0603CR", "3VOL" or the like is shown. Here, in the figure, external appearances of components of various component types are also shown for convenience. Further, in the size field A2, 0.6 (mm)×0.3 (mm)×0.25 (mm) is shown as the size (vertical length×horizontal length×thickness) of the component having the component name "0603CR", while 4.8 (mm)×4.0 (mm)×3.0 (mm) is shown as the size of the component having the component name "3VOL". This indicates that the component having the component name "0603CR" is smaller than the component having the component name "3VOL". In the recognition method field A3, a reflective method is shown as the recognition method for the component having the component name "0603CR" and the component having the component name "3VOL". Further, in the nozzle field A4, type SX is shown as the nozzle type for the component having the component name "0603CR", while type M is shown as the nozzle type for the component having the component name "3VOL". This indicates that a small nozzle is required for the component having the component name "0603CR" and that a medium size nozzle is required for the component having the component name "3VOL". In the tact field A5, 0.086 second is shown as the tact of the component having the component name "0603CR", while 0.13 second is shown as the tact of the component having the component name "3VOL". This indicates that the component having the component name "0603CR" can be mounted more rapidly than the component having the component name "3VOL". Further, in the speed field A6, "1" is shown as the maximum speed ratio of the head 5112 that picks up the component having the component name "0603CR", while "2" is shown as the maximum speed ratio of the head 5112 that picks up the component having the component name "3VOL". This maximum speed ratio indicates the maximum speed, that is, the transportation speed limit, for the head 5112, while a smaller value indicates a higher maximum speed (transportation speed limit). That is, in a state that one component having the component name "0603CR" is picked up, the head 5112 is allowed to move faster than the case that the component having the component name "3VOL" is picked up. The component library 5307$b$ has the above-mentioned speed field A6 as speed information.

As such, when the head 5112 picks up one component, the transportation speed of the head 5112 is restricted by the maximum speed ratio corresponding to the component. Further, when the head 5112 picks up a plurality of components, the transportation speed of the head 5112 is restricted by the greatest maximum speed ratio among the maximum speed ratios corresponding to the individual components picked up. For example, when the head 5112 picks up the component having the component name "0603CR" and the component having the component name "3VOL", the transportation speed of the head 5112 is restricted to the maximum speed ratio of 2.

That is, when the component having the component name "0603CR" and the component having the component name "3VOL" are to be mounted onto the board 5020 by one task, a condition that minimizes the time duration of picking up (holding) the component having the component name "3VOL" and having the greater maximum speed ratio (the lower maximum speed) can reduce the time duration necessary for mounting these components.

Thus, in the component mounter 5100, when a plurality of components are to be picked up, with reference to the component library 5307$b$, the head 5112 picks up the plurality of components sequentially starting with a component having the smallest maximum speed ratio. When the plurality of components picked up by the head 5112 are to be mounted, the plurality of components are mounted sequentially starting at a component having the greatest maximum speed ratio. That is, the component mounter 5100 is provided with an order determining apparatus that determines handling order (pickup order and mounting order) for the components so that the time duration that the head 5112 picks up (holds) components having a lower maximum speed is reduced. Here, the above-mentioned pickup order indicates the order of holding the plurality of components held by the head 5112.

Here, when the head 5112 picks up a plurality of components by one task, the component mounter 5100 moves the head 5112 to the pickup position for each component in the Z-axis direction on the component supply unit 5115$a$ and 5115$b$ side at a transportation speed corresponding to the greatest maximum speed ratio of the held components. When the head 5112 has picked up all components, the component mounter 5100 moves the head 5112 to the board 5020 side at a transportation speed corresponding to the above-mentioned greatest maximum speed ratio. When the plurality of components picked up by the head 5112 are to be mounted respectively at the mounting points on the board 5020, the component mounter 5100 moves the head 5112 on the board 5020 at a transportation speed corresponding to the above-mentioned greatest maximum speed ratio.

Figure 89:
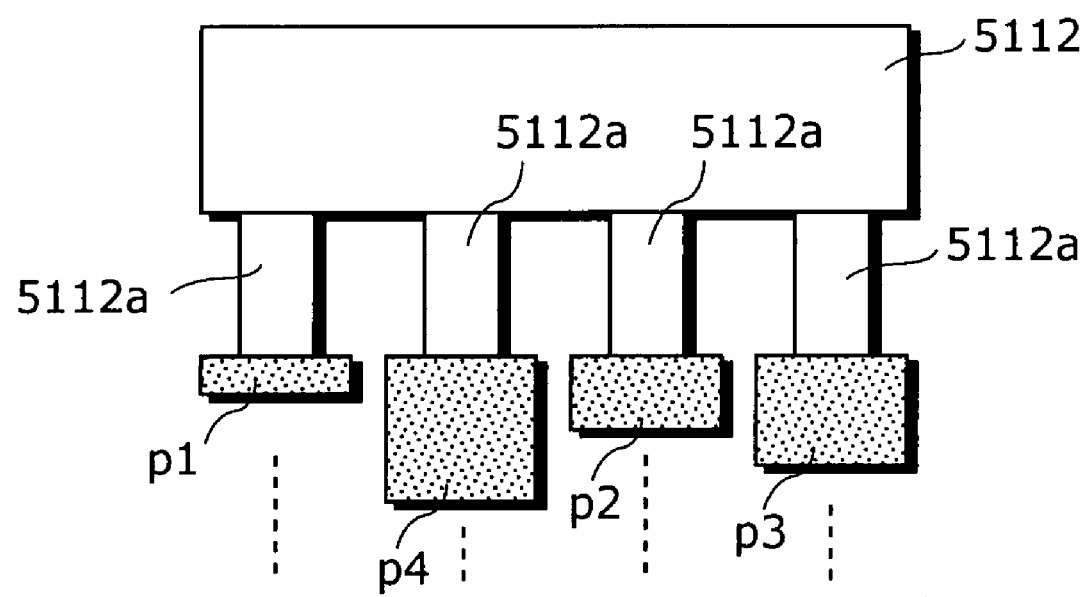
FIG. 89 is an explanation diagram describing pickup order and mounting order for the above-mentioned components.
Figure 90A:
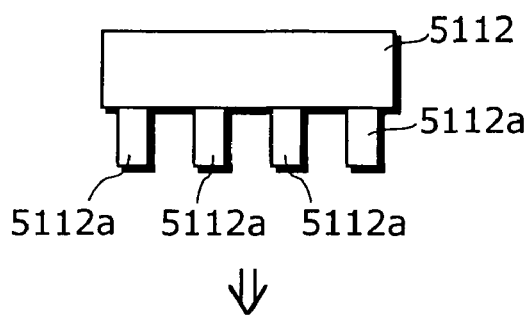
FIG. 90 is an explanation diagram describing a situation that the above-mentioned head picks up components.
Figure 90B:
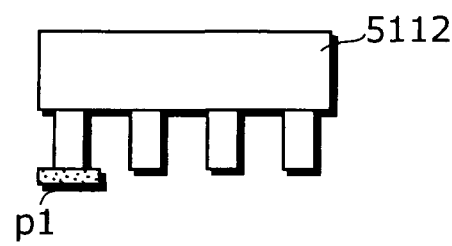
Figure 90C:
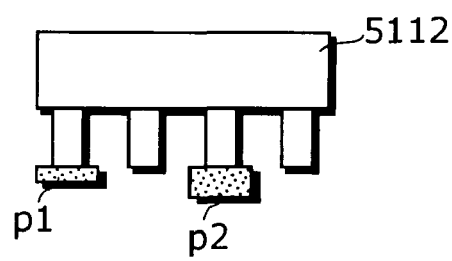
Figure 90D:
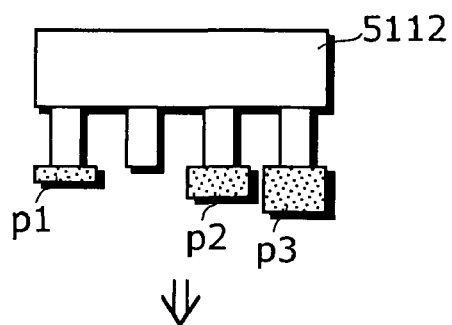
Figure 90E:
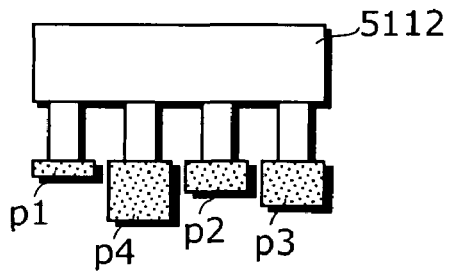
Figure 91A:
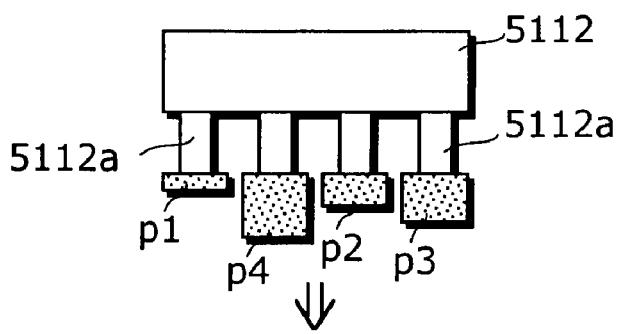
FIG. 91 is an explanation diagram describing a situation that the above-mentioned head mounts components.
Figure 91B:
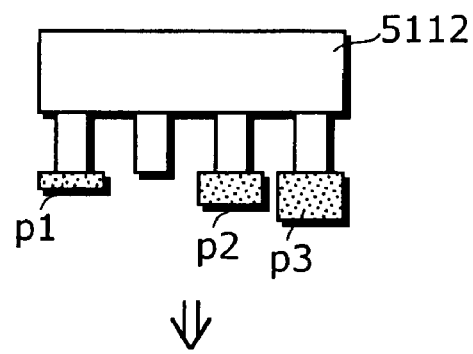
Figure 91C:
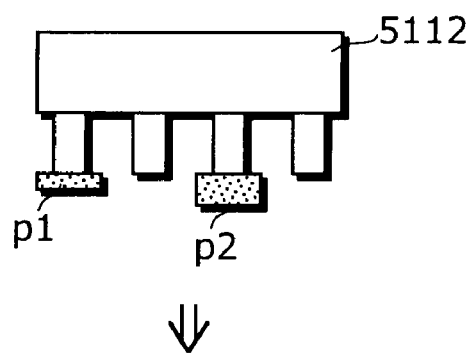
Figure 91D:
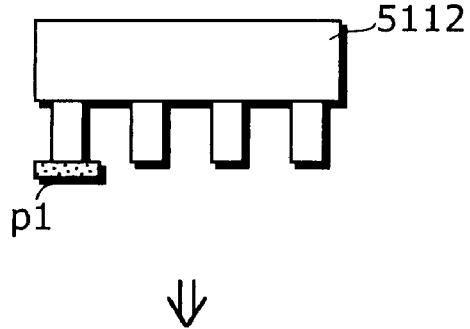
Figure 91E:
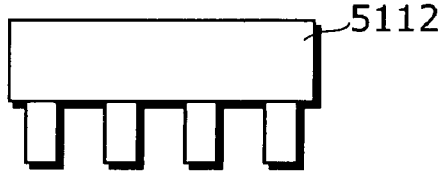

FIG. 89 is an explanation diagram describing pickup order and mounting order for the components.

As described above, with reference to the component library 5307$b$, the component mounter 5100 determines pickup order (holding order) and mounting order for the components in one task.

For example, when the head 5112 handles four components p1, p2, p3 and p4 by one task, with reference to the component library 5307$b$, the component mounter 5100 identifies the maximum speed ratios of the individual components p1, p2, p3 and p4. Here, the component library 5307$b$ shows, for example, the maximum speed ratio "1" of the component p1, the maximum speed ratio "2" of the component p2, the maximum speed ratio "3" of the component p3 and the maximum speed ratio "4" of the component p4. That is, the relation between the maximum speed ratios of the above-mentioned components is "component p1<component p2<component p3<component p4", while the relation between the maximum speed values (transportation speed limits) of the above-mentioned components is "component p1>component p2>component p3>component p4". In other words, the maximum speed of the component p1 is the highest, the maximum speed of the component p2 is the second highest, the maximum speed of the component p3 is the third highest, and the maximum speed of the component p4 is the lowest. Here, the reason why the relation of the maximum speed ratio in the component library 5307$b$ is shown as described above is that, for example, the relation between the sizes (or weights) of the components p1, p2, p3 and p4 is shown as "component p1<component p2<component p3<component p4".

Then, using the identified maximum speed ratios, the component mounter 5100 determines pickup order for the four components p1, p2, p3 and p4. At that time, the component mounter 5100 determines the pickup order starting with a component having the smallest maximum speed ratio, that is, a component having the highest maximum speed. Specifically, since the maximum speed ratio of the component p1 is the smallest, the component mounter 5100 determines the pickup order for the component p1 to be the first. Further, since the maximum speed ratio of the component p2 is the next smallest to the component p1, the component mounter 5100 determines the pickup order for the component p2 to be the second. Similarly, since the maximum speed ratio of the component p3 is the next smallest to the component p2, the component mounter 5100 determines the pickup order for the component p3 to be the third. Further, since the maximum speed ratio of the component p4 is the greatest, the pickup order for the component p4 is determined to be the fourth.

Further, using the maximum speed ratios identified as described above, the component mounter 5100 determines a mounting order for the four components p1, p2, p3 and p4. At that time, the component mounter 5100 determines the mounting order starting with a component having the greatest maximum speed ratio, that is, a component having the lowest maximum speed. Specifically, since the maximum speed ratio of the component p4 is the greatest, the component mounter 5100 determines the mounting order for the component p4 to be the first. Further, since the maximum speed ratio of the component p3 is the next greatest to the component p4, the component mounter 5100 determines the mounting order for the component p3 to be the second. Similarly, since the maximum speed ratio of the component p2 is the next greatest to the component p3, the component mounter 5100 determines the mounting order for the component p2 to be the third. Further, since the maximum speed ratio of the component p1 is the lowest, the mounting order for the component p1 is determined to be the fourth.

FIG. 90 is an explanation diagram describing a situation that a head 5112 picks up components.

Based on the determined pickup order, the component mounter 5100 causes the individual nozzles 5112$a$ of the head 5112 to pick up the components.

First, the component mounter 5100 moves the head 5112 shown in FIG. 90(*a*) to the pickup position for the component p1 in the Z-axis direction on the component supply unit 5115*a* and 5115*b* side at a very high speed. Then, as shown in FIG. 90(*b*), the component mounter 5100 causes any one of the plurality of nozzles 5112*a* of the head 5112 to pick up the component p1 having the pickup order of first. When the component p1 has been picked up, the component mounter 5100 reduces the transportation speed of the head 5112 shown in FIG. 90(*b*) into the maximum speed of the component p1, and then moves the head 5112 in the Z-axis direction to the pickup position for the component p2. Then, as shown in FIG. 90(*c*), the component mounter 5100 causes a not-yet-picking-up nozzle 5112*a* of the head 5112 to pick up the component p2 having the pickup order of second. When the component p2 has been picked up, the component mounter 5100 reduces the transportation speed of the head 5112 shown in FIG. 90(*c*) into the maximum speed of the component p2, and then moves the head 5112 in the Z-axis direction to the pickup position for the component p3. Then, as shown in FIG. 90(*d*), the component mounter 5100 causes a not-yet-picking-up nozzle 5112*a* of the head 5112 to pick up the component p3 having the pickup order of third. When the component p3 has been picked up, the component mounter 5100 reduces the transportation speed of the head 5112 shown in FIG. 90(*d*) into the maximum speed of the component p3, and then moves the head 5112 in the Z-axis direction to the pickup position for the component p4. Then, as shown in FIG. 90(*e*), the component mounter 5100 causes a not-yet-picking-up nozzle 5112*a* of the head 5112 to pick up the component p4 having the pickup order of fourth.

When individual nozzles 5112*a* of the head 5112 pick up the components p1, p2, p3 and p4 respectively, the component mounter 5100 moves the head 5112 to the board 5020. At that time, the transportation speed of the head 5112 is restricted by the maximum speed ratio of the component p4.

FIG. 91 is an explanation diagram describing a situation that a head 5112 mounts components.

When the head 5112 moves to the board 5020, based on the determined mounting order, the component mounter 5100 mounts the components picked up by the nozzles 5112*a* of the head 5112 at the mounting points of the board 5020.

First, the component mounter 5100 moves the head 5112 shown in FIG. 91(*a*) to the mounting point for the component p4 of the board 5020 at a very low speed. Then, the component mounter 5100 causes the nozzle 5112*a* of the head 5112 that picks up the component p4 to mount the component p4. As a result, as shown in FIG. 91(*b*), the head 5112 goes into a state that only the components p1, p2 and p3 are picked up. When the component p4 has been mounted, the component mounter 5100 increases the transportation speed of the head 5112 shown in FIG. 91(*b*) into the maximum speed of the component p3, and then moves the head 5112 to the mounting point for the component p3 on the board 5020. Then, the component mounter 5100 causes the nozzle 5112*a* of the head 5112 that picks up the component p3 to mount the component p3. As a result, as shown in FIG. 91(*c*), the head 5112 goes into a state that only the components p1 and p2 are picked up. When the component p3 has been mounted, the component mounter 5100 increases the transportation speed of the head 5112 shown in FIG. 91(*c*) into the maximum speed of the component p2, and then moves the head 5112 to the mounting point for the component p2 on the board 5020. Then, the component mounter 5100 causes the nozzle 5112*a* of the head 5112 that picks up the component p2 to mount the component p2. As a result, as shown in FIG. 91(*d*), the head 5112 goes into a state that only the component p1 is picked up.

When the component p2 has been mounted, the component mounter 5100 increases the transportation speed of the head 5112 shown in FIG. 91(*d*) into the maximum speed of the component p1, and then moves the head 5112 to the mounting point for the component p1 on the board 5020. Then, the component mounter 5100 causes the nozzle 5112*a* of the head 5112 that picks up the component p1 to mount the component p1. As a result, as shown in FIG. 91(*e*), the head 5112 goes into a state that no component is picked up. Then, the component mounter 5100 moves the head 5112 to the component supply unit 5115*a* and 5115*b* side.

Figure 92:
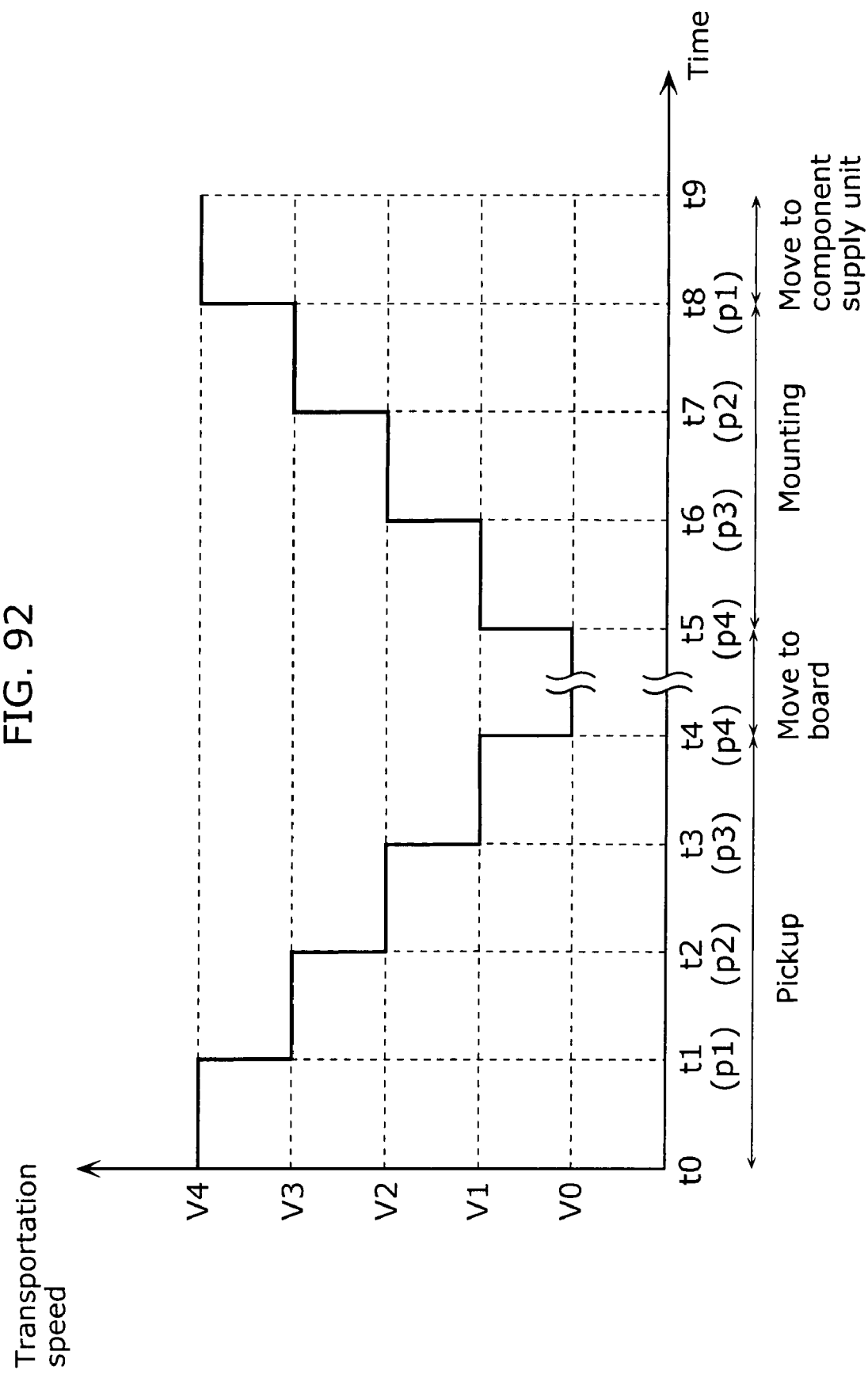
FIG. 92 is a diagram showing a transportation speed of the above-mentioned head.

FIG. 92 is a diagram showing the transportation speed of the head 5112.

In the component mounter 5100, since the maximum speed ratio is set up to each component as described above, when each component is to be picked up by the head 5112, the head 5112 is moved in the Z-axis direction on the component supply unit 5115*a* and 5115*b* side with changing stepwise the speed of the head 5112.

For example, between time t0 and time t1, the component mounter 5100 moves the head 5112 to the pickup position for the component p1 in the Z-axis direction at a transportation speed V4. Then, when the head 5112 has picked up the component p1 at time t1, the component mounter 5100 moves the head 5112 to the pickup position for the component p2 in the Z-axis direction at a transportation speed V3 lower than the transportation speed V4, between time t1 and time t2. Then, when the head 5112 has picked up the component p2 at time t2, the component mounter 5100 moves the head 5112 to the pickup position for the component p3 in the Z-axis direction at a transportation speed V2 yet lower than the transportation speed V3, between time t2 and time t3. Then, when the head 5112 has picked up the component p3 at time t3, the component mounter 5100 moves the head 5112 to the pickup position for the component p4 in the Z-axis direction at a transportation speed V1 yet lower than the transportation speed V2, between time t3 and time t4. Then, the head 5112 picks up the component p4 at time t4.

Here, when the component p4 has been picked up, the component mounter 5100 moves the head 5112 to the mounting point for the component p4 on the board 5020 at a transportation speed V0 yet lower than the transportation speed V1, between time t4 and t5.

Then, when the components picked up by the head 5112 are to be mounted, the component mounter 5100 moves the head 5112 on the board 5020 with changing stepwise the speed of the head 5112.

For example, when the head 5112 has mounted the component p4 at time t5, the component mounter 5100 moves the head 5112 to the mounting point for the component p3 at a transportation speed V1 higher than the transportation speed V0, between time t5 and time t6. Then, when the head 5112 has mounted the component p3 at time t6, the component mounter 5100 moves the head 5112 to the mounting point for the component p2 at a transportation speed V2 higher than the transportation speed V1, between time t6 and time t7. Then, when the head 5112 has mounted the component p2 at time t7, the component mounter 5100 moves the head 5112 to the mounting point for the component p1 at a transportation speed V3 higher than the transportation speed V2, between time t7 and time t8. Then, when the head 5112 has mounted the component p1 at time t8, the component mounter 5100 moves the head 5112 to the component supply unit 5115*a* and 5115*b* side at a transportation speed V4 yet higher than the transportation speed V3, between time t8 and time t9.

For example, in the case where the component mounter 5100 causes the head 5112 to pick up the component p4 first and mount the component p4 at last, the component mounter 5100 need move the head 5112 at the transportation speed V0 for a long time from the first pickup of the component p4 until the mounting of the component p4. In contrast, according to the present embodiment, the necessity of moving the head 5112 at the transportation speed V0 for a long time is avoided, so that the head 5112 can be moved faster.

Here, the transportation speed of the head 5112 shown in FIG. 92 is a schematic example.

Figure 93:
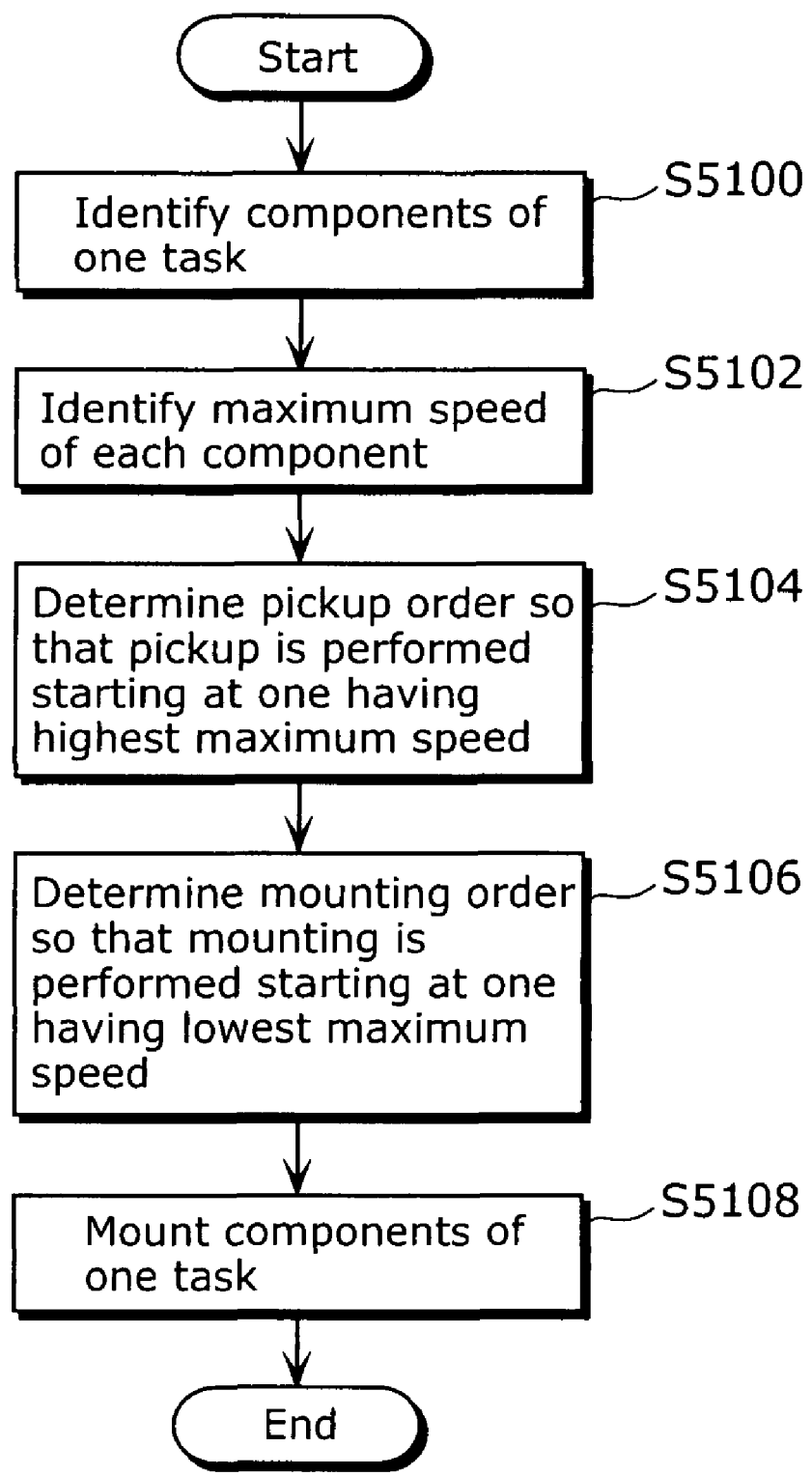
FIG. 93 is a flow chart showing operation that the above-mentioned component mounter mounts components.

FIG. 93 is a flow chart showing operation that the component mounter 5100 mounts components.

First, the component mounter 5100 identifies components to be mounted by one task (step S5100). Then, with reference to the component library 5307*b*, the component mounter 5100 identifies the maximum speed (the maximum speed ratio) of the components (step S5102). Then, the component mounter 5100 determines pickup order for the components identified in step S5100 so that pickup is performed sequentially starting at a component having the highest maximum speed (step S5104). Then, the component mounter 5100 determines a mounting order for the components identified in step S5100 so that mounting is performed sequentially starting at a component having the lowest maximum speed (step S5106).

Then, in accordance with the determined pickup order, the component mounter 5100 causes the head 5112 to pick up the components, then moves it, and then causes it to mount the components onto the board 5020 in accordance with the determined mounting order (step S5108). As a result, all components of one task are mounted onto the board 5020.

As such, even in the case where the head 5112 is moved at a speed not exceeding the lowest maximum speed of the components held by the head 5112, when the plurality of components are handled by the head 5112 in accordance with the pickup order and the mounting order determined as described above, the time duration that a component having a low maximum speed is picked up by the holding unit is reduced, so that the transportation speed of the head 5112 can be increased. This reduces the time necessary for component mounting, and hence improves throughput. Further, when the head 5112 is moved at a speed not exceeding the lowest maximum speed of the components picked up by the head 5112, the components are prevented from deviating or departing from the head 5112, so that the components can accurately be mounted onto the board 5020.

In a situation that a large number of component mounters not having the function of nozzle change in accordance with various components are distributed in the market recent years, the present invention is remarkably effective.

That is, in a component mounter described above, nozzles necessary for mounting of one board, that is, nozzles corresponding to various kinds of components, are attached to the head in advance. For example, nozzles of type S, type M, type L and type LL are attached. Here, for the purpose of improving the throughput, the number of tasks need be reduced. Thus, all of these nozzles need pick up components. Accordingly, the head need pick up various kinds of components and mount these components onto the board by one task.

In this situation, if mounting were performed sequentially starting at the smallest component as in the conventional art, the transportation speed of the head becomes low, so that throughput is difficult to be improved. However, according to the present invention, pickup order and mounting order are determined so that the time duration that a component having a low transportation speed is reduced. This improves the transportation speed of the head, and hence improves throughput. Here, in the component mounter not having the above-mentioned function of nozzle change, the nozzle station on which the changeable nozzles are placed can be omitted. This permits size reduction of the component mounter, reduction of the production space, and cost reduction. This is the reason why a large number of such component mounters are distributed in the market.

The component mounting method in which the component mounter 5100 mounts the components have been described above with reference to embodiments. However, the present invention is not limited to these.

For example, in the above-mentioned example, the component mounter 5100 has included the order determining apparatus, and has determined the pickup order and the mounting order for the components. However, the fifth component mounting order determining unit 308*e* may include the order determining apparatus and determine the order. In this case, the component mounter 5100 acquires the pickup order and the mounting order for the components determined by the fifth component mounting order determining unit 308*e*, and then handles the plurality of components in accordance with the pickup order and the mounting order having been acquired, so as to perform component mounting onto the board 5020. Further, in the present embodiment, the component mounter 5100 has held the component library 5307*b*. However, the fifth component mounting order determining unit 308*e* may hold it. Here, the above-mentioned order determining apparatus includes: a speed identifying unit that identifies the maximum speed ratio (maximum speed) of the head 5112; and a determination unit that determines handling order for the components so that the time duration that a components having a great maximum speed ratio is picked up by the head 5112 is reduced.

Further, in the above-mentioned example, the component mounter 5100 has determined the mounting order for the components after having determined the pickup order for the components. However, the mounting order may be determined first, and then the pickup order may be determined. Further, in the above-mentioned example, after having determined the pickup order and the mounting order for the components, the component mounter 5100 has caused the head 5112 to pick up the components and mount them onto the board 5020. However, the timing of determination of mounting order is arbitrary as long as it is before the mounting of components. For example, mounting order may be determined after the components are picked up by the head 5112.

Further, in the above-mentioned example, in order that each component is picked up by the head 5112, the component mounter 5100 has moved the head 5112 to the pickup position for each component. However, a plurality of components may simultaneously be picked up by the head 5112 without moving of the head 5112. For example, in the above-mentioned case that the pickup position for the component p1 is located adjacent to the pickup position for the component p2, the head 5112 picks up the components p1 and p2 simultaneously with two nozzles 5112*a* without moving. Similarly, in the above-mentioned example, in order that each component is mounted onto the board 5020, the component mounter 5100 has moved the head 5112 to the mounting position for each component. However, a plurality of components picked up by the head 5112 may simultaneously be mounted without moving of the head 5112. For example, in the above-mentioned case that the mounting position for the component p1 is located adjacent to the mounting position for the component p2, the head 5112 mounts the components p1 and p2 simultaneously with two nozzles 5112*a* without moving.

Further, in the above-mentioned example, the component library 5307*b* has shown the maximum speed ratio. However, the maximum speed may be shown. Further, the component mounter 5100 may specify the maximum speed ratio (maximum speed) of each component based on the component size, the tact or the like shown in the component library 5307b. The reason why the maximum speed can be identify from the component size is that particular relation holds in general between the component size and the maximum speed. That is, such relation holds that when the component size is large, the maximum speed need be low, while when the component size is small, the maximum speed may be high. Thus, with reference to the component size of the component library 5307b, the component mounter 5100 specifies the maximum speed to each component so that the transportation speed of the head 5112 is restricted for a component having a larger component size. In this case, the speed field A6 of the component library 5307b can be omitted. This suppresses the amount of information. Here, the maximum speed ratio (maximum speed) of each component may be specified from the thickness solely in the component size. Further, when the component library 5307b shows the weight of each component, the component mounter 5100 may specify the maximum speed from the weight. The reason why the maximum speed can be specified from the component size is the same as the above-mentioned case, and is that particular relation holds between the component weight and the maximum speed.

Further, in the above-mentioned example, the transportation speed of the head 5112 has been changed based on the maximum speed ratio (maximum speed) shown in the component library 5307b. However, the acceleration of the head 5112 may be changed. Alternatively, the transportation speed and the acceleration may be changed. Further, the component mounter 5100 may determine the pickup order and the mounting order based on the acceleration similarly to the case of the maximum speed ratio of the head 5112. In such a case, the present invention has an effect similar to the above-mentioned one. In general, in a component mounter, the head is moved approximately at the same maximum speed regardless of the type of a picked-up component, while the (maximum) acceleration of the head is solely changed depending on the property (such as the size and the weight) of the component. This acceleration includes positive acceleration and negative acceleration, and hence indicates acceleration/deceleration. For example, when the head picks up small components only, the absolute value of the acceleration of the head is set up to be great. When the head picks up a large component, the absolute value of the acceleration of the head is set up to be small. Thus, accordingly, also in the present invention, it is practical that the acceleration is changed. Thus, the maximum speed in the above-mentioned embodiment may be replaced by the maximum acceleration, while the transportation speed (speed) may be replaced by the acceleration.

Further, in the above-mentioned example, pickup order and mounting order for the components has been determined first, and then the head 5112 has been controlled in accordance with the order. However, any one of the pickup order and the mounting order may be determined, and then the head 5112 may be controlled in accordance with the determined order.

Further, in the above-mentioned example, the head 5112 has only performed parallel displacement without rotation. However, the head 5112 may be rotated. Further, the rotation speed of the head 5112 may be controlled based on the maximum speed ratio in the component library 5307b similarly to the transportation speed. Then, the rotation speed of the head 5112 may be increased, so that throughput can be improved further.

Further, in place of the configuration that the component mounting order determination processing is switched and executed as in the operating time reducing apparatus 300 in FIG. 2, the component mounting order determination processing performed by the order determining apparatus for the component mounter 5100 or the fifth component mounting order determining unit 308e may exclusively be executed.

Figure 94:
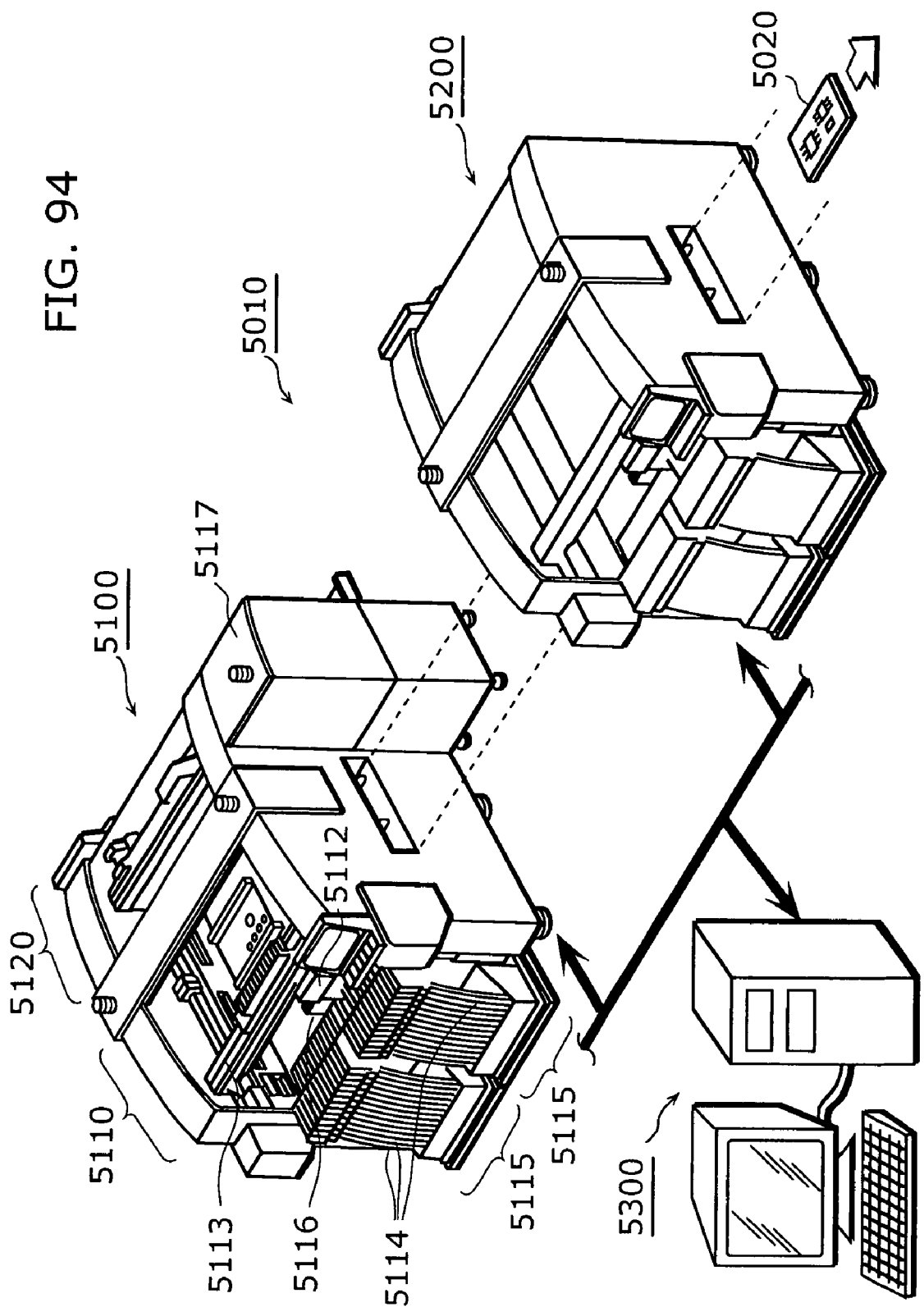
FIG. 94 is an external appearance view showing an overall configuration of a component mounting system according to an embodiment of the present invention.

FIG. 94 is an external appearance view showing an overall configuration of a component mounting system 5010 having this configuration. The component mounting system 5010 includes: a plurality of component mounters 5100 and 5200 that make up a production line in which electronic components (components) are mounted during the time that a circuit board (board) 20 is transferred from the upstream to the downstream; and a management apparatus 5300 that manages the component mounters 5100 and 5200. Here, the component mounters 5100 and 5200 have mutually the same configuration.

[Sixth Component Mounting Order Determining Unit 308f]

With progress of function improvement and size reduction in electronic apparatuses such as a personal computer and a portable phone, high-density component mounting is required in the circuit board (referred to simply as a "board", hereinafter) built in the electronic apparatus. Thus, a component mounter for fabricating such a board is desired to have a function corresponding to extremely close adjacency mounting (this indicates that components are mounted at extremely close positions with each other on a board).

Figure 95:
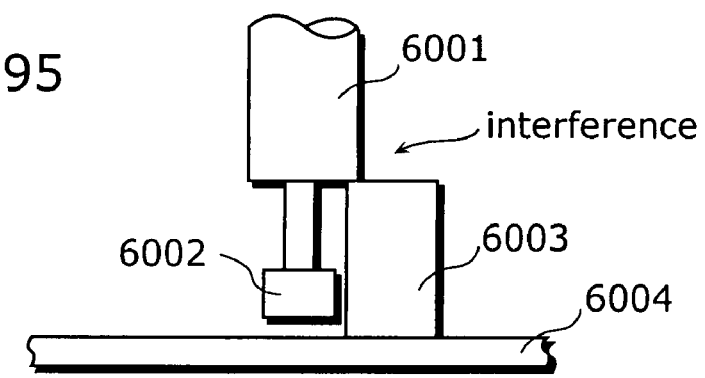
FIG. 95 is a diagram describing extremely close adjacency mounting.

FIG. 95 is a diagram describing extremely close adjacency mounting. This figure shows interference that could be generated when a component 6003 is mounted onto a board 6004 and then a new component 6002 (the component 6002 picked up by the pickup nozzle 6001 of the component mounter, in this example) is mounted at a position immediately close to the component 6003. The component 6002 has a lower height (a smaller component thickness) than the component 6003, and further need be mounted at a position extremely close to the component 6003. This causes interference that the pickup nozzle 6001 collides with the component 6003 and hence the component 6002 cannot be mounted onto the board 6004. Here, in addition to such collision between the pickup nozzle (or the mounting head of the component mounter) and a component, interference also includes collision between a component and another component (for example, collision between a component picked up by the pickup nozzle and a component mounted on the board).

Conventionally, in order that such extremely close adjacency mounting is processed, various component mounting methods have been proposed (see, for example, Japanese Laid-Open Patent Publication No. 2003-37396 (FIGS. 11 to 13 and the like)). In the technique disclosed in Japanese Laid-Open Patent Publication No. 2003-37396, all components to be mounted are divided into groups depending on the height of the component, and then components belonging to a group of a low height are mounted first. As such, interference is avoided in extremely close adjacency mounting.

However, in the conventional art described above, in a component mounter of modular type, for the purpose of tact reduction, processing is performed that individual mounting points are divided into tasks and then task order and mounting order for the components in each task are determined. At that time, interference has not been taken into consideration. Further, on the contrary, in the case where mounting order for the components is determined with taking interference into consideration, no attention has been paid on the process that the tact is to be minimized under the condition that interference is taken into consideration.

Figure 96A:
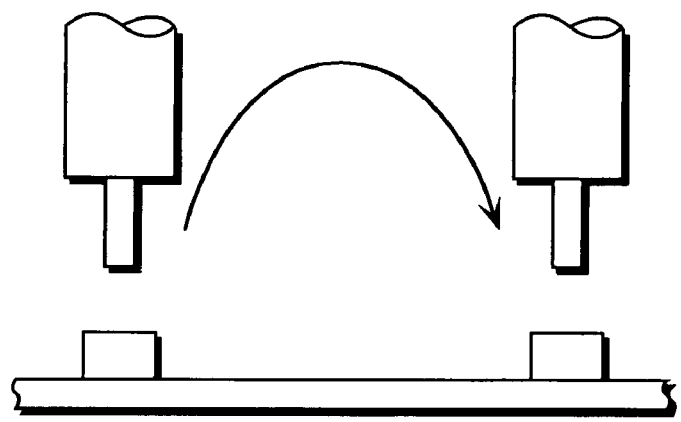
FIG. 96 is a diagram describing arch motion operation and ordinary operation (non-arch motion operation).
Figure 96B:
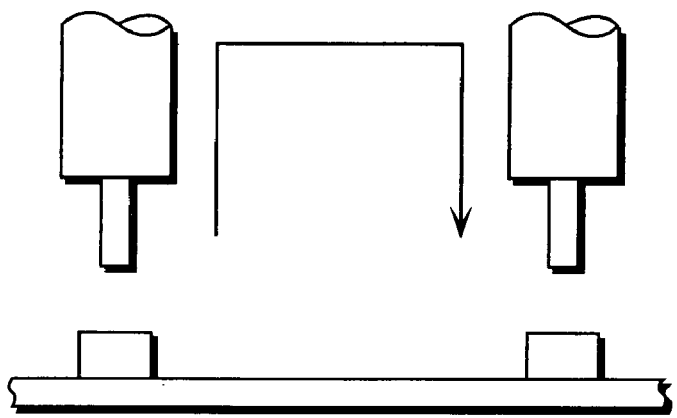

Further, in the conventional art described above, the fact that the mounting head of the component mounter performs arch motion operation has not been taken into consideration. This has caused a problem that the method is insufficient for avoiding interference in extremely close adjacency mounting. Here, the arch motion operation indicates the operation that the mounting head of the component mounter performs lowering and raising operation and XY operation (movement in a plane parallel to the board) in parallel. For example, this operation is that as shown in FIG. 96(a), after the mounting head has completed the mounting of a particular component onto the board, the mounting head moves with an arch-shaped locus at the time of next component mounting. By virtue of such arch motion operation, the transportation time of the mounting head is reduced in comparison with ordinary operation (non-arch motion operation) shown in FIG. 96(b). This reduces the mounting time.

FIG. 97 is a diagram describing interference caused by arch motion operation. This figure shows a situation that the component 6005 picked up by the pickup nozzle 6001 is lowered from an oblique direction by arch motion operation and hence interference arises so that the component 6005 collides with the component 6006 already mounted on the board 6004. Such interference does not occur in the case of mounting without arch motion operation, and hence is interference specific to arch motion operation. In the conventional art described above, interference at the time that the mounting head of the component mounter mounts the components has not been taken into consideration. Thus, problems have arisen that the interference degrades the quality and that an operation loss at the time of component mounting is caused because arch motion operation cannot be performed.

Another problem is that since interference caused by arch motion operation is not taken into consideration, mounting with arch motion operation cannot be performed so that fine pitch mounting cannot be achieved.

Accordingly, an object of the sixth component mounting order determining unit 308f is to provide a component mounting order determination method in which an operation loss seldom occurs at the time of component mounting.

Another object is to provide a component mounting order determination method suitable for fine pitch and high density mounting in which interference between components caused by the arch motion operation or the like of the mounting head is taken into consideration.

The component mounter controlled by the sixth component mounting order determining unit 308f is the component mounter 6100 shown in FIG. 1.

The component mounter 6100 is an apparatus that determines a mounting order for the components and mounts the components onto the board in accordance with the determined order. The component mounter 6100 includes: a component housing unit 6115 that holds the components; a mounting head 6110 that picks up the components from the component housing unit 6115, then moves to the mounting point of the board with performing arch motion operation or the like, and then mounts the components; and an XY robot 6113 that is a stage for XY-driving the mounting head 6110 (moving it in a plane parallel to the ground surface).

Here, the mounting head 6110 is, for example, a modular type mounting head, and is provided with ten pickup nozzles that can be raised and lowered. Thus, the mounting head 6110 can pick up and mount ten components at maximum onto the board. Further, for example, the pickup nozzles can be attached to and removed from the mounting head 6110. Further, in the mounting head 6110, prior to the pickup of the components, the pickup nozzles can automatically be changed in correspondence to the size, the weight and the like of the components to be mounted.

Figure 98:
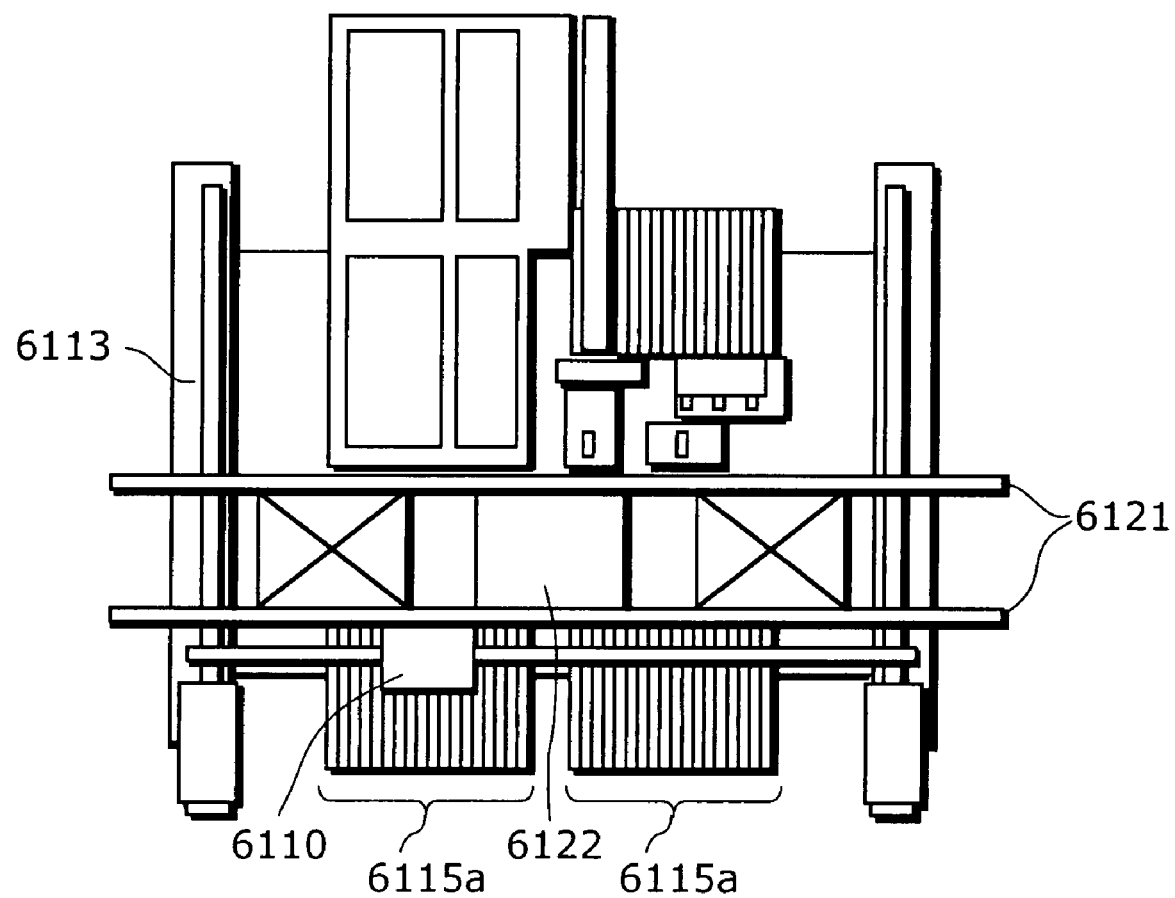
FIG. 98 is a diagram showing an internal structure of a component mounter.
Figure 99:
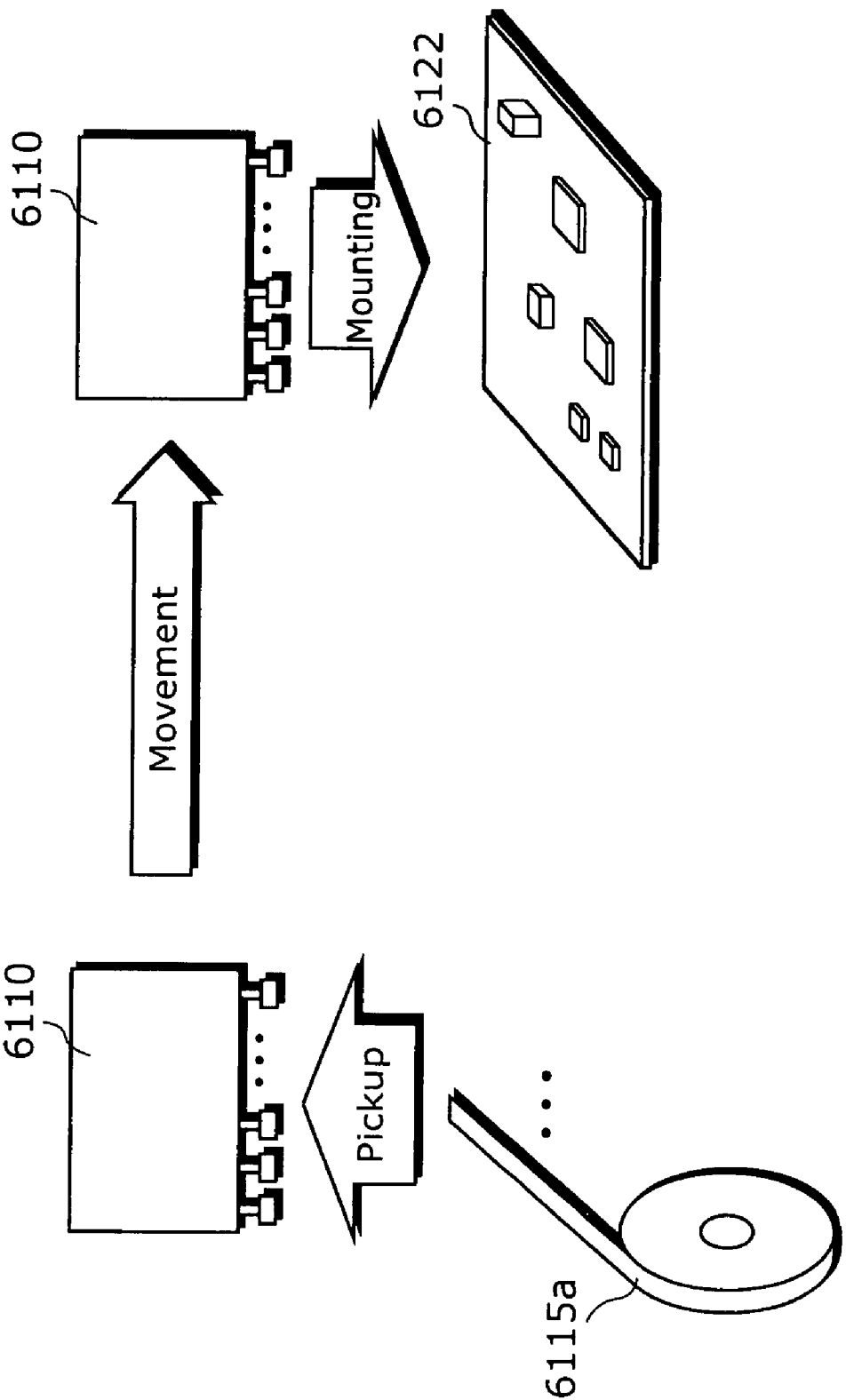
FIG. 99 is a diagram describing a task.

FIG. 98 is a diagram showing an internal structure of the component mounter 6100 shown in FIG. 1. This figure shows: a situation that component cassettes 6115a each accommodating a component tape (taping components) are arranged in line (the direction of arrangement of the component cassettes are referred to as the Z-axis, hereinafter) in the inside of the component housing unit 6115; and a transportation unit 6121 that transports a board 6122. At the time of mounting of the components, the mounting head 6110 picks up ten components simultaneously or sequentially from each of a plurality of component tapes held in the component cassettes 6115a, for example, by the lowering and raising operation of the ten pickup nozzles. Then, the mounting head 6110 is moved by the XY robot 6113 to the position where the board 6122 is placed. Then, the mounting head 6110 mounts the components at ten mounting points on the board 6122 sequentially by arch motion operation or the like. This series of operation is repeated until all components are mounted onto the board 6122. Here, a component group to be mounted in one iteration (one cycle) of a repeated series (cycles) of operations composed of pickup of the components, transportation to the mounting board, and mounting of the components onto the mounting board performed by the mounting head 6110 as shown in FIG. 99 is defined as a task.

Figure 100:
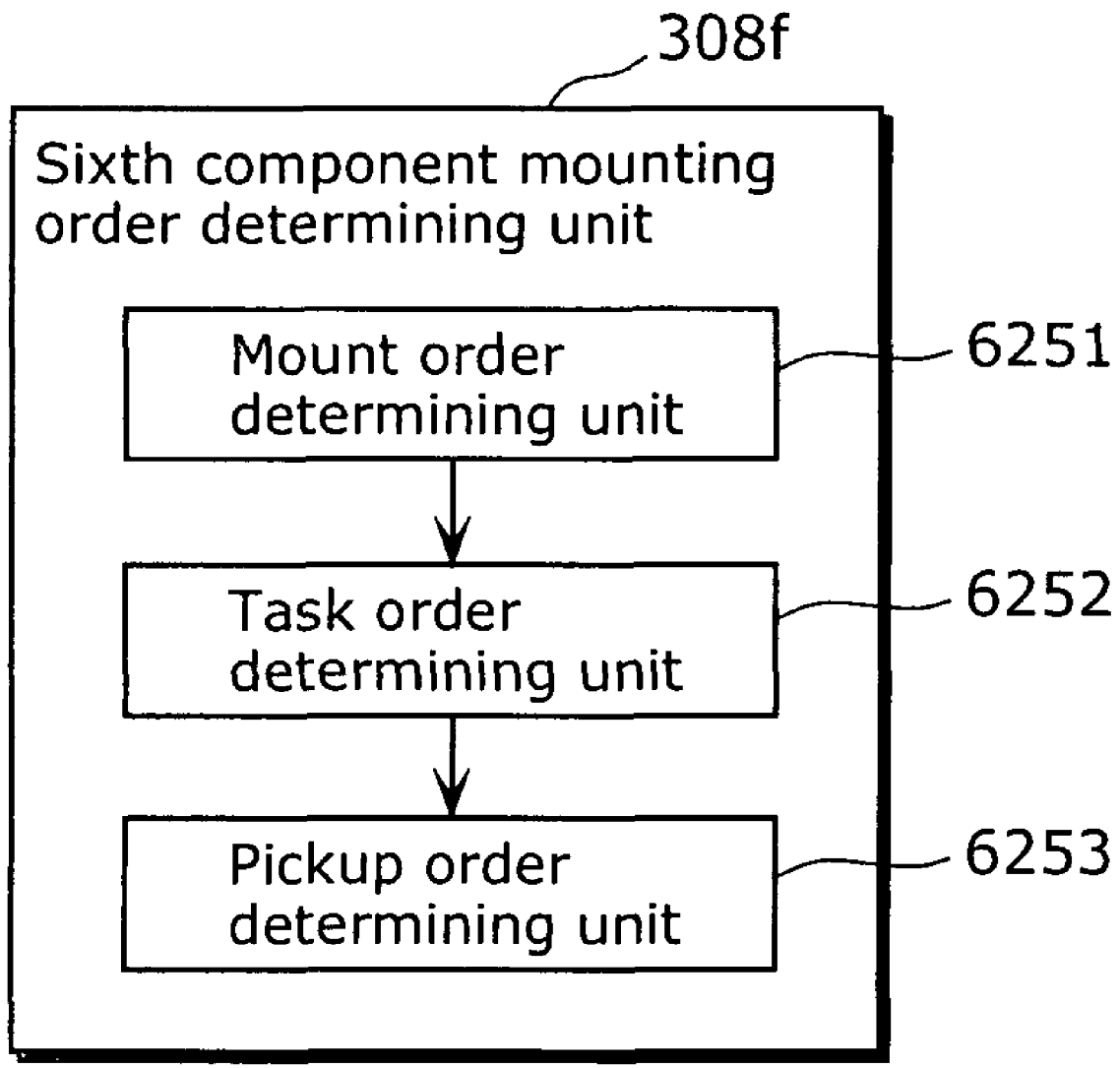
FIG. 100 is a block diagram showing a configuration of a sixth component mounting order determining unit.

As shown in FIG. 100, the sixth component mounting order determining unit 308f is a program, a CPU and the like that, based on the mounting point data 6241, the component data 6242 and the like held in the database unit 307, determines optimal component mounting order in which arch motion operation of the mounting head 6110 is taken into consideration, and that store the determination result as mounting order data 6243 into the database unit 307. The sixth component mounting order determining unit 308f includes a mount order determining unit 6251, a task order determining unit 6252 and a pickup order determining unit 6253.

Figure 101:
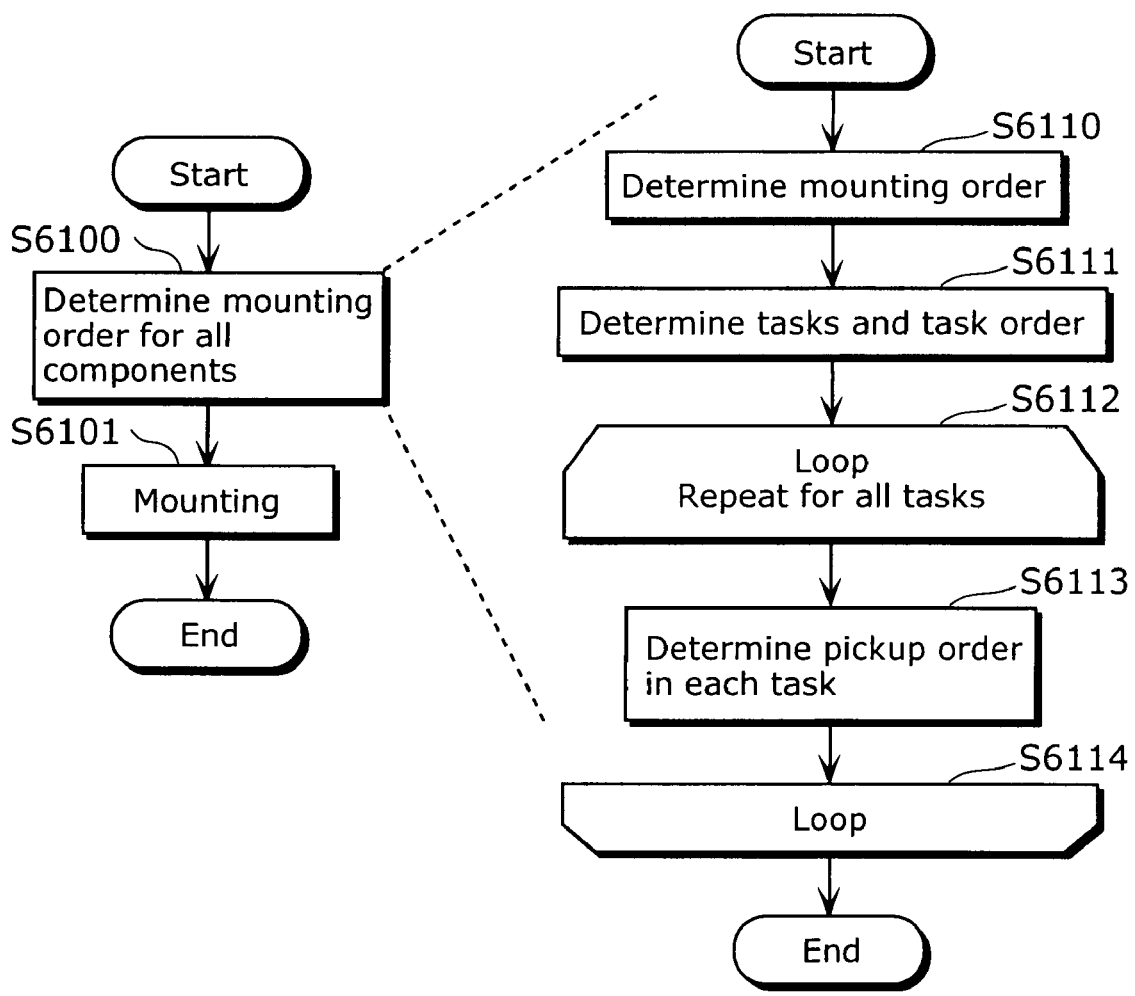
FIG. 101 is a flow chart showing basic operation of a component mounter.

FIG. 101 is a flow chart showing basic operation of the sixth component mounting order determining unit 308f and the component mounter 6100. As shown in the flow chart in the left-hand part of the figure, the sixth component mounting order determining unit 308f determines a mounting order for all components to be mounted (S6100), and then mounts the components in accordance with the determined mounting order (S6101). In the determination of mounting order (S6100), as shown in the flow chart in the right-hand part of the figure, first, the mount order determining unit 6251 determines a mounting order for all components for each component group made up of one or more components corresponding to the mounting points so that interference caused by arch motion operation or the like of the mounting head 6110 is taken into consideration (S6110). After that, the task order determining unit 6252 determines tasks and task order in a state that the mounting order determined by the mount order determining unit 6251 is maintained (S6111). Finally, the pickup order determining unit 6253 determines pickup order for the components within the task for each task determined in the task order determining unit 6252 (S6112 to S6114). As such, mounting order for all components is determined first so that interference caused by arch motion operation or the like is taken into consideration. Then, tasks and pickup order are determined in a state that the mounting order is maintained, and then the result is adopted as the mounting order for the components. This permits fine pitch mounting of the components by using arch motion operation of the mounting head 6110.

Figure 102:
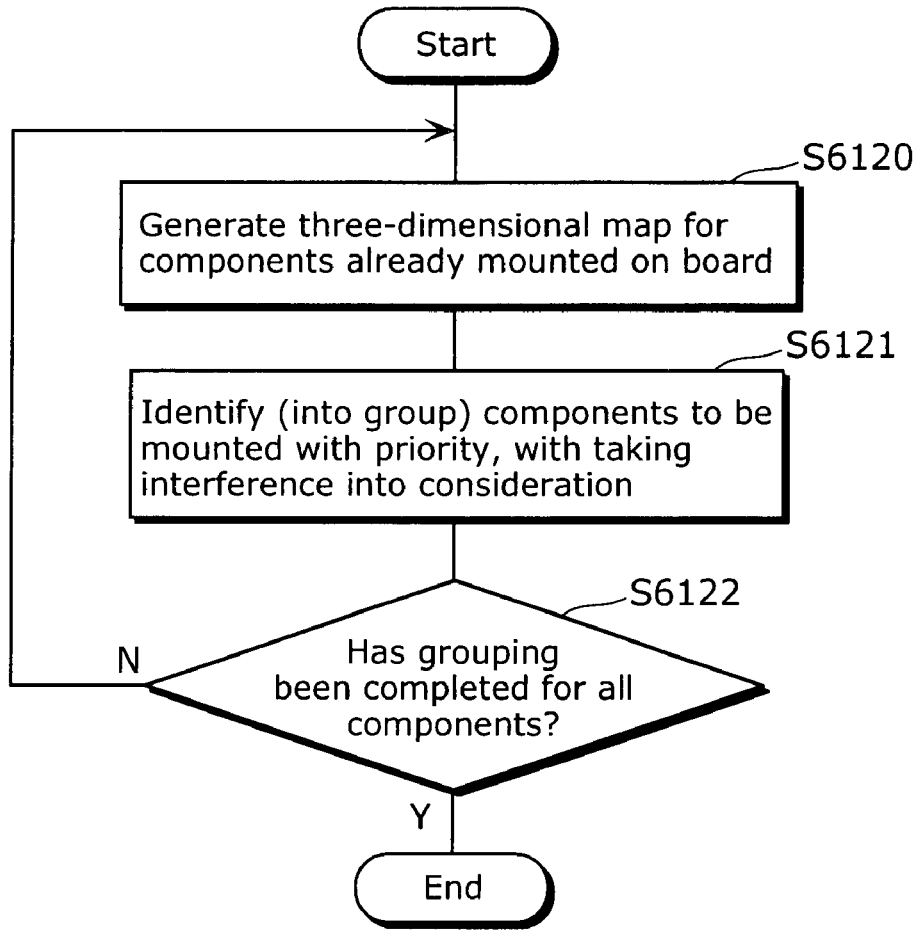
FIG. 102 is a flow chart showing detailed procedure (S6110) of determining mounting order in FIG. 101.

FIG. 102 is a flow chart showing the determination of mounting order in FIG. 101 (S6110), that is, showing a detailed procedure of determining mounting order for all components so that interference between the mounting head 6110 and a component and between the components at the time of mounting of the components is taken into consideration.

Figure 103:
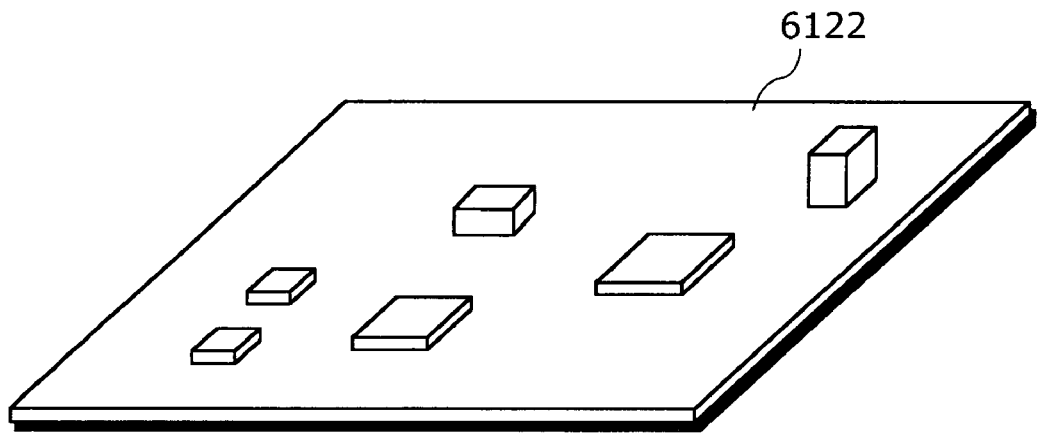
FIG. 103 is a diagram showing an example of a three-dimensional map.

First, the mount order determining unit 6251 generates a three-dimensional map of all components already mounted on the board 6122 at that time (S6120). Here, as shown in FIG. 103, the three-dimensional map is data that expresses three-dimensional space indicating the positions and the types of the components mounted on the board 6122. This map is generated, for example, by acquiring information from a component mounter in the upstream or a host computer via the communication I/F unit 6260.

Then, with reference to the three-dimensional map generated at the above-mentioned step S6120, the component data 6242 and the like, for the board 6122 in the mounting state at that time, the mount order determining unit 6251 identifies all components that do not interfere with other components and do not have a restriction concerning the mounting order (may be mounted in arbitrary order), from the components registered in the mounting point data 6241, and then stores them as the first group (S6121). Specifically, starting at a component having the lowest height, check is sequentially performed that other components (a part of a component is also included) are not present within a space (this space is referred to as the interference area, hereinafter) through which the component and the pickup nozzle pass at the time that the component is mounted onto the board 6122 by arch motion operation. Here, when other components are present in the interference area (at least a part of a component is present), processing is performed that these other components are not included into this first group (included into a later group). More specifically, a hypothetical three-dimensional map is assumed for a component to be mounted onto the board 6122 in the subsequent processing among the not-yet-mounted components. Then, not-yet-mounted components that would interfere with that component on the three-dimensional map at the time of component mounting are not included into the first group. This processing is performed on all not-yet-mounted components, so that components not interfering with any other not-yet-mounted components are acquired and adopted as the first group.

Figure 104:
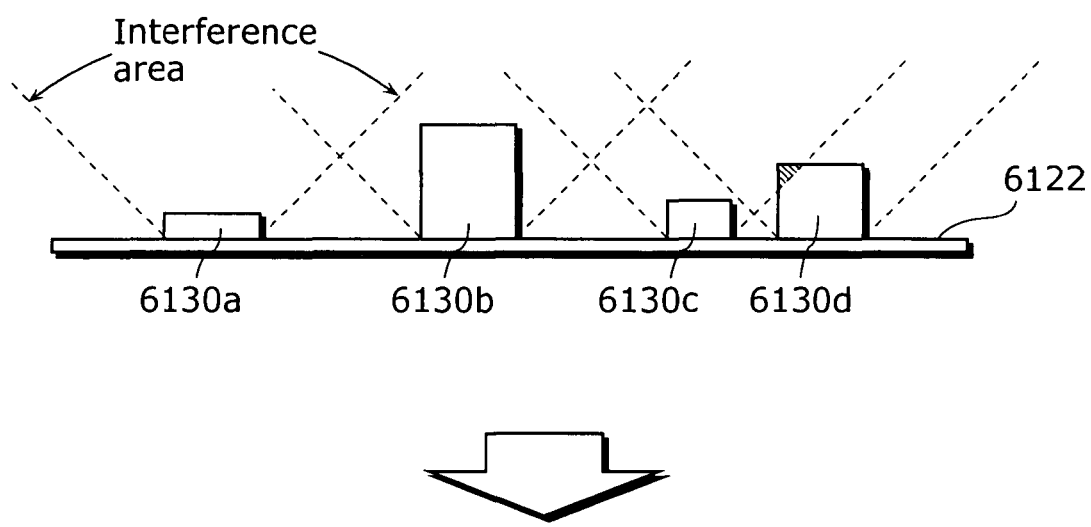
FIG. 104 is a diagram showing an example of an interference area.

For example, as for the case of the interference area shown in FIG. 104 (here, the interference area which is a three-dimensional space is expressed in a two-dimensional manner), when the components 6130a to 6130d to be mounted onto the board 6122 are checked, the component 6130a, the component 6130b, and the component 6130d do not have other components present in the individual interference areas. However, the component 6130d is present in the interference area of the component 6130c (a part of the component d is present). Thus, it is judged that the component 6130d should be removed from that group (included into a later-mounted group), so that only the components 6130a to 6130c are stored as the group. Here, the interference area is an interference space obtained, for example, with assuming that a component is lowered to the mounting point on the board from entire directions (entire directions around the mounting point) at a predetermined angle (for example, from the above obliquely at 45 degrees relative to the board) by arch motion operation. Thus, this space is a space surrounded by a surface rising obliquely upward at the above-mentioned angle from the outline of the component mounted onto the board.

As such, when one group has been determined, the mount order determining unit 6251 then performs similar procedure (S6120 and S6121) again for the remaining components except for the components having been determined as the group, so as to determine the next group. This processing of grouping is performed on all components (S6120 to S6122). That is, like in an encampment game, the three-dimensional map is updated with assuming that the components determined as the group are mounted onto the board (S6120), and then a similar encampment game is performed on the remaining components based on the updated three-dimensional map (S6121). This processing is repeated until no component remains (S6122). The groups generated sequentially are designated by group numbers such as No. 1, 2, . . . .

FIG. 105 is a diagram showing these groups determined by the mount order determining unit 6251. This figure shows that the components corresponding to the mounting points P0003, . . . , P0048 belong to Group 1, the components corresponding to the mounting points P0001, . . . , P0041 belong to Group 2, the components corresponding to the mounting points P0005, . . . , P0044 belong to Group 3, and the components corresponding to the mounting points P0002, . . . , P0031 belong to Group 4. That is, as long as mounting is performed in the order of these group numbers, even when the mounting employs arch motion operation of the mounting head 6110, it is ensured that interference between a components and another component or between a component and the mounting head 6110 does not arise. Further, it is recognized that the components belonging to the same group have no restriction with each other in the mounting order.

Figure 106:
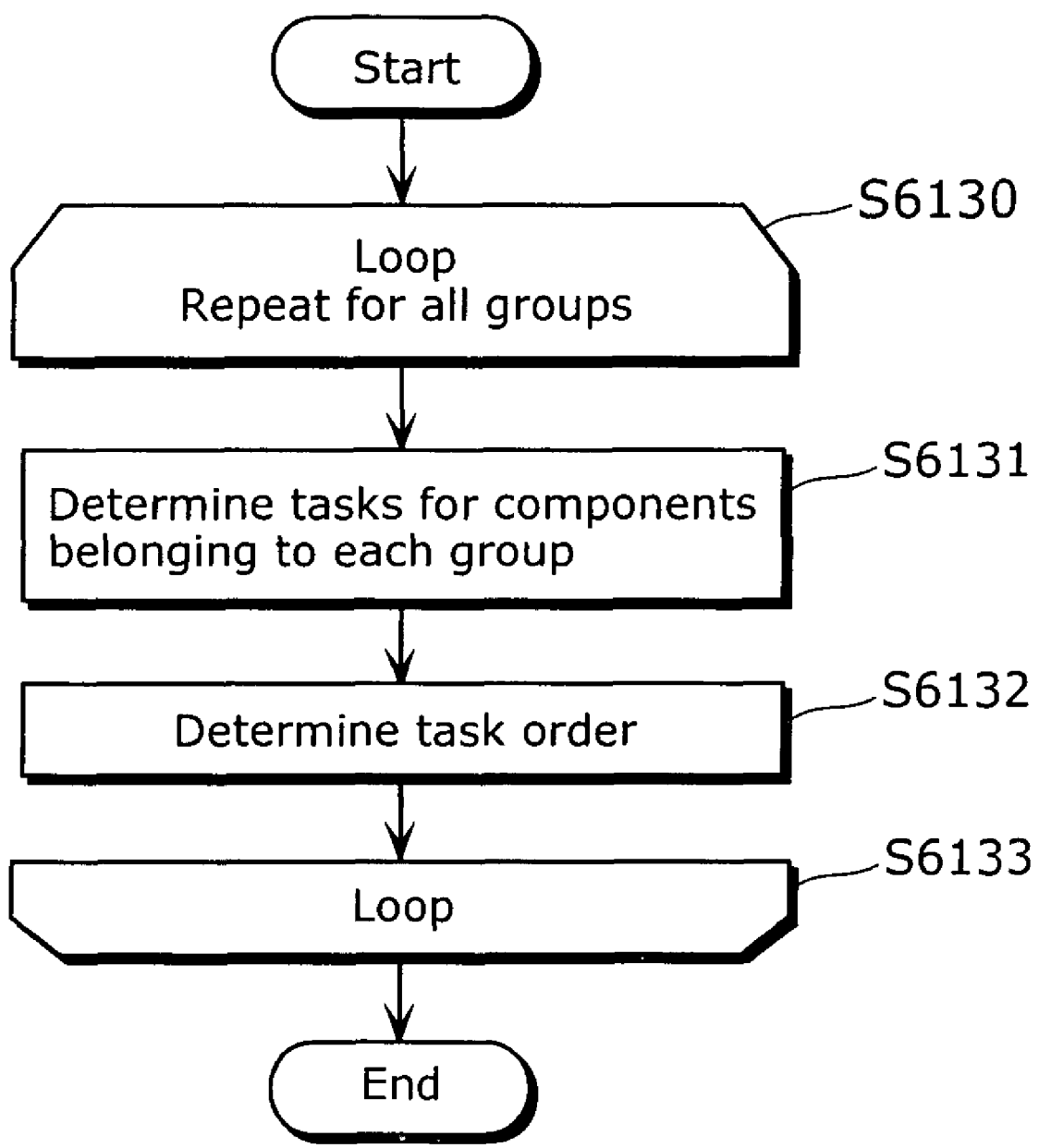
FIG. 106 is a flow chart showing detailed procedure (S6111) of determining tasks and task order in FIG. 101.

FIG. 106 is a flow chart showing the determination (S6111) of tasks and task order in FIG. 101, that is, showing a detailed procedure of determining tasks and task order in a state that the mounting order determined by the mount order determining unit 6251 is maintained. As shown in FIG. 107, for each of all groups determined by the mount order determining unit 6251, the task order determining unit 6252 divides into tasks the components belonging to the group and thereby determines tasks (S6131). Then, for all determined tasks, the task order determining unit 6252 determines a mounting order for these tasks (S6132). This processing is repeated (S6130 to S6133). FIG. 107 shows that, for example, the components corresponding to the mounting points P008, P009, P019 and P023 belong to the first task T001 in the first mounting group, and the component corresponding to the mounting point P015 belong to the second task T002 in the first mounting group.

Here, in a detailed procedure of determination of tasks and task order (S6131, S6132), for example, component tapes (or component cassettes 6115a) are arranged in the component housing unit 6115 starting with components which are greatest in number (the number of components to be mounted), for each of the component groups ("group 1", "group 2") determined by the mount order determining unit 6251 as shown in the component histogram in FIG. 108(a). Then, as shown in FIG. 108(b), for each group, n components (n is the number of pickup nozzles provided in the mounting head 6110; 4 in the example of the figure) arranged from Z1 in the Z-axis direction (rightward) are determined as the first task. Then, as shown in FIG. 108(c), the n components are removed from the component histogram, so that the component histogram is updated. Then, for the updated component histogram, similarly, n components are determined as the next task as shown in FIG. 108(b), so that the component histogram is updated. Similar processing is repeated until no component remains.

Here, when the components of Z1 have run out, the components arranged from Z2 in the Z-axis direction are acquired. When the components of Z2 have run out, the components arranged from Z3 in the Z-axis direction are acquired. As such, when the components are acquired one by one in the Z-axis direction starting with the component located in the leftmost on the Z-axis, each task made up of n components is determined. As such, the task order determining unit 6252 determines tasks and mounting order for the tasks for each group.

Figure 109:
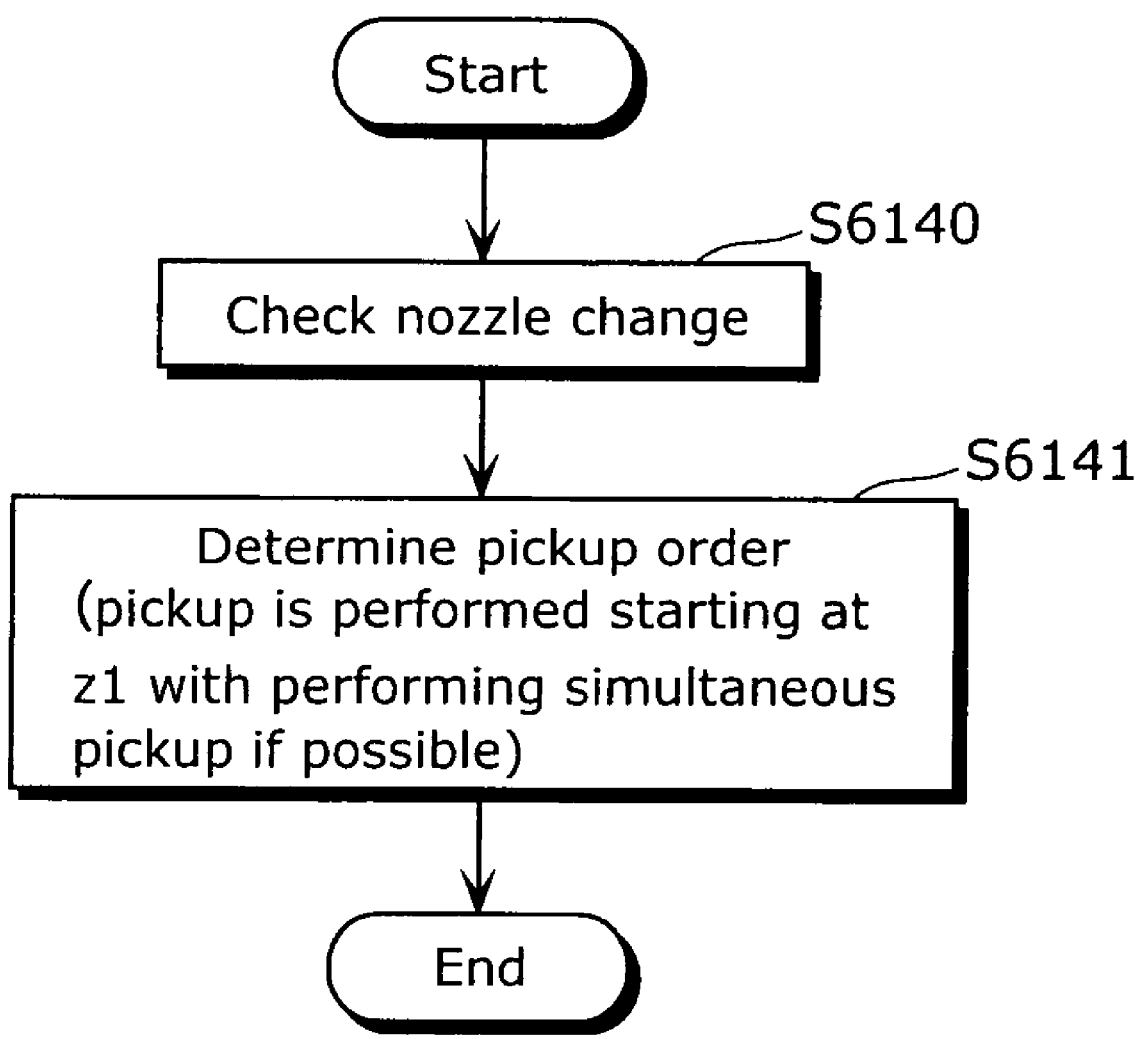
FIG. 109 is a flow chart showing detailed procedure (S6113) of determining pickup order in FIG. 101.

FIG. 109 is a flow chart showing the determination (S6113) of pickup order in FIG. 101, that is, showing a detailed procedure of determining pickup order for the components for each task determined by the task order determining unit 6252.

First, the pickup order determining unit 6253 checks nozzle change (S6140). That is, the types and the number of pickup nozzles used in the mounting in the preceding task are compared with the types and the number of pickup nozzles necessary in the mounting in the next task. Then, when they are different from each other, it is determined that nozzle change need be performed.

Figure 108:
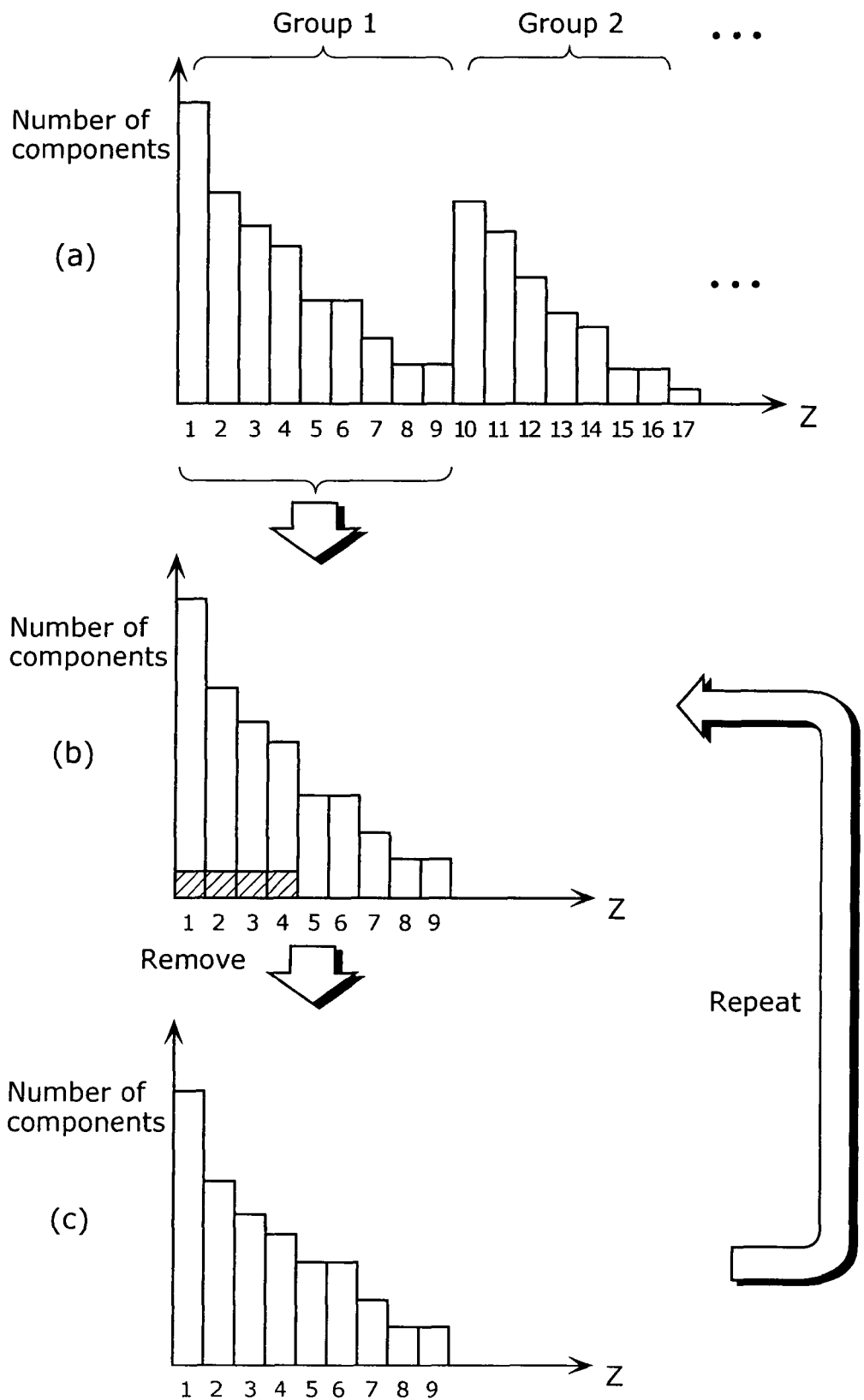
FIG. 108 is a component histogram describing a determination method for tasks and pickup order for components.

Then, similarly to the task determination procedure in the task order determining unit 6252, the pickup order determining unit 6253 determines pickup order for the components for each task (S6141). That is, for the arrangement of the component tapes shown in FIG. 108(*a*), the pickup order determining unit 6253 determines that n components arranged from Z1 on the Z-axis in the Z-axis direction (rightward) should be picked up as shown in FIG. 108(*b*). At that time, components that can be picked up simultaneously are picked up simultaneously. Thus, for example, in the case of a task made up of n components successively arranged in line, it is judged that n components should be picked up in one iteration of the pickup operation (simultaneous pickup).

Then, as shown in FIG. 108(*c*), the pickup order determining unit 6253 removes the task for which the pickup order has been determined, and thereby updates the component histogram. Then, pickup order is determined for the next task by a similar procedure. That is, it is determined that the components should be picked up sequentially rightward starting at Z1 on the Z-axis (or the leftmost of the component tapes in which the components remain) with performing simultaneous pickup if possible.

As such, for all components, the mounting order determining unit 6250 determines mounting order, tasks and task order, and pickup order for each task, and then stores the result as the mounting order data 6243 into the storage unit 6240. After that, in response to an instruction from the operator, the mounting control unit 6210 starts mounting of the components in accordance with the mounting order data 6243 stored in the storage unit 6240.

As such, according to the present embodiment, mounting order for all components is determined first so that interference caused by arch motion operation or the like is taken into consideration. After that, tasks and pickup order are determined in a state that the mounting order is maintained, and then the components are mounted based on the obtained mounting order. This permits fine pitch mounting of the components by using arch motion operation of the mounting head 6110.

The processing of the sixth component mounting order determining unit 308*f* has been described above with reference to an embodiment. However, the present invention is not limited to this embodiment. Various deformations to the present embodiment that can be made by a person skilled in the art without departing from the spirit of the present invention are included within the scope of the present invention.

For example, in the present embodiment, as shown in FIG. 107, the task order determining unit 6252 has determined the tasks and the task order within each group determined by the mount order determining unit 6251. However, in place of this, as shown in FIG. 110, all components arranged in the order of groups determined by the mount order determining unit 6251 may be divided sequentially into groups each made up of n components which is equal to the number of pickup nozzles provided in the mounting head 6110. Then, the components belonging to each generated group may be adopted as a task, so that the sequence of the tasks may be adopted as task mounting order. As a result, task order is determined so that the tasks are arranged sequentially starting at one having the smallest group number. Thus, interference caused by arch motion operation is avoided. Here, in the case where a task made up of the components belonging to two or more groups is generated, when mounting is performed sequentially starting at the components having the smallest group number, interference is avoided.

Figure 111:
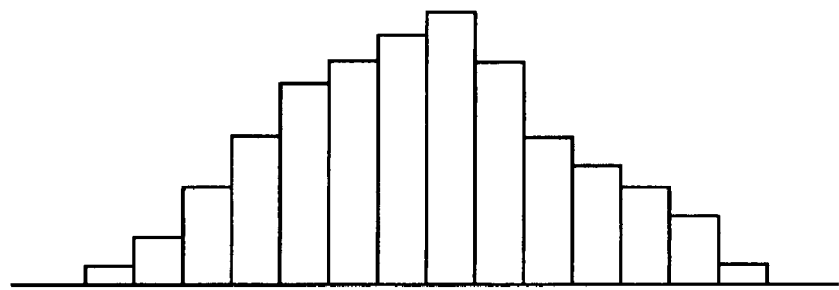
FIG. 111 is a component histogram describing another method of determining tasks and pickup order for components.

Further, in the present embodiment, as shown in FIG. 108(*a*), the task order determining unit 6252 and the pickup order determining unit 6253 have arranged the component tapes on the Z-axis in descending order of the number of components. However, in place of this, as shown in FIG. 111, the component tape may be arranged on the Z-axis so that components having a greater number are located closer to the center (the component histogram should have a bell shape). Then, components may be acquired starting at the components having the greatest number of remaining components to be mounted onto the board at that time, so that tasks, task order and pickup order may be determined.

Further, in the present embodiment, after the tasks and task order have been determined, pickup order for the components has been determined for each task. However, the present invention is not limited to this sequence of procedure. That is, pickup order may be determined with priority. Then, as a result of this, tasks and task order may be determined. Alternatively, the determination of tasks and task order and the determination of pickup order may be mixed and integrated. For example, as described above, in the case where the method is adopted that components are picked up starting at the components having the greatest number of remaining components to be mounted onto the board, when the mounting head picks up the components in accordance with a particular pickup order, tasks are formed as a result of this. Thus, task determination and pickup order determination are mixed and integrated.

Further, in the present embodiment, in the determination of task order and pickup order, as shown in FIG. 108(*a*), arrangement on the Z-axis has been performed for each component group determined by the mount order determining unit 6251. However, in place of this, the arrangement on the Z-axis may be performed for each component obtained by grouping based on the height values of the components (for example, starting at one having the lowest height). This is because the component group order determined by the mount order determining unit 6251 is expected to be, as a result, close to the component group order generated based on the height values of the components.

Figure 112:
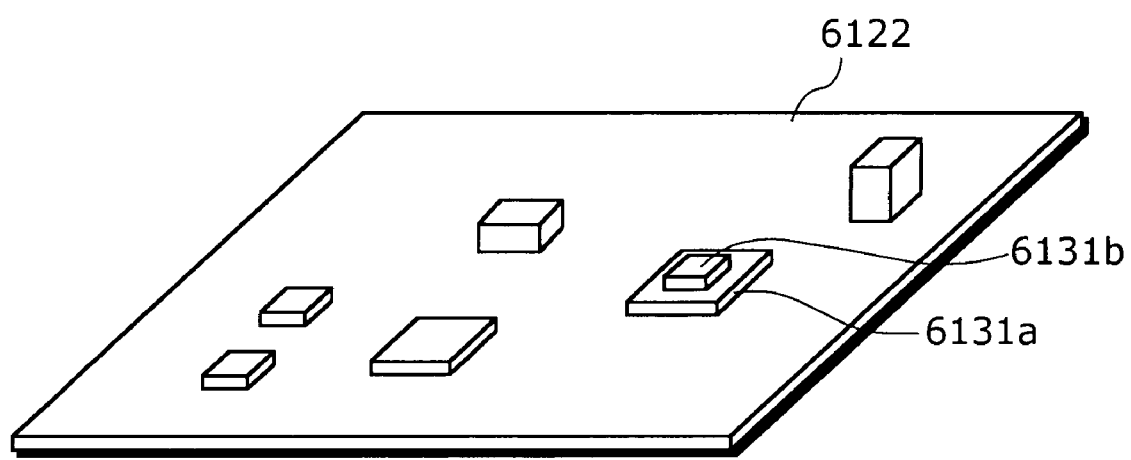
FIG. 112 is a diagram describing three-dimensional mounting.

Further, in the present embodiment, the mount order determining unit 6251 has determined the mounting order for the components in such a manner that interference between a component and another component and between a component and the mounting head 6110 is taken into consideration. However, in place of this or in addition to this, mounting order for the components may be determined in such a manner that a restriction in the mounting order for the components associated with three-dimensional mounting (mounting by stacking of components) as shown in FIG. 112 is taken into consideration. In such three-dimensional mounting, the upper component 6131*b* cannot be mounted until the lower component 6131*a* (or the board) has been mounted. Thus, a restriction in mounting order is present between these components, which can be treated similarly to a restriction in mounting order caused by interference between components in the present embodiment.

Further, in the present embodiment, after the mounting order determining unit 6250 has determined mounting order for all components, the mounting control unit 6210 has started the mounting of the components. However, the present invention is not limited to this sequence of procedure. That is, in parallel to the component mounting, mounting order for the remaining components may be determined dynamically (in real time). For example, after the completion of mounting of the components of a group having the highest priority determined by the mount order determining unit 6251, the mount order determining unit 6251 may determines a group of components to be mounted next among the remaining components other than the already-mounted components. Then, the components of the determined group may be mounted. Then, this cycle may be repeated. More specifically, a hypothetical three-dimensional map is assumed for a component to be mounted onto the board 6122 in the subsequent processing among the not-yet-mounted components. Then, not-yet-mounted components that would interfere with that component on the three-dimensional map at the time of component mounting are not included into the group to be mounted next. This processing is performed on all not-yet-mounted components, so that components not interfering with any other not-yet-mounted components are acquired and adopted as the group of components to be mounted next.

Further, in place of the configuration that the component mounting order determination processing is switched and executed as in the operating time reducing apparatus 300 in FIG. 2, the component mounter 6100 may perform the component mounting order determination processing.

Figure 113:
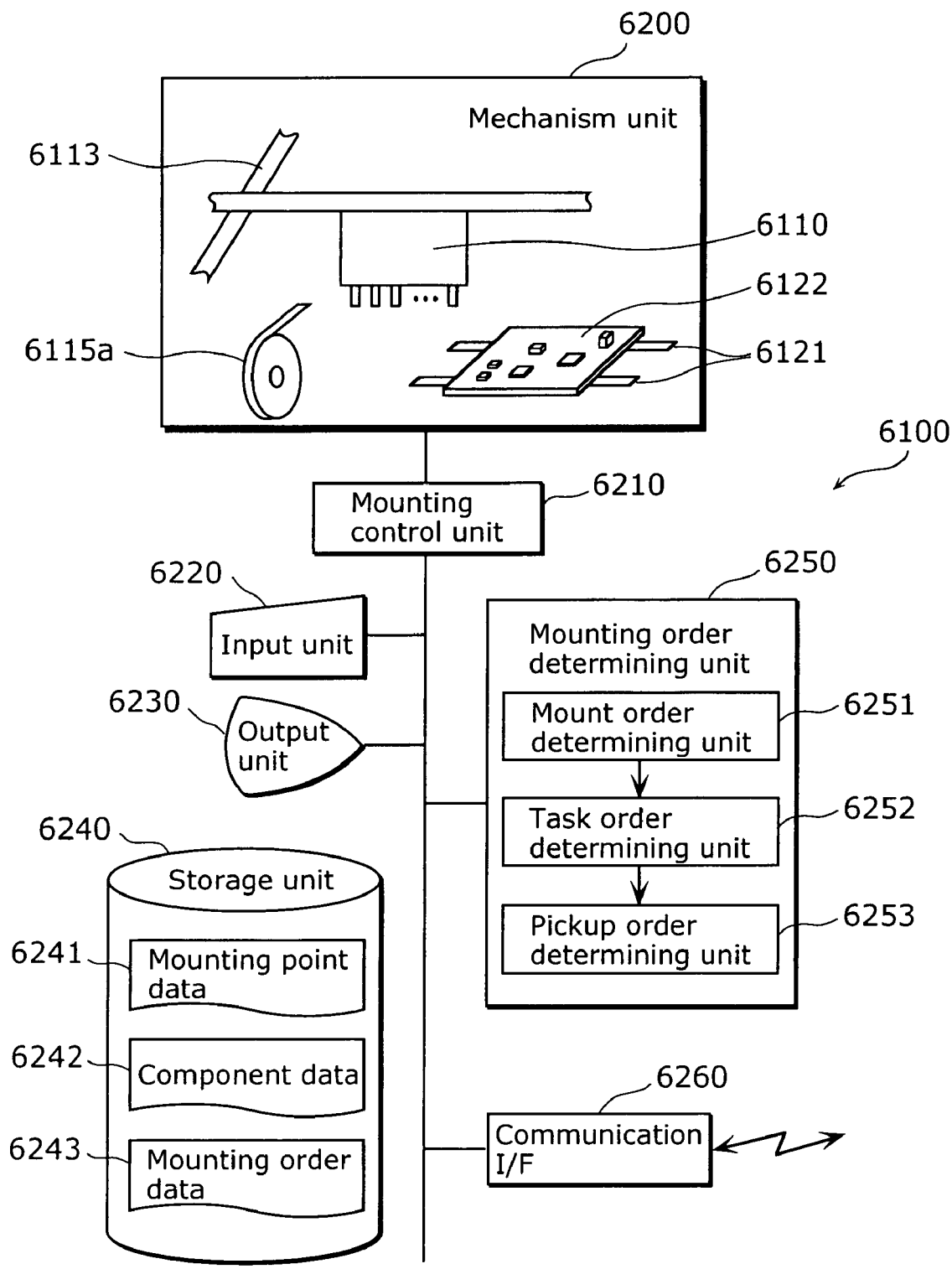
FIG. 113 is a block diagram showing a functional configuration of a component mounter.

FIG. 113 is a block diagram showing a functional configuration of this component mounter 6100. The component mounter 6100 includes, in terms of function, a mechanism unit 6200, a mounting control unit 6210, an input unit 6220, an output unit 6230, a storage unit 6240, a mounting order determining unit 6250, and a communication I/F unit 6260.

The mechanism unit 6200 includes a mounting head 6110, an XY robot 6113, a component cassette 6115*a*, a transportation unit 6121, and mechanical constituent elements including motors and motor drivers for driving these.

Based on the mounting order data 6243 determined by the mounting order determining unit 6250, the mounting control unit 6210 controls the mechanism unit 6200 so as to control the mounting of components.

The input unit 6220 is a keyboard that acquires an instruction from the operator. The output unit 6230 is an LCD that presents various kinds of information to the operator.

Figure 116:
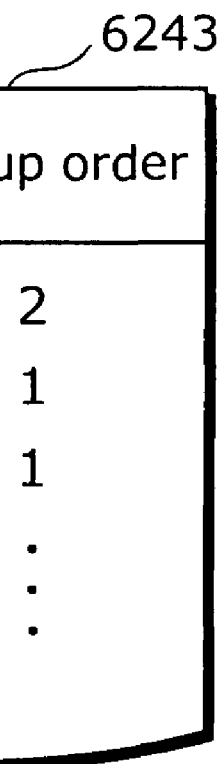
FIG. 116 is a diagram showing an example of mounting order data.

The storage unit 6240 is a hard disk, a memory or the like, and holds the mounting point data 6241, the component data 6242, the mounting order data 6243 and the like. As shown in FIG. 114, the mounting point data 6241 is composed of information that indicates the component name and the mounting position (X, Y, Θ) for all mounting points of the target board. As shown in FIG. 115, the component data 6242 is composed of information that indicates the "component name", the "component external appearance" (shape), the "component size", the "two-dimensional recognition method" (image recognition method with the camera performed after the pickup by the mounting head), the "pickup nozzle" (type of a pickup nozzle to be used), the "tact" (mounting time per component), the "speed XY" (transfer speed at the time of mounting) and the like. As shown in FIG. 116, the mounting order data 6243 is composed of information that indicates the mounting order for all components finally determined by the mounting order determining unit 6250 (information that indicates the "task" and the "pickup order" for each mounting point, in the example in FIG. 116). Here, in FIG. 116, the "task" indicates a task name in the case where mounting is performed in the order of T001, T002, . . . , while the "pickup order" indicates pickup order (iteration number in pickup) in each task.

The mounting order determining unit 6250 is a program, a CPU and the like that, based on the mounting point data 6241, the component data 6242 and the like held in the storage unit 6240, determines optimal component mounting order in which arch motion operation of the mounting head 6110 is taken into consideration, and that store the determination result as mounting order data 6243 into the storage unit 6240. The mounting order determining unit 6250 includes a mount order determining unit 6251, a task order determining unit 6252 and a pickup order determining unit 6253.

The mount order determining unit 6251 is a processing unit that determines the mounting order onto the board based on a restriction condition concerning the before-after relation in the mounting order for the components. That is, the mount order determining unit 6251 determines the mounting order for all components for each component group made up of one or more components corresponding to the mounting points in such a manner that interference caused by arch motion operation or the like of the mounting head 6110 is taken into consideration. The task order determining unit 6252 is a processing unit that determines tasks and mounting order for the tasks (task order) in a state that the mounting order determined by the mount order determining unit 6251 is maintained. The pickup order determining unit 6253 is a processing unit that determines pickup order for the components within the task for each task determined in the task order determining unit 6252.

The communication I/F unit 6260 is an interface card or the like that communicates with other apparatuses, and is used, for example, when the mounting point data and the component data are downloaded from the host computer in the upstream and then stored respectively as the mounting point data 6241 and the component data 6242 into the storage unit 6240.

Figure 117:
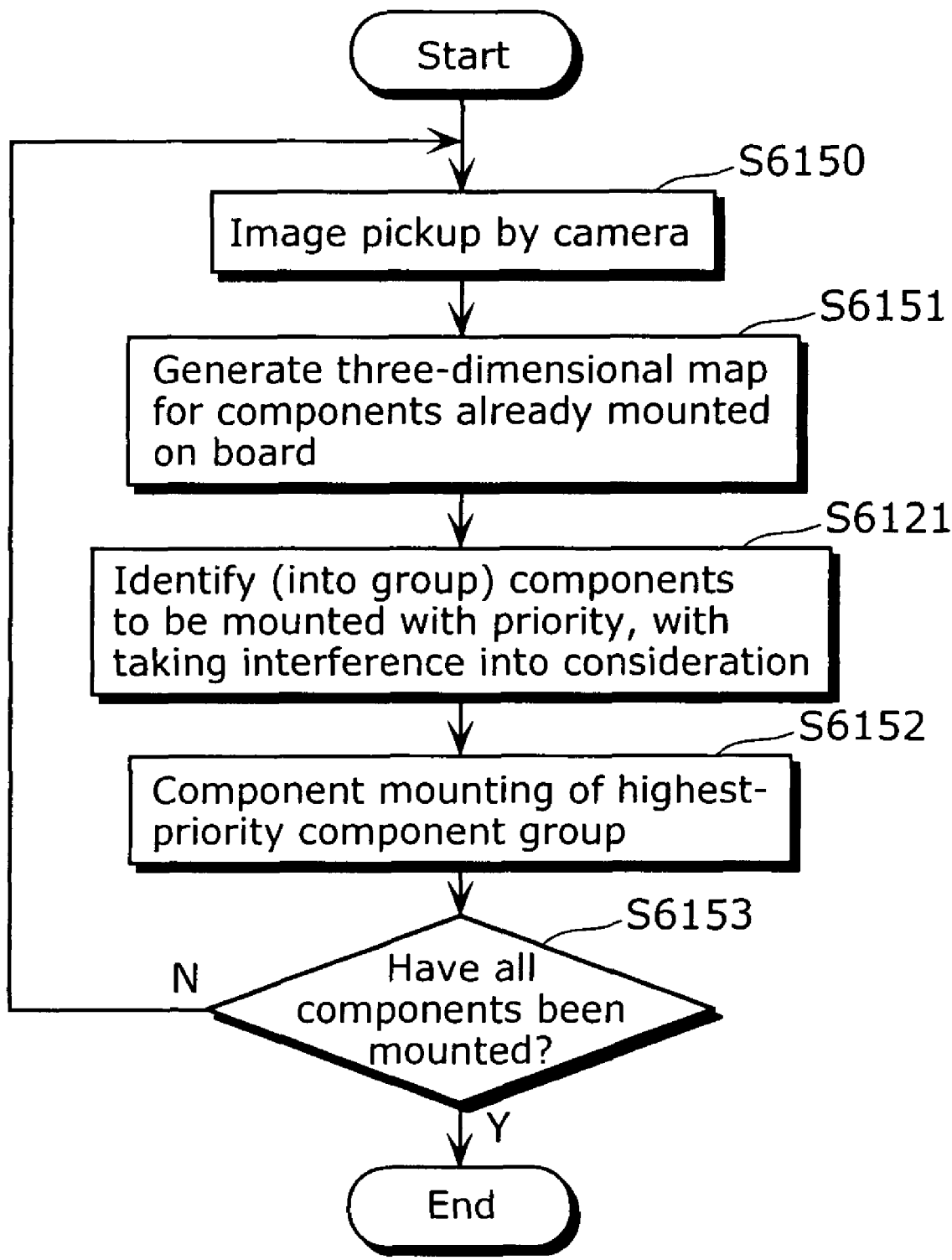
FIG. 117 is a flow chart showing basic operation of a component mounter at the time of dynamically determining mounting order.
Figure 118:
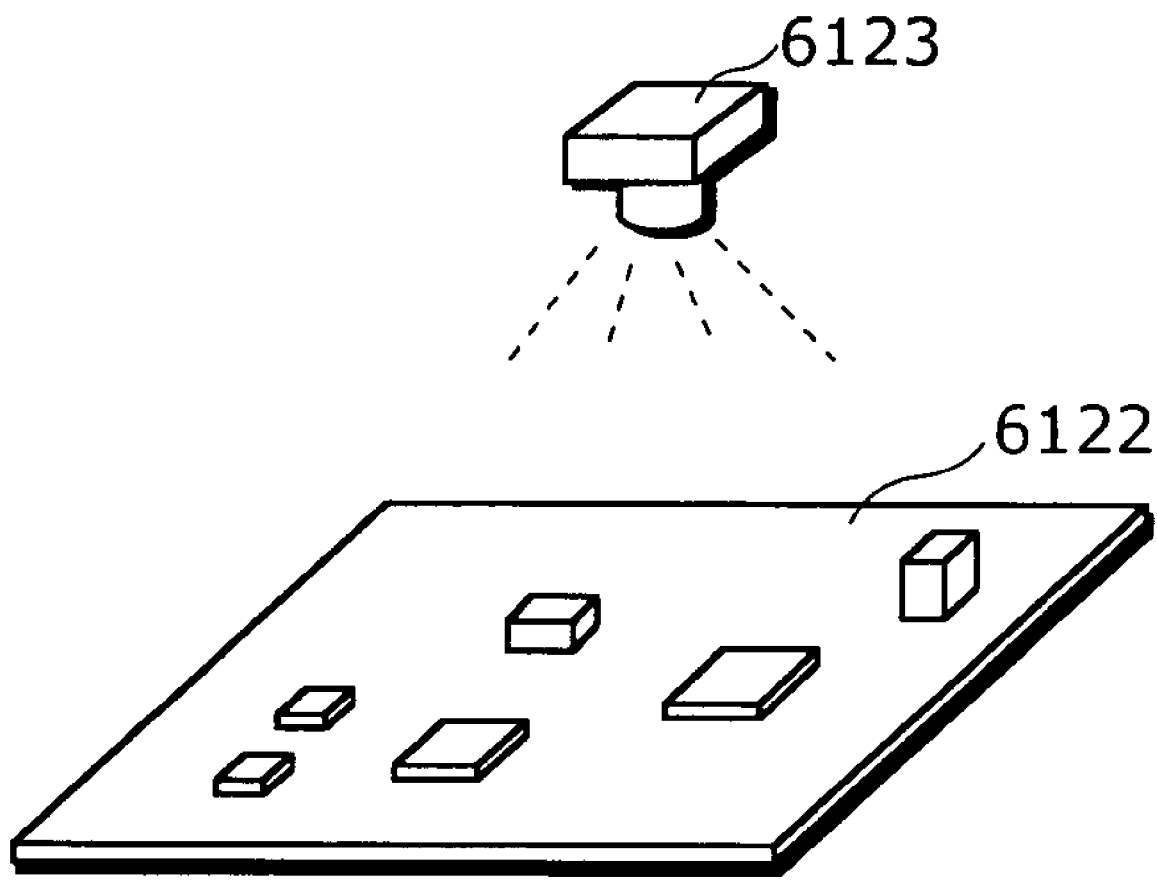
FIG. 118 is a diagram showing a situation that a mounting surface of a board is imaged by a three-dimensional camera.

FIG. 117 is a flow chart showing basic operation of a component mounter 6100 at the time of dynamically determining mounting order. As shown in FIG. 118, the three-dimensional camera 6123 provided in the component mounter 6100 images the mounting surface of the board 6122 (S6150). Then, the mount order determining unit 6251 performs image processing on the image acquired by the three-dimensional camera 6123, and thereby generates a three-dimensional map as shown in FIG. 103 (S6151). Then, with reference to the three-dimensional map generated at the above-mentioned step S6151, the component data 6242 and the like, for the board 6122 in the mounting state at that time, the mount order determining unit 6251 identifies all components that do not interfere with other components and do not have a restriction concerning the mounting order (may be mounted in arbitrary order), from the components registered in the mounting point data 6241, and then stores them as the first group (S6121). Here, the processing of step S6121 is similar to the processing shown in the above-mentioned embodiment. Then, the component mounter 6100 mounts onto the board 6122 the components included in the first group (S6152). When all components have been mounted onto the board 6122 (Y in S6153), the processing is completed. When a not-yet-mounted component remains (N in S6153), the processing subsequent to step S6150 is performed repeatedly.

Further, in the case where mounting order for the components is determined dynamically as described above, the processing of dynamical determination may be, for example, any one of: determination of groups by the mount order determining unit 6251; determination of tasks and task order for each group by the task order determining unit 6252; determination of pickup order for the components within a task by the pickup order determining unit 6253. For example, determination of all groups by the mount order determining unit 6251 may solely be completed in advance, and then the determination processing subsequent to the determination of tasks may be performed dynamically for the remaining components. By virtue of this, for example, in the case where pickup order for the components is determined dynamically for the to-be-mounted components remaining at that time in such a manner that the arrangement of the component tapes at the time is taken into consideration, even when the situation has varied (for example, run-out of-components) during the component mounting, mounting order can be determined in accordance with the situation, so that the component mounting can be continued.

As described above, the component mounting system according to an embodiment of the present invention has been described. However, the present invention is not limited to this embodiment.

For example, in the above-mentioned embodiment, the operation loss identifying unit 305a and the processing procedure selecting unit 305b of the operating time reducing apparatus 300 have selected a program from the optimization program storing unit 308. However, the user may select a program from the optimization program storing unit 308.

Figure 119:
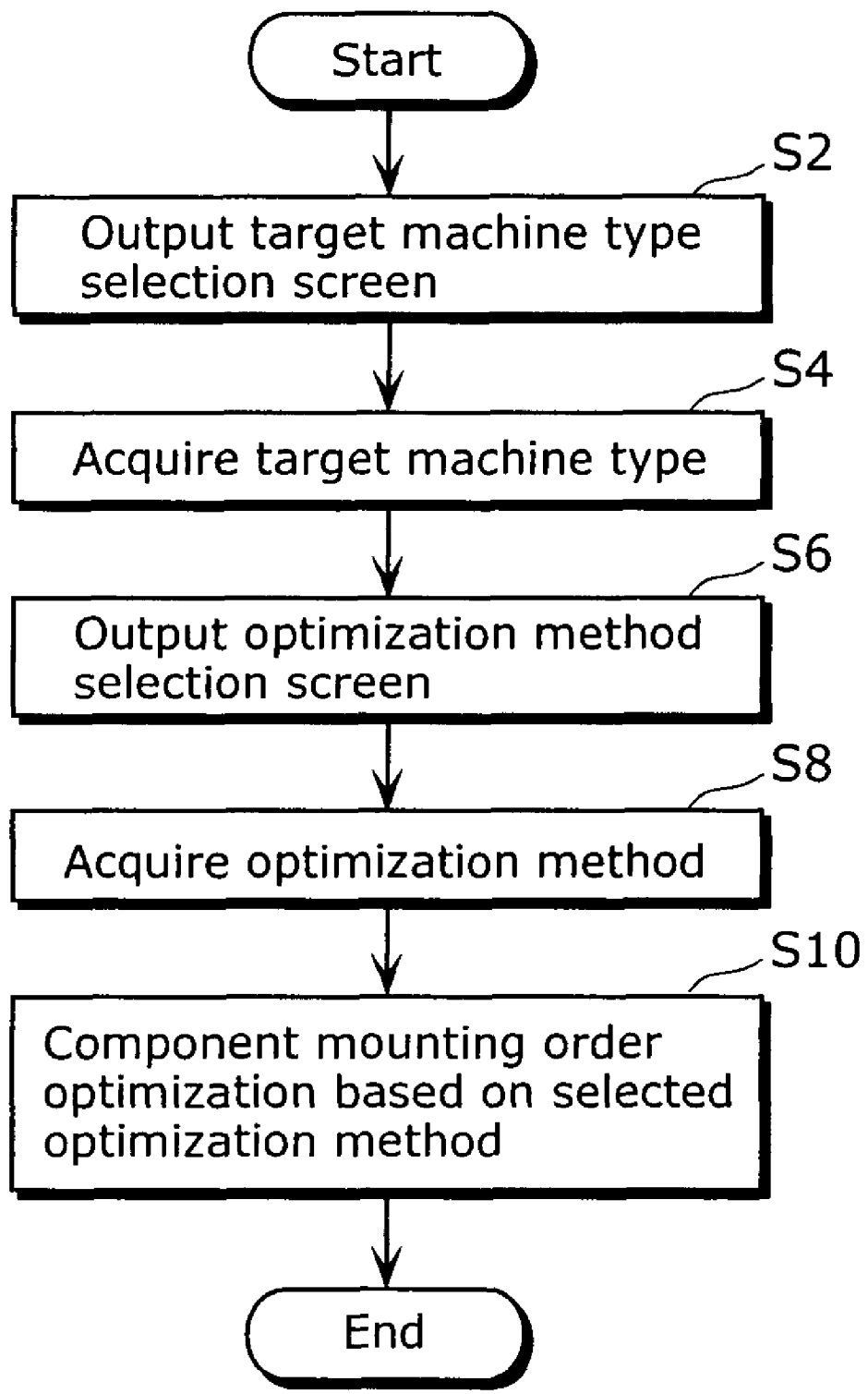
FIG. 119 is a flow chart of processing executed by an operating time reducing apparatus at the time that a user selects a program from an optimization program storing unit.

FIG. 119 is a flow chart of processing executed by an operating time reducing apparatus 300 at the time that a user selects a program from an optimization program storing unit 308.

Figure 120:
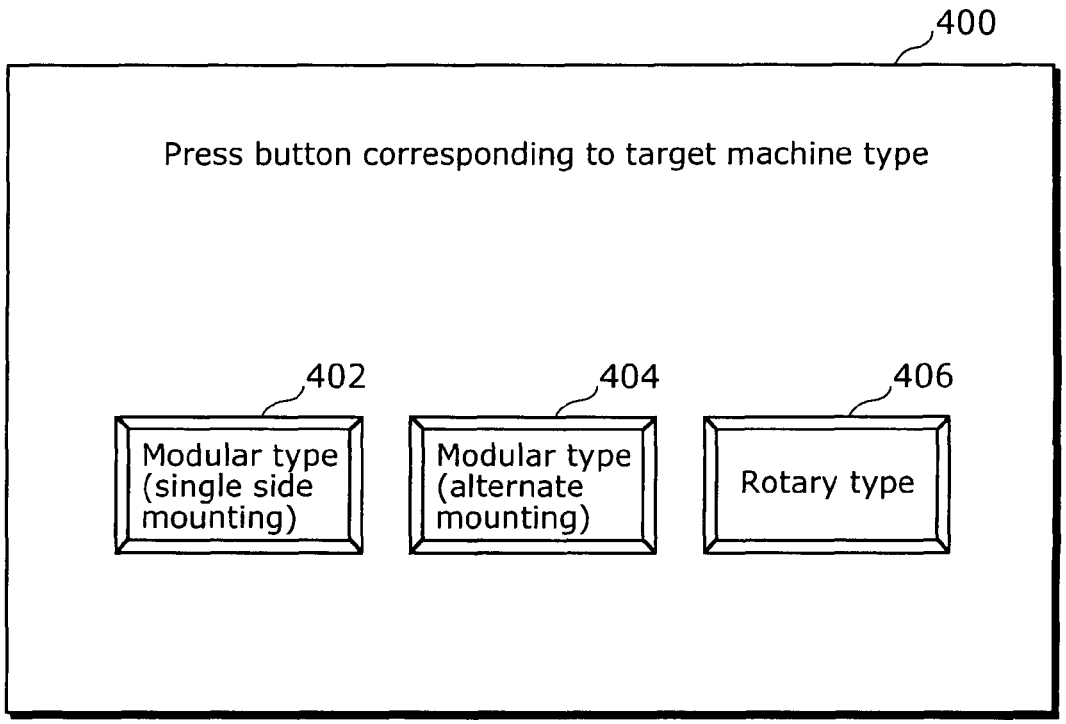

The arithmetic control unit 301 outputs to the display unit 302 a screen that allows the operator to select the type of a target component mounter (S2). For example, a screen 400 as shown in FIG. 120 is outputted to the display unit 302. Here, component mounters are classified into: a modular type (single side mounting) provided with only one mounting head; a modular type (alternate mounting) provided with a plurality of mounting heads; and a rotary type. Then, buttons 402 to 406 corresponding to these component mounters are displayed.

Figure 121:
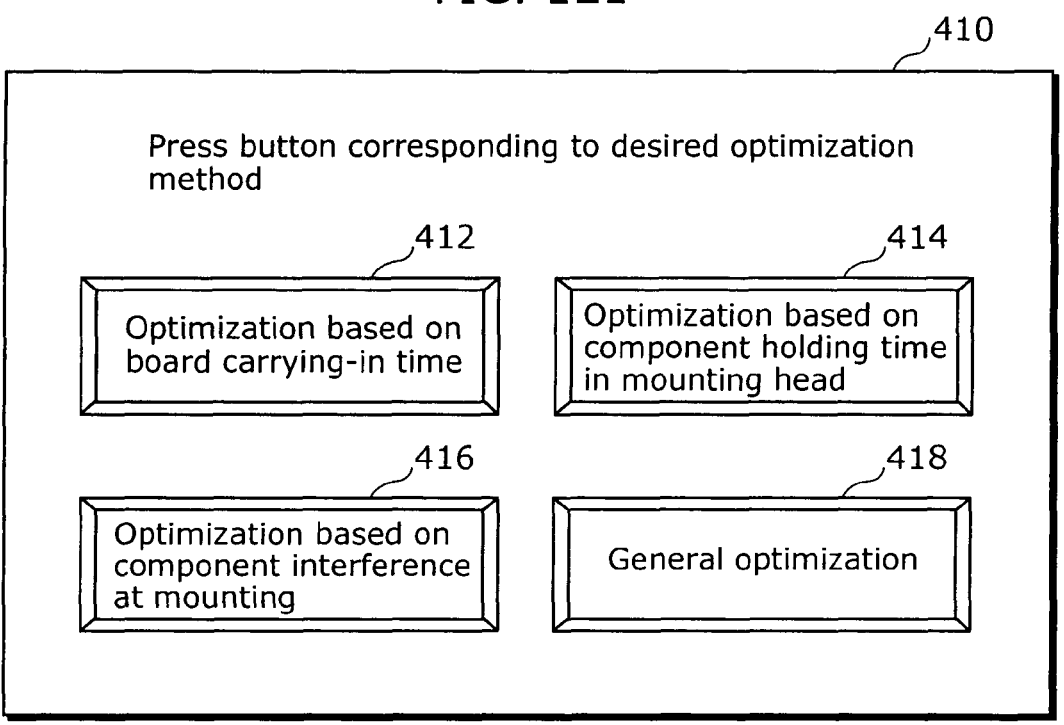
Figure 122:
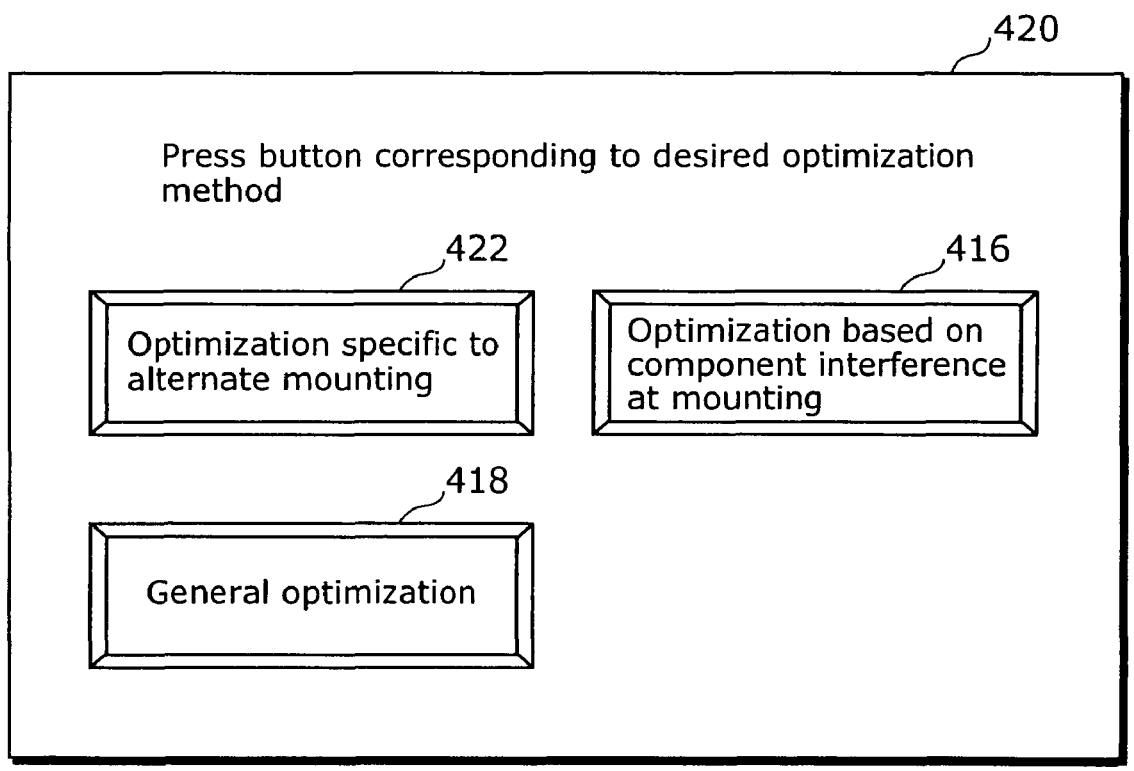

When the operator operates the input unit 303 and presses any one of the buttons 402 to 406 (S4), the arithmetic control unit 301 outputs to the display unit 302 a selection screen for optimization methods applicable to the corresponding component mounter (S6). FIGS. 121 and 122 are diagrams each showing an example of a screen displayed on the display unit 302.

FIG. 121 shows a screen 410 in the case where the button 402 corresponding to a component mounter of modular type (single side mounting) is pressed, where buttons 412 to 418 are displayed that correspond to four optimization methods applicable to the modular type (single side mounting). The buttons 412, 414, 416 and 418 correspond respectively to a program for implementing the fourth component mounting order determining unit 308d, a program for implementing the fifth component mounting order determining unit 308e, a program for implementing the sixth component mounting order determining unit 308f, and a program for implementing the second component mounting order determining unit 308b.

FIG. 122 shows a screen 420 in the case where the button 404 corresponding to a component mounter of modular type (alternate mounting) is pressed, where buttons 422, 416 and 418 are displayed that correspond to three optimization methods applicable to the modular type (alternate mounting). The buttons 422, 416 and 418 correspond to programs for implementing the third component mounting order determining unit 308c, the sixth component mounting order determining unit 308f, and the second component mounting order determining unit 308b, respectively.

When the operator operates the input unit 303 and presses any one of the buttons 412 to 418 and 422 displayed on the screen 410 or the screen 420, the processing procedure selecting unit 305b reads from the optimization program storing unit 308 the program for implementing the component mounting order determining unit corresponding to the pressed button, and then loads it to the memory unit 304 (S8). When the arithmetic control unit 301 executes the program loaded to the memory unit 304, any one of the component mounting order determining units optimizes the component mounting order (S10).

For example, when the operator presses the button 412 displayed on the screen 410 shown in FIG. 121, the processing procedure selecting unit 305b loads the program for implementing the fourth component mounting order determining unit 308d, from the optimization program storing unit 308 to the memory unit 304 (S8). Then, when the arithmetic control unit 301 executes the program, the fourth component mounting order determining unit 308d optimizes the component mounting order (S10).

Here, a program applicable to a component mounter of rotary type is solely the program for implementing the first component mounting order determining unit 308a. Thus, when the button 406 corresponding to a component mounter of rotary type is pressed on the screen 400 shown in FIG. 120, a screen for selecting the optimization method as shown in FIG. 121 or 122 is not displayed. Then, the processing procedure selecting unit 305b loads the program for implementing the first component mounting order determining unit 308a, from the optimization program storing unit 308 to the memory unit 304. Then, the arithmetic control unit 301 executes the program. Then, the first component mounting order determining unit 308a optimizes the component mounting order.

INDUSTRIAL APPLICABILITY

The present invention is applicable to a determination method for component mounting order in a component mounter and, in particular, to a determination method for component mounting order and the like in a situation that plural types of component mounters are incorporated in a mixed manner.

The invention claimed is:

1. An operating time reducing method for a component mounter, the method comprising:
an operation loss identifying step of identifying an operation loss to be resolved in the component mounter;
a processing procedure selecting step of selecting, based on the identified operation loss, a processing procedure for reducing an operating time of the component mounter; and
a processing procedure executing step of executing the selected processing procedure, wherein the component mounter is provided with a rotary head which, while rotating about an axis, picks up components and mounts the components onto a board, wherein the selected processing procedure is a component mounting order determination method for the component mounter, wherein a board mark provided on the board for board positioning or a point included in component mounting points where a first component is mounted is defined as a start point, wherein for an arbitrary two points among a plurality of component mounting points and the start point, a distance between the two points or a time duration necessary from completion of mounting of a component on one of the two points until completion of mounting of a component on the other of the two points is defined as a cost for the two as points, wherein a point set up hypothetically as a last movement point is defined as a dummy point, wherein the component mounting order determination method includes:
  a component mounting point information acquiring step of acquiring position information concerning the plurality of component mounting points, the costs for two points among the plurality of component mounting points, the start point, and the dummy point;
  a traveling path calculating step of calculating a traveling path that passes individual points so as to minimize a sum of the costs for two points among the start point, the dummy point and the plurality of component mounting points on the board; and
  a mounting order determining step of determining the component mounting order based of the traveling path, and wherein the dummy point is a hypothetical point where a cost relative to each component mounting point is greater than a cost for every two points among the plurality of component mounting points and the start point, and where a cost relative to the start point is smaller than a cost for every two points among the plurality of component mounting points and the start point.

2. An operating time reducing method for a component mounter, the method comprising:
  an operation loss identifying step of identifying an operation loss to be resolved in the component mounter;
  a processing procedure selecting step of selecting, based on the identified operation loss, a processing procedure for reducing an operating time of the component mounter; and
  a processing procedure executing step of executing the selected processing procedure, wherein the component mounter is provided with a rotary head which, while rotating about an axis, picks up components and mounts the components onto a board, wherein the selected processing procedure is a component mounting order determination method for the component mounter, wherein a board mark provided on the board for board positioning or a point included in component mounting points where a first component is mounted is defined as a start point, wherein for an arbitrary two points among a plurality of component mounting points and the start point, a distance between the two points or a time duration necessary from completion of mounting of a component on one of the two points until completion of mounting of a component on the other of the two points is defined as a cost for the two points, wherein a point set up hypothetically as a last movement point is defined as a dummy point, wherein the component mounting order determination method includes:
  a component mounting point information acquiring step of acquiring position information concerning: the plurality of component mounting points; the costs for two points among the plurality of component mounting points; the start point; and the dummy point;
  a traveling path calculating step of calculating a traveling path that passes individual points so as to minimize a sum of the costs for two points among the start point, the dummy point and the plurality of component mounting points on the board; and
  a mounting order determining step of determining the component mounting order based of the traveling path, wherein the component mounter further includes a table on which the board is placed and which moves so that a component mounting point on the board conforms with a component mounting position of the rotary head, and wherein a cost from a particular component mounting point to another component mounting point is defined based on at least one of a time duration necessary when the table moves between the component mounting points, a time duration necessary when the rotary head performs intermittent rotation operation, and a time duration necessary when the component supply unit supplies a component to the rotary head.

3. An operating time reducing method for a component mounter, the method comprising:
  an operation loss identifying step of identifying an operation loss to be resolved in the component mounter;
  a processing procedure selecting step of selecting, based on the identified operation loss, a processing procedure for reducing an operating time of the component mounter; and
  a processing procedure executing step of executing the selected processing procedure, wherein the component mounter is provided with a rotary head which, while rotating about an axis, picks up components and mounts the components onto a board, wherein the selected processing procedure is a component mounting order determination method for the component mounter, wherein a board mark provided on the board for board positioning or a point included in component mounting points where a first component is mounted is defined as a start point, wherein for an arbitrary two points among a plurality of component mounting points and the start point, a distance between the two points or a time duration necessary from completion of mounting of a component on one of the two points until completion of mounting of a component on the other of the two points is defined as a cost for the two points, wherein a point set up hypothetically as a last movement point is defined as a dummy point, wherein the component mounting order determination method includes:
  a component mounting point information acquiring step of acquiring position information concerning the plurality of component mounting points, the costs for two points among the plurality of component mounting points, the start point, and the dummy point;

a traveling path calculating step of calculating a traveling path that passes individual points so as to minimize a sum of the costs for two points among the start point, the dummy point and the plurality of component mounting points on the board; and a mounting order determining step of determining the component mounting order based of the traveling path, wherein said processing procedure further includes a cost calculating step of calculating a cost for an arbitrary two points among the start point, the dummy point, and the plurality of component mounting points on the board, and wherein, in said traveling path calculating step, a traveling path that passes individual points so as to minimize a sum of the costs for two points among the start, the dummy point, and the plurality of component mounting points point on the board is calculated in accordance with a traveling salesman problem by using the costs calculated in said cost calculating step.

4. An operating time reducing method for a component mounter, the method comprising:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a rotary head which, while rotating about an axis, picks up components and mounts the components onto a board, wherein the selected processing procedure is a component mounting order determination method for the component mounter, wherein a board mark provided on the board for board positioning or a point included in component mounting points where a first component is mounted is defined as a start point, wherein for an arbitrary two points among a plurality of component mounting points and the start point, a distance between the two points or a time duration necessary from completion of mounting of a component on one of the two points until completion of mounting of a component on the other of the two points is defined as a cost for the two points, wherein a point set up hypothetically as a last movement point is defined as a dummy point, wherein the component mounting order determination method includes:

a component mounting point information acquiring step of acquiring position information concerning the plurality of component mounting points, the costs for two points among the plurality of component mounting points, the start point, and the dummy point;

a traveling path calculating step of calculating a traveling path that passes individual points so as to minimize a sum of the costs for two points among the start point, the dummy point and the plurality of component mounting points on the board; and a mounting order determining step of determining the component mounting order based of the traveling path, and wherein the dummy point is located at the same position as the start point.

5. An operating time reducing method for a component mounter, the method comprising:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a mounting head, for holding and transporting a plurality of components, that mounts the plurality of components onto a board;

wherein the selected processing procedure is a component mounting order determination method of determining a mounting order in a case where components are mounted onto the board by the component mounter, wherein, for an arbitrary two points among a plurality of component mounting points and a dummy point, which is a point set up hypothetically, a distance between the two points or a time duration necessary from completion of mounting of a component to one point of the two points until completion of mounting of a component to the other point is defined as a cost for the two points, wherein the dummy point is defined as a point set up as a start point and an end point of component mounting, and wherein the component mounting order determination method includes:

a component mounting point information acquiring step of acquiring position information concerning the plurality of component mounting points and costs for two points among the plurality of component mounting points and the dummy point;

a traveling path calculating step of calculating a traveling path in which the dummy point serves as a starting point and an end point, and which passes individual points so as to minimize a sum of costs for two points among the plurality of component mounting points and the dummy point; and a mounting order determining step of determining the component mounting order based on the traveling path.

6. The operating time reducing method according to claim 5, wherein the dummy point is defined as a location of a component supply unit which supplies the component to the mounting head.

7. The operating time reducing method according to claim 6, wherein the dummy point is defined as a location of a center of a plurality of component supply openings in the component supply unit.

8. The operating time reducing method according to claim 5, wherein said component mounting point information acquiring step includes:

an acquiring position information step of acquiring position information concerning the plurality of component mounting points;

a generating corrected position information step of generating corrected position information by correcting the position information concerning the plurality of component mounting points based on a pickup position of the component in the mounting head; and a deriving step of deriving, based on the corrected position information, the cost for two points among the plurality of component mounting points and the dummy point.

9. An operating time reducing method for a component mounter, the method comprising:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a plurality of mounting heads, each for holding and transporting a plurality of components, that alternatively mount components onto one board, wherein the selected processing procedure is a component mounting order determination method of determining a mounting order in a case where the plurality of mounting heads alternately mount the components onto the one board, wherein each mounting head is a head that picks up and transports a plurality of components so as to mount the plurality of components onto the board, wherein a component group that is mounted in one iteration of a repeated series of operations composed of pickup, transportation and mounting of the components performed by each mounting head is defined as a task, and wherein the component mounting order determination method includes:

an assignment step of assigning components to be mounted onto the board to any one of the plurality of mounting heads so that the number of tasks assigned to each of the plurality of mounting heads becomes uniform; and a task generating step of generating each task for the components assigned to each head o that a time duration from completion of component mounting in the task of a mounting head until start of component mounting in the task of a next mounting head is minimized.

10. The operating time reducing method according to claim 9, wherein, in said task generating step, for each of the plurality of mounting heads, tasks are generated by dividing the assigned component group into tasks so that pickup and recognition of the components can be completed by the time mounting of components by other mounting heads is completed.

11. The operating time reducing method according to claim 10, wherein said task generating step includes:

a calculating step of calculating, for each of the plurality of mounting heads, a maximum number of component pickup iterations in which pickup and recognition of the components can be completed within a mounting time for mounting components performed by the other mounting heads, by comparing a pickup time and a recognition time with the mounting time which is a time duration from completion of recognition of components until completion of mounting performed by the other mounting heads, the pickup time being a time duration from completion of mounting of components until completion of pickup, the recognition time being a time duration from completion of pickup of the components until completion of recognition; and a generating step of generating tasks for each of the plurality of mounting heads, by dividing the assigned component group into tasks so that the number of component pickup iterations is smaller than or equal to the maximum number of pickup iterations.

12. The operating time reducing method according to claim 9, wherein said component mounting order determination method further includes a number-of-nozzles acquiring step of acquiring the number of pickup nozzles that are provided in each mounting head for picking up the components, wherein, in said assignment step, a component to be mounted onto the board is assigned to one of the plurality of mounting heads, based on the acquired number of pickup nozzles, and wherein, in said task generating step, the component group assigned to each mounting head is divided into tasks, and a mounting order for the divided tasks is determined.

13. The operating time reducing method according to claim 12, wherein the mounting head includes a plurality of pickup nozzles arranged along a rotating circumference, and wherein, in said task generating step, the component group assigned to each mounting head is divided into tasks so that, in a same task order, the number of components included in each task assigned to each of the plurality of mounting heads is equal, and an order for the divided tasks is determined.

14. An operating time reducing method for a component mounter, the method comprising:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a plurality of mounting heads, each for holding and transporting a plurality of components, that alternatively mount components onto one board, wherein the selected processing procedure is a method of generating tasks for each mounting head when the plurality of the mounting heads alternately mount the components onto the one board, wherein each of the mounting heads is a head that picks up and transports a plurality of components so as to mount the plurality of components onto the board, and wherein the task generating method includes a task generating step of generating, in a case where a component group to be mounted in one iteration of a repeated series of operation composed of pickup, transportation and mounting of the components performed by the mounting head is defined as a task, each task for the components assigned to each head so that a time duration from completion of component mounting in the task of a mounting head until start of component mounting in the task of a next mounting head is minimized.

15. An operating time reducing method for a component mounter, the method comprising:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a mounting head, for holding and transporting a plurality of components, that mounts the plurality of components onto a board, wherein the selected processing procedure is selected in said processing procedure selecting step when a board carrying-in time, which is a time duration after the components have been mounted onto the board until a next board is carried in to a board stop position in the component mounter, greater than a predetermined threshold is identified in said operation loss identifying step, wherein the selected processing procedure is a method of reducing an operating time in a case where the components are mounted onto the board by the component mounter, wherein the method of reducing an operating time includes:

a board carrying-in time calculating step of calculating the board carrying-in time which is the time duration after the components have been mounted onto the board until the next board is carried in to the board stop position in the component mounter; and a timing determining step of determining, in a case where one iteration of a repeated series of operations composed of pickup and mounting of the components performed by the mounting head is defined as a task, timing of pickup of components in a first task so that pickup of the components in the first task, for a board carried in, is started within the board carrying-in time.

16. The operating time reducing method according to claim 15, wherein the component mounting order determination method further includes a task order determining step of determining task order so that a task having the greatest component pickup time is adopted as the first task and pickup of a component in the first task is started within the board carrying-in time.

17. The operating time reducing method according to claim 16, wherein said task order determining step includes:

a comparison step of comparing a greatest component pickup time among all tasks with the board carrying-in time; and a first determination step of determining a task order so that when the greatest component pickup time is smaller than the board carrying-in time, a task having the greatest component pickup time is adopted as the first task and pickup of the component in the first task is started within the board carrying-in time.

18. The operating time reducing method according to claim 17, wherein said task order determining step further includes a second determination step of determining, when the greatest component pickup time is greater than or equal to the board carrying-in time, a task order so that an arbitrary task having a component pickup time greater than or equal to the board carrying-in time is adopted as the first task and pickup of the component in the first task is started within the board carrying-in time.

19. An operating time reducing method for a component mounter, the method comprising:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein, the component mounter is provided with a mounting head, the mounting head including a holding unit for holding and transporting a plurality of components, that mounts the plurality of components onto a board, wherein a component group to be mounted in one iteration of a repeated series of operations composed of pickup, transportation and mounting of the components performed by the mounting head is defined as a task, wherein the processing procedure is selected in said processing selecting step when an operation loss caused by a presence of a task in which the components have mutually different component transportation speed limits for the mounting head or by a presence of a task in which the components have mutually different component transportation acceleration limits for the mounting head is identified in said operation loss identifying step, wherein the selected processing procedure is a component mounting method of mounting the plurality of components onto the board by using the holding unit, and wherein the component mounting method includes:

a speed identifying step of identifying a transportation speed limit for the holding unit corresponding to each of the plurality of components;

a determination step of determining, based on the transportation speed limits, a handling order for the plurality of components in the holding unit so that a time duration that a component having a lower transportation speed limit, among the plurality of components, is held by the holding unit is reduced; and a mounting step of mounting the plurality of components onto the board by handling the plurality of components with the holding unit in accordance with the handling order determined in said determination step, and moving the holding unit at a speed not exceeding the lowest transportation speed limit of the components held by the holding unit.

20. The operating time reducing method according to claim 19, wherein, in said determination step, a holding order for the plurality of components in the holding unit is determined as the handling order so that the components are held sequentially starting from a component having the highest transportation speed limit identified in said speed identifying step, and wherein, in said mounting step, the holding unit holds the plurality of components in accordance with the handling order, and the held plurality of components is mounted onto the board.

21. The operating time reducing method according to claim 19, wherein, in said determination step, a mounting order for the plurality of components in the holding unit is determined as the handling order so that the components are mounted sequentially starting from a component having the lowest transportation speed limit identified in said speed identifying step, and wherein, in said mounting step, the holding unit holds the plurality of components, and the held plurality of components are mounted onto the board in accordance with the mounting order.

22. The operating time reducing method according to claim 19,
wherein, in said speed specifying step, a transportation speed limit for each component is specified by referring to speed information that indicates transportation speed limits for the plurality of components.

23. The operating time reducing method according to claim 19,
wherein, in said speed specifying step, a transportation speed limit for each component is specified by referring to size information that indicates sizes of the plurality of components, so that the transportation speed of the holding unit is restricted to be lower for a component having a larger size.

24. The operating time reducing method according to claim 19,
wherein, in said speed specifying step, a transportation speed limit for each component is specified by referring to weight information that indicates weights of the plurality of components, so that the transportation speed of the holding unit is restricted to be lower for a component having greater weight.

25. The operating time reducing method according to claim 19,
wherein, in said speed specifying step, a transportation speed limit for each component is specified by referring to thickness information that indicates thicknesses of the plurality of components, so that the transportation speed of the holding unit is restricted to be lower for a component having greater thickness.

26. An operating time reducing method for a component mounter, the method comprising:
an operation loss identifying step of identifying an operation loss to be resolved in the component mounter;
a processing procedure selecting step of selecting, based on the identified operation loss, a processing procedure for reducing an operating time of the component mounter; and
a processing procedure executing step of executing the selected processing procedure,
wherein, the component mounter is provided with a mounting head, the mounting head including a holding unit for holding and transporting a plurality of components, that mounts the plurality of components onto a board,
wherein a component group to be mounted in one iteration of a repeated series of operations composed of pickup, transportation and mounting of the components performed by the mounting head is defined as a task,
wherein the processing procedure is selected in said processing procedure selecting step when an operation loss caused by a presence of a task in which the components have mutually different component transportation speed limits for the mounting head or by a presence of a task in which the components have mutually different component transportation acceleration limits for the mounting head is identified in said operation loss identifying step,
wherein the selected processing procedure is a component mounting method of mounting the plurality of components onto the board by using the holding unit, and
wherein the component mounting method includes:
an acceleration identifying step of identifying a transportation acceleration limit for the holding unit corresponding to each of the plurality of components;
a determination step of determining a handling order for the plurality of components in the holding unit based on the transportation acceleration limits so that a time duration that a component having a lower transportation acceleration limit, among the plurality of components, is held by the holding unit is reduced; and
a mounting step of mounting the plurality of components onto the board by handling the plurality of components with the holding unit in accordance with the handling order determined in said determination step, and moving the holding unit with an acceleration not exceeding the lowest transportation acceleration limit of the components held by the holding unit.

27. An operating time reducing method for a component mounter, the method comprising:
an operation loss identifying step of identifying an operation loss to be resolved in the component mounter;
a processing procedure selecting step of selecting, based on the identified operation loss, a processing procedure for reducing an operating time of the component mounter; and
a processing procedure executing step of executing the selected processing procedure,
wherein the component mounter is provided with a mounting head that mounts a component to a board,
wherein the processing procedure is selected in said processing procedure step when an operation loss caused by an interference, which is a collision between the components or between a component and the mounting head that can occur when the component mounter provided with the mounting head mounts a component on the board, is identified in said operation loss identifying step,
wherein the selected processing procedure is a component mounting order determination method of determining mounting order in a case where the components are mounted onto the board by the component mounter, and
wherein the component mounting order determination method includes:
a mounting order determining step of determining a mounting order onto the board based on a restriction condition concerning a before-after relation in the mounting order for the components; and
a task order determining step of dividing all components into tasks in a state where the mounting order determined in said mounting order determining step is maintained, and determining a mounting order for the divided tasks, in a case where a component group to be mounted in one iteration of a repeated series of operations composed of pickup, transportation and mounting of the components performed by the mounting head is defined as a task.

28. The operating time reducing method according to claim 27,
wherein, in said mounting order determining step, the mounting order is determined so that interference does not occur, the interference being a collision between components or between a component and the mounting head that can occur when the components are mounted onto the board.

29. The operating time reducing method according to claim 28,
wherein, in said mounting order determining step, the mounting order is determined so that interference caused by an arch motion operation of the mounting head does not occur.

30. The operating time reducing method according to claim 29,
wherein, in said mounting order determining step, it is judged, for each component, whether another component or a part of another component mounted on the board is present within a range of a moving space of the mounting head in the case where the mounting head mounts the component onto the board by an arch motion operation, and when it is judged as being present, the mounting order is determined so that the component being judged is mounted before the another component.

31. The operating time reducing method according to claim 30,
wherein, in said mounting order determining step, a sequence of component groups is generated as the mounting order by repeating a process in which, based on the judgment result, a group of components to be mounted first is specified as a first component group, and a group of components to be mounted next among the components excluding the first component group is specified as a second component group.

32. The operating time reducing method according to claim 31,
wherein, in said mounting order determining step, a three-dimensional map that shows three-dimensional positions and shapes of the components to be mounted on the board is generated, and a group of components to be mounted first is specified as a first component group, in the generated three-dimensional map, based on the judgment result.

33. An operating time reducing apparatus for a component mounter, said operating time reducing apparatus comprising:
an operation loss identifying unit operable to identify an operation loss to be resolved in the component mounter;
a processing procedure selecting unit operable to select a processing procedure for reducing an operating time of the component mounter, based on the identified operation loss; and
a processing procedure executing unit operable to execute the selected processing procedure,
wherein the component mounter is provided with a rotary head which, while rotating about an axis, picks up components and mounts the components onto a board,
wherein the selected processing procedure is a processing procedure performed by an apparatus which determines a mounting order for the components in the component mounter,
wherein a board mark provided on the board for board positioning or a point included in component mounting points where a first component is mounted is defined as a start point,
wherein for an arbitrary two points among a plurality of component mounting points and the start point, a distance between the two points or a time duration necessary from completion of mounting of a component to one point of the two points until completion of mounting of a component to the other point is defined as a cost for the two points,
wherein a point set up hypothetically as a last movement point is defined as a dummy point, and
wherein the mounting order determining apparatus includes:
a component mounting point information acquiring unit which acquires position information concerning the plurality of component mounting points and the costs for two points among the plurality of component mounting points, the start point, and the dummy point;
a traveling path calculating unit which calculates according to a traveling salesman problem a traveling path that passes individual points so as to minimize a sum of the costs for two points among the start point on the board, the dummy point, and the plurality of component mounting points; and
a mounting order determining unit which determines a mounting order for the component based on of the traveling path.

34. An operating time reducing apparatus for a component mounter, said operating time reducing apparatus comprising:
an operation loss identifying unit operable to identify an operation loss to be resolved in the component mounter;
a processing procedure selecting unit operable to select a processing procedure for reducing an operating time of the component mounter, based on the identified operation loss; and
a processing procedure executing unit operable to execute the selected processing procedure,
wherein the component mounter is provided with a mounting head, for holding and transporting a plurality of components, that mounts the plurality of components onto a board,
wherein the selected processing procedure is a processing procedure executed by a component mounting order determining apparatus operable to determine a mounting order in a case where the components are mounted onto the board by the component mounter,
wherein for an arbitrary two points among a plurality of component mounting points and a dummy point, which is a point set up hypothetically, a distance between the two points or a time duration necessary from completion of mounting of a component to one point of the two points until completion of mounting of a component to the other point is defined as a cost for the two points,
wherein the dummy point is defined as a point set up as a start point and an end point of component mounting, and
wherein the component mounting order determining apparatus includes:
a component mounting point information acquiring unit which acquires position information concerning the plurality of component mounting points and the costs for two points among the plurality of component mounting points and the dummy point;
a traveling path calculating unit which calculates a traveling path in which the dummy point serves as a starting point and an end point, and which passes individual points so as to minimize a sum of the costs for two points among the plurality of component mounting points and the dummy point; and
a mounting order determining unit which determines a mounting order for the component based on the traveling path.

35. An operating time reducing apparatus for a component mounter, said operating time reducing apparatus comprising:
an operation loss identifying unit operable to identify an operation loss to be resolved in the component mounter;
a processing procedure selecting unit operable to select a processing procedure for reducing an operating time of the component mounter, based on the identified operation loss; and
a processing procedure executing unit operable to execute the selected processing procedure, wherein the component mounter is provided with a plurality of mounting heads, each for holding and transporting a plurality of components, that alternatively mount the components onto one board, wherein the selected processing procedure is a processing procedure executed by a component mounting order determining apparatus which determines a mounting order in a case where the plurality of mounting heads alternately mount the components onto the one board, wherein each mounting head is a head that picks up and transports a plurality of components so as to mount the plurality of components onto the board, wherein a component group to be mounted in one iteration of a repeated series of operations composed of pickup, transportation and mounting of the components performed by each mounting head is defined as a task, and wherein the component mounting order determining apparatus includes:

an assignment unit which assigns components to be mounted onto the board to any one of the plurality of mounting heads so that a number of tasks assigned to each of the plurality of mounting heads becomes uniform; and a task generating unit which generates each task for the components assigned to each head so that a time duration from completion of component mounting in the task of a particular mounting head until start of component mounting in the task of the next mounting head is minimized.

36. An operating time reducing apparatus for a component mounter, said operating time reducing apparatus comprising:

an operation loss identifying unit operable to identify an operation loss to be resolved in the component mounter;

a processing procedure selecting unit operable to select a processing procedure for reducing an operating time of the component mounter, based on the identified operation loss; and a processing procedure executing unit operable to execute the selected processing procedure, wherein the component mounter is provided with a mounting head, for holding and transporting a plurality of components, that mounts the plurality of components onto a board, wherein the selected processing procedure is selected by said processing procedure selecting unit when a board carrying-in time which is a time duration after the components have been mounted onto the board until the next board is carried in to a board stop position in the component mounter, greater than a predetermined threshold is identified by said operation loss identifying unit, wherein the selected processing procedure is a processing procedure executed by an apparatus which reduces an operating time in a case where components are mounted onto the board by the component mounter, wherein the apparatus which reduces an operating time includes:

a board carrying-in time calculating unit which calculates a board carrying-in time which is a time duration after the components have been mounted onto the board until the next board is carried in to a board stop position in the component mounter; and a timing determining unit which, when one iteration of a repeated series of operations composed of pickup and mounting of the components performed by the mounting head is defined as a task, determines timing of pickup of components in a first task so that pickup of the components in the first task for a board carried in is started within the board carrying-in time.

37. An operating time reducing apparatus for a component mounter, said operating time reducing apparatus comprising:

an operation loss identifying unit operable to identify an operation loss to be resolved in the component mounter;

a processing procedure selecting unit operable to select a processing procedure for reducing an operating time of the component mounter, based on the identified operation loss; and a processing procedure executing unit operable to execute the selected processing procedure, wherein the component mounter is provided with a mounting head, the mounting head including a holding unit for holding and transporting a plurality of components, that mounts the plurality of components onto a board, wherein a component group to be mounted in one iteration of a repeated series of operations composed of pickup, transportation and mounting of the components performed by the mounting head is defined as a task, wherein the processing procedure is selected by said processing procedure selecting unit when an operation loss caused by a presence of a task in which the components have mutually different component transportation speed limits for the mounting head or by a presence of a task in which the components have mutually different component transportation acceleration limits for the mounting head is identified by said operation loss identifying unit, wherein the selected processing procedure is a processing procedure executed by an order determining apparatus operable to determine a handling order for the plurality of components in the holding unit, and wherein the order determining apparatus includes:

a speed identifying unit which identifies a transportation speed limit for the holding unit corresponding to each of the plurality of components; and a determination unit which determines handling order for the plurality of components performed by the holding unit based on the transportation speed limits in so that a time duration that a component having a lower transportation speed limit among the plurality of components is held by the holding unit is reduced.

38. An operating time reducing apparatus for a component mounter, said operating time reducing apparatus comprising:

an operation loss identifying unit operable to identify an operation loss to be resolved in the component mounter;

a processing procedure selecting unit operable to select a processing procedure for reducing an operating time of the component mounter, based on the identified operation loss; and a processing procedure executing unit operable to execute the selected processing procedure, wherein the component mounter is provided with a mounting head that mounts a component on a board, wherein the selected processing procedure is selected when an operation loss caused by interference, which is a collision between the components or between a component and the mounting head which can occur when the component mounter provided with the mounting head mounts a component on the board, is identified by said operation loss identifying unit, wherein the selected processing procedure is a processing procedure executed by a component mounting order determining apparatus which determines a mounting order in a case where the components are mounted onto the board by the component mounter, and wherein the component mounting order determining apparatus includes:
- a mounting order determining unit which determines a mounting order onto the board based on a restriction condition concerning before-after relation in the mounting order for the components; and
- a task order determining unit which, in a case where a component group to be mounted in one iteration of a repeated series of operations composed of pickup, transportation and mounting of the components performed by the mounting head is defined as a task, divides all components into tasks in a state that the mounting order determined by said mounting order determining unit is maintained, and determines a mounting order for the divided tasks.

39. A component mounter comprising a unit operable to mount components based on a control procedure determined by an operating time reducing method,
wherein the operating time reducing method is a method for reducing operating time in a component mounter, the method including:
- an operation loss identifying step of identifying an operation loss to be resolved in the component mounter;
- a processing procedure selecting step of selecting, based on the identified operation loss, a processing procedure for reducing an operating time of the component mounter; and
- a processing procedure executing step of executing the selected processing procedure, wherein the component mounter is provided with a rotary head that, in a state rotating about an axis, picks up components and mounts the components onto a board,
wherein the selected processing procedure is a method of determining component mounting order in the component mounter,
wherein a board mark provided on the board for board positioning or a point included in component mounting points where a first component is mounted is defined as a start point,
wherein for an arbitrary two points among a plurality of component mounting points and the start point, a distance between the two points or a time duration necessary from completion of mounting of a component to one point of the two points until completion of mounting of a component to the other point is defined as a cost for the two points,
wherein a point set up hypothetically as a last movement point is defined as a dummy point, and
wherein the component mounting order determining method including:
- a component mounting point information acquiring step of acquiring position information concerning the plurality of component mounting points and the costs for two points among the plurality of component mounting points, the start point, and the dummy point;
- a traveling path calculating step of calculating a traveling path that passes individual points so as to minimize a sum of the costs for two points among the start point on the board, the dummy point and the plurality of component mounting points; and
- a mounting order determining step of determining the component mounting order based on the traveling path.

40. A component mounter comprising a unit operable to mount components based on a control procedure determined by an operating time reducing method,
wherein the operating time reducing method is a method for reducing operating time in a component mounter, the method including:
- an operation loss identifying step of identifying an operation loss to be resolved in the component mounter;
- a processing procedure selecting step of selecting, based on the identified operation loss, a processing procedure for reducing an operating time of the component mounter; and
- a processing procedure executing step of executing the selected processing procedure, wherein the component mounter is provided with a mounting head, for holding and transporting a plurality of components, that mounts the plurality of components onto a board,
wherein the selected processing procedure is a component mounting order determination method of determining mounting order in a case where the components are mounted onto the board by the component mounter,
wherein for an arbitrary two points among a plurality of component mounting points and a dummy point, which is a point set up hypothetically, a distance between the two points or a time duration necessary from completion of mounting of a component to one point of the two points until completion of mounting of a component to the other point is defined as a cost for the two points,
wherein the dummy point is defined as a point set up as a start point and an end point of component mounting, and
wherein the component mounting order determination method includes:
- a component mounting point information acquiring step of acquiring position information concerning the plurality of component mounting points and the costs for two points among the plurality of component mounting points and the dummy point;
- a traveling path calculating step of calculating a traveling path in which the dummy point serves as starting point and an end point, and which passes individual points such as to minimize a sum of the costs for two points among the plurality of component mounting points and the dummy point; and
- a mounting order determining step of determining the component mounting order based on the traveling path.

41. A component mounter comprising a unit operable to mount components based on a control procedure determined by an operating time reducing method,
wherein the operating time reducing method is a method for reducing operating time in a component mounter, the method including:
- an operation loss identifying step of identifying an operation loss to be resolved in the component mounter;
- a processing procedure selecting step of selecting, based on the identified operation loss, a processing procedure for reducing an operating time of the component mounter; and
- a processing procedure executing step of executing the selected processing procedure, wherein the component mounter is provided with a plurality of mounting heads, each for holding and transporting a plurality of components, that alternatively mount the components onto one board,
wherein the selected processing procedure is a component mounting order determination method of determining mounting order in a case where the plurality of mounting heads alternately mount the components onto the one board, wherein each mounting head is a head that picks up and transports a plurality of components so as to mount the plurality of components onto the board, wherein a component group to be mounted in one iteration of a repeated series of operations composed of pickup, transportation and mounting of the components performed by each mounting head is defined as a task, and wherein the component mounting order determination method includes:

an assignment step of assigning components to be mounted onto the board to any one of the plurality of mounting heads so that a number of tasks assigned to each of the plurality of mounting heads becomes uniform; and a task generating step of generating each task for the components assigned to each head so that a time duration from completion of component mounting in the task of a particular mounting head until start of component mounting in the task of the next mounting head is minimized.

42. A component mounter comprising a unit operable to mount components based on a control procedure determined by an operating time reducing method, wherein the operating time reducing method is a method for reducing operating time in a component mounter, the method including:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a mounting head, for holding and transporting a plurality of components, that mounts the plurality of components onto a board, wherein the selected processing procedure is selected in said processing procedure step when a board carrying-in time, which is a time duration after the components have been mounted onto the board until the next board is carried in to a board stop position in the component mounter, greater than a predetermined threshold is identified in said operation loss identifying step, wherein the selected processing procedure is a method of reducing an operating time in a case where the components are mounted onto the board by the component mounter, and wherein the operating time reduction method includes:

a board carrying-in time calculating step of calculating a board carrying-in time which is a time duration after the components have been mounted onto the board until the next board is carried in to a board stop position in the component mounter; and a timing determining step of determining, when one iteration of a repeated series of operations composed of pickup and mounting of the components performed by the mounting head is defined as a task, timing of pickup of components in a first task so that pickup of the components in the first task for a board carried in is started within the board carrying-in time.

43. A component mounter comprising a unit operable to mount components based on a control procedure determined by an operating time reducing method, wherein the operating time reducing method is a method for reducing operating time in a component mounter, the method including:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a mounting head, the mounting head including a holding unit for holding and transporting a plurality of components, that mounts the plurality of components onto a board, wherein a component group to be mounted in one iteration of a repeated series of operations composed of pickup, transportation and mounting of the components performed by the mounting head is defined as a task, wherein the selected processing procedure step is selected in said processing procedure step when an operation loss caused by the presence of a task in which the components have mutually different component transportation speed limits for the mounting head or by the presence of a task in which the components have mutually different component transportation acceleration limits for the mounting head is identified in said operation loss identifying step, wherein the selected processing procedure is a component mounting method of mounting the plurality of components onto the board by using the holding unit, and wherein the component mounting method includes:

a speed identifying step of identifying a transportation speed limit for the holding unit corresponding to each of the plurality of components;

a determination step of determining handling order for the plurality of components performed by the holding unit based on the transportation speed limits so that a time duration that a component having a lower transportation speed limit among the plurality of components is held by the holding unit is reduced; and a mounting step of handling the plurality of components with the holding unit in accordance with the handling order determined in said determination step, and moving the holding unit at a speed not exceeding the lowest transportation speed limit of the components held by the holding unit so as to mount the plurality of components onto the board.

44. A component mounter comprising a unit operable to mount components based on a control procedure determined by an operating time reducing method, wherein the operating time reducing method is a method for reducing operating time in a component mounter, the method including:

an operation loss identifying step of identifying an operation loss to be resolved in the component mounter;

a processing procedure selecting step of selecting, based on the identified operation loss, a processing procedure for reducing an operating time of the component mounter; and a processing procedure executing step of executing the selected processing procedure, wherein the component mounter is provided with a mounting head that mounts a component on a board,
wherein the selected processing procedure is selected in said processing procedure selecting step when an operation loss caused by interference, which is a collision between the components or between a component and the mounting head that could occur at the time that the component mounter mounts a component on the board, is identified in said operation loss identifying step,
wherein the selected processing procedure is a component mounting order determination method of determining mounting order in a case where the components are mounted onto the board by the component mounter, and
wherein the component mounting order determination method includes:

a mounting order determining step of determining mounting order onto the board based on a restriction condition concerning before-after relation in the mounting order for the components; and
a task order determining step of, in a case where a component group to be mounted in one iteration of a repeated series of operations composed of pickup, transportation and mounting of the components performed by the mounting head is defined as a task, dividing all components into tasks in a state that the mounting order determined in said mounting order determining step is maintained, and determining mounting order for the divided tasks.

* * * * *